US012749533B2

(12) United States Patent
Cao

(10) Patent No.: US 12,749,533 B2
(45) Date of Patent: Sep. 29, 2026

(54) 3D MEMORY BLOCK HAVING LOW-RESISTANCE SOURCE/DRAIN BURIED LAYER STACKED ARCHITECTURE

(71) Applicant: WUHAN XINXIN SEMICONDUCTOR MANUFACTURING CO., LTD., Wuhan (CN)

(72) Inventor: Kaiwei Cao, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 59 days.

(21) Appl. No.: 18/584,346

(22) Filed: Feb. 22, 2024

(65) Prior Publication Data

US 2024/0290386 A1 Aug. 29, 2024

(30) Foreign Application Priority Data

Feb. 28, 2023 (CN) ......................... 202310187788.0

(51) Int. Cl.
*G11C 16/04* (2006.01)
*H10B 41/10* (2023.01)
(Continued)

(52) U.S. Cl.
CPC ......... *G11C 16/0483* (2013.01); *H10B 41/10* (2023.02); *H10B 41/27* (2023.02); *H10B 43/10* (2023.02); *H10B 43/27* (2023.02)

(58) Field of Classification Search
CPC .... G11C 16/0483; H10B 41/10; H10B 41/27; H10B 43/10; H10B 43/27; H10B 41/20; H10B 41/30
See application file for complete search history.

(56) References Cited

U.S. PATENT DOCUMENTS

| | | | |
|---|---|---|---|
| 5,511,022 | A | 4/1996 | Yim et al. |
| 10,475,812 | B2 | 11/2019 | Harari |

(Continued)

FOREIGN PATENT DOCUMENTS

| | | | |
|---|---|---|---|
| CN | 1401140 | A | 3/2003 |
| CN | 104576597 | A | 4/2015 |

(Continued)

OTHER PUBLICATIONS

W. Huang et al., "A Novel 3D NOR Flash With Single-Crystal Silicon Channel: Devices, Integration, and Architecture," in IEEE Electron Device Letters, vol. 43, No. 11, pp. 1874-1877, Nov. 2022, (Year: 2022).*

(Continued)

*Primary Examiner* — Alfredo Bermudez Lozada
*Assistant Examiner* — James S. Wells

(57) ABSTRACT

The present disclosure provides a memory block, a memory cell, and a manufacturing method of a memory block. The memory block includes a memory array, including: a plurality of columns of semiconductor stacked strip structures that are spaced apart along a row direction; wherein each column of stacked strip structure extends along a column direction and comprises at least one drain region semiconductor strip, at least one channel semiconductor strip, and at least one source region semiconductor strip that are stacked along a height direction. Each drain region semiconductor strip and/or each source region semiconductor strip in each column of semiconductor stacked strip structure comprises a low-resistance conductive structure.

9 Claims, 44 Drawing Sheets

(51) Int. Cl.

| | |
|---|---|
| ***H10B 41/27*** | (2023.01) |
| ***H10B 43/10*** | (2023.01) |
| ***H10B 43/27*** | (2023.01) |

(56) References Cited

U.S. PATENT DOCUMENTS

| | | | |
|---|---|---|---|
| 2002/0080653 | A1 | 6/2002 | Lee et al. |
| 2016/0056168 | A1 | 2/2016 | Lue |
| 2017/0092370 | A1 | 3/2017 | Harari |
| 2018/0269229 | A1 | 9/2018 | Or-Bach et al. |
| 2020/0251490 | A1 | 8/2020 | Matsumoto et al. |
| 2020/0251492 | A1 | 8/2020 | Lee |
| 2021/0202703 | A1 | 7/2021 | Rajashekhar et al. |
| 2022/0123003 | A1 | 4/2022 | Young et al. |
| 2022/0199643 | A1 | 6/2022 | Harari et al. |
| 2022/0343980 | A1 | 10/2022 | Kamisaka et al. |
| 2023/0178425 | A1 | 6/2023 | Tirukkonda et al. |

FOREIGN PATENT DOCUMENTS

| | | | |
|---|---|---|---|
| CN | 105308751 | A | 2/2016 |
| CN | 109863575 | A | 6/2019 |
| CN | 112567516 | A | 3/2021 |
| CN | 113748466 | A | 12/2021 |
| TW | 202109849 | A | 3/2021 |
| TW | 202230746 | A | 8/2022 |
| WO | 2018032407 | A1 | 2/2018 |

OTHER PUBLICATIONS

Taiwan First Notice of examination opinions, Taiwan Application No. 112150443, mailed Aug. 28, 2024 (14 pages).
US Non Final office action, U.S. Appl. No. 18/146,471, mailed Jan. 20, 2026 (37 pages).
W.Huang et al "A Novel 3D NOR Flash With Single-Crystal Silicon Channel: Devices, Integration, and Architecture," in IEEE Electron Device Letters, vol. 43, No. 11, pp. 1874-1877, Nov. 2022 (Year: 2022); Publication dated 2022 (4 pages).
Bendersky ("Memory layout of multi-dimensional arrays") https://eli.thegreenplace.net/2015/memory-layout-of-multi-dimensional-arrays/ (Year: 2015); Publication dated Sep. 26, 2015 (12 pages).
Chinese First Office Action, Chinese Application No. 202211343303.4, mailed Jan. 4, 2025 (18 pages).
International Search Report and Written Opinion, International Application No. PCT/CN2022/139686, mailed Jun. 28, 2023 (16 pages).
Taiwan, China First Notice of examination opinions, Taiwan, China Application No. 112141137, mailed Oct. 14, 2024 (12 pages).
Chinese Second Office Action, Chinese Application No. 202211343303.4, mailed May 21, 2025 (16 pages).
US Final OA, U.S. Appl. No. 18/146,471, mailed Aug. 12, 2025 (33 pages).
Chinese First Office Action, Chinese Application No. 202211343304.9, mailed Jan. 23, 2025 (20 pages).
International Search Report and Written Opinion, International Application No. PCT/CN2022/139687, mailed Jun. 28, 2023 (15 pages).
Taiwan, China First Notice of examination opinions, Taiwan, China Application No. 112141133, mailed Apr. 11, 2024 (21 pages).
Chinese Rejection decision, Chinese Application No. 202211343304.9, mailed Aug. 8, 2025 (18 pages).
International Search Report and Written Opinion, International Application No. PCT/CN2023/124594, mailed Nov. 24, 2023 (12 pages).
Taiwan, China First Notice of examination opinions, Taiwan, China Application No. 112142092, mailed Aug. 27, 2024 (16 pages).
Taiwan, China First Notice of examination opinions, Taiwan, China Application No. 112136660, mailed Aug. 6, 2024 (33 pages).
US Non Final Oa, U.S. Appl. No. 18/145,031, mailed May 22, 2025 (18 pages).
US Final OA, U.S. Appl. No. 18/145,031, mailed Nov. 26, 2025 (23 pages).
Taiwan, China Patent approval certificate, Taiwan, China application No. 112135754, mailed Sep. 3, 2024 (6 pages).
Taiwan, China First Notice of examination opinions, Taiwan, China Application No. 112135753, mailed May 22, 2024 (24 pages).
US Second Non Final OA1, U.S. Appl. No. 18/146,471, mailed Feb. 25, 2025 (18 pages).
Taiwan, China First Notice of examination opinions, Taiwan, China Application No. 112143529, mailed Sep. 9, 2024 (16 pages).
Chinese First Office Action, Chinese Application No. 202310690422.5, mailed Sep. 17, 2025 (17 pages).
US Non Final OA, U.S. Appl. No. 18/528,818, mailed May 8, 2025 (28 pages).
US Final OA, U.S. Appl. No. 18/528,818, mailed Oct. 17, 2025 (16 pages).
International Search Report and Written Opinion, International Application No. PCT/CN2022/139688, mailed Jun. 23, 2023 (12 pages).
US First Non Final OA1, U.S. Appl. No. 18/146,471, mailed Jan. 20, 2025 (37 pages).

* cited by examiner

3D MEMORY BLOCK HAVING LOW-RESISTANCE SOURCE/DRAIN BURIED LAYER STACKED ARCHITECTURE

CROSS REFERENCE TO REPLATED APPLICATIONS

The present disclosure claims priority of Chinese Patent Application No. 202310187788.0, filed on Feb. 28, 2023, the entire contents of which are hereby incorporated by reference in its entirety.

TECHNICAL FIELD

The present disclosure relates to the field of semiconductor manufacturing technologies, and in particular to a memory block and a buried layer manufacturing method thereof.

BACKGROUND

Three-dimensional (3D) memory arrays are a new type of electronic devices, which may include, for example, a NOR flash memory array, a NAND flash memory array, a dynamic random-access memory (DRAM) array, etc. However, in the memory array of the three-dimensional architecture, for a drain region as a bit line (BL) and a source region as a source line (SL), the source region and the drain region are made of semiconductor materials with doping, whose electrical conductivity is weak and electrical resistance is large, which greatly affects the speed of read (RD), program (PGM), and other operations performed by the memory block.

SUMMARY OF THE DISCLOSURE

The present disclosure provides a memory block and a buried layer manufacturing method thereof, which is intended to solve the problem that existing 3D memory arrays have poor conductivity and high resistance in the source and drain regions, the problem resulting in greatly affecting the speed of the block in performing operations such as reading and writing (RD), programming (PGM), etc.

To solve the above technical problem, the present disclosure provides a memory block, including: a memory array, including: a plurality of columns of semiconductor stacked strip structures that are spaced apart along a row direction; wherein each column of stacked strip structure extends along a column direction and includes at least one drain region semiconductor strip, at least one channel semiconductor strip, and at least one source region semiconductor strip that are stacked along a height direction; each drain region semiconductor strip and/or each source region semiconductor strip in each column of semiconductor stacked strip structure includes a low-resistance conductive structure.

In some embodiments, the memory array includes a plurality of memory cells distributed in a three-dimensional array; wherein the memory array includes a plurality of memory subarray layers sequentially stacked along the height direction, and each memory subarray layer includes a drain region semiconductor layer, a channel semiconductor layer, and a source region semiconductor layer stacked along the height direction; in each memory subarray layer, the drain region semiconductor layer includes a plurality of drain region semiconductor strips spaced apart along the row direction, each drain region semiconductor strip extending along the column direction; the channel semiconductor layer includes a plurality of channel semiconductor strips spaced apart along the row direction, each channel semiconductor strip extending along the column direction; the source region semiconductor layer includes a plurality of source region semiconductor strips spaced apart along the row direction, each source region semiconductor strip extending along the column direction; the drain region semiconductor strips, the channel semiconductor strips, and the source region semiconductor strips that are in a same column are stacked to form a corresponding column of semiconductor stacked strip structure.

In some embodiments, each drain region semiconductor strip and/or each source region semiconductor strip in each column of semiconductor stacked strip structure at a non-edge position includes the low-resistance conductive structure.

In some embodiments, each column of semiconductor stacked strip structure at a non-edge position includes a first semiconductor substructure, a second semiconductor substructure, and an insulating isolation structure arranged between the first semiconductor substructure and the second semiconductor substructure; each drain region semiconductor strip in the column of semiconductor stacked strip structure at the non-edge position is divided into a first drain region semiconductor sub-strip and a second drain region semiconductor sub-strip; each channel semiconductor strip in the column of semiconductor stacked strip structure at the non-edge position is divided into a first channel semiconductor sub-strip and a second channel semiconductor sub-strip; each source region semiconductor strip in the column of semiconductor stacked strip structure at the non-edge position is divided into a first source region semiconductor sub-strip and a second source region semiconductor sub-strip.

In some embodiments, each of the first drain region semiconductor sub-strip and the second drain region semiconductor sub-strip includes a first drain region semiconductor layer structure, a second drain region semiconductor layer structure, and a third drain region semiconductor layer structure; the second drain region semiconductor layer structure is arranged between the first drain region semiconductor layer structure and the third drain region semiconductor layer structure; the first drain region semiconductor layer structure and the third drain region semiconductor layer structure are each of a silicon semiconductor layer structure, and the second drain region semiconductor layer structure is of a silicon germanium semiconductor layer structure; and/or each of the first source region semiconductor sub-strip and the second source region semiconductor sub-strip includes a first source region semiconductor layer structure, a second source region semiconductor layer structure, and a third source region semiconductor layer structure; the second source region semiconductor layer structure is arranged between the first source region semiconductor layer structure and the third source region semiconductor layer structure; the first source region semiconductor layer structure and the third source region semiconductor layer structure are each of a silicon semiconductor layer structure, and the second source region semiconductor layer structure is of a silicon germanium semiconductor layer structure.

In some embodiments, a length of the second drain region semiconductor layer structure in the row direction is less than a length of the first drain region semiconductor layer structure and a length of the third drain region semiconductor layer structure in the row direction, to define a drain region filling space between the first drain region semiconductor layer structure, the second drain region semiconductor layer structure, and the third drain region semiconductor layer structure; a drain region low-resistance conductive layer structure is formed in the drain region filling space, and the low-resistance conductive structure in each of the first drain region semiconductor sub-strip and the second drain region semiconductor sub-strip includes the drain region low-resistance conductive layer structure; and/or a length of the second source region semiconductor layer structure in the row direction is less than a length of the first source region semiconductor layer structure and a length of the third source region semiconductor layer structure in the row direction, to define a source region filling space between the first source region semiconductor layer structure, the second source region semiconductor layer structure, and the third source region semiconductor layer structure; a source region low-resistance conductive layer structure is formed in the source region filling space, and the low-resistance conductive structure in each of the first source region semiconductor sub-stripe and the second source region semiconductor sub-strip includes the source region low-resistance conductive layer structure.

In some embodiments, the drain region low-resistance conductive layer structure and/or the source region low-resistance conductive layer structure is made of a high-conductivity material; the drain region low-resistance conductive layer structure or the source region low-resistance conductive layer structure includes a first conductive layer structure, a second conductive layer structure, a third conductive layer structure, a fourth conductive layer structure, and a fifth conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, the third conductive layer structure is formed on a portion of a lower surface of the third drain region semiconductor layer structure or the third source region semiconductor layer structure, the fourth conductive layer structure is formed on a side of the first drain region semiconductor layer structure or the first source region semiconductor layer structure, and the fifth conductive layer structure is formed on a side of the third drain region semiconductor layer structure or the third source region semiconductor layer; the first conductive layer structure, the second conductive layer structure, the third conductive layer structure, the fourth conductive layer structure, and the fifth conductive layer structure are made of a material including a metal silicide; or the drain region low-resistance conductive layer structure or the source region low-resistance conductive layer structure includes a first conductive layer structure, a second conductive layer structure, and a third conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, and the third conductive layer structure is formed on a portion of a lower surface of the third drain region semiconductor layer structure or the third source region semiconductor layer structure; each of the first conductive layer structure, the second conductive layer structure, and the third conductive layer structure includes at least a first low-resistance layer; the first low-resistance layer is made of a material including titanium nitride or tantalum nitride; or the drain region low-resistance conductive layer structure or the source region low-resistance conductive layer structure includes a conductive layer structure filled in the drain region filling space or the source region filling space, and the conductive layer structure is made of a material including a metal.

In some embodiments, each of the first conductive layer structure, the second conductive layer structure, and the third conductive layer structure further includes a second low-resistance layer, wherein the second low-resistance layer is attached to a surface of the first low-resistance layer; a material of the second low-resistance layer includes titanium or tantalum, or the material of the second low-resistance layer includes a combination layer of titanium and another metal, or a combination layer of tantalum and another metal.

In some embodiments, the first conductive layer structure and the third conductive layer structure are spaced apart from each other to define a first space configured to be filled with an insulating substance.

In some embodiments, the column of semiconductor stacked strip structure is etched into a stepped structure at an edge position, for leading out each drain region semiconductor strip and each source region semiconductor strip in the column of semiconductor stacked strip structure.

In some embodiments, adjacent two of the plurality of memory subarray layers include the drain region semiconductor layer, the channel semiconductor layer, the source region semiconductor layer, the channel semiconductor layer, and the drain region semiconductor layer, in a sequential cascade along the height direction, so as to share the same source region semiconductor layer; an interlayer isolation layer is arranged on every adjacent two of the plurality of memory subarray layers to be isolated from another two of the plurality of memory subarray layers.

To solve the above technical problem, the present disclosure further provides a memory cell, including: a drain region portion, a channel portion, and a source region portion stacked perpendicular to a substrate wherein a side of the drain region portion, the channel portion, and the source region portion is arranged with a gate portion, and the drain region portion and/or the source region portion is arranged with a low-resistance conductive structure.

In some embodiments, the drain region portion includes a first drain region semiconductor layer structure, a second drain region semiconductor layer structure, and a third drain region semiconductor layer structure; the second drain region semiconductor layer structure is arranged between the first drain region semiconductor layer structure and the third drain region semiconductor layer structure; the first drain region semiconductor layer structure and the third drain region semiconductor layer structure are each of a silicon semiconductor layer structure, and the second drain region semiconductor layer structure is of a silicon germanium semiconductor layer structure; and/or the source region portion includes a first source region semiconductor layer structure, a second source region semiconductor layer structure, and a third source region semiconductor layer structure; the second source region semiconductor layer structure is arranged between the first source region semiconductor layer structure and the third source region semiconductor layer structure; the first source region semiconductor layer structure and the third source region semiconductor layer structure are each of a silicon semiconductor layer structure, and the second source region semiconductor layer structure is of a silicon germanium semiconductor layer structure.

In some embodiments, a length of the second drain region semiconductor layer structure in a first direction is less than a length of the first drain region semiconductor layer structure and a length of the third drain region semiconductor layer structure in the first direction, to define a drain region filling space between the first drain region semiconductor layer structure, the second drain region semiconductor layer structure, and the third drain region semiconductor layer structure; a drain region low-resistance conductive layer structure is formed in the drain region filling space; and/or a length of the second source region semiconductor layer structure in the first direction is less than a length of the first source region semiconductor layer structure and a length of the third source region semiconductor layer structure in first row direction, to define a source region filling space between the first source region semiconductor layer structure, the second source region semiconductor layer structure, and the third source region semiconductor layer structure; a source region low-resistance conductive layer structure is formed in the source region filling space.

In some embodiments, the drain region low-resistance conductive layer structure and/or the source region low-resistance conductive layer structure is a low-resistance conductive layer structure made of a high-conductivity material; the low-resistance conductive layer structure includes a first conductive layer structure, a second conductive layer structure, a third conductive layer structure, a fourth conductive layer structure, and a fifth conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, the third conductive layer structure is formed on a portion of a lower surface of the third drain region semiconductor layer structure or the third source region semiconductor layer structure, the fourth conductive layer structure is formed on a side of the first drain region semiconductor layer structure or the first source region semiconductor layer structure, and the fifth conductive layer structure is formed on a side of the third drain region semiconductor layer structure or the third source region semiconductor layer; the first conductive layer structure, the second conductive layer structure, the third conductive layer structure, the fourth conductive layer structure, and the fifth conductive layer structure are made of a material including a metal silicide; or the low-resistance conductive layer structure includes a first conductive layer structure, a second conductive layer structure, and a third conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, and the third conductive layer structure is formed on a portion of a lower surface of the third drain region semiconductor layer structure or the third source region semiconductor layer structure; each of the first conductive layer structure, the second conductive layer structure, and the third conductive layer structure includes at least a first low-resistance layer; the first low-resistance layer is made of a material including titanium nitride or tantalum nitride; or the low-resistance conductive layer structure includes a conductive layer structure filled in the drain region filling space or the source region filling space, and the conductive layer structure is made of a material including a metal.

In some embodiments, each of the first conductive layer structure, the second conductive layer structure, and the third conductive layer structure further includes a second low-resistance layer, wherein the second low-resistance layer is attached to a surface of the first low-resistance layer; a material of the second low-resistance layer includes titanium or tantalum, or the material of the second low-resistance layer includes a combination layer of titanium and another metal, or a combination layer of tantalum and another metal.

To solve the above technical problem, the present disclosure further provides manufacturing method of a memory block, including: providing a semiconductor substrate; wherein the semiconductor substrate includes a substrate, and a plurality of columns of semiconductor stacked strip structures formed on the substrate; the plurality of columns of semiconductor stacked strip structures are spaced apart along a row direction, each column of semiconductor stacked strip structure extends along a column direction, and each column of semiconductor stacked strip structure includes at least one drain region semiconductor strip, at least one channel semiconductor strip, and at least one source region semiconductor strip stacked along a height direction; defining an isolation opening in each column of semiconductor stacked strip structure; wherein the isolation opening divides the column of semiconductor stacked strip structure into a first semiconductor substructure and a second semiconductor substructure; and defining a filling opening in a drain/source region semiconductor sub-strip in each of the first semiconductor substructure and the second semiconductor substructure through the isolation opening, and forming a low-resistance conductive structure in the filling opening.

In some embodiments, the providing a semiconductor substrate includes: providing the substrate; forming a plurality of memory subarray layers sequentially on the substrate along the height direction; wherein each memory subarray layer includes a drain region semiconductor layer, a channel semiconductor layer, and a source region semiconductor layer stacked along the height direction; and forming a first hard mask layer on the plurality of memory subarray layers, and defining a plurality of isolation wall holes and word line holes on the first hard mask layer and the plurality of memory subarray layers, for causing the drain region semiconductor layer of each memory subarray layer to be divided into a plurality of drain region semiconductor strips, the channel semiconductor layer of each memory subarray layer to be divided into a plurality of channel semiconductor strips, and the source region semiconductor layer of each memory subarray layer to be divided into a plurality of source region semiconductor strips, along the row direction; each of the plurality of drain region semiconductor strips, the plurality of channel semiconductor strips, and the plurality of source region semiconductor strips extends along the column direction, and a column of the drain region semiconductor strips, channel semiconductor strips, and source region semiconductor strips in the plurality of memory subarray layers constitutes a corresponding column of semiconductor stacked strip structure.

In some embodiments, each of the drain region semiconductor and the source region semiconductor is denoted as a drain/source region semiconductor layer, and formation of the drain/source region semiconductor layer includes: forming a first drain/source semiconductor sublayer by epitaxial growth; wherein the first drain/source semiconductor sublayer is a semiconductor sublayer made of silicon; forming a second drain/source semiconductor sublayer by epitaxial growth on the first drain/source semiconductor sublayer; wherein the second drain/source semiconductor sublayer is a semiconductor sublayer made of silicon germanium; and forming a third drain/source semiconductor sublayer by epitaxial growth on the second drain/source semiconductor sublayer; wherein the third drain/source semiconductor sublayer is a semiconductor sublayer made of silicon; wherein after the plurality of memory subarray layers are divided into the multiple columns of semiconductor stacked strip structures along the row direction, the first drain/source semiconductor sublayer is divided into a plurality of columns of first drain/source semiconductor sublayer strips, the second drain/source semiconductor sublayer is divided into a plurality of columns of second drain/source semiconductor sublayer strips, and the third drain/source semiconductor sublayer is divided into a plurality of columns of third drain/source semiconductor sublayer strips; each drain region semiconductor strip and/or each source region semiconductor strip in the column of semiconductor stacked strip structure includes a corresponding first drain/source semiconductor sublayer strip, second drain/source semiconductor sublayer strip, and third drain/source semiconductor sublayer strip; each of the first drain/source semiconductor sublayer strip, second drain/source semiconductor sublayer strip, and third drain/source semiconductor sublayer strip is denoted as a drain/source semiconductor sublayer strip; after the isolation opening is defined in each column of semiconductor stacked strip structure at a non-edge position to divide the column of semiconductor stacked strip structure into the first semiconductor substructure and the second semiconductor substructure, each drain/source semiconductor sublayer strip and/or each drain/source region semiconductor sub-strip in the first semiconductor substructure includes a corresponding first drain/source semiconductor layer structure, a second drain/source semiconductor layer structure, and a third drain/source semiconductor layer structure.

In some embodiments, the defining a filling opening in a drain/source region semiconductor sub-strip in each of the first semiconductor substructure and the second semiconductor substructure through the isolation opening, and forming a low-resistance conductive structure in the filling opening include: in the isolation opening, replacing each of a first sacrificial semiconductor layer and a second sacrificial semiconductor layer in each of the first semiconductor substructure and the second semiconductor substructure with an insulating isolation layer through a first recessed groove, replacing a portion of the second drain/source semiconductor layer structure in each of the first semiconductor substructure and the second semiconductor substructure with a protective dielectric layer, and replacing a portion of the channel semiconductor sub-strip in each of the first semiconductor substructure and the second semiconductor substructure with an insulating isolation layer; removing the protective dielectric layer in the first recessed groove in each of the first semiconductor substructure and the second semiconductor substructure, and deepening the first recessed groove to form a drain/source region filled space; and depositing a high-conductivity material in a drain/source region filling space to form the low-resistance conductive structure.

In some embodiments, in the isolation opening, the replacing each of a first sacrificial semiconductor layer and a second sacrificial semiconductor layer in each of the first semiconductor substructure and the second semiconductor substructure with an insulating isolation layer through a first recessed groove, replacing a portion of the second drain/source semiconductor layer structure in each of the first semiconductor substructure and the second semiconductor substructure with a protective dielectric layer, and replacing a portion of the channel semiconductor sub-strip in each of the first semiconductor substructure and the second semiconductor substructure with an insulating isolation layer include: in the isolation opening, etching the portion of each of the first sacrificial semiconductor layer, the second sacrificial semiconductor layer, and the second drain/source semiconductor layer structure in each of the first semiconductor substructure and the second semiconductor substructure to remove the portion of each of the first sacrificial semiconductor layer, the second sacrificial semiconductor layer, and the second drain/source semiconductor layer structure; forming the protective dielectric layer in the first recessed groove in the removed portion of each of the first sacrificial semiconductor layer, the second sacrificial semiconductor layer, and the second drain/source semiconductor layer structure; removing the protective dielectric layer in the first recessed groove corresponding to each of the first sacrificial semiconductor layer and the second sacrificial semiconductor layer to expose a residual part of the first sacrificial semiconductor layer and the second sacrificial semiconductor layer; removing the residual part of the first sacrificial semiconductor layer and the second sacrificial semiconductor layer; and performing deposition in a region where the removed first sacrificial semiconductor layer and the second sacrificial semiconductor layer are located to fill with an insulating material, for replacing the first sacrificial semiconductor layer and the second sacrificial semiconductor layer with the insulating isolation layer, and forming the insulating isolation layer on a sidewall of the isolation opening.

In some embodiments, in the isolation opening, the replacing each of a first sacrificial semiconductor layer and a second sacrificial semiconductor layer in each of the first semiconductor substructure and the second semiconductor substructure with an insulating isolation layer through a first recessed groove, replacing a portion of the second drain/source semiconductor layer structure in each of the first semiconductor substructure and the second semiconductor substructure with a protective dielectric layer, and replacing a portion of the channel semiconductor sub-strip in each of the first semiconductor substructure and the second semiconductor substructure with an insulating isolation layer further include: removing the insulating isolation layer formed on the sidewall of the isolation opening; etching the portion of the channel semiconductor sub-strip in each of the first semiconductor substructure and the second semiconductor substructure to remove the portion of the channel semiconductor sub-strip, and defining a second recessed groove in the removed portion of the channel semiconductor sub-strip; and performing deposition in a region where the second recessed groove is located to fill with an insulating material, and forming the insulating isolation layer in the second recessed groove and on the sidewall of the isolation opening.

In some embodiments, the removing the protective dielectric layer in the first recessed groove in each of the first semiconductor substructure and the second semiconductor substructure, and deepening the first recessed groove to form a drain/source region filled space include: removing the insulating isolation layer formed on a sidewall of the isolation opening; removing the protective dielectric layer in the first recessed groove; and continuing to etching the portion of each of the first semiconductor substructure and the second semiconductor substructure within the first recessed groove to remove the portion of the second drain/source region semiconductor layer structure, deepening the first recessed groove, and forming the drain/source region filling space.

In some embodiments, the depositing a high-conductivity material in a drain/source region filling space to form the low-resistance conductive structure includes: depositing a metal on an inner surface of the drain/source filled space and on a sidewall of the isolation opening; performing a heat treatment to react the metal with a silicon material of the drain/source region semiconductor sub-strip in each of the first semiconductor substructure and the second semiconductor substructure to form a metal-silicide layer; wherein the metal remains on a sidewall of the insulating isolation layer; and removing the metal remaining on the sidewall of the insulating isolation layer, and retaining the metal-silicide layer to form the low-resistance conductive structure; wherein the low-resistance conductive structure includes a first conductive layer structure, a second conductive layer structure, a third conductive layer structure, a fourth conductive layer structure, and a fifth conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, the third conductive layer structure is formed on a portion of a lower surface of the third drain region semiconductor layer structure or the third source region semiconductor layer structure, the fourth conductive layer structure is formed on a side of the first drain region semiconductor layer structure or the first source region semiconductor layer structure, and the fifth conductive layer structure is formed on a side of the third drain region semiconductor layer structure or the third source region semiconductor layer structure.

In some embodiments, the depositing a high-conductivity material in a drain/source region filling space to form the low-resistance conductive structure includes: depositing a first low-resistance layer on an inner surface of the drain/source region filling space; wherein a material of the first low-resistance layer includes titanium nitride and tantalum nitride; etching in a direction from the isolation opening toward a corresponding one of the first semiconductor substructure and the second semiconductor substructure to remove titanium nitride or tantalum nitride from the sidewall of the isolation opening, for forming the low-resistance conductive structure; wherein the low-resistance conductive layer structure includes a first conductive layer structure, a second conductive layer structure, and a third conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, and the third conductive layer structure is formed on a portion of a lower surface of the third drain region semiconductor layer structure or the third source region semiconductor layer structure; each of the first conductive layer structure, the second conductive layer structure, and the third conductive layer structure includes the first low-resistance layer.

In some embodiments, after the first low-resistance layer is deposited on the inner surface of the drain/source region filling space, a second low-resistance layer is deposited on the first low-resistance layer and on the sidewall of the isolation opening; wherein a material of the second low-resistance layer includes titanium or tantalum, a combination layer of titanium and another metal, or a combination layer of tantalum and another metal; the second low-resistance layer on the sidewall of the isolation opening is removed by etching in the direction from the isolation opening toward a corresponding one of the first semiconductor substructure and the second semiconductor substructure, for forming the low-resistance conductive structure; wherein each of the first conductive layer structure, the second conductive layer structure, and the third conductive layer structure further includes and the second low-resistance layer.

In some embodiments, the depositing a high-conductivity material in a drain/source region filling space to form the low-resistance conductive structure includes: depositing a metal within the drain/source region filling space and on a sidewall of the isolation opening; and removing the metal on the sidewall of the isolation opening by etching in a direction from the isolation opening toward a corresponding one of the first semiconductor substructure and the second semiconductor substructure to form the low-resistance conductive structure; wherein the low-resistance conductive structure includes a conductive layer structure filled in the drain/source region filling space, and the conductive layer structure is made of a material including a metal.

In some embodiments, the depositing a high-conductivity material in a drain/source region filling space to form the low-resistance conductive structure further includes: filling an insulating material in a first space between the first conductive layer structure and the third conductive layer structure, and in the isolation opening to form the insulating isolation layer.

Compared to the related art, the beneficial effect of the present disclosure: the present disclosure provides a memory block, including: a memory array, including: a plurality of columns of semiconductor stacked strip structures that are spaced apart along a row direction; wherein each column of stacked strip structure extends along a column direction and includes at least one drain region semiconductor strip, at least one channel semiconductor strip, and at least one source region semiconductor strip that are stacked along a height direction; each drain region semiconductor strip and/or each source region semiconductor strip in each column of semiconductor stacked strip structure includes a low-resistance conductive structure. The drain region semiconductor strip and the source region semiconductor strip having a low-resistance conductive structure have higher electron mobility, and thus higher conductivity and lower resistance, thereby enhancing the response speed of the storage block. In addition, due to the elevated electrical energy utilization, the array of drain/source connection terminals for voltage renewal in the memory block may be reduced or removed, thereby enhancing the space utilization of the memory block and saving process steps and material costs.

BRIEF DESCRIPTION OF THE DRAWINGS

In order to more clearly illustrate the technical solutions in the embodiments of the present disclosure, the following is a brief description of the drawings required for the description of the embodiments, and it will be obvious that the drawings in the following description are only some embodiments of the present disclosure, and that other drawings can be obtained from these drawings without creative work for those skilled in the art.

REFERENCE NUMERALS

Figure 1:
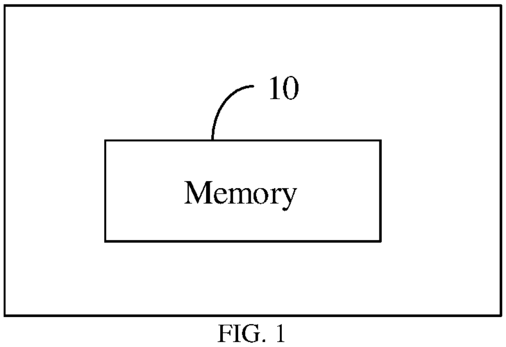
FIG. 1 is a sketch of a structure of a memory device according to an embodiment of the present disclosure.

Memory block 10; memory array 1; memory subarray layer 1*a*; drain region semiconductor strip 11; bit line connection line 11*a*; channel semiconductor strip 12; well region connection line 12*a*; common well region line 12*b*; source region semiconductor strip 13; source connection line 13*a*; common source line 13*b*; inter-layer isolation strip 14*a*; second sacrificial semiconductor layer 14; insulating isolation layer 14'; body structure 15*a*; protrusion 15*b*; support post 16; column of semiconductor strip structures 1*b*; gate strip 2; isolation wall 3; isolation wall hole 31; word line hole 4; storage structure 5; first dielectric layer 51; charge-trapping layer 52; second dielectric layer 53; floating gate 54; first insulating dielectric layer 56; odd word line 8*a*; even word line 8*b*; word line connection line 7; drain region portion 11'; channel portion 12'; source region portion 13'; gate portion 2'; storage structure portion 5'; substrate 81; first sacrificial semiconductor layer 82; first hard mask layer 83; word line opening 831; first recess 84; second recess 84'; third recess 84*a*; first insulating dielectric 85; first insulating dielectric layer 85*a*; second insulating dielectric layer 85*b*; second insulating dielectric 86; drain region semiconductor layer 11*c*; channel semiconductor layer 12*c'*; source region semiconductor layer 13c'; drain/source connection terminal array 9; drain/source connection terminal subarray 9a; drain connection terminal 91a; source connection terminal 91b; first drain/source connection terminal group 92a; second drain/source connection terminal group 92b; drain/source connection plug 94; first insulating material 95a; filling material 95b; insulating layer 95c; drain/source hole 96; drain/source hole array 97; drain/source connection terminal hole 98; second hard mask layer 99; insulating dielectric structure 100; low-resistance conductive structure 101; drain region low-resistance conductive structure 101a; source region low-resistance conductive structure 101b; first semiconductor substructure 102a; second semiconductor substructure 102b; insulating isolation structure 102c; first drain region semiconductor sub-strip 103a; second drain region semiconductor sub-strip 103b; first channel semiconductor sub-strip 104a; second channel semiconductor sub-strip 104b; first source region semiconductor sub-strip 105a; second source region semiconductor sub-strip 105b; first drain region semiconductor layer structure 106a; second drain region 106b semiconductor layer structure; third drain region semiconductor layer structure 106c; first source region semiconductor layer structure 107a; second source region semiconductor layer structure 107b; third source region semiconductor layer structure 107c; drain region filling space 108a; source region filling space 108b; drain region low-resistance conductive layer structure 109a; source region low-resistance conductive layer structure 109b; first conductive layer structure 110a; second conductive layer structure 110b; third conductive layer structure 110c; fourth conductive layer structure 110d; fifth conductive layer structure 110e; first low-resistance layer 110f; second low-resistance layer 110g; first space 111; first drain/source connection terminal subarray 93a; second drain/source connection terminal subarray 93b; semiconductor stacked strip structure 1c; interlayer isolation layer 112; first drain region semiconductor layer 11c1; first channel semiconductor layer 12c1; second channel semiconductor layer 12c2; second drain region semiconductor layer 11c2; first drain/source semiconductor sublayer 113a; second drain/source semiconductor sublayer 113b; third drain/source semiconductor sublayer 113c; first drain/source semiconductor sublayer strip 114a; second drain/source semiconductor sublayer strip 114b; third drain/source semiconductor sublayer strip 114c; isolation opening 115; first recessed groove 116; protective dielectric layer 117; first protection recess 118; second recessed groove 119; metal 120; metal silicide 121.

DETAILED DESCRIPTION

The technical solutions in embodiments of the present disclosure will be clearly and completely described below in conjunction with the accompanying drawings in the embodiments of the present disclosure, and it is obvious that the described embodiments are only a part of the embodiments of the present disclosure, but not all of them. Based on the embodiments in the present disclosure, all other embodiments obtained by those skilled in the art without creative labor fall within the scope of the present disclosure.

The terms "first", "second", and "third" in the present disclosure are intended for descriptive purposes only and are not to be construed as indicating or implying relative importance or implicitly indicating the number of indicated technical features. Therefore, a feature defined with "first", "second", or "third" may explicitly or implicitly include at least one such feature. In the description of the present disclosure, "a plurality of" or "multiple" means at least two, e.g., two, three, etc., unless otherwise expressly and specifically limited. All directional indications (e.g., up, down, left, right, forward, backward . . . ) in the present disclosure are intended only to explain the relative position relationship, movement, etc., between components in a particular posture (as shown in the accompanying drawings), and if that particular posture is changed, the directional indications are changed accordingly. In addition, the terms "include" and "have", and any variations thereof are intended to cover non-exclusive inclusion. For example, a process, method, system, product, or apparatus including a series of steps or units is not limited to the listed steps or units, but optionally further includes steps or units not listed, or optionally further includes other steps or units inherent to the process, method, product, or apparatus.

References herein to "embodiment" mean that particular features, structures, or characteristics described in connection with an embodiment may be included in at least one embodiment of the present disclosure. The presence of the phrase at various positions in the specification does not necessarily mean the same embodiment, nor is it a separate or alternative embodiment that is mutually exclusive with other embodiments. It is understood, both explicitly and implicitly, by those skilled in the art that the embodiments described herein may be combined with other embodiments.

The present disclosure is described in detail below in conjunction with the accompanying drawings and embodiments.

Referring to FIG. 1, FIG. 1 is a sketch of a structure of a memory device according to an embodiment of the present disclosure. A memory device is provided, which may specifically be a non-volatile memory device. The memory device may include one or more memory blocks 10. The specific structure and function of the memory block 10 may be described in connection with the memory block 10 provided in any of the following embodiments. It will be understood by those skilled in the art that a memory array 1 includes a structure in which multiple memory cells are arranged in a three-dimensional array; and the memory block 10 may include, in addition to the memory array 1 formed by the multiple memory cell arrays, other components, such as various types of wires (or connection lines), etc., enabling the memory block 10 to implement various memory operations.

Figure 2A:
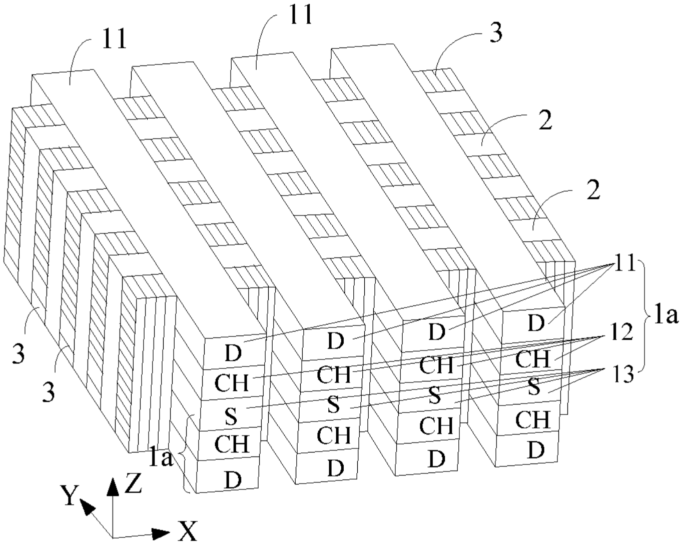
FIG. 2*a* is a perspective structural schematic view of a memory array according to an embodiment of the present disclosure.
Figure 2B:
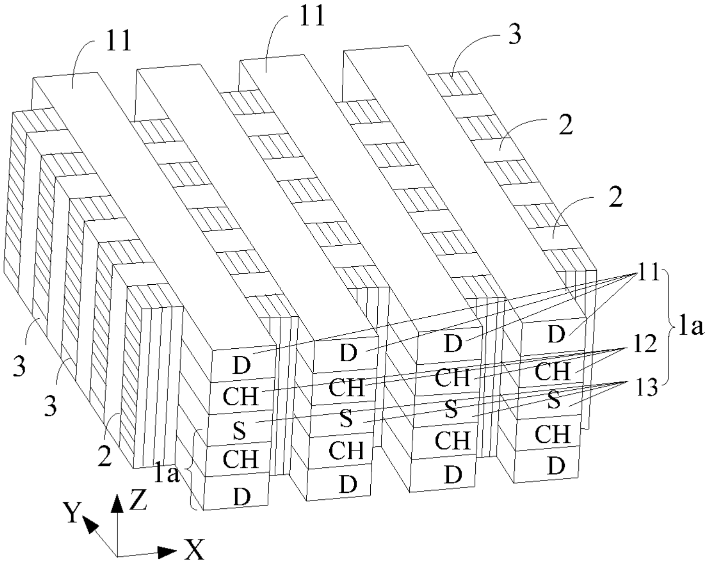
FIG. 2*b* is another perspective structural schematic view of a memory array according to an embodiment of the present disclosure.
Figure 3:
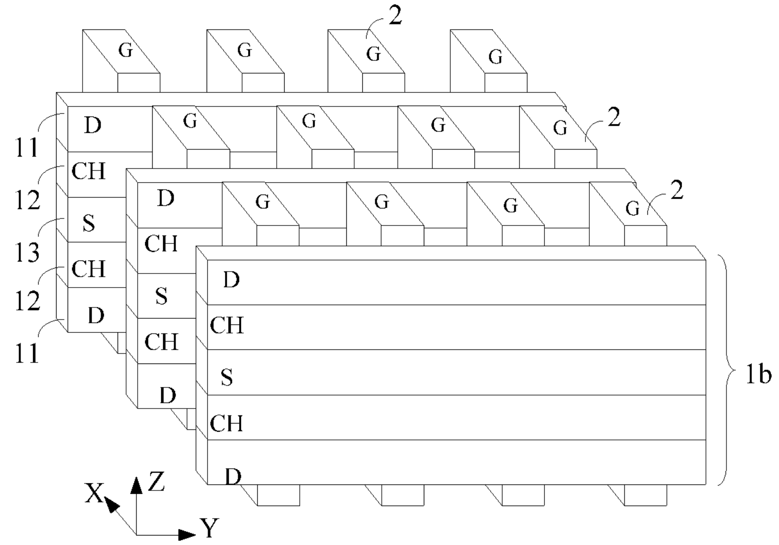
FIG. 3 is further another perspective structural schematic view of a memory array according to an embodiment of the present disclosure.

Referring to FIGS. 2a to 3, FIGS. 2a-3 are perspective structural schematic views of a memory array according to an embodiment of the present disclosure. In the embodiments, a memory block 10 is provided, which includes a memory array 1. The memory array 1 includes multiple memory cells distributed in a three-dimensional array.

As shown in FIG. 2a, the memory array 1 includes multiple memory subarray layers 1a stacked sequentially along a height direction Z. Each memory subarray layer 1a includes a drain region semiconductor layer 11c, a channel semiconductor layer 12c, and a source region semiconductor layer 13c stacked along the height direction Z. The drain region semiconductor layer 11c, the channel semiconductor layer 12c, and the source region semiconductor layer 13c may each be a single-crystal semiconductor layer grown by epitaxy. The height direction Z is a direction perpendicular to the substrate (e.g., substrate 81 of FIG. 9). The sequential stacking indicates a sequential arrangement on the substrate from bottom to top, and the stacking represents an arrangement and does not express or imply a structure or a top-to-bottom relationship of the layers.

In each memory subarray layer 1*a*, the drain region semiconductor layer (D) includes multiple drain region semiconductor strips 11 spaced along a row direction X, each drain region semiconductor strip 11 extending along a column direction Y. The channel semiconductor layer (CH) includes multiple channel semiconductor strips 12 spaced along the row direction X, each channel semiconductor strip 12 extending along the column direction Y. The source region semiconductor layer (S) includes multiple source region semiconductor strips 13 spaced along the row direction X, each source region semiconductor strip 13 extending along the column direction Y. Each drain region semiconductor strip 11, channel semiconductor strip 12, and source region semiconductor strip 13 is a single-crystal semiconductor strip, respectively. It is understood by those skilled in the art that each drain region semiconductor strip 11, channel semiconductor strip 12, and source region semiconductor strip 13 may be a single-crystal semiconductor strip formed by processing the drain region semiconductor layer, channel semiconductor layer, and source region semiconductor layer formed by epitaxy, respectively. As shown in FIGS. 2*a*-3, multiple gate strips 2 (G) are arranged on each side of each column of drain region semiconductor strips 11, channel semiconductor strips 12, and source region semiconductor strips 13, respectively, the multiple gate strips 2 distributed on a side of each column of drain region semiconductor strips 11, channel semiconductor strips 12, and source region semiconductor strips 13 are spaced along the column direction Y, and each gate strip 2 extends along the height direction Z, such that corresponding parts of the multiple drain region semiconductor strips 11, channel semiconductor strips 12, and source region semiconductor strips 13 in the same column in the multiple memory subarray layers 1*a* share a same gate strip 2.

As shown in FIG. 2*b*, among the multiple gate strips 2, each gate strip in the column and the gate strip in the adjacent column are staggered in the row direction X. Of course, as shown in FIG. 2*a*, each gate strip 2 in the same column and a corresponding gate strip 2, in an adjacent column, corresponding to the gate strip 2 in the row direction X, may be aligned with each other in the column direction Y. The staggered arrangement may reduce the influence of an electric field between the corresponding two gate strips 2 in adjacent columns.

Figure 4:
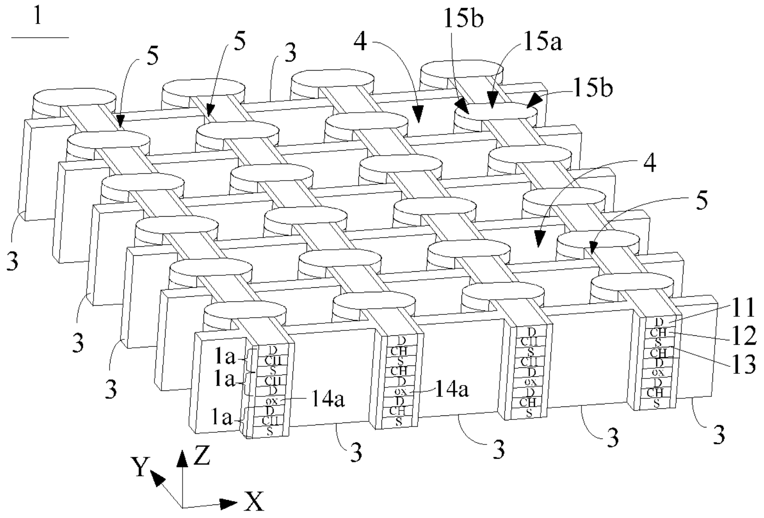
FIG. 4 is further another perspective structural schematic view of a memory array according to an embodiment of the present disclosure.

In the height direction Z, a projection of at least a part of each gate strip 2 coincides with a projection of a part of a corresponding channel semiconductor strip 12 in each memory subarray layer 1*a* on a projection plane. The projection plane is a plane defined by the height direction Z and the column direction Y, i.e., the projection plane extends along the height direction Z and the column direction Y. As shown in FIGS. 2*a*-3, for the purpose of description, it is defined that a column of drain region semiconductor strip 11, channel semiconductor strip 12, and source region semiconductor strip 13 in each memory subarray layer 1*a* constitutes a semiconductor strip structure; two adjacent memory subarray layers 1*a* may share a common source, i.e., the two adjacent memory subarray layers 1*a* share a same source region semiconductor layer (S). Therefore, two semiconductor strip structures corresponding to the two memory subarray layers 1*a* share a same source region semiconductor strip 13. Of course, it is understood by those skilled in the art that the two adjacent memory subarray layers 1*a* may be arranged with a non-common source, i.e., each memory subarray layer 1*a* has an independent source region semiconductor layer, such that the two semiconductor strip structures corresponding to the two adjacent memory subarray layers 1*a* each has its own independent source region semiconductor strip 13. In the multiple memory subarray layers 1*a*, the drain region semiconductor strips 11, channel semiconductor strips 12, and source region semiconductor strips 13 in the same column constitute a column of semiconductor strip structures 1*b*, i.e., a stacked structure 1*b*. The column of semiconductor strip structures 1*b* includes multiple semiconductor strip structures, and the number of the semiconductor strip structures in the column of semiconductor strip structures 1*b* is the same as the number of the memory subarray layers 1*a*. As shown in FIGS. 2*a*-3, each column of semiconductor strip structures 1*b* includes two semiconductor strip structures, but those skilled in the art can understand that a column of semiconductor strip structures 1*b* may include multiple stacked semiconductor strips. As shown in FIG. 4, which is a sketch of a perspective structure of a memory array according to another embodiment of the present disclosure, where a column of semiconductor strip structures 1*b* includes three semiconductor strip structures.

In other words, it is understood by those skilled in the art that the memory array 1 includes multiple stacked structures 1*b* distributed along the row direction X, each stacked structure 1*b* extending along the column direction Y. Each stacked structure 1*b* includes drain region semiconductor strips 11, channel semiconductor strips 12, and source region semiconductor strips 13 stacked along the height direction. Each drain region semiconductor strip 11, channel semiconductor strip 12, and source region semiconductor strip 13 extends along the column direction Y. Multiple gate strips 2 spaced along the column direction Y are arranged on each of two sides of each stacked structure 1*b*, and each gate strip 2 extends along the height direction Z.

A projection of a part of each semiconductor strip structure coincides with a projection of a corresponding part of a corresponding gate strip 2 on the projection plane. In particular, a projection of a part of the channel semiconductor strip 12 in each semiconductor strip structure coincides with a projection of a part of a corresponding gate strip 2 on the projection plane. In this way, a part of the gate strip 2, a corresponding part of the channel semiconductor strip 12, a part of the drain region semiconductor strip 11 adjacent to the corresponding part of the channel semiconductor bar 12, and a part of the source region semiconductor strip 13 adjacent to the corresponding part of the channel semiconductor bar 12 are configured to form a memory cell. For example, as shown in FIGS. 2*a*-3, for the gate strip 2 of the first column along the row direction X and the first row along the column direction Y, a projection of a part of the gate strip 2 coincides with a projection of a corresponding part of the channel semiconductor strip 12 of the first column of the drain region semiconductor strip 11, the channel semiconductor strip 12, and the source region semiconductor strip 13 (a semiconductor strip structure with a D/CH/S structure) of the first memory subarray layer 1*a* in the height direction Z. That is, the part of the gate strip 2 of the first column and the first row, the corresponding part of the first column of the channel semiconductor strip 12 of the first memory subarray layer 1*a* in the height direction Z, and a part of the drain region semiconductor 11 and a part of the source region semiconductor 13, that are matched with the corresponding part of the first column of the channel semiconductor strip 12 of the first memory subarray layer 1*a* in the height direction Z, are configured to form a memory cell.

It will be understood by those skilled in the art that, a channel is required to be formed in a semiconductor region between the semiconductor drain region and the semiconductor source region; and the gate is arranged on a side of the semiconductor region between the semiconductor drain region and the semiconductor source region for constituting a semiconductor device. Therefore, as shown in FIGS. 2*a*-3, the part of each gate strip 2 whose projection overlaps with the projection of a channel semiconductor strip 12 in an adjacent stacked structure 1*b* on the above projection plane is configured as a gate, i.e., a control gate of the corresponding memory cell; the part of the channel semiconductor strip 12 whose projection overlaps with the projection of the gate strip 2 on the above projection plane, i.e., the corresponding part of the channel semiconductor strip 12, is configured as the channel region (well region) for forming a channel therein; and the drain region semiconductor strip 11 and the source region semiconductor strip 13 adjacent to the channel semiconductor strip 12 each has a part arranged just above or below the corresponding part of the channel semiconductor strip 12, i.e., the parts of the drain region semiconductor strip 11 and the source region semiconductor strip 13 exactly match the corresponding part of the channel semiconductor strip 12 as the semiconductor drain region and the semiconductor source region. Therefore, the parts of the drain region semiconductor strip 11 and the source region semiconductor strip 13, the corresponding part of the channel semiconductor strip 12 sandwiched between the parts of the drain region semiconductor strip 11 and the source region semiconductor strip 13, cooperating with the part of the gate strip 2 as the control gate, are configured to form a memory cell.

Therefore, as shown in FIGS. 2*a*-3, the memory array 1 of the present disclosure is formed with multiple memory cells arranged in an array, and the multiple memory cells are included by the drain region semiconductor strips 11, the channel semiconductor strips 12, the source region semiconductor strips 13, and the gate strips 2. In particular, the memory array 1 of the present disclosure includes multiple memory subarray layers 1*a* stacked sequentially along the height direction Z. Each memory subarray layer 1*a* includes a layer of drain region semiconductor strips 11, a layer of channel semiconductor strips 12, a layer of source region semiconductor strips 13, and parts of gate strips 2 matching the above layers, such that each memory subarray layer 1*a* includes a layer of array-arranged memory cells along the height direction Z, and the stacked multiple memory subarray layers 1*a* constitute multiple layers of memory cells arrayed along the height direction Z.

In the present disclosure, each drain region semiconductor strip 11 is a semiconductor strip of a first doping type, such as an N-type doped semiconductor strip. In some embodiments, each drain region semiconductor strip 11 serves as a bit line (BL) of a memory block.

Each channel semiconductor strip 12 is a semiconductor strip of a second doping type, such as a P-type doped semiconductor strip. In some embodiments, each channel semiconductor strip 12 serves as a well region of a memory cell.

Each source region semiconductor strip 13 is also a semiconductor strip of the first doping type, such as an N-type doped semiconductor strip. In some embodiments, each source region semiconductor strip 13 serves as a source line (SL) of the memory block.

Of course, it is understood by those skilled in the art that in other types of memory devices, each drain region semiconductor strip and each source region semiconductor strip may also be a P-type doped semiconductor strip, while each channel semiconductor strip 12 is an N-type doped semiconductor strip. The present disclosure does not limit thereto.

Referring further to FIGS. 2*a*-3, in the height direction Z, two adjacent memory subarray layers 1*a* include a drain region semiconductor layer, a channel semiconductor layer, a source region semiconductor layer, a channel semiconductor layer, and a drain region semiconductor layer laminated in sequence to share the common source region semiconductor layer. As shown in FIGS. 2*a*-3, the common source region semiconductor strip 13 is arranged between two adjacent channel semiconductor strips 12 in the height direction Z in the same column, and two drain region semiconductor strips 11 are arranged respectively on two sides of the two adjacent channel semiconductor strips 12. That is, in the height direction Z, the same column of semiconductor strip structures 1*b* of two adjacent memory subarray layers 1*a* includes the drain region semiconductor strip 11, the channel semiconductor strip 12, the source region semiconductor strip 13, the channel semiconductor strip 12, and the drain region semiconductor strip 11 laminated in sequence, thereby forming two semiconductor strip structures which share the same source region semiconductor strip 13. In this way, the storage density of the memory block 10 may be further increased while reducing cost and process.

Referring together to FIG. 4, the memory array 1 includes multiple memory subarray layers 1*a* stacked sequentially along the height direction Z. Each memory subarray layer 1*a* includes a drain region semiconductor layer, a channel semiconductor layer, and a source region semiconductor layer stacked along the height direction Z.

In each memory subarray layer 1*a*, the drain region semiconductor layer, the channel semiconductor layer, and the source region semiconductor layer include multiple drain region semiconductor strips 11, multiple channel semiconductor strips 12, and multiple source region semiconductor strips 13, respectively, spaced along the row direction X.

Two adjacent memory subarray layers 1*a* include a drain region semiconductor layer, a channel semiconductor layer, a source region semiconductor layer, a channel semiconductor layer, and a drain region semiconductor layer sequentially stacked to share the same source region semiconductor layer.

An interlayer isolation layer is arranged between every two memory subarray layers 1*a* to isolate from the other two memory subarray layers 1*a*. That is, an interlayer isolation layer is arranged between each two consecutive memory subarray layers 1*a* and another two consecutive memory subarray layers 1*a*, the another two consecutive memory subarray layers 1*a* being adjacent to the each two consecutive memory subarray layers 1*a*. For example, in the height direction Z, an interlayer isolation layer is arranged between the first/second memory subarray layers 1*a* and the third/fourth memory subarray layers 1*a*; another interlayer isolation layer is arranged between the third/fourth memory subarray layers 1*a* and the fifth/sixth memory subarray layers 1*a*, and so on. The first/second memory subarray layers mean the first memory subarray layer and the second memory subarray layer which share a common source region semiconductor layer, and the third/fourth memory subarray layers mean the third memory subarray layer and the fourth memory subarray layer which share another common source region semiconductor layer, while the fifth/sixth memory subarray layers mean the fifth memory subarray layer and the sixth memory subarray layer which share another common source region semiconductor layer. It is understood that the one interlayer isolation layer is disposed between the second memory subarray layer 1*a* and the third memory subarray layer 1*a*; and the other interlayer isolation layer is disposed between the fourth memory subarray layer 1*a* and the fifth memory subarray layer 1*a*.

Specifically, as shown in FIG. 4, one interlayer isolation strip 14*a* is arranged between every two adjacent semiconductor strip structures in the same column of semiconductor strip structures in the height direction Z. Similarly, an interlayer isolation strip 14*a* is arranged between every two adjacent semiconductor strip structures in another column of semiconductor strip structures. It is understood by those skilled in the art that multiple interlayer isolation strips 14*a* in the same horizontal plane constitute an interlayer isolation layer to isolate from the semiconductor strip structures in the other two memory subarray layers 1*a*.

In other words, in the present disclosure, each stacked structure 1*b* may include multiple stacked substructures, each stacked substructure including a drain region semiconductor strip 11, a channel semiconductor strip 12, a source region semiconductor strip 13, a channel semiconductor strip 12, and a drain region semiconductor strip 11 stacked sequentially along the height direction Z, thereby sharing the same source region semiconductor strip 13. In the stacked structure 1*b*, an interlayer isolation strip 14*a* is arranged between two adjacent stacked substructures to isolate them from each other. That is, in two adjacent memory subarray layers 1*a*, the drain region semiconductor strip 11, channel semiconductor strip 12, source region semiconductor strip 13, channel semiconductor strip 12, and drain region semiconductor strip 11 in the same column form a stacked substructure, such that two adjacent memory subarray layers 1*a* share a common source region semiconductor strip 13.

Referring further to FIG. 4 or FIG. 2*a*, multiple isolation walls 3 are distributed in the memory array 1, and the multiple isolation walls 3 are arranged in a matrix in the row direction X and the column direction Y. As shown in FIG. 2*a*, multiple isolation walls 3 distributed along the column direction Y are arranged on each of two sides of each column of drain region semiconductor strips 11, channel semiconductor strips 12, and source region semiconductor strips 13. Each isolation wall 3 extends along the height direction Z and the row direction X to separate at least parts of two adjacent columns of drain region semiconductor strips 11, channel semiconductor strips 12, and source region semiconductor strips 13. That is, the multiple isolation walls 3 distributed along the column direction Y are arranged on each of the two sides of each stacked structure 1*b* to separate at least parts of the two adjacent columns of stacked structures 1*b*. In some embodiments, particularly during the manufacturing process of the memory block 10, the isolation walls 3 may further serve as support structures that may support two adjacent columns of the stacked structures 1*b* during and/or after the manufacturing process. In addition, apart of each side of each stacked structure 1*b* may be arranged with support posts (not shown and described in detail below), respectively, to support the two adjacent columns of the stacked structures 1*b* during and/or after the manufacturing process of the memory array 1.

A region between two adjacent isolation walls 3 in the same column in the column direction Y is configured to define a word line hole 4. That is, any two adjacent isolation walls 3 in the same column, cooperating with two columns of semiconductor strip structures 1*b* (i.e., stacked structures 1*b*) on both sides thereof, may define multiple regions for the word line holes 4, and these regions may be processed such that corresponding word line holes 4 may be defined. That is, the multiple columns of drain region semiconductor strips 11, channel semiconductor strips 12, and source region semiconductor strips 13 extending along the column direction Y pass through the multiple rows of isolation walls 3 extending along the row direction X, to define the multiple word line holes 4 cooperating with the multiple isolation walls 3. Each word line hole 4 extends along the height direction Z.

Each word line hole 4 is configured to fill a gate material to form a corresponding gate strip 2. That is, a gate strip 2 is filled between two adjacent isolation walls 3 in the same column direction Y.

Figure 5:
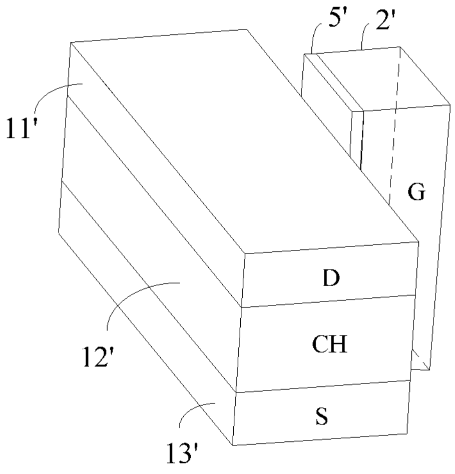
FIG. 5 is a perspective structural schematic view of a memory cell according to an embodiment of the present disclosure.

Referring together to FIG. 5, FIG. 5 is a perspective structural schematic view of a memory cell according to an embodiment of the present disclosure. As shown in FIG. 5, the memory cell includes a drain region portion 11', a channel portion 12', a source region portion 13', and a gate portion 2'. The drain region portion 11', the channel portion 12', and the source region portion 13' are stacked along the height direction Z, respectively. The channel portion 12' is disposed between the drain region portion 11' and the source region portion 13'. The gate portion 2' is disposed on a side of the drain region portion 11', the channel portion 12', and the source region portion 13'. The drain region portion 11', the channel portion 12', and the source region portion 13' are each a single-crystal semiconductor.

In addition, a projection of the gate portion 2' at least partially coincides with a projection of the channel portion 12' on a projection plane in the height direction Z. The projection plane is located on a side of the drain region portion 11', the channel portion 12', and the source region portion 13', and extends along the height direction Z and the column direction Y.

As shown in FIG. 5, it is easily understood by those skilled in the art that the drain region portion 11' is a part of one of the drain region semiconductor strips 11 shown in FIGS. 2*a*-4, the channel portion 12' is a part of one of the channel semiconductor strips 12 shown in FIGS. 2*a*-4, and the source region portion 13' is a part of one of the source region semiconductor strips shown in FIGS. 2*a*-4. Therefore, in the height direction Z, the multiple memory subarray layers 1*a* includes multiple memory cells.

In addition, as shown in FIG. 5, a storage structure portion 5' is sandwiched between the gate portion 2' and the drain region portion 11', the channel portion 12', and the source region portion 13'. The storage structure portion 5' may be configured to store an electric charge; the gate portion 2', the drain region portion 11', the channel portion 12', the source region portion 13', together with the storage structure portion 5' sandwiched between the gate portion 2' and the channel portion 12', constitutes a memory cell. The memory cell may indicate logical data 1 or logical data 0 by a state whether any storage charge is stored or not in the storage structure portion 5', thereby enabling storage of data. The storage structure portion 5' may include a charge trapping storage structure portion, a floating gate storage structure portion, or other types of capacitive storage structure portions.

Therefore, it will be understood by those skilled in the art that in the memory array 1 shown in FIGS. 2*a*-4, a storage structure 5 is also arranged between the gate strip 2 and the drain region semiconductor strip 11, the channel semiconductor strip 12, and the source region semiconductor strip 13, such that each memory cell can store electric charges by its corresponding storage structure portion 5'.

In addition, it should be noted that for the convenience of the accompanying drawings showing the storage structure portion 5', the drain region portion 11', the channel portion 12', the source region portion 13', the gate portion 2', and the storage structure portion 5 shown in FIG. 5' are shown for illustrative purposes only and do not represent actual dimensions or proportions.

It will be understood by those skilled in the art that, as above, the part of the gate strip 2 whose projection coincides with the projection of the adjacent channel semiconductor strip 12 on the above projection plane is configured as the control gate of the memory cell, such that the part of the gate strip 2 as the gate portion 2' is the part whose projection coincides with the projection of the channel semiconductor 12 on the projection plane; the part of the channel semiconductor strip 12 whose projection coincides with the projection of the gate strip 2 on the above projection plane is the corresponding part of the channel semiconductor strip 12 as the well region, such that the part of the channel semiconductor strip 12 as the channel portion 12' is the part of the channel semiconductor strip 12 whose projection coincides with the projection of the gate strip 2 on the projection plane; the parts of the drain region semiconductor strip 11 and the source region semiconductor strip 13 as the drain region portion 11' and the source region portion 13', i.e., the part of the drain region semiconductor strip 11 or the source region semiconductor strip 13 arranged above or below the channel portion 12', are configured as the semiconductor drain region and the semiconductor source region, respectively.

Similarly, the storage structure portion 5' is a part of the storage structure 5 disposed between the channel portion 12' and the gate portion 2'.

Referring further to FIG. 2*a*-FIG. 4, a gate strip 2 is flanked by two adjacent columns of drain region semiconductor strips 11, channel semiconductor strips 12, and source region semiconductor strips 13. Therefore, these two adjacent columns of drain region semiconductor strips 11, channel semiconductor strips 12, and source region semiconductor strips 13 share the same gate strip 2. That is, for a gate strip 2 in a memory subarray layer 1*a*, the gate strip cooperates with corresponding parts of the drain region semiconductor strip 11, channel semiconductor strip 12, and source region semiconductor strip 13 on the left side of the gate strip 2 to form a memory cell, and cooperates with corresponding parts of the drain region semiconductor strip 11, channel semiconductor strip 12, and source region semiconductor strip 13 on the right side of the gate strip 2 to form another memory cell. In other words, in a same row, two gate strips 2 are arranged on the left and right sides of one column of drain region semiconductor strip 11, channel semiconductor strip 12, and source region semiconductor strip 13 in one memory subarray layer 1*a*. In this way, the one column of drain region semiconductor strip 11, channel semiconductor strip 12, and source region semiconductor strip 13 cooperates with a part of the gate strip 2 on the left side to constitute a memory cell, and cooperates with a part of the gate strip 2 on the right side to constitute another memory cell. That is, in the same row, a column of drain region semiconductor strip 11, channel semiconductor strip 12, and source region semiconductor strip 13 in one memory subarray layer 1*a* is shared by two gate strips 2 on its left and right sides.

Figure 6:
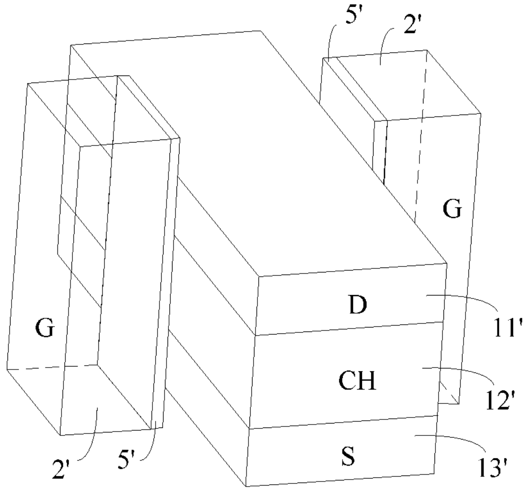
FIG. 6 is a perspective schematic view of a structure in which of two memory cells share the same column of drain region semiconductor strip, channel semiconductor strip, and source region semiconductor strip.

Specifically, further referring to FIG. 6, FIG. 6 is a perspective schematic view of a structure in which of two memory cells share the same column of drain region semiconductor strip, channel semiconductor strip, and source region semiconductor strip. As shown in FIG. 6, the source region portion 13', channel portion 12', and drain region portion 11' stacked along the height direction Z' cooperate with the gate portion 2' on the left side and the storage structure portion 5' between them to constitute a memory cell; similarly, the drain region portion 11', the channel portion 12', and the source region portion 13' cooperate with the gate portion 2' on the right side and the storage structure portion 5' between them to constitute another memory cell. In this way, both the two memory cells share the same drain region portion 11', channel portion 12', and the source region portion 13'.

For ease of understanding, it may be considered that the drain region portion 11', the channel portion 12', and the source region portion 13' cooperate with the gate portion 2' on the left side and the storage structure portion 5' between them to form a memory cell (bit); the drain region portion 11', the channel portion 12', and the source region portion 13' cooperate with the gate portion 2' on the right side and the storage structure portion 5' between them to form another memory cell (bit).

Therefore, returning to FIGS. 2*a*-4, it will be understood by those skilled in the art that a storage structure 5 is first arranged on each of the left and right sides in each word line hole 4, and the gate material is filled in the word line hole 4 to form the gate strip 2. That is, the two adjacent columns of drain region semiconductor strips 11, channel semiconductor strips 12, and source region semiconductor strips 13 in conjunction with the storage structures 5 share the same gate strip 2.

In conjunction with FIGS. 2*a*-3 and 5-6, in some embodiments, each of the above drain region semiconductor strip 11, channel semiconductor strip 12, and source region semiconductor strip 13 is a standard strip structure. That is, each drain region semiconductor strip 11, channel semiconductor strip 12, and source region semiconductor strip 13 has a standard rectangular cross-section at each position along the respective extension direction. The memory cell corresponding to the embodiments may be illustrated specifically in FIGS. 5 and 6.

Figure 7:
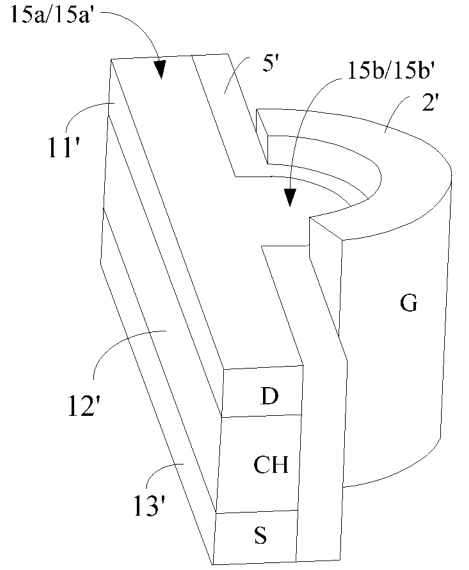
FIG. 7 is a perspective structural schematic view of a memory cell according to another embodiment of the present disclosure.

In other embodiments, in conjunction with FIG. 4 and FIG. 7, FIG. 7 is a perspective structural schematic view of a memory cell according to another embodiment of the present disclosure. Each drain region semiconductor strip 11, channel semiconductor strip 12, and source region semiconductor strip 13 includes a body structure 15*a* and multiple protrusions 15*b*, respectively. The body structure 15*a* extends along the column direction Y and is in the shape of a strip. The multiple protrusions 15*b* are distributed on both sides of the body structure in two columns, and each column includes multiple protrusions 15*b* spaced apart, each protrusion 15*b* extending from the body structure 15*a* in the row direction X toward a corresponding gate strip 2 (word line hole 4) in a direction deviating from the body structure 15*a*. In other words, in each column of drain region semiconductor strips 11, channel semiconductor strips 12, and source region semiconductor strips 13, two columns of protrusions 15*b* extend from the strip-shaped body structure 15*a* toward the gate strips 2 (word line holes 4) on each side. Therefore, it is understood by those skilled in the art that a surface of the storage structure 5 formed in the word line hole 4 and a surface of the gate strip 2 near the drain region semiconductor strip 11, the channel semiconductor strip 12, and the source region semiconductor strip 13 are curved concave surfaces.

As shown in FIG. 7, for each memory cell, the drain region portion 11', the channel portion 12', and the source region portion 13' include a body portion 15*a'* and a protrusion portion 15*b'*, and each of the storage structure portion 5' and the gate portion 2' includes a concave surface corresponding to the protrusion portion 15*b*' to wrap a surface of the protrusion 15*b* away from the body structure 15*a*.

In the present disclosure, by making each drain region semiconductor strip 11, channel semiconductor strip 12, and source region semiconductor strip 13 include multiple protrusions 15*b* that are raised toward the two sides, it is possible to increase the surface area of each drain region semiconductor strip 11, channel semiconductor strip 12, and source region semiconductor strip 13, thereby increasing the area of a corresponding region of the channel portion 12' and the gate portion 2' in each memory cell, thereby enhancing the performance of the memory block 10.

Specifically, the convex surface of the protrusion 15*b* away from the body structure 15*a* may be an arc or other form of convex surface, where the arc may include a columnar semicircular surface. The protrusions 15*b* of each column of drain region semiconductor strip 11, channel semiconductor strip 12, and source region semiconductor strip 13 form a columnar semicircle. The gate strip 2 corresponding to the protrusions 15*b* is arranged with a concave surface toward the drain region semiconductor strip 11, the channel semiconductor strip 12, and the source region semiconductor strip 13, and the concave surface is a curved surface corresponding to the convex surface of the protrusions 15*b* to ensure that the gate strip 2 matches the channel semiconductor strip 12 at the corresponding position.

In some embodiments, as shown in FIG. 4, the storage structure 5 extends inside the word line hole 4 in the height direction Z and is arranged between the gate strip 2 and the adjacent drain region semiconductor strip 11, the channel semiconductor strip 12, and the source region semiconductor strip 13, such that the storage structures 5 may form the multiple memory cells together with the parts of the drain region semiconductor strips 11, the channel semiconductor strips 12, and the source region semiconductor strips 13 at corresponding positions. In the present disclosure, the storage structure 5 may be a charge trapping storage structure, a floating gate storage structure, or other types of capacitive dielectric structures.

Figure 8:
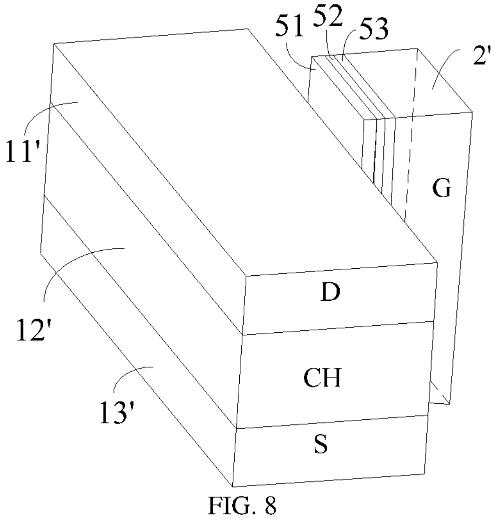
FIG. 8 is a perspective structural schematic view of a memory cell according to further another embodiment of the present disclosure.

Referring to FIG. 8, FIG. 8 is a perspective structural schematic view of a memory cell according to further another embodiment of the present disclosure. In the embodiments, the storage structure 5 is a charge trapping storage structure. As shown in FIG. 8, the storage structure portion 5' of the memory cell includes a first dielectric portion 51, a charge-trapping portion 52, and a second dielectric portion 53. The first dielectric portion 51 is disposed between the charge-trapping portion 52 and the stacked drain region portion 11', the channel portion 12', and the source region portion 13'; the charge-trapping portion 52 is disposed between the first dielectric portion 51 and the second dielectric portion 53; and the second dielectric portion 53 is disposed between the charge-trapping portion 52 and the gate portion 2'. The charge-trapping portion 52 is configured to store an electrical charge to enable the memory cell to store data.

Therefore, with reference to FIG. 8, it will be understood by those skilled in the art that the storage structure 5 in the memory array shown in FIGS. 2*a*-4 of the present disclosure includes a first dielectric layer, a charge-trapping layer, and a second dielectric layer, the first dielectric layer being disposed between the charge-trapping layer and the drain region semiconductor strip 11, the channel semiconductor strip 12, and the source region semiconductor strip 13, the charge-trapping layer being disposed between the first dielectric layer and the second dielectric layer, and the second dielectric layer being disposed between the charge-trapping layer and the gate strip 2.

The first dielectric layer (first dielectric portion 51) and the second dielectric layer (second dielectric portion 53) may be made of an insulating material, such as silicon oxide. The charge-trapping layer (charge-trapping portion 52) may be made of a storage material with charge energy trapping properties, in particular, the charge-trapping layer may be made of silicon nitride. Therefore, the first dielectric layer (first dielectric portion 51), the charge-trapping layer (charge-trapping portion 52), and the second dielectric layer (second dielectric portion 53) form an ONO storage structure. Specifically, reference thereto may be made to a manufacturing method involving a memory block of a charge trapping storage structure in the following embodiments.

Figure 9:
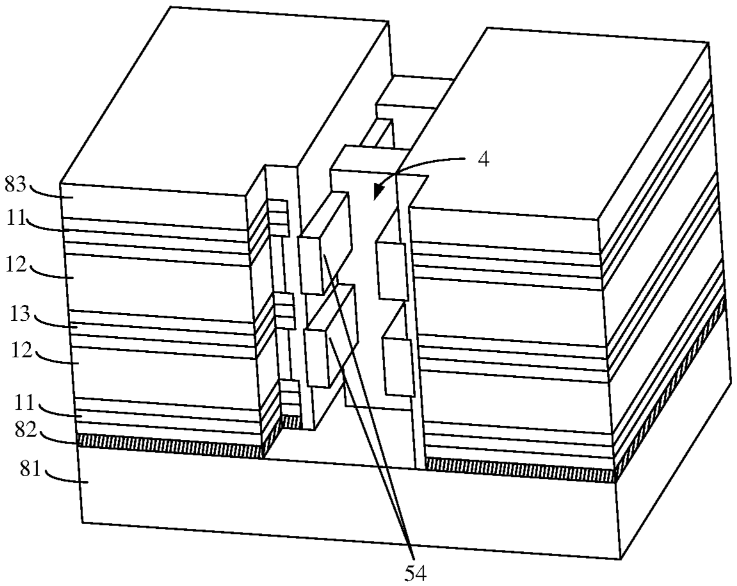
FIG. 9 is a perspective schematic view of a partial structure of a memory block according to another embodiment of the present disclosure.

In other embodiments, referring to FIG. 9, FIG. 9 is a perspective schematic view of a partial structure of a memory block 10 according to another embodiment of the present disclosure. In the embodiments, the storage structure 5 is a floating gate storage structure, and the floating gate storage structure extends at least partially within the word line hole 4 in the height direction Z and is arranged between the gate strip 2 and the drain region semiconductor strip 11, the channel semiconductor strip 12, and the source region semiconductor strip 13.

Figure 10:
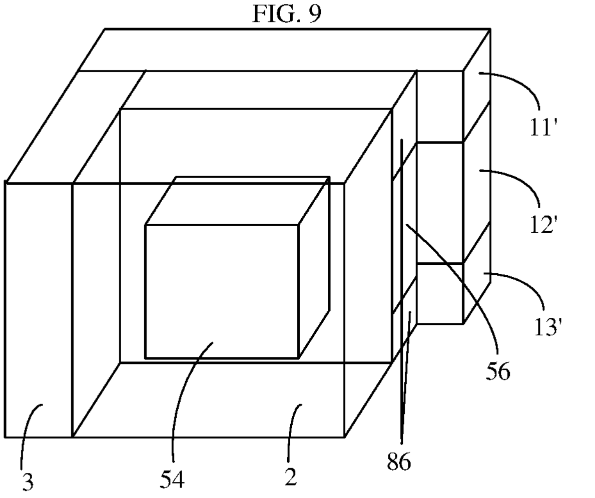
FIG. 10 is a perspective structural schematic view of a memory cell according to further another embodiment of the present disclosure.

Specifically, in conjunction with FIG. 9-FIG. 10, FIG. 10 is a perspective structural schematic view of a memory cell according to further another embodiment of the present disclosure. For each memory cell, the floating gate storage structure includes multiple floating gates 54 and an insulating dielectric wrapping each floating gate 54. As shown in FIG. 9, as can be seen through the word line hole 4, the multiple floating gates 54 are spaced along the height direction Z, and each floating gate 54 is arranged on a side of the channel semiconductor strip 12 along the row direction X and faces a corresponding part of the channel semiconductor strip 12. As shown in FIG. 10, the insulating dielectric wrapping the floating gate 54 includes a first insulating dielectric layer 56 between the channel semiconductor strip 12 and the floating gate 54 (referring also to the first insulating dielectric layer 85*a* shown in FIG. 41 below), and a second insulating dielectric layer covering several other faces of the floating gate 54 (not shown in FIG. 10, referring to the second insulating dielectric layer 85*b* shown in FIG. 41 below). That is, the insulating dielectric is present between the floating gate 54 and the corresponding part of the channel semiconductor strip 12, between two adjacent floating gates 54, and between the floating gate 54 and the gate strip 2. The insulating dielectric wraps every surface of the floating gate 54 to completely isolate the floating gate 54 from the rest of the structure.

Among them, the floating gate 54 may be made of polycrystalline silicon. The insulating dielectric may be made of an insulating material such as silicon oxide. Specifically, reference thereto may be made to a manufacturing method involving a memory block of a floating gate storage structure in the following embodiments.

In the memory cell of the charge trapping storage structure shown in FIG. 8 and FIGS. 2*a*-4, the storage structure 5 is adopted with a first dielectric layer (first dielectric portion 51), a charge-trapping layer (charge-trapping portion 52), and a second dielectric layer (second dielectric portion 53) to form an ONO storage structure.

The ONO storage structure is characterized by the fact that the charges injected into can be fixed near an injection point, while the floating gate storage structure (e.g., FIGS.

9-11 is adopted with polysilicon as a floating gate) is characterized by the fact that the charges injected into can be uniformly distributed in the entire floating gate 54. In other words, in the ONO storage structure, the charges can only move in the injection/removal direction, i.e., the stored charges can only be fixed near the injection point and cannot move arbitrarily in the charge-trapping layer, especially cannot move in the extension direction of the charge-trapping layer. Therefore, for the ONO storage structure, the charge-trapping layer only needs to have an insulating dielectric on its front and back side, and the charges stored in each memory cell will be fixed near the injection point of the charge-trapping portion 52 and will not move along the same layer of the charge-trapping layer to the charge-trapping portion 52 in another memory cell. While in the floating gate storage structure, the charge can not only move in the injection/removal direction, but also can move arbitrarily in the floating gate 54. Therefore, when the floating gate 54 is a continuous structure, the stored charge can move in the direction of extension of the floating gate 54 and thus move to the floating gate 54 in another memory cell. Therefore, for the floating gate storage structure, the floating gates 54 of each memory cell are independent, and each surface of each floating gate needs to be covered by an insulating dielectric, and needs to be isolated from each other, to prevent the charges stored in the floating gate 54 in one memory cell from moving to the floating gates 54 in the other memory cells.

That is, for the memory cell and memory block of the charge trapping storage structure shown in FIGS. 8 and 2*a*-4, the storage structure 5 may extend from top to bottom in the word line hole 4, and it is sufficient to arrange a first dielectric layer and a second dielectric layer on both sides of the charge-trapping layer, respectively.

Figure 11:
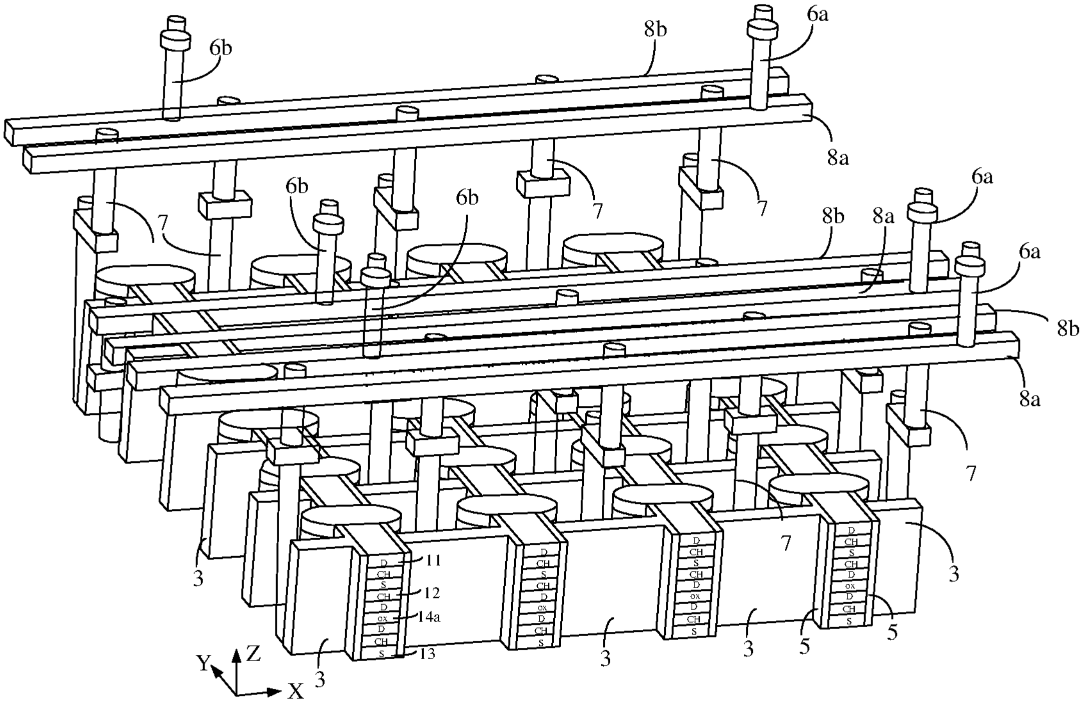
FIG. 11 is a perspective structural schematic view of a memory block according to further another embodiment of the present disclosure.

In contrast, in the floating gate storage structure shown in FIGS. 9-11, the floating gates 54 of each memory cell are independent, and each surface of each floating gate 54 needs to be covered by an insulating dielectric, and needs to be isolated from each other, to prevent the charges stored in the floating gates 54 in one memory cell from moving to the floating gates in other memory cells.

It will be understood by those skilled in the art that some parts of the insulating dielectric (e.g., the second insulating dielectric layer 85*b* mentioned above) are interconnected with each other, as long as it is possible to ensure that the floating gates 54 of each memory cell are independent of each other and that the surfaces of each floating gate 54 are wrapped with the insulating dielectric. Therefore, parts of the insulating dielectric (e.g., the second insulating dielectric layer 85*b* mentioned above) that wraps the floating gates 54 in the word line hole 4 may extend substantially in the height direction, thereby wrapping the floating gates 54 of each memory cell. Specifically, reference to the memory block 10 with a floating gate storage structure may be made to a manufacturing method involving a memory block of a floating gate storage structure in the following embodiments.

In addition, it will be understood by those skilled in the art that the storage structure 5 may be adopted with other types of storage structures, such as ferroelectric, variable resistance, or other types of capacitive storage structures.

In some embodiments, referring to FIG. 11, FIG. 11 is a perspective structural schematic view of a memory block 10 according to further another embodiment of the present disclosure. In FIG. 11, only three layers of memory subarray layers 1*a* are shown, which are merely schematic, and it will be understood by those skilled in the art that the memory block 10 includes multiple layers of memory subarray layers 1*a*, with each two layers of memory subarray layers 1*a* separated from each other by an interlayer isolation layer (formed by multiple interlayer isolation strips 14*a*). The memory block 10 further includes multiple word lines (WL) and multiple word line connection lines 7.

As above, the part of the gate strip 2 whose projection overlaps with the projection of the channel semiconductor strip 12 in an adjacent stacked structures 1*b* on the above projection plane is configured as the control gate of the corresponding memory cell. Therefore, each gate strip 2 is configured to form the control gate (CG) of multiple memory cells. As is known, the control gates of a row of memory cells need to be connected to a corresponding word line, through which a voltage is applied to the control gates of the row of the memory cells, thereby controlling the memory cells to perform various memory operations.

In the present disclosure, as shown in FIG. 11, multiple word lines are arranged on top of multiple memory subarray layers 1*a* and are spaced apart in the column direction Y, with each word line extending along the row direction X. Each word line is connected to multiple word line connection lines 7. The multiple word line connection lines 7 connected to the same word line extend along the height direction Z, respectively, and extend to the gate strips 2 in the multiple word line holes 4 in the same row, respectively, to be connected to the gate strips 2 in the corresponding word line holes 4, thereby realizing the connection of the word line to the control gates of the multiple memory cells in the same row of the multiple memory subarray layers 1*a*. It can be understood that the multiple word line holes 4 and the multiple word line connection lines 7 are arranged in a one-to-one correspondence.

Specifically, the word line of the same row may be an individual word line connected to the gate strip 2 in each word line hole 4 of the same row. Of course, the word lines of the same row may include multiple different types of word lines; the gate strips 2 in multiple word line holes 4 of the same row may each be connected to the multiple different types of word lines of the corresponding row. In some embodiments, as shown in FIG. 11, multiple gate strips 2 in the same row are configured to be connected to two corresponding word lines, i.e., each row of word line includes an odd word line 8*a* and an even word line 8*b*. It should be noted that one odd word line 8*a* and one even word line 8*b* connected to the multiple gate strips 2 of the same row in the present disclosure are defined as one row of word line corresponding to one row of gate strips 2.

Specifically, the memory cells of the same row in the multiple memory subarray layers 1*a* are connected to the odd word line 8*a* of the corresponding row through the odd word line holes 4 of the same row, respectively; the others of the memory cells of the same row in the multiple memory subarray layers 1*a* are connected to the even word line 8*b* of the corresponding row through the even word line holes 4 of the same row, respectively. For example, a first part of the memory cells of the first row are connected to the odd word line 8*a* of the first row through the first word line hole 4, the third word line hole 4, the fifth word line hole 4 . . . , respectively; a second part of the memory cells of the first row are connected to the even word line 8*b* of the first row through the second word line hole 4, the fourth word line hole 4, the sixth word line hole 4 . . . , respectively. That is, the odd word line 8*a* of the word line of the same row is connected to multiple memory cells (the first part of the memory cells) in the multiple memory subarray layers 1*a* corresponding to the odd word line holes 4 of this row; the even word line 8*b* of the word line of the same row are connected to multiple memory cells (the second part of the memory cells) in the multiple memory subarray layers 1*a* corresponding to the even word line holes 4 of this row.

As above, each drain region semiconductor strip 11, channel semiconductor strip 12, and source region semiconductor strip 13 has odd word line holes 4 distributed on one side thereof and even word line holes 4 distributed on the other side thereof. Therefore, a part of the drain region semiconductor strip 11, channel semiconductor strip 12, and source region semiconductor strip 13 in each same column in each memory subarray layer 1*a* may cooperate with an odd gate strip 2 in an odd word line hole 4 on one side thereof and a storage structure arranged between the gate strip 2 and the drain region semiconductor strip 11, channel semiconductor strip 12, and source region semiconductor strip 13, to form a memory cell, i.e., a first memory cell; and may cooperated with an even word line hole 4 on the other side thereof and a storage structure 5 arranged therebetween, to form another memory cell, i.e., a second memory cell.

In other words, the gate strip 2 filled in each word line hole 4 may be configured to form a memory cell (bit) in conjunction with the drain region semiconductor strip 11, the channel semiconductor strip 12, the source region semiconductor strip 13, and the storage structure 5 on the left side in each memory subarray layer 1*a*; and may be configured to form another memory cell (bit), i.e., a second memory cell, in conjunction with the drain region semiconductor strip 11, the channel semiconductor strip 12, the source region semiconductor strip 13, and the storage structure 5 on the right side in each memory subarray layer 1*a*.

Therefore, for an odd word line hole 4, the left half or right half of each drain region semiconductor strip 11, channel semiconductor strip 12, and source region semiconductor strip 13 in the same column in each memory subarray layer 1*a* may cooperate with the corresponding gate strip 2 in the odd word line hole 4 to form a first memory cell. Specifically, in each memory subarray layer 1*a*, for each column of drain region semiconductor strip 11, channel semiconductor strip 12, and source region semiconductor strip 13: for example, word line holes 4 on the left side of the first column of drain region semiconductor strip 11, channel semiconductor strip 12, and source region semiconductor strip 13 counting from left to right are odd word line holes, and a part of the drain region semiconductor strip 11, channel semiconductor strip 12, and source region semiconductor strip 13 of that column cooperate with a gate strip 2 in a corresponding odd word line hole 4 on its left side for forming a first memory cell. Word line holes 4 on the right side of the second column of the drain region semiconductor strip 11, channel semiconductor strip 12, and source region semiconductor strip 13 counting from left to right are odd word line holes, and a part of the drain region semiconductor strip 11, channel semiconductor strip 12, and source region semiconductor strip 13 of this column cooperate with a gate strip 2 in a corresponding odd word line hole 4 on its right side also for forming a first memory cell.

Similarly, for an even word line hole 4, the other half of each drain region semiconductor strip 11, channel semiconductor strip 12, and source region semiconductor strip 13 in the same column in each memory subarray layer 1*a* may cooperate with a corresponding gate strip 2 in the even word line hole 4 to form a second memory cell. Specifically, in each memory subarray layer 1*a*, for each column of drain region semiconductor strip 11, channel semiconductor strip 12, and source region semiconductor strip 13: for example, word line holes 4 on the right side of the first column of drain region semiconductor strip 11, channel semiconductor strip 12, and source region semiconductor strip 13 from left to right are even word line holes, and a part of the drain region semiconductor strip 11, channel semiconductor strip 12, and source region semiconductor strip 13 of that column cooperate with a gate strip 2 in a corresponding even word line hole 4 on its right side for forming a second memory cell. Word line holes 4 on the left side of the second column of the drain region semiconductor strip 11, channel semiconductor strip 12, and source region semiconductor strip 13 from left to right are even word line holes, and a part of the drain region semiconductor strip 11, channel semiconductor strip 12, and source region semiconductor strip 13 of this column cooperate with a gate strip 2 in a corresponding even word line hole 4 on its left side also for forming a second memory cell.

Therefore, in the present disclosure, each gate strip 2 in the memory array 1 is connected to a corresponding word line, and the gate strips 2 in the same row are connected to the corresponding row of word line. The gate strips 2 in the odd word line hole 4 in the same row are connected to the odd word lines 8*a* in the corresponding row of word line, and the gate strips 2 in the even word line hole 4 in the same row are connected to the even word lines 8*b* in the corresponding row of word line. In other words, all the first memory cells of the same row in the multiple memory subarray layers 1*a* are each connected to an odd word line 8*a* of the corresponding row through odd gate strips 2 in odd word line holes 4 of the same row, and all the second memory cells of the same row in the multiple memory subarray layers 1*a* are each connected to an even word line 8*a* of the corresponding row through even gate strips 2 in even word line holes 4 of the same row.

Of course, in other embodiments, it may be, in the same row, every adjacent three, four, or five word line holes 4, etc. are configured as a group, then each line word line includes three, four, five, etc. different types of word lines, and the gate strip 2 in each word line hole 4 in each group is connected to a different type of word line.

Furthermore, as shown in FIG. 11, in the present disclosure, the number of rows of word lines may be defined to be the same as the number of rows of word line holes 4. That is, as shown in FIG. 11, although the gate strips 2 in the word line holes 4 of the same row are connected to a corresponding odd word line 8*a* and a corresponding even word line 8*b*, one odd word line 8*a* and one even word line 8*b* corresponding to the word line holes 4 of the same row may be defined as one row of word lines corresponding to the row of gate strips 2 (word line holes 4). That is, each row of word line includes one odd word line 8*a* and one even word line 8*b*, and the number of rows of word lines is the same as the number of rows of the word line holes 4. It should also be noted that, as shown in FIG. 11, in each row, each of the left side and right side of a word line hole 4 not disposed on ends of the memory array correspond to a column of drain region semiconductor strips 11, channel semiconductor strips 12, and source region semiconductor strips 13. However, from left to right, for a word line hole 4 disposed on a left end of the memory array (first end), only the right side of the word line hole 4 corresponds to a column of drain region semiconductor strips 11, channel semiconductor strips 12, and source region semiconductor strips 13; for a word line hole 4 disposed on a right end of the memory array (last end), only the left side of the word line hole 4 corresponds to a column of drain region semiconductor strips 11, channel semiconductor strips 12, and source region semiconductor strips 13. Therefore, it is understood by those skilled in the art that in each row, the word line hole 4 at the first end and the word line hole 4 at the last end functionally constitute a complete word line hole.

As shown in FIG. 11, in the embodiments, multiple word lines may be arranged above the multiple memory subarray layers 1*a* in the memory block 10, each of which is connected to corresponding word line holes 4 through word line connection lines 7.

Of course, it is understood by those skilled in the art that multiple word lines may be arranged on another stacked chip, and the stacked chip may be stacked with and electrically connected to a chip in which the memory block 10 is located. For example, the stacked chip may be stacked with the chip in which the memory block 10 is located through hybrid bonding. An end of each word line connection line 7 in the memory block 10 away from the corresponding gate strip 2 serves as a word line connection terminal of the memory block 10 for connecting to the stacked chip stacked together in the height direction Z of the memory block 10.

In addition, as shown in FIG. 11, in another embodiments, the memory block 10 may further include multiple word line lead lines 6*a* or 6*b*, each word line further corresponding to a word line lead line 6*a* or 6*b*, respectively, with the word line lead line 6*a* or 6*b* extending in the height direction Z and away from the gate strip 2 with respect to the word line connection line 7. An end of the word line lead line 6*a* or 6*b* away from the word line is configured as a word line connection terminal for connection to the stacked chip stacked together in the height direction Z of the memory block 10. That is, the word lines are arranged on the memory array chip and the control circuit is arranged on the other chip. Of course, those skilled in the art can understand that each word line may be connected to the control circuit on the chip on which the memory block 10 is located through a corresponding word line lead line 6*a* or 6*b*, i.e., the relevant lines, memory array, and control circuit are arranged on the same chip.

Figure 12:
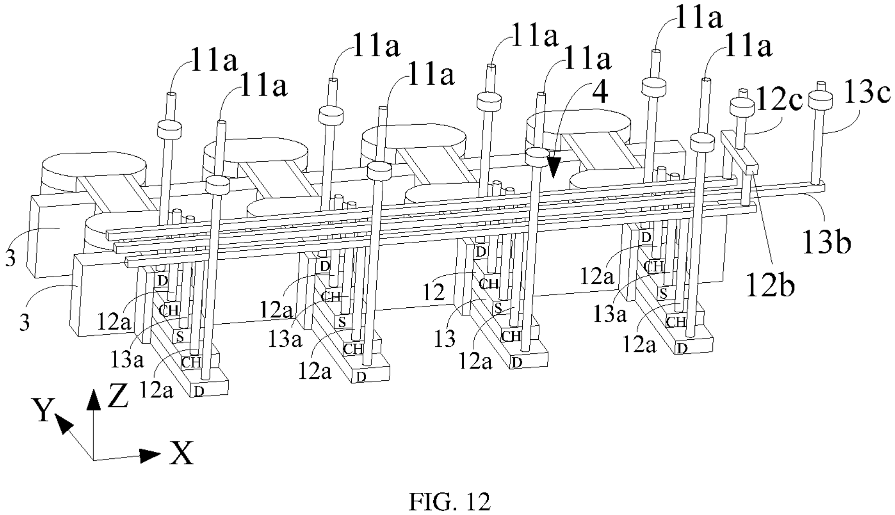
FIG. 12 is a structural schematic view of a circuit connection of part of memory cells of a memory block according to an embodiment of the present disclosure.

Referring further to FIG. 12, FIG. 12 is a structural schematic view of a circuit connection of part of memory cells of a memory block according to an embodiment of the present disclosure. As shown in FIG. 12, for each column of drain region semiconductor strips 11, channel semiconductor strips 12, and source region semiconductor strips 13 of the multiple memory subarray layers 1*a*: the multiple drain region semiconductor strips 11 in the same column are led out through different bit line connection lines 11*a* arranged on an end of each drain region semiconductor strip 11, the bit line connection line 11*a* extending along the height direction Z as shown in FIG. 12. For example, for the drain region semiconductor strips 11, the channel semiconductor strips 12, and the source region semiconductor strips 13 in the first column, the drain region semiconductor strip 11 in the first memory subarray layer 1*a* is led out at its end by a bit line connection line 11*a*, where an end of the bit line connection line 11*a* away from the drain region semiconductor strip 11 may be configured as a bit line connection terminal; the drain region semiconductor strip 11 in the second memory subarray layer 1*a* is led out at its end by another bit line connection line 11*a*, and an end of the another bit line connection line 11*a* away from the corresponding drain region semiconductor strip 11 is configured as another bit line connection terminal; . . . , and so on. Therefore, each drain region semiconductor strip 11 may serve as a bit line and receive a bit line voltage through each bit line connection terminal.

It will be understood by those skilled in the art that the memory block 10 may be connected to another stacked chip stacked together in the height direction Z of the memory block 10 through the bit line connection terminal, and provide a bit line voltage to each drain region semiconductor strip 11 in the memory block 10 as a bit line through the bit line connection terminal through another stacked chip. Of course, the bit line connection terminal may be further configured to be connected to the control circuit on the chip where the memory block 10 is located, i.e., the relevant lines, the memory array 1, and the control circuit are arranged on the same chip.

Similarly, for each column of drain region semiconductor strips 11, channel semiconductor strips 12, and source region semiconductor strips 13 of the multiple memory subarray layers 1*a*, the multiple source region semiconductor strips 13 in the same column are led out through different source line connection lines 13*a* disposed on an end of each source region semiconductor strip, and the source connection lines 13*a* extend along the height direction Z.

As shown in FIG. 12, all of the source connection lines 13*a* in the memory block 10 may be connected to the same common source line 13*b*, respectively, and a source voltage is applied to the source region semiconductor strips 13 in the memory block 10 through the common source line 13*b* and the source connection lines 13*a*.

Of course, it is understood by those skilled in the art that in other embodiments, the memory block 10 may include multiple common source lines 13*b*, such as a predetermined number of the multiple common source lines 13*b*, and the source region semiconductor strips 13 in the multiple memory subarray layers 1*a* may be connected to different multiple common source lines 13*b* via corresponding source connection lines 13*a* according to a predetermined rule. In addition, also similar to the bit line connection line 11*a* corresponding to the drain region semiconductor strip 11, an end of the source connection line 13*a* corresponding to each source region semiconductor strip 13 away from the source region semiconductor strip 13 may be configured as a source connection terminal to receive the source voltage.

Referring further to FIG. 12, the memory block 10 may further include a common source lead line 13*c* connected to the common source line 13*b*, where the common source line 13*b* is connected to all source connection lines 13*a* in the memory block 10. The common source lead line 13*c* extends away from the memory array 1 in the memory block 10 and in the height direction Z. An end of the common source lead line 13*c* away from the common source line 13*b* may be configured as a common source connection terminal for connecting to another stacked chip stacked together in the height direction Z in the memory block 10. Of course, the common source connection terminal may further be configured to connect to the control circuit on the chip on which the memory block 10 is located, i.e., the relevant lines, the memory array, and the control circuit are arranged on the same chip.

Of course, it can be understood by those skilled in the art that the common source line 13*b* may be arranged in another stacked chip stacked with the memory block 10 in the height direction Z. That is, an end of the source connection line 13*a* away from the corresponding source region semiconductor strip 13 may be configured as a source connection terminal for connection with another stacked chip stacked with the memory block 10 in the height direction Z, such that the common source line 13*b* are arranged in another stacked chip.

As above, for each column of drain region semiconductor strips 11, channel semiconductor strips 12, and source region semiconductor strips 13 of the multiple memory subarray layers 1*a*, the multiple channel region semiconductor strips 12 in the same column are led out through different well region connection lines 12*a* disposed on an end of each channel semiconductor strip 12, and the well region connection lines 12*a* extend along the height direction Z.

As shown in FIG. 12, all of the well region connection lines 12*a* in the memory block 10 are each connected to the same common well region line 12*b*, thereby uniformly applying a well region voltage to all the channel semiconductor strips 12 in the memory block 10 through the common well region line 12*b*.

Of course, it will be understood by those skilled in the art that the corresponding well region connection line 12*a* of each channel semiconductor strip 12 in the memory block 10 may be connected to multiple separate well voltage lines 12*b* to apply a well voltage to each channel semiconductor strip 12 separately. For example, similar to the above, an end of the well region connection line 12*a* corresponding to each channel semiconductor strip 12 away from the channel semiconductor strip 12 serves as a well connection terminal which is configured to receive a separate well voltage.

Referring further to FIG. 12, all of the well region connection lines 12*a* in the memory block 10 are each connected to the same common well region line 12*b*; the memory block 10 may further include a common well region lead line 12*c* connected to the common well region line 12*b*, with the common well region lead line 12*c* extending away from the memory array 1 in the memory block 10 and along the height direction Z. An end of the common well region lead line 12*c* away from the common well region line 12*b* may be configured as a common well region connection terminal for connection to another stacked chip stacked with the memory block 10 in the height direction Z. Of course, the common well region connection terminal may further be configured for connection to the control circuit on the chip on which the memory block 10 is located, i.e., the associated lines, the memory array 1, and the control circuit are arranged on the same chip. That is, through the common well region line 12*b* it is possible to connect all the channel semiconductor strips 12 in the memory block 10 together to receive the same well voltage. In the embodiments, the channel semiconductor strip 12 may be a p-type semiconductor strip forming a p-well, and all the channel semiconductor strips 12 in the memory block 10 are connected together through the common well region line 12*b*, receiving the same well voltage through the common well region line 12*b*. In addition, in the embodiments, the memory block 10 may read signals through the same common source line 13*b*.

Of course, it will be understood by those skilled in the art that the common well region line 12*b* may be arranged in another stacked chip stacked together with the memory block 10 in the height direction Z. That is, an end of the well region connection line 12*a* away from the corresponding channel semiconductor strip 12 may be configured as a well region connection terminal for connection to another stacked chip stacked together with the memory block 10 in the height direction Z, thereby arranging the common well region line 12*b* in another stacked chip.

Figure 13:
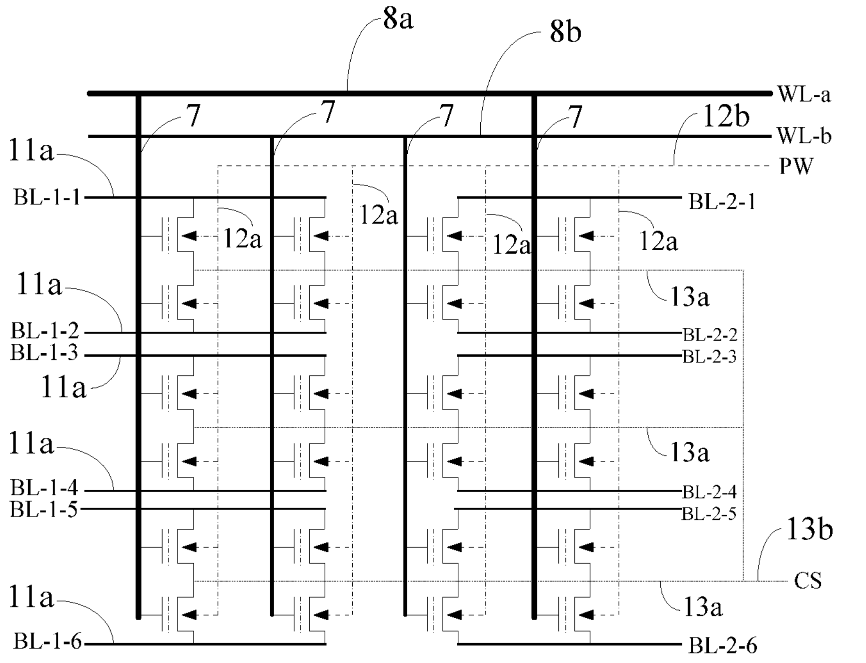
FIG. 13 is a schematic view of a circuitry of the memory block shown in FIG. 11.

Furthermore, it is noted that, as shown in FIGS. 11 and 13, in the present disclosure, various wires, such as word line, word line connection line 7, word line lead line 6*a* or 6*b*, common source line 13*b*, common well region line 12*b*, etc. are arranged on a same side of the memory array 1 in the memory block 10, i.e., arranged above the memory array 1. Therefore, it may be ensured that the drain region semiconductor strips 11, the channel semiconductor strips 12, and the source region semiconductor strips 13 in the memory array 1 may be each formed as single-crystal semiconductor strips by epitaxial growth, while only polycrystalline semiconductor strips can be formed by the deposition method. Compared to polycrystalline semiconductor strips formed by deposition, the drain region semiconductor strips 11, channel semiconductor strips 12, and source region semiconductor strips 13 formed by epitaxial growth of the present disclosure may have superior device performance and greatly improve the performance of the relevant memory device. Specifically, when comparing the memory cell adopted with a single-crystal semiconductor (single-crystal drain region semiconductor strip 11, channel semiconductor strip 12, and source region semiconductor strip 13) to the memory cell adopted with a polycrystalline semiconductor, the memory cell with the polycrystalline semiconductor has more interfaces, along which electrons move when passing through the polycrystalline semiconductor, i.e., the distance of electron movement increases and the current decreases significantly. According to a practical empirical test, the current of the memory cell with a polycrystalline semiconductor is only 1/10 of the current of the memory cell with a single-crystal semiconductor. Therefore, the memory block 10 of the present disclosure, with the memory cell with a single-crystal semiconductor, may greatly improve the performance of the memory device. In addition, the low current of the memory cell with the polycrystalline semiconductor affects the read window between the read/write operation (PGM) and the erase operation (ERS) of the memory cell, which has a great impact on the reliability of the memory device, especially for the NOR memory device. In addition, for NOR memory devices, when a hot carrier injection (HCI) method is applied for read/write operations, a single-crystal semiconductor must be adopted to accomplish this.

In addition, since the various wires in the present disclosure are arranged on the same side of the memory array 1 in the memory block 10, it is more convenient to perform the bonding stacking process in three dimensions with the stacked chips, thereby improving the performance of the related memory devices, and manufacturing the chips separately is conducive to optimizing the process and reducing the manufacturing time.

It can be understood by those skilled in the art that in some embodiments, in order for the memory block 10 to obtain better performance, the outermost memory cell may generally serve as a virtual memory cell (dummy cell) and does not perform actual storage works. For example, the memory cells included in the lowermost memory subarray layer 1*a* may be configured as virtual memory cells. In addition, in some embodiments, the leftmost and rightmost columns of the memory block 10 are each arranged with a column of drain region semiconductor strips 11, channel semiconductor strips 12, and source region semiconductor strips 13, respectively. The memory cells formed by the leftmost column of the drain region semiconductor strips 11, the channel semiconductor strips 12, and the source region semiconductor strips 13, together with the gate strips 2 in the word line holes 4 on the right side and the storage structures 5 between them, and the memory cells formed by the rightmost column of drain region semiconductor strips 11, channel semiconductor strips 12 and source region semiconductor strips 13, together with the gate strips 2 in the word line hole 4 on the left side and the storage structures 5 between them, are also taken as virtual memory cells not participating in the actual storage work.

Therefore, in the present disclosure, unless intentionally pointed out, the memory subarray layers 1*a* in the entire specification do not include the lowermost memory subarray layer involved in the virtual memory cells (dummy cells); nor do the drain region semiconductor strips 11, the channel semiconductor strips 12, and the source region semiconductor strips 13 include the leftmost column of drain region semiconductor strips 11, channel semiconductor strips 12, and source region semiconductor strips 13, and the rightmost column of drain region semiconductor strips 11, channel semiconductor strips 12, and source region semiconductor strips 13, involved in the virtual memory cells (dummy cells).

Therefore, as above, in a same row, from left to right, the first word line hole 4 only corresponds to a column of drain region semiconductor strips 11, channel semiconductor strips 12, and source region semiconductor strips 13 on the right side; the last word line hole 4 only corresponds to a column of drain region semiconductor strips 11, channel semiconductor strips 12, and source region semiconductor strips 13 on the left side. Therefore, those skilled in the art can understand that the first and last word line holes functionally constitute a complete word line hole.

Figure 14:
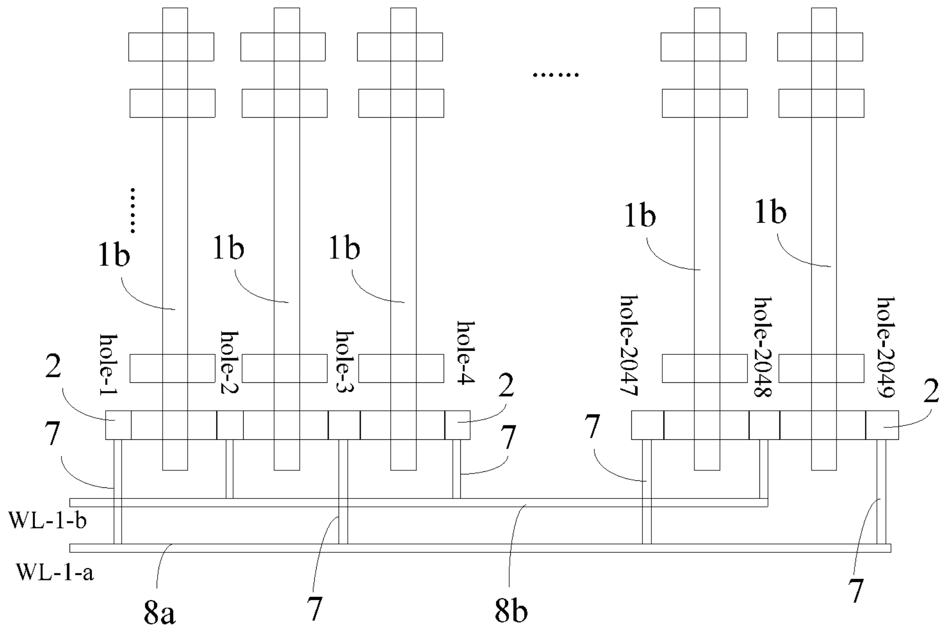
FIG. 14 is a schematic sketch of a plan view of the memory block shown in FIG. 11.
Figure 15:
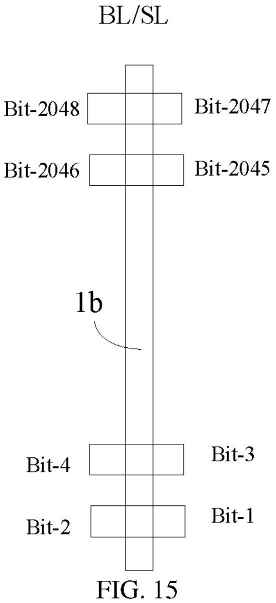
FIG. 15 is a schematic view of a memory cell corresponding to each layer of bit lines.
Figure 16:
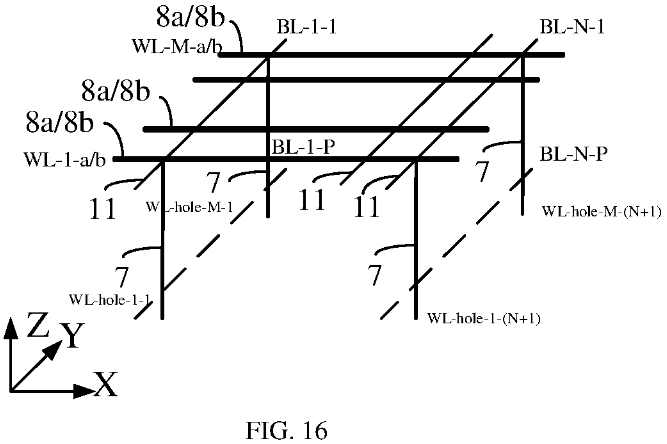
FIG. 16 is a schematic view of a three-dimensional distribution of word lines and bit lines.

In conjunction with FIGS. 13-16, FIG. 13 is a schematic view of a circuitry of the memory block 10 shown in FIG. 11, FIG. 14 is a schematic sketch of a plan view of the memory block 10 shown in FIG. 11, FIG. 15 is a schematic view of a memory cell corresponding to each layer of bit lines, and FIG. 16 is a schematic view of a three-dimensional distribution of word lines and bit lines.

As shown in FIG. 13, the memory block 10 includes multiple memory subarray layers 1*a* (six layers herein illustrated in FIG. 13), and the drain region semiconductor strips 11 in the multiple memory subarray layers 1*a* serve as bit lines, such as BL-1-1, BL-1-2, BL-1-3, BL-1-4, BL-1-5, BL-1-6; multiple columns of drain region semiconductor strips 11 in each memory subarray layer 1*a* constitute multiple columns of bit lines, such as BL-1-1, BL-2-1, . . . ; the source region semiconductor strips 13 in the multiple memory subarray layers 1*a* in memory block 10 are connected to a common source line 13*b*; the well region semiconductor strips 12 in the multiple memory subarray layers 1*a* in memory block 10 are connected to a common well region line 12*b*. In addition, the gate strip 2 in the same word line hole 4, together with the drain region semiconductor strips 11, the channel region semiconductor strips 12, and the source region semiconductor strips 13 on the left and right sides, forms two columns of memory cells (as shown in the middle two columns of memory cells), respectively. The gate strips 2 corresponding to the odd word holes 4 are connected to an odd word line WL-a, such as the first, fourth column memory cells, which correspond to the first word line holes and third word line holes, respectively; and the gate strips 2 corresponding to the even word holes 4 are connected to an even word line WL-b, such as the second, third column memory cells, which correspond to the second word line holes.

As shown in FIGS. 14-16, in each memory subarray layer 1*a*, for the drain region semiconductor strips 11, channel semiconductor strips 12, and source region semiconductor strips 13 extending along the column direction, one column of semiconductor strip structures 1*b* forms a memory cell (bit) with the gate strip 2 in the left word line hole 4 and another memory cell (bit) with the gate strip 2 in the right word line hole 4. The first row of odd word line holes 4, such as hole-1, hole-3, . . . , are connected to the first row of odd word line WL-1-*a*, and the first row of even word line holes, such as hole-2, hole-4, . . . , are connected to the first row of even word line WL-1-*b*.

As shown in FIG. 16, assume that the memory block 10 includes P layers of memory subarray layer 1*a*, M rows of word lines, and N columns of bit lines. Then, each memory subarray layer 1*a* includes N columns of drain region semiconductor strips 11 as bit lines, such as shown as BL-1-1, . . . , BL-N-1; for the P-th memory subarray layer 1*a*, such as BL-1-1, . . . , BL-N-P as shown, the memory block 10 includes N*P drain region semiconductor strips 11 as bit lines. M rows of word lines, e.g., WL-1-*a/b*, . . . , WL-M-a/b, each have a projection crossed with a projection of each of the N columns of bit lines on a projection plane defined by the row direction X and column direction Y, respectively, to form multiple memory cells. P, M and N are all natural numbers greater than 0.

According to the above conditions, it is understood by those skilled in the art that in the same row direction X, the memory block 10 includes (N+1) word line holes 4, such as shown as WL-hole-1-1, . . . , WL-hole-1-(N+1); and in the same column direction Y, the memory block 10 includes M word line holes 4, such as shown as WL-hole-1-(N+1), . . . , WL-hole-M-(N+1). A side of each column of drain region semiconductor strips 11, channel semiconductor strips 12, and source region semiconductor strips 13 corresponds to M word line holes 4. Each row of word lines (one odd word line 8*a* and one even word line 8*b*) corresponds to (N+1) word line holes 4. As above, in the same row, the word line holes 4 at the first and last ends each correspond to only one memory cell in each memory subarray layer 1*a*, and therefore the word line holes 4 at the first and last ends can be functionally regarded as a complete word line hole; while other word line holes 4 correspond to two memory cells (one on each of the left and right sides) in each memory subarray layer 1*a*. Therefore, each row of word lines corresponds to N*2*P memory cells. When N is an even number, an odd word line 8*a* corresponds to (N/2+1) word line holes, which includes word line holes 4 at the first and last ends of the same row, that is, an odd word line 8*a* also corresponds to N/2 complete word line holes 4, corresponding to (N/2)*P*2 memory cells. An even word line 8*b* corresponds to N/2 word line holes 4, corresponding to (N/2)*P*2 memory cells. In other words, the number of memory cells corresponding to an odd word lines 8*a* and the number of memory cells corresponding to an even word lines 8*b* are the same.

In some embodiments, assume that the memory block 10 specifically includes 8 layers of the memory subarray layers 1*a* and 1024 rows of word lines, each row of word lines includes an odd word line 8*a* and an even word line 8*b*, each layer of the memory subarray layer 1*a* includes 2048 columns of the drain region semiconductor strips 11 as bit lines, and the memory block 10 includes 2048*8 of the drain region semiconductor strips 11 as bit lines.

In the same row direction X, the memory block 10 includes (2048+1=2049) word line holes 4; in the same column direction Y, the memory block 10 includes 1024 word line holes 4. Each drain region semiconductor strip 11 as a bit line corresponds to 1024 word line holes 4, corresponding to 1024*2 memory cells. Each row of word lines corresponds to (2048+1=2049) word line holes 4. The word line holes 4 at the first and last ends each correspond to only one memory cell in each memory subarray layer 1*a*, which functionally constitutes a complete word line hole 4, which corresponds to 2048*2*8=32K memory cells. N is an even number 2048, then an odd word line 8*a* corresponds to (2048/2+1=1025) word line holes, which includes the word line holes 4 at the first and last ends of the same row, that is, an odd word line 8*a* also corresponds to 1024 complete word line holes 4, which corresponds to (2048/2)*8*2 memory cells; an even word line 8*b* corresponds to 2048/2 word line holes 4, which corresponds to (2048/2)*8*2 memory cells.

In the memory block 10, ⅛ of the memory cells corresponding to a word line, that is, 1024*2 memory cells, may be defined as one memory page (128 complete word line holes 4). In the memory block 10, 32K memory cells corresponding to one word line may be defined as a sector, which can be understood that one sector corresponds to 2 word lines, (2048+1) word line holes 4 (2048 complete word line holes 4), and 2048*2*8 memory cells (bit).

In the memory block 10, 16 sectors may be defined to form a sub memory block 10 (eblk) including 0.5M memory cells (2048*2*8*16=1024*2*2*8*16=1024*1024*0.5). In specific embodiments, the memory block 10 includes 64 sub memory blocks 10 including 32M memory cells. Each memory block 10 shares a common source line 13*b* and a common well region line 12*b*.

The memory block 10 provided in the embodiments includes a memory array 1, and the memory array 1 includes multiple memory cells distributed in a three-dimensional array; the memory array 1 includes multiple memory subarray layers 1*a* stacked sequentially along a height direction Z, and each memory subarray layer 1*a* includes a drain region semiconductor layer, a channel semiconductor layer, and a source region semiconductor layer stacked along the height direction Z; the drain region semiconductor layer, channel semiconductor layer, and source region semiconductor layer in each memory subarray layer 1*a* include multiple drain region semiconductor strips 11, channel semiconductor strips 12, and source region semiconductor strips 13, respectively, distributed along a row direction X, and each drain region semiconductor strip 11, channel semiconductor strip 12, and source region semiconductor strip 13 extends along a column direction Y; multiple gate strips 2 distributed along the column direction Y are arranged on each side of each column of drain region semiconductor strips 11, channel semiconductor strips 12, and source region semiconductor strips 13, each gate strip 2 extending along the height direction Z; in the height direction Z, a projection of at least a part of each gate strip 2 coincides with a projection of a part of a corresponding channel semiconductor strip 12 in each memory subarray layer 1*a* on a projection plane, the projection plane extending along the height direction Z and the column direction Y. Apart of the gate strip 2, a corresponding part of the channel semiconductor strip 12, a part of the drain region semiconductor strip 11 adjacent to the corresponding part of the channel semiconductor bar 12, and a part of the source region semiconductor strip 13 adjacent to the corresponding part of the channel semiconductor bar 12 are configured to form a memory cell. The memory block 10 has a higher storage density compared to a two-dimensional memory array.

As above, the memory block 10 of the present disclosure includes at least two structures of memory cells. In some embodiments, in combination with FIG. 5, FIG. 7, FIG. 8 and FIG. 10, a memory cell is provided that includes a drain region portion 11', a channel portion 12', a source region portion 13' and a gate portion 2'. The drain region portion 11', the channel portion 12', and the source region portion 13' are stacked along the height direction Z, and the gate portion 2' is disposed on one side of the drain region portion 11', the channel portion 12', and the source region portion 13', and extends along the height direction Z. In the height direction Z, a projection of the gate portion 2' partially overlaps with a projection of the channel portion 12' on a projection plane extending along the height direction Z. A storage structure portion 5' is arranged between the gate portion 2' and the drain region portion 11', the channel portion 12', and the source region portion 13'.

The drain region portion 11' is a part of the drain region semiconductor layer, the channel portion 12' is a part of the channel semiconductor layer, and the source region portion 13' is a part of the source region semiconductor layer of the memory block 10 provided in the above embodiments. The specific structures, functions, and stacking methods of the drain region portion 11', the channel portion 12', the source region portion 13', and the storage structure portion 5' can be found in those of the drain region semiconductor layer, the channel semiconductor layer, the source region semiconductor layer, and the storage structure portion 5' in each of the memory subarray layers 1*a* described above, and the same or similar technical effects can be achieved, which will not be repeated herein.

When the drain region portion 11', the channel portion 12', and the source region portion 13' are each in a strip structure and the storage structure portion 5' is a charge trapping storage structure portion, the specific structure of the memory cell can be seen in FIG. 5, and other structures of the memory cell can be seen in the relevant description of FIG. 5 above. When the drain region portion 11', the channel portion 12', and the source region portion 13' each include the body structure 15*a* and multiple protrusions 15*b*, and the storage structure portion 5' is a charge trapping storage structure portion, the specific structure of the memory cell can be seen in FIG. 7, and other structures of the memory cell can be found in the above description of FIG. 7. When the storage structure portion 5' is a floating gate storage structure portion, the specific structure of the memory cell can be seen in FIG. 10 and FIG. 11, and other structures of the memory cell can be seen in the above description of FIG. 10 and FIG. 11.

Figure 17:
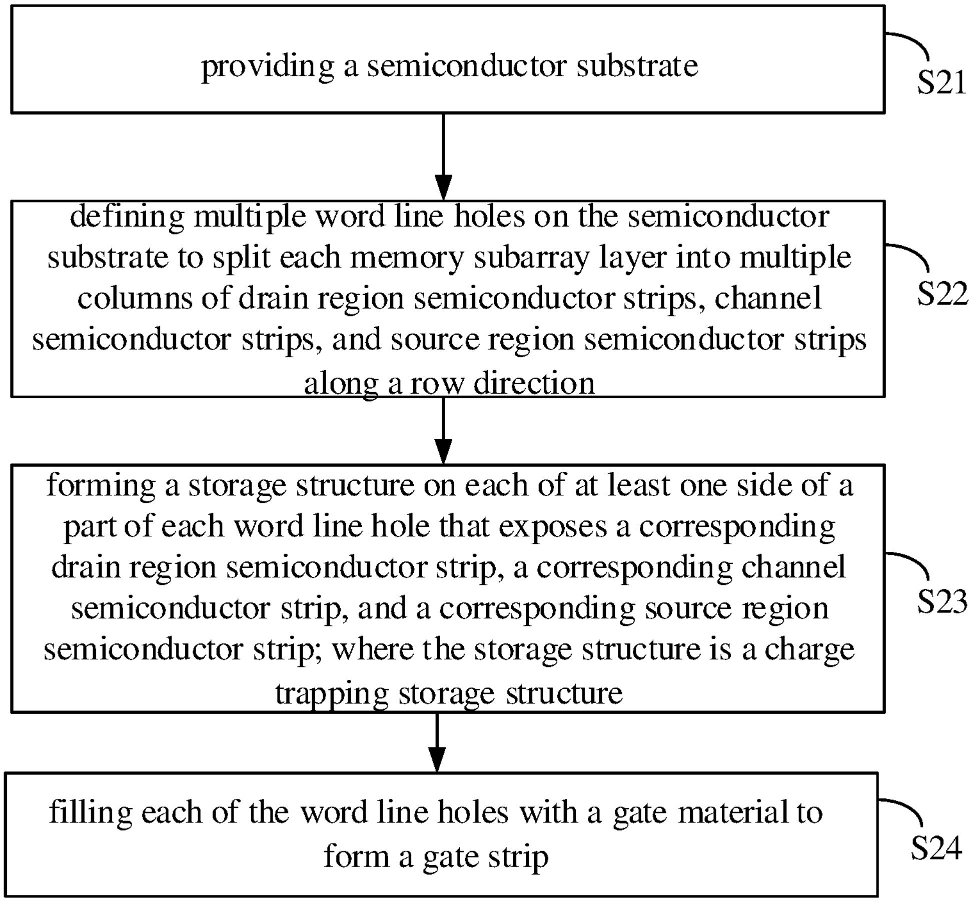
FIG. 17 is a flowchart of a manufacturing method of a memory block according to an embodiment of the present disclosure.

Referring to FIG. 17, FIG. 17 is a flowchart of a manufacturing method of a memory block according to an embodiment of the present disclosure. In the embodiments, a manufacturing method of a memory block is provided that may be configured to prepare the memory block 10 provided in FIG. 2*a*-FIG. 4 of the above embodiments, and the storage structure 5 of the memory block 10 is a charge trapping storage structure. Specifically, the method includes operations at blocks illustrated in FIG. 17.

At step S21: providing a semiconductor substrate.

Figure 18:
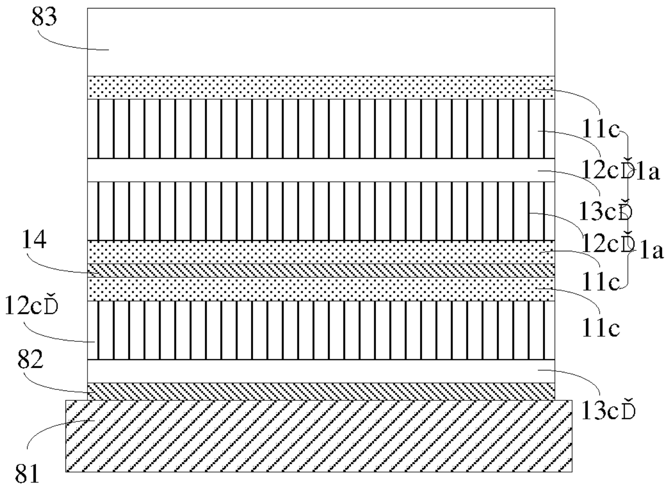
FIG. 18 is a schematic view of a structure at a specific operation of a manufacturing method of a memory block according to an embodiment of the present disclosure.

Referring to FIG. 18, FIG. 18 is a cross-sectional view of a semiconductor substrate according to an embodiment of the present disclosure. The semiconductor substrate includes a substrate 81, a first single-crystal sacrificial semiconductor layer 82 arranged on the substrate 81, and two memory subarray layers 1*a* and a second single-crystal sacrificial semiconductor layer 14 stacked and formed alternately in sequence on the first single-crystal sacrificial semiconductor layer 82, until another two memory subarray layers 1*a* are formed uppermost.

The substrate 81 may be a single-crystal substrate 81; specifically, it may be made of single-crystal silicon. The first single-crystal sacrificial semiconductor layer 82 and/or the second single-crystal sacrificial semiconductor layer 14 may be made of silicon germanium (SiGe). The multiple memory subarray layers 1*a* are sequentially layered in a height direction Z perpendicular to the substrate 81. Each memory subarray layer 1*a* includes a drain region semiconductor layer 11*c*, a channel semiconductor layer 12*c*', and a source region semiconductor layer 13*c*' stacked along the height direction Z. Two adjacent memory subarray layers 1*a* in the height direction Z may share a common source region.

The two adjacent memory subarray layers 1*a* may include sequentially stacked drain region semiconductor layer 11*c*, channel semiconductor layer 12*c*', source region semiconductor layer 13*c*', channel semiconductor layer 12*c*', and drain region semiconductor layer 11*c*, to achieve sharing the common source region semiconductor layer 13*c*'. Therefore, for common-source memory subarray layers 1*a*, a second single-crystal sacrificial semiconductor layer 14 is arranged on every two memory subarray layers 1*a* to isolate from the other two memory subarray layers 1*a*. The second single-crystal sacrificial semiconductor layer 14 may be made of a silicon germanium (SiGe) semiconductor material.

It should be noted that the structure shown in FIG. 18 only exemplarily illustrates part of the structure of the semiconductor substrate; it is understood by those skilled in the art that between the first single-crystal sacrificial semiconductor layer 82 and the second single-crystal sacrificial semiconductor layer 14 shown in FIG. 18, two memory subarray layers 1*a* sharing a common source region semiconductor layer 13*c*' are arranged. For the sake of brevity of the accompanying drawings, one layer of the memory subarray layer 1*a* is shown schematically only for illustrative purposes only.

In some embodiments, step S21 may specifically include the following.

Step S211*a*: providing a substrate 81.

The substrate 81 may be a single-crystal substrate 81; specifically, it may be a single-crystal silicon.

Step S212*a*: forming multiple memory subarray layers 1*a* sequentially on the substrate 81 along the height direction Z.

Step S212*a* may specifically include the following.

Step a: forming the first single-crystal sacrificial semiconductor layer 82 on the substrate 81 by epitaxial growth.

The first single-crystal sacrificial semiconductor layer 82 may be silicon germanium (SiGe).

Step b: forming two memory subarray layers 1*a* and a second single-crystal sacrificial semiconductor layer 14 alternately in sequence by epitaxial growth on the first single-crystal sacrificial semiconductor layer 82; continuing to form another two memory subarray layers 1*a*, optionally continuing to repeatedly stack another second single-crystal sacrificial semiconductor layer 14 and another two common-source memory subarray layers 1*a*, until forming uppermost two common-source memory subarray layers.

The material of the second single-crystal sacrificial semiconductor layer 14 is the same as the material of the first single-crystal sacrificial semiconductor layer 82, which may also be silicon germanium (SiGe).

It is understood by those skilled in the art that the purpose of providing the first single-crystal sacrificial semiconductor layer 82 on the substrate 81 first is to avoid electrical leakage caused by the multiple memory subarray layers 1*a* directly contacting the substrate 81. However, as above, the device performance of the lowermost memory subarray layer 1*a* in the memory block of the present disclosure is poor, and therefore, the memory cells in the lowermost memory subarray layer 1*a* are generally configured as virtual memory cells and do not participate in the actual memory work. Therefore, it is understood by those skilled in the art that the first single-crystal sacrificial semiconductor layer 82 may not be arranged on the substrate 81, and a single memory subarray layer 1*a* or two common-source memory subarray layers 1*a* are formed directly on the substrate 81 as virtual memory cells, on which the second single-crystal sacrificial semiconductor layer 14 and two common-source memory subarray layers 1*a* are alternately formed by epitaxial growth until the uppermost layer of two common-source memory subarray layers 1*a* are formed. That is, the lowermost one memory subarray layer 1*a* or two common-source memory subarray layers 1*a*, as a virtual memory cell(s), does not participate in the actual memory work, and therefore, it can also prevent electrical leakage to the substrate 81.

Two adjacent memory subarray layers 1*a* share a common source region, and each two common-source memory subarray layers may be formed in a manner including the following.

Step b1: forming a first single-crystal semiconductor layer of a first doping type by epitaxial growth on the first single-crystal sacrificial semiconductor layer 82 or the second single-crystal sacrificial semiconductor layer 14 of the lower layer.

Specifically, a semiconductor material gas and a first type of dopant ion gas may be simultaneously introduced to form one layer of the first single-crystal semiconductor layer of the first doping type on the first single-crystal sacrificial semiconductor layer 82 or the second single-crystal sacrificial semiconductor layer 14 of the lower layer by epitaxial growth. The first single-crystal semiconductor layer serves as a drain region semiconductor layer 11*c* (or a source region semiconductor layer 13*c*'). The first type of dopant ion may be an arsenic ion. The semiconductor material may be an existing semiconductor material for forming the drain region (or source region).

Step b2: forming a second single-crystal semiconductor layer of a second doping type on the first single-crystal semiconductor layer by epitaxial growth.

Specifically, a semiconductor material gas and a second type of dopant ion gas may be simultaneously fed to form one layer of the second single-crystal semiconductor layer of the second doping type on the first single-crystal semiconductor layer by epitaxial growth. The second single-crystal semiconductor layer serves as a channel semiconductor layer 12*c*'. The second type of dopant ion may be a $BF^{2+}$ ion. The semiconductor material may be an existing semiconductor material for forming a well region.

Step b3: forming a third single-crystal semiconductor layer of the first doping type on the second single-crystal semiconductor layer by epitaxial growth.

Specifically, a semiconductor material gas and a first type of dopant ion gas may be simultaneously fed to form one layer of the third single-crystal semiconductor layer of the first doping type on the second single-crystal semiconductor layer by epitaxial growth. The third single-crystal semiconductor layer serves as a source region semiconductor layer 13*c*' (or a drain region semiconductor layer 11*c*). The first type of dopant ion may be an arsenic ion. The semiconductor material may be an existing semiconductor material for forming the source drain region (or drain region).

In a specific implementation of step S212*a*, one layer of the second single-crystal sacrificial semiconductor layer 14 is further formed between every two memory subarray layers 1*a*. Each two adjacent memory subarray layers 1*a* separated by the second single-crystal sacrificial semiconductor layer 14 in the height direction Z includes sequentially stacked drain region semiconductor layer 11*c*, channel semiconductor layer 12*c*', source region semiconductor layer 13*c*', channel semiconductor layer 12*c*', and drain region semiconductor layer 11*c* to share the same source region semiconductor layer 13*c*'.

Step b4: forming a fourth single-crystal semiconductor layer of a second doping type on the third single-crystal semiconductor layer by epitaxial growth.

This step b4 is performed in a similar manner to step b2. The fourth single-crystal semiconductor layer serve as the channel semiconductor layer 12*c'*.

Step b5: forming a fifth single-crystal semiconductor layer of a first doping type on the fourth single-crystal semiconductor layer by epitaxial growth.

This step b5 is performed in a similar manner as step b1. The fifth single-crystal semiconductor layer serve as the drain region semiconductor layer 11*c* (or source region semiconductor layer 13*c'*).

The first single-crystal semiconductor layer, the second single-crystal semiconductor layer, and the third single-crystal semiconductor layer form a memory subarray layer 1*a*; the third single-crystal semiconductor layer, the fourth single-crystal semiconductor layer, and the fifth single-crystal semiconductor layer form another memory subarray layer 1*a*; and the two memory subarray layers 1*a* share the third single-crystal semiconductor layer as the shared source region semiconductor layer 13*c'*.

It is understood that, in the embodiments, after step b5, one layer of the second single-crystal sacrificial semiconductor layer 14 is formed on the fifth single-crystal semiconductor layer, after which steps b1-b5 may be repeated on the second single-crystal sacrificial semiconductor layer 14 until a predetermined number of layers of the memory subarray layers 1*a* is formed.

That is, a second single-crystal sacrificial semiconductor layer 14 is formed between every two memory subarray layers 1*a*. Moreover, each adjacent two memory subarray layers 1*a* separated by the second single-crystal sacrificial semiconductor layer 14 in the height direction Z includes sequentially stacked drain region semiconductor layer 11*c*, channel semiconductor layer 12*c'*, source region semiconductor layer 13*c'*, channel semiconductor layer 12*c'*, and drain region semiconductor layer 11*c* to share the same source region semiconductor layer 13*c'*.

Step S213*a*: forming a first hard mask layer 83 on the multiple memory subarray layers 1*a*, and defining multiple isolation wall holes 31 in the first hard mask layer 83 and the multiple memory subarray layers 1*a*, and filling the multiple isolation wall holes 31 with an isolation material to form multiple isolation walls 3 to form a semiconductor substrate.

The first hard mask layer 83 may be made of a silicon dioxide material or a silicon nitride.

Figure 19:
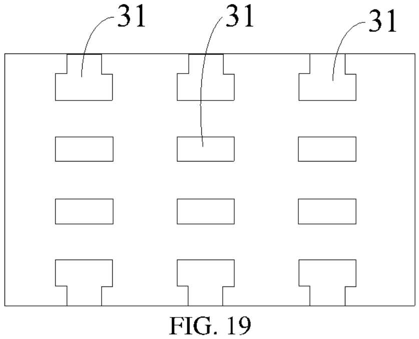
FIG. 19 is a schematic view of a structure at another specific operation of a manufacturing method of a memory block according to an embodiment of the present disclosure.
Figure 20:
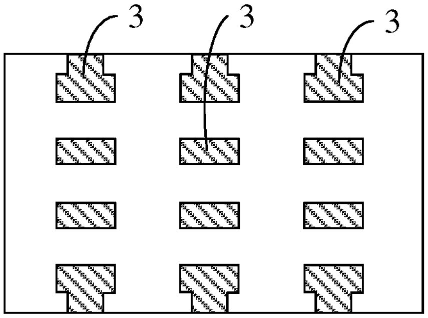
FIG. 20 is a schematic view of a structure at further another specific operation of a manufacturing method of a memory block according to an embodiment of the present disclosure.

Specifically, referring to FIG. 19, FIG. 19 is a top view of defining multiple isolation wall holes 31 in the memory subarray layers 1*a*. The multiple isolation wall holes 31 may be formed by etching, and the isolation wall holes 31 are arranged in a matrix in the row direction X and column direction Y, with each isolation wall hole 31 extending in the height direction Z to a surface of the substrate 81. The specific structure of forming the isolation walls 3 in the isolation wall holes 31 can be seen in FIG. 20, which is a top view of the multiple isolation walls 3 formed in the isolation wall holes 31 shown in FIG. 19. Specifically, the isolation wall 3 near an edge of the memory block 10 in the column direction Y extends further in the column direction Y to the edge of the memory block 10 to ensure that the isolation wall 3 at the edge of the column direction Y can completely isolate two adjacent columns of stacked structures 1*b*. Specifically, in some embodiments, the isolation wall 3 near the edge of the memory block 10 in the column direction Y is a T-shaped isolation wall 3, i.e., the isolation wall 3 includes a lateral portion and a protruding portion toward the edge of the memory block 10 in the column direction Y, and the protruding portion is in contact with the edge of the memory block 10 in the column direction Y to completely isolate the two adjacent columns of stack structures 1*b* to prevent a short circuit between the two columns of the drain region semiconductor strips 11, the channel semiconductor strips 12, and the source region semiconductor strips 13. The isolation wall 3 and the first hard mask layer 83 may be made of the same material.

In other embodiments, step S21 specifically includes the following operations.

Step S211*b*: providing the substrate 81.

Step S212*b*: forming multiple isolation walls 3 on the substrate 81, where the multiple isolation walls 3 are arranged in a matrix in the row direction X and the column direction Y, each isolation wall 3 extending along the height direction Z perpendicular to the substrate 81.

Step S213*b*: forming multiple memory subarray layers 1*a* sequentially on the substrate 81 and between the multiple isolation walls 3 along the height direction Z.

The specific implementation process of forming the multiple memory subarray layers 1*a* is the same or similar to the specific implementation process of forming the multiple memory subarray layers 1*a* in step S212*a* above, and the same or similar technical effect can be achieved, as described above.

Step S214*b*: forming a first hard mask layer 83 on the above structure to form the semiconductor substrate.

Specifically, the first hard mask layer 83 may be formed on the product structure after being processed by step S213*b*, with the first hard mask layer 83 being disposed on a side surface of the multiple memory subarray layers 1*a* away from the substrate 81.

At step S22: defining multiple word line holes on the semiconductor substrate to split each memory subarray layer into multiple columns of drain region semiconductor strips, channel semiconductor strips, and source region semiconductor strips along a row direction.

In some embodiments, step S22 specifically includes the following.

Step S221: forming the multiple word line openings 831 on the first hard mask layer 83.

Figure 21:
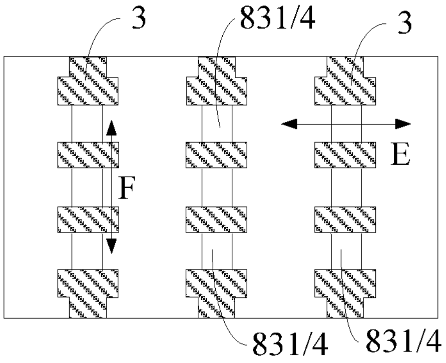
FIG. 21 is a schematic view of a structure at further another specific operation of a manufacturing method of a memory block according to an embodiment of the present disclosure.

Referring to FIG. 21, FIG. 21 is a top view of forming the multiple word line openings 831 and word line holes 4 on the semiconductor substrate. The multiple word line openings 831 may be formed on the first hard mask layer 83 by etching. The multiple word line openings 831 are arranged in a matrix in the row direction X and the column direction Y.

Step S222: etching the multiple memory subarray layers 1*a* under the first hard mask layer 83 to form multiple word line holes 4.

Figure 22:
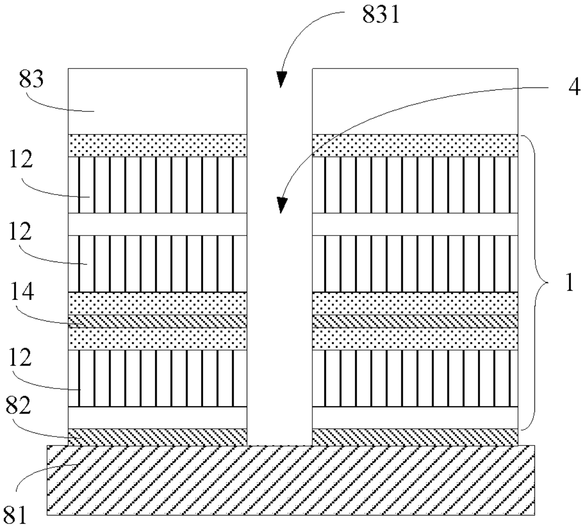
FIG. 22 is a schematic view of a structure at further another specific operation of a manufacturing method of a memory block according to an embodiment of the present disclosure.
Figure 23:
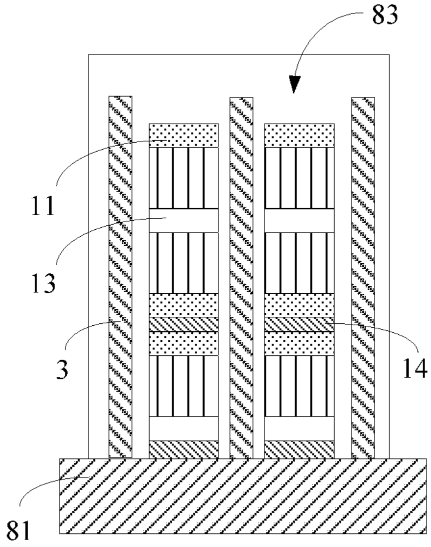
FIG. 23 is a schematic view of a structure at further another specific operation of a manufacturing method of a memory block according to an embodiment of the present disclosure.

Referring to FIGS. 21 to 23, FIG. 22 is a cross-sectional view in the E direction of the product corresponding to FIG. 21; and FIG. 23 is a cross-sectional view in the F direction of the product corresponding to FIG. 21. Specifically, the word line holes 4 may be formed by etching, and as shown in FIG. 21, the multiple word line holes 4 are spaced apart from the isolation walls 3; and the multiple word line holes 4 are arranged in a matrix in the row direction X and column direction Y, and each memory subarray layer 1*a* is divided into multiple columns of drain region semiconductor strips 11, channel semiconductor strips 12, and source region semiconductor strips 13 along the row direction X. As shown in FIG. 22, each word line hole 4 extends along the height direction Z, and the left and right sides (such as the left and right sides in the orientation of FIG. 22) of each word line hole 4 at a non-edge position expose parts of two columns of drain region semiconductor strips 11, channel semiconductor strips 12, and source region semiconductor strips 13 of the multiple memory subarray layers 1*a*, respectively. Each word line hole 4's both sides in the left-right direction are the drain region semiconductor strips 11, channel semiconductor strips 12 and, source region semiconductor strips 13; both sides in the front-rear direction are isolation walls 3. In this step, an etchant with a high etch ratio for the semiconductor material and a low etch ratio for the isolation wall 3 may be applied to process the formation of the word line holes 4. In addition, as shown in FIGS. 2-4, the leftmost edge word line holes 4 correspond to only one column of the drain region semiconductor strips 11, channel semiconductor strips 12 and, source region semiconductor strips 13 on right side; similarly, the rightmost edge word line holes 4 correspond to only one column of the drain region semiconductor strips 11, channel semiconductor strips 12 and, source region semiconductor strips 13 on left side. However, it is understood by those skilled in the art that the leftmost edge line holes 4 and the rightmost edge line holes 4 can be considered as a combination to form a complete word line hole, and the differences in the edge word line holes 4 will not be specifically noted subsequently.

As shown in FIGS. 2 and 4, the multiple word line holes 4 together with the multiple isolation walls 3 divide the drain region semiconductor layer 11*c* in each memory subarray layer 1*a* into multiple drain region semiconductor strips 11 spaced at intervals along the row direction X; the channel semiconductor layer 12*c*' into multiple channel semiconductor strips 12 spaced at intervals along the row direction X; and the source region semiconductor layer 13*c*' into multiple source region semiconductor strips 13 spaced at intervals along the row direction X. The other specific structures and functions of each drain region semiconductor strip 11, channel semiconductor strip 12, and source region semiconductor strip 13 can be found in the above description and will not be repeated here. In addition, as shown in FIG. 23, the interior of the isolation wall 3 may be silicon oxide with a layer of silicon nitride material wrapped around the outside, and the silicon nitride material wrapped around the outside may be the same as the material of the first hard mask layer 83.

Figure 24A:
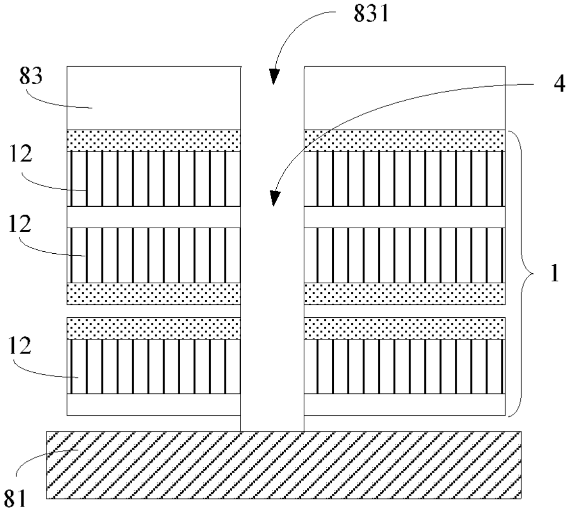
FIG. 24*a* is a schematic view of a structure at further another specific operation of a manufacturing method of a memory block according to an embodiment of the present disclosure.
Figure 24B:
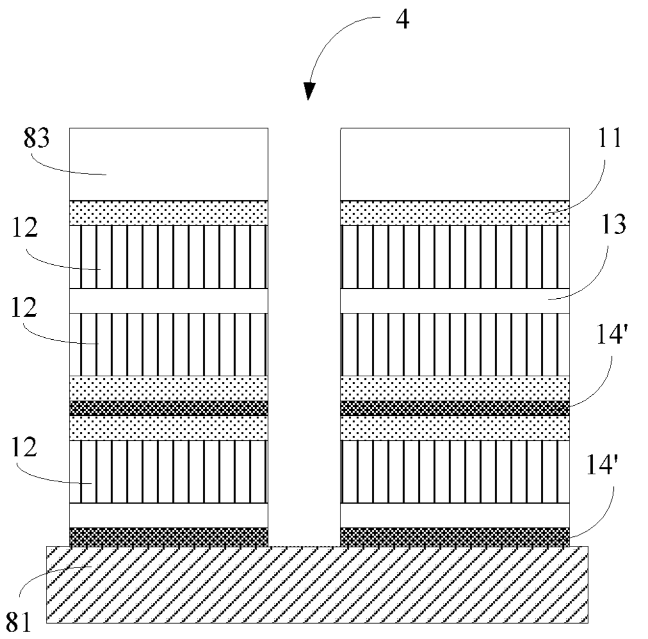
FIG. 24*b* is a schematic view of a structure at further another specific operation of a manufacturing method of a memory block according to an embodiment of the present disclosure.

In a specific implementation, referring to FIGS. 24*a*-24*b*, FIG. 24*a* is a schematic view of the structure shown in FIG. 21 after being processed by step S223; FIG. 24*b* is a schematic view of the structure shown in FIG. 24*a* after being filled with the insulating material; after step S222, the method may further include the following.

Step S223: removing the first single-crystal sacrificial semiconductor layer 82 and the second single-crystal sacrificial semiconductor layer 14 through the word line holes 4.

Specifically, the first single-crystal sacrificial semiconductor layer 82 and the second single-crystal sacrificial semiconductor layer 14 may be removed by etching.

Step S224: depositing on regions where the removed first single-crystal sacrificial semiconductor layer 82 and the second single-crystal sacrificial semiconductor layer 14 were located to fill the regions with an insulating material, thereby replacing the first single-crystal sacrificial semiconductor layer 82 and the second single-crystal sacrificial semiconductor layer 14 with an insulating isolation layer 14'.

The insulating material may be filled through atomic layer deposition. The insulating material may specifically be silicon oxide. It will be understood by those skilled in the art that after step S223 removing the first single-crystal sacrificial semiconductor layer 82 and the second single-crystal sacrificial semiconductor layer 14, the isolation walls 3 may provide sufficient support to the adjacent stacked structures 1*b* to facilitate subsequent execution of step S224.

Figure 25A:
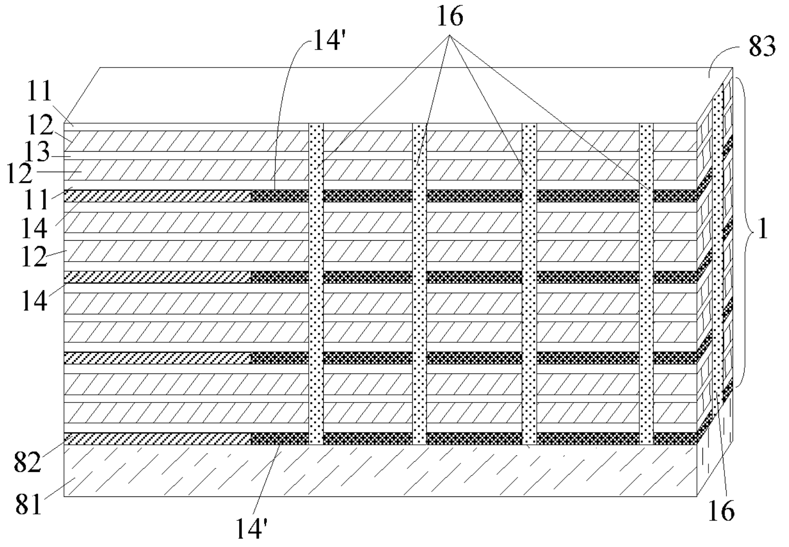
FIG. 25*a* is a schematic view of a structure at further another specific operation of a manufacturing method of a memory block according to an embodiment of the present disclosure.

Further, it will be understood by those skilled in the art that in some embodiments, the memory array 1 further includes a support post 16. Specifically, referring to FIG. 25*a* and FIG. 25*b*. FIG. 25*a* is a schematic view of a perspective structure of a memory array according to an embodiment of the present disclosure; and FIG. 25*b* is a partial plan schematic view of a memory array according to an embodiment of the present disclosure.

Figure 25B:
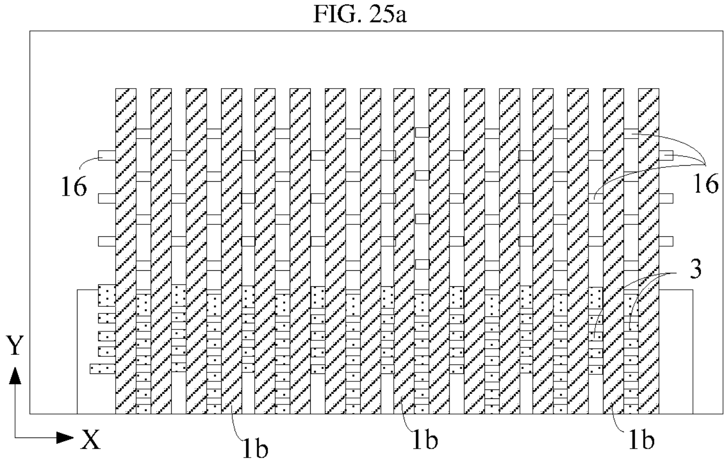
FIG. 25*b* is a schematic view of a structure at further another specific operation of a manufacturing method of a memory block according to an embodiment of the present disclosure.

As shown in FIGS. 25*a* and 25*b*, the memory array 1 further includes multiple support posts 16, each of which extends along the height direction Z of the memory array 1.

As described above, the first single-crystal sacrificial semiconductor layer 82 and the second single-crystal sacrificial semiconductor layer 14 are required to be replaced with the insulating isolation layer 14'. In this step, the first single-crystal sacrificial semiconductor layer 82 and the second single-crystal sacrificial semiconductor layer 14 are partially replaced with the insulating isolation layer 14', but in subsequent steps, all of the first single-crystal sacrificial semiconductor layer 82 and the second single-crystal sacrificial semiconductor layer 14 are replaced with the insulating isolation layer 14' as required for electrical isolation. That is, during the manufacturing of the memory array 1, after etching off the first single-crystal sacrificial semiconductor layer 82 and/or the second single-crystal sacrificial semiconductor layer 14, the memory subarray layers 1*a* in the relevant regions are overhanging. In these relevant regions, when the isolation walls 3 are provided, the isolation walls 3 can provide sufficient support to the overhanging memory subarray layers 1*a* in these regions to prevent the memory subarray layers 1*a* from collapsing.

However, the isolation walls 3 may not present in some regions. For example, in a drain/source lead region, the memory subarray layers 1*a* in this region are not required to manufacture the memory cells, and the drain region semiconductor strips 11, source region semiconductor strips 13, and/or channel semiconductor strips 12 in the memory subarray layers 1*a* in this region are required to be led out to be connected with corresponding wires. Therefore, in these regions, multiple support posts 16 are required to be arranged between two columns of the stacked structures 1*b*. In this way, after etching the first single-crystal sacrificial semiconductor layer 82 and/or the second single-crystal sacrificial semiconductor layer 14 in the stacked structures 1*b* in these regions during the manufacturing of the memory array 1, the support posts 16 can provide sufficient support to the overhanging memory subarray layers 1*a* to prevent the memory subarray layers 1*a* from collapsing, and can support the frame of the memory array 1 and maintain the structural stability of the memory array 1.

It will be understood by those skilled in the art that each support post 16 may be made of the same material as the isolation wall 3 and manufactured in the same process steps as the isolation wall 3. That is, the isolation wall 3 and the support post 16 are similar in nature, except that the isolation wall 3 is arranged in the region of the memory array 1 where the memory cells are required to be manufactured, and it serves to support and form the word line holes 4 during the manufacturing of the memory array 1; whereas the support post 16 is formed in another region of the memory array 1 where the memory cell is not required to be manufactured, for example, the drain/source lead region, and it serves to support the memory array 1 during the manufacturing process. Of course, in other embodiments, the support post 16 may be arranged in the region of the memory array 1 where the memory cells are required to be manufactured. For example, when the distance between two adjacent isolation walls 3 is far, and the isolation wall 3 does not provide sufficient support, then the support post 16 may be arranged in this region as needed to assist the isolation wall 3 to provide support. That is, the support post 16 may be arranged according to the actual needs, which is not limited by the present disclosure.

The material of the support post 16 may be silicon oxide or silicon nitride.

Step S23: forming a storage structure on each of at least one side of a part of each word line hole that exposes a corresponding drain region semiconductor strip, a corresponding channel semiconductor strip, and a corresponding source region semiconductor strip; where the storage structure is a charge trapping storage structure.

Figure 26:
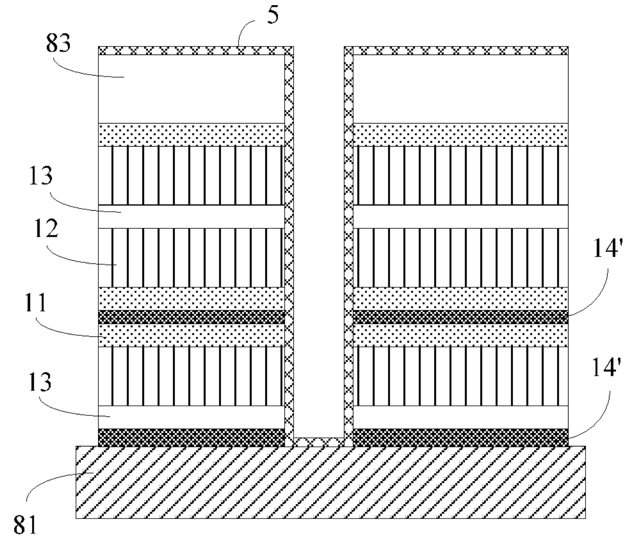
FIG. 26 is a schematic view of a structure at further another specific operation of a manufacturing method of a memory block according to an embodiment of the present disclosure.

The product structure after processing by step S23 can be seen specifically in FIG. 26, which is a schematic view of the structure shown in FIG. 24*b* after processing by step S23. In some embodiments, step S23 specifically includes the following.

Step S231: depositing a first dielectric layer on the semiconductor substrate defining the word line holes 4.

Specifically, one layer of the first dielectric layer is deposited within each word line hole 4 and on a surface of the first hard mask layer 83 away from the substrate 81. The first dielectric layer within each word line hole 4 covers surfaces of the parts of the drain region semiconductor strips 11, channel semiconductor strips 12, and source region semiconductor strips 13 that are exposed on both sides of the word line hole 4. For example, in conjunction with FIG. 4, parts of the first stacked structures 1*b* and the second stacked structures 1*b* are exposed through word line hole 4 of the first row and the second column (hereinafter referred to as a first word line hole 4), the first dielectric layer in the first word line hole 4 covers the part of the first column of storage structures 1*b* exposed through the first word line hole 4, and the part of the second column of semiconductor strip structures 1*b* exposed through the first word line hole 4.

Step S232: depositing a charge-trapping layer on the first dielectric layer.

The charge-trapping layer is disposed on a side surface of the first dielectric layer away from a corresponding column of semiconductor strip structures 1*b*.

Step S233: depositing a second dielectric layer on the charge-trapping layer.

The second dielectric layer is disposed on a side surface of the charge-trapping layer away from the first dielectric layer.

At step S24: filling each of the word line holes with a gate material to form a gate strip.

Figure 27:
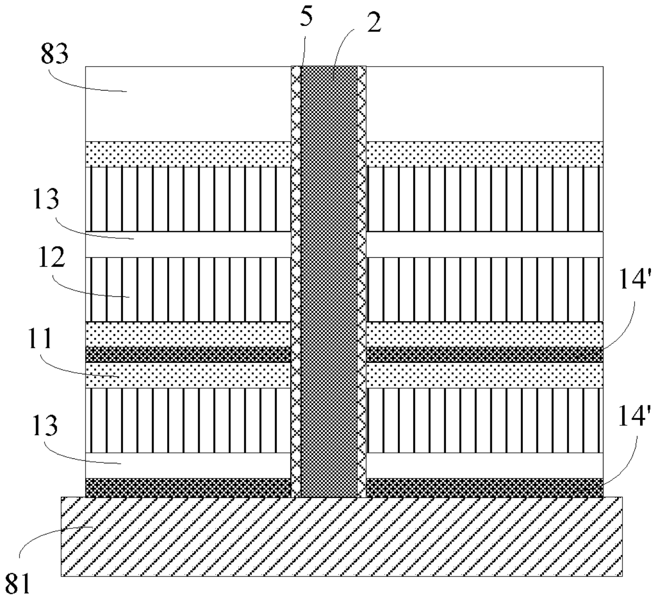
FIG. 27 is a schematic view of a structure at further another specific operation of a manufacturing method of a memory block according to an embodiment of the present disclosure.

The product structure after processing by step S24 is specified in FIG. 5 and FIG. 27, where FIG. 27 is a schematic view of the structure shown in FIG. 26 after processing by step S24. As shown in FIG. 5, a projection of at least a part of each gate strip 2 coincides with a projection of a part of a corresponding channel semiconductor strip 12 in each memory subarray layer 1*a* on a projection plane extending along the height direction Z and the column direction Y. A part of the gate strip 2, a corresponding part of the channel semiconductor strip 12, a part of the drain region semiconductor strip 11 adjacent to the corresponding part of the channel semiconductor strip 12, a part of the source region semiconductor strip 13 adjacent to the corresponding part of the channel semiconductor strip 12, and a part of the charge trapping storage structure form a memory cell.

As above, in the embodiments, the storage structure 5 is a charge trapping storage structure, such as an ONO type charge trapping storage structure, such that it can hold the electric charges injected into near the injection point. The electric charges can only move in the injection/removal direction (substantially perpendicular to the extension direction of the charge-trapping layer 52), and cannot move freely in the charge-trapping layer 52, especially not in the extension direction of the charge-trapping layer 52. For the charge trapping storage structure, the charge-trapping layer 52 is only required to have an insulating dielectric arranged on its front and back side, and the charge stored in each memory cell will be fixed near the injection point of the charge-trapping portion and will not move to the charge-trapping portion in other memory cells along the same layer of the charge-trapping layer 52. Therefore, in its corresponding manufacturing method, it is only necessary to form a first dielectric layer 51 and a second dielectric layer 53 on both sides of the charge-trapping layer 52, respectively, to separate the charge-trapping layer 52 from the drain region semiconductor strip 11, the channel semiconductor strip 12, the source region semiconductor strip 13 and the gate strip 2, and its manufacturing method is relatively simple.

Specifically, the above manufacturing method of memory blocks may be configured to prepare the memory blocks involved in the following embodiments. The memory block 10 includes a memory array 1, which includes multiple memory cells distributed in a three-dimensional array. The memory array 1 includes multiple stacked structures 1*b* distributed along the row direction X, each stacked structure 1*b* extending along the column direction Y, and each stacked structure 1*b* includes drain region semiconductor strips 11, channel semiconductor strips 12, and source region semiconductor strips 13 stacked along the height direction Z. Each drain region semiconductor strip 11, channel semiconductor strip 12, and source region semiconductor strip 13 extends along column direction Y, and each drain region semiconductor strip 11, channel semiconductor strip 12, and source region semiconductor strip 13 is a single-crystal semiconductor strip.

Multiple gate strips 2 are arranged on each of two sides of each stacked structure 1*b* along the column direction Y, and each gate strip 2 extends along the height direction Z. In the height direction Z, a projection of at least a part of each gate strip 2 coincides with a projection of a part of a corresponding channel semiconductor strip 12 on a projection plane extending along the height direction Z and the column direction Y. A part of the gate strip 2, a corresponding part of the channel semiconductor strip 12, a part of the drain region semiconductor strip 11 adjacent to the corresponding part of the channel semiconductor bar 12, and a part of the source region semiconductor strip 13 adjacent to the corresponding part of the channel semiconductor bar 12 form a memory cell. Specifically, a charge trapping storage structure is arranged between each gate strip 2 and corresponding drain region semiconductor strips 11, channel semiconductor strips 12, and source region semiconductor strips 13 in the multiple memory subarray layers 1*a*. The specific structure and function of the charge trapping storage structure, and the position relationship with the memory array 1, etc., can be found in the relevant description above.

Specifically, each stacked structure 1*b* includes multiple stacked substructures, each stacked substructure including a drain region semiconductor strip 11, a channel semiconductor strip 12, a source region semiconductor strip 13, a channel semiconductor strip 12, and a drain region semiconductor strip 11 stacked sequentially along the height direction Z to share the same source region semiconductor strip 13. Specifically, an interlayer isolation layer is arranged between two adjacent stacked substructures (i.e., the above-mentioned insulating isolation layer 14') to isolate the two adjacent stacked substructures from each other.

Multiple isolation walls 3 distributed along the column direction Y are arranged on each side of each stacked structure 1*b*, and each isolation wall 3 extends along the height direction Z and the row direction X to separate at least part of the two adjacent columns of the stacked structures 1*b*. The isolation walls 3 further serve as support structures to support the two adjacent columns of the stacked structures 1*b* in the manufacturing process as shown above to facilitate the subsequent manufacturing process. Of course, after the manufacturing process, the isolation walls 3 may be further configured as support structures to support the two adjacent columns of the stacked structures 1*b*. The isolation wall 3 near an edge of the memory block 10 in the column direction Y is a T-shaped wall to completely isolate the two adjacent columns of the stacked structures 1*b*. Of course, the isolation wall 3 at the edge in the column direction Y may take other shapes, such as extending in the column direction Y to the edge of the memory block 10 in the column direction Y, etc., as long as it can completely isolate the two adjacent columns of the stacked structures 1*b* at the edge of the memory block 10 in the column direction Y.

In the column direction Y, a gate strip 2 is arranged between two adjacent isolation walls 3 on the same column; parts of two adjacent columns of the stacked structures 1*b* share the same gate strip 2.

Other structures and functions of the memory block 10 provided in the embodiments can be found in the specific description of the memory block 10 provided in any of the above embodiments where the storage structure is a charge trapping storage structure, and will not be repeated herein.

The memory cell corresponding to the above manufacturing method includes: a drain region portion 11', a channel portion 12', a source region portion 13', and a gate portion 2'. The drain region portion 11', the channel portion 12', and the source region portion 13' are stacked along the height direction Z, and the gate portion 2' is disposed on one side of the drain region portion 11', the channel portion 12', and the source region portion 13', and along the height direction Z. In the height direction Z, a projection of the gate portion 2' at least partially coincides with a projection of the channel portion 12' on a projection plane, the projection plane extending along the height direction Z and the drain region portion 11'. A charge trapping storage structure portion is arranged between the gate portion 2' and the drain region portion 11', the channel portion 12', and the source region portion 13'.

The specific structure and position of the charge trapping storage structure portion can be found in the above description. Other structures and functions of the memory cell can be found in the description of the memory cell with the charge trapping storage structure portion 5' involved in the above embodiments, which will not be repeated herein.

Figure 28:
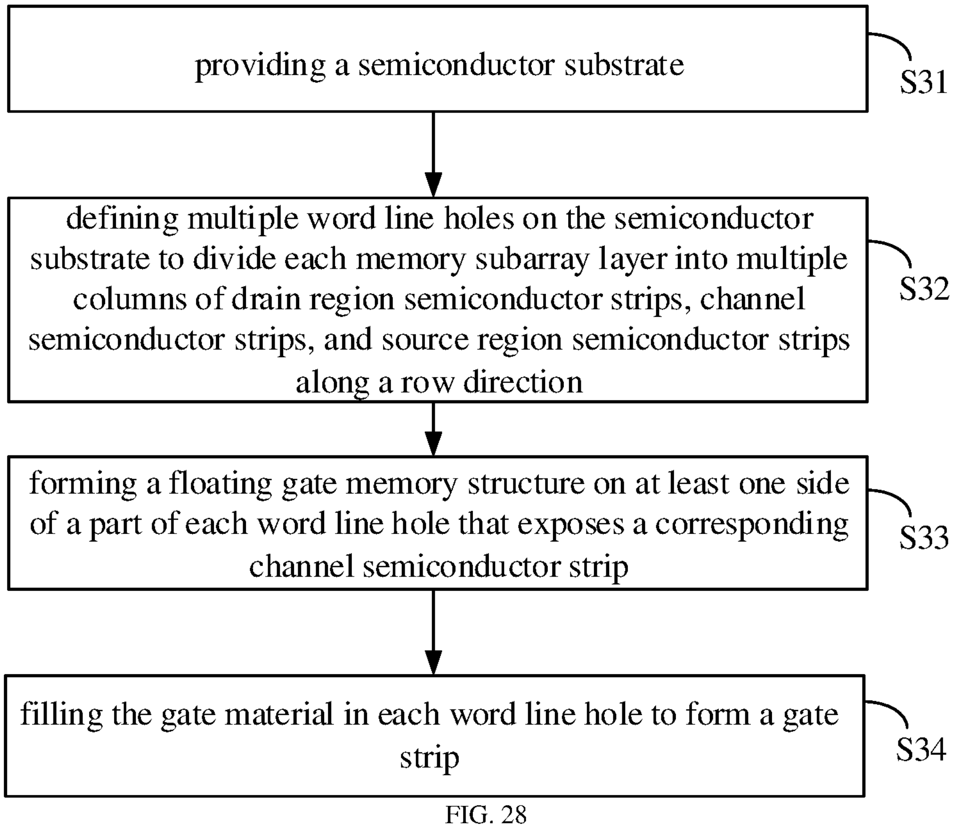
FIG. 28 is a flowchart of a manufacturing method of a memory block according to another embodiment of the present disclosure.

In other embodiments, referring FIG. 28, FIG. 28 is a flowchart of a manufacturing method of a memory block according to another embodiment of the present disclosure. A storage structure of the memory block 10 herein is a floating gate storage structure. Another manufacturing method of a memory block is provided, which may be configured to prepare the memory block 10 corresponding to FIGS. 9-FIG. 11 above. The method specifically includes operations at blocks illustrated in FIG. 28.

At step S31: providing a semiconductor substrate.

At step S32: defining multiple word line holes on the semiconductor substrate to divide each memory subarray layer into multiple columns of drain region semiconductor strips, channel semiconductor strips, and source region semiconductor strips along a row direction.

The specific implementation process of step S31-step S32 is the same or similar to the specific implementation process of step S21-step S22 above, and can achieve the same or similar technical effect, as can be seen above, which will not be repeated herein.

It should be noted that the subsequent steps are the relevant steps after the first single-crystal sacrificial semiconductor layer 82 and the second single-crystal sacrificial semiconductor layer 14 are replaced by the insulating isolation layer 14' using the word line holes 4. The relevant process steps of the embodiments are the same as the relevant process steps of the previous embodiments, and will not be repeated herein.

At step S33: forming a floating gate storage structure on at least one side of a part of each word line hole that exposes a corresponding channel semiconductor strip.

Step S33 may specifically include the following.

Step S331: forming a first insulating dielectric layer 85*a* on at least one side of a part of each word line hole 4 that exposes a corresponding drain region semiconductor strip 11, channel semiconductor strip 12, and source region semiconductor strip 13.

In some embodiments, step S331 specifically includes the following.

Step A: removing a part of the corresponding channel semiconductor strip 12 exposed by each word line hole 4 to define a first recess 84.

Figure 29:
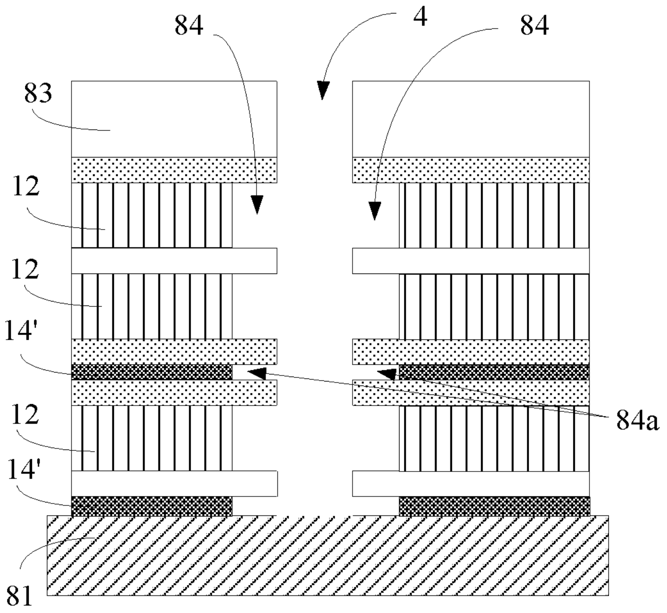
FIG. 29 is a schematic view of a structure at a specific operation of a manufacturing method of a memory block according to another embodiment of the present disclosure.
Figure 30:
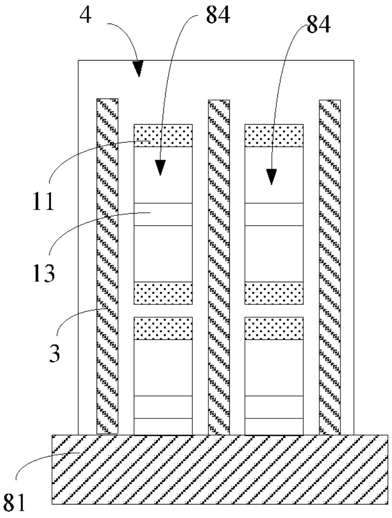
FIG. 30 is a schematic view of a structure at another specific operation of a manufacturing method of a memory block according to another embodiment of the present disclosure.

Referring to FIGS. 29-30, FIG. 29 is a schematic view of the structure shown in FIG. 24*b* defining the first recess 84; FIG. 30 is a cross-sectional view of the product corresponding to FIG. 29 in another direction. Specifically, parts of the channel semiconductor strips 12 exposed on both sides of each word line hole 4 may be removed by etching to define the first recesses 84, for example by acid etching.

In the embodiments, etching may be performed using an etchant with a high etch ratio for the channel semiconductor strips 12 and the insulating isolation layers 14', and with a low etch ratio for the drain region semiconductor strips 11 and the source region semiconductor strips 13. For example, when the drain region semiconductor strips 11 and the source region semiconductor strips 13 are N-type semiconductor strips and the channel semiconductor strips 12 are P-type semiconductor strips, then an etchant with a high etch ratio for the P-type semiconductor material and with a low etch ratio for the N-type semiconductor material may be applied for selective etching, such that only the parts of the channel semiconductor strips 12 and the insulating isolation layers 14' exposed on both sides of the word line hole 4 are etched, thereby defining the first recesses 84.

It will be understood by those skilled in the art that when acid etching is performed on a part of the channel semiconductor strips 12, the etchant etches a part of the insulating isolation layers 14' while etching the part of the channel semiconductor strip 12, defining third recesses 84*a*, as shown in FIG. 29. Although this etching is unfavorable, the third recesses 84*a* will be backfilled in subsequent steps, in particular with the same material as the insulating isolation layer 14'.

Although in FIG. 29, the third recesses 84*a* are formed by etching, in other embodiments, the third recesses 84*a* may not be necessarily formed when the etching selection ratio is well controlled.

Step B: filling the multiple first recesses 84 each with a first insulating dielectric 85.

Figure 31:
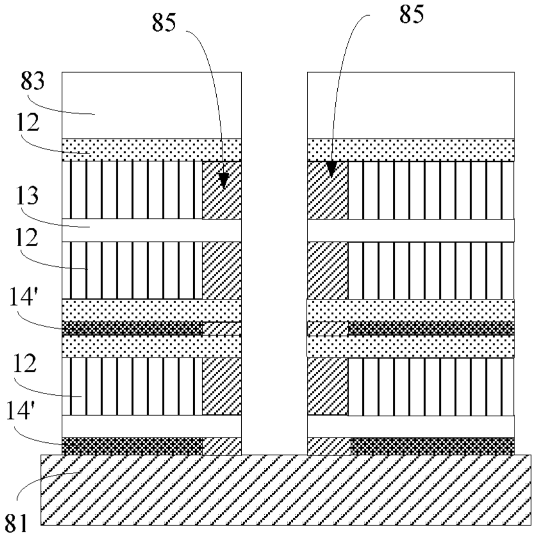
FIG. 31 is a schematic view of a structure at further another specific operation of a manufacturing method of a memory block according to another embodiment of the present disclosure.
Figure 32:
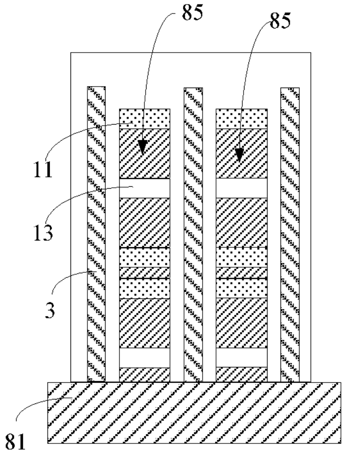
FIG. 32 is a schematic view of a structure at further another specific operation of a manufacturing method of a memory block according to another embodiment of the present disclosure.

Referring to FIGS. 31-32, FIG. 31 is a schematic view of the formation of the first insulating dielectric 85 on the structure shown in FIG. 29; FIG. 32 is a cross-sectional view in the F-direction of the product corresponding to FIG. 31. Specifically, the first insulating dielectric 85 may be filled in the first recesses 84 by deposition. The third recesses 84*a* may be also filled with the first insulating dielectric 85 by deposition. The first insulating dielectric 85 may be made of the same material as the insulating layer 14', e.g., silicon oxide.

When the first recesses 84 are filled with the first insulating dielectric 85, the third recess 84*a*, formed by etching off parts of the insulating layers 14', are also filled with the first insulating dielectric 85. Since the material of the first insulating dielectric 85 is silicon oxide, which is the same material as the insulating isolation layers 14', the device performance will not be affected.

Figure 33:
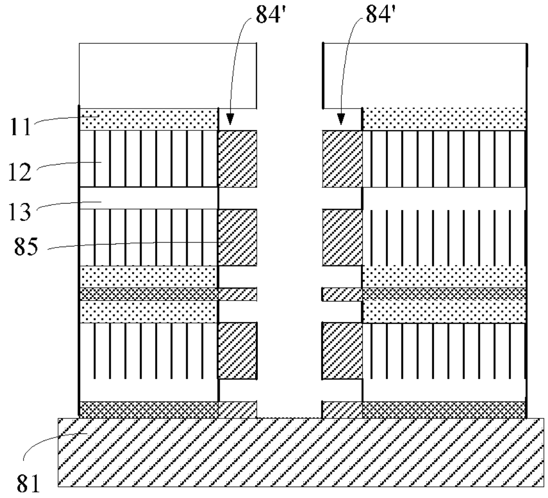
FIG. 33 is a schematic view of a structure at further another specific operation of a manufacturing method of a memory block according to another embodiment of the present disclosure.
Figure 34:
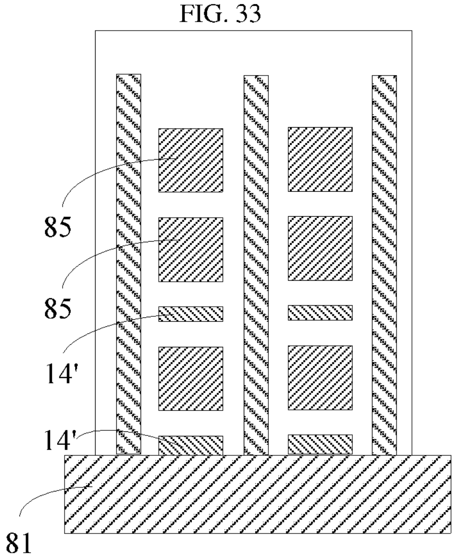
FIG. 34 is a schematic view of a structure at further another specific operation of a manufacturing method of a memory block according to another embodiment of the present disclosure.
Figure 35:
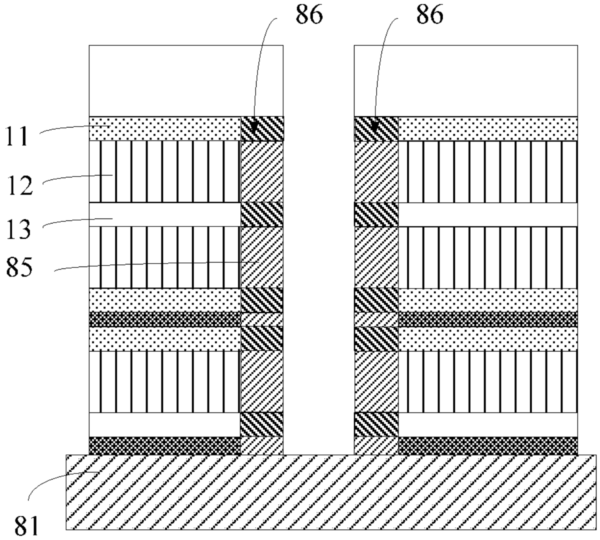
FIG. 35 is a schematic view of a structure at further another specific operation of a manufacturing method of a memory block according to another embodiment of the present disclosure.

In some embodiments, referring to FIGS. 33-35, FIG. 33 is a schematic view of the structure shown in FIG. 31 after defining the second recesses 84'; FIG. 34 is a cross-sectional view of the F-direction of the product corresponding to FIG. 33; and FIG. 35 is a schematic view of the structure shown in FIG. 33 after forming a second insulating dielectric 86. After step B, the method may further include the following.

Step C: removing parts of corresponding drain region semiconductor strips 11 and parts of corresponding source region semiconductor strips 13 exposed on both sides of each word line hole 4 to define multiple second recesses 84'; where each second recess 84' exposes at least a part of a corresponding first insulating dielectric 85.

The second recesses 84' may be defined by etching. A vertical cross-sectional view of the product after removing the parts of the drain region semiconductor strips 11 and the parts of the source region semiconductor strips 13 exposed on both sides of each word line hole 4 to define the multiple second recesses 84' can be seen in FIG. 33. Specifically, in this step, an etchant with a low etch ratio for the channel semiconductor strip 12 and with a high etch ratio for the drain region semiconductor strip 11 and source region semiconductor strips 13 may be applied. For example, when the drain region semiconductor strips 11 and the source region semiconductor strips 13 are N-type semiconductor strips and the channel semiconductor strips 12 are P-type semiconductor strips, an etchant with a high etch ratio for the N-type semiconductor material and with a low etch ratio for the P-type semiconductor material may be applied for selective etching, such that only the parts of the drain region semiconductor strips 11 and the parts of the source region semiconductor strips 13 exposed on both sides of the exposed line hole 4 are etched to define the second recesses 84'.

Step D: forming a second insulating dielectric 86 in each second recess 84'.

The second insulating dielectric 86 may be formed by deposition. The second insulating dielectric 86 may be made of silicon nitride. After Step D, step E is performed.

Step E: removing the first insulating dielectric 85 in the first recesses 84 to empty the first recesses 84, and depositing a first insulating dielectric layer 85*a* on walls of the first recesses 84.

Figure 36A:
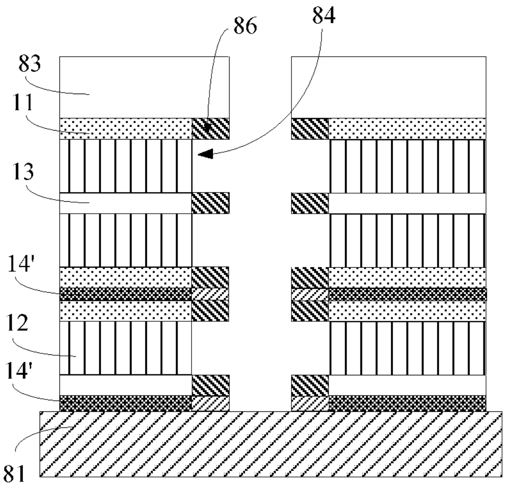
FIG. 36*a* is a schematic view of a structure at further another specific operation of a manufacturing method of a memory block according to another embodiment of the present disclosure.
Figure 36B:
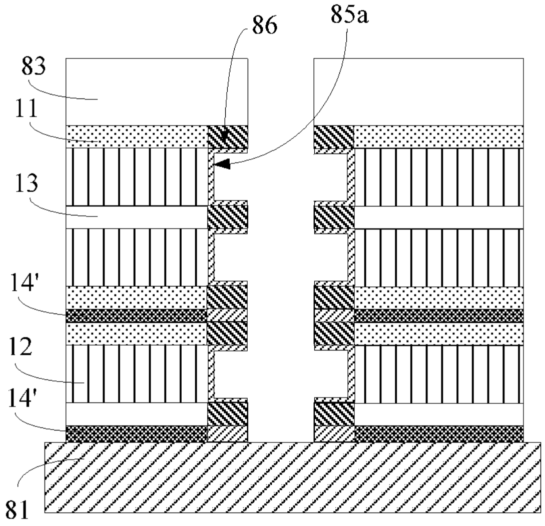
FIG. 36*b* is a schematic view of a structure at further another specific operation of a manufacturing method of a memory block according to another embodiment of the present disclosure.

As shown in FIGS. 36*a*-36*b*, FIG. 36*a* is a schematic view of the structure after removing the first insulating dielectric 85 in the first recesses 84; FIG. 36*b* is a schematic view of the structure shown in FIG. 35 forming the first insulating dielectric layer 85*a*. In this step, etching may be performed using an etchant with a high etch ratio for the first insulating dielectric 85 and with a low etch ratio for the second insulating dielectric 86, e.g., an etchant with a high etch ratio for silicon oxide and with a low etch ratio for silicon nitride. Further, by controlling the amount of etchant, etch speed, and etch time to etch off the first insulating dielectric 85. Thereafter, a first insulating dielectric layer 85*a* is formed by deposition or growth in the first recesses 84 where the first insulating dielectric 85 was etched off; the first insulating dielectric layer 85*a* has a gate-shaped (U-shaped) cross-section for defining a floating gate slot.

Step S332: forming a floating gate 54 on a side surface of a part of the first insulating dielectric layer 85*a* away from a corresponding channel semiconductor strip 12.

Figure 37:
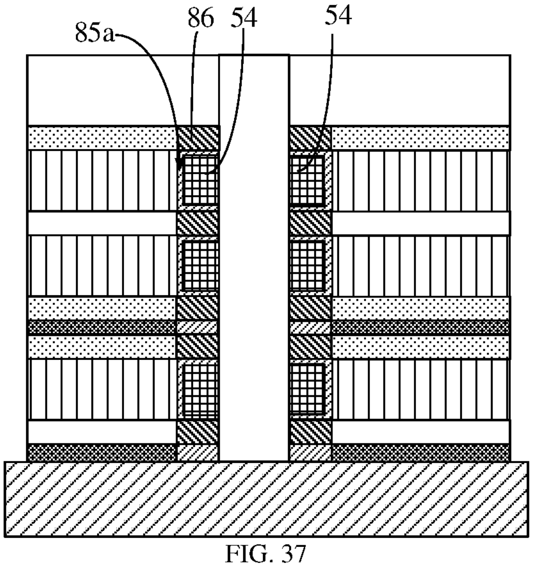
FIG. 37 is a schematic view of a structure at further another specific operation of a manufacturing method of a memory block according to another embodiment of the present disclosure.
Figure 38:
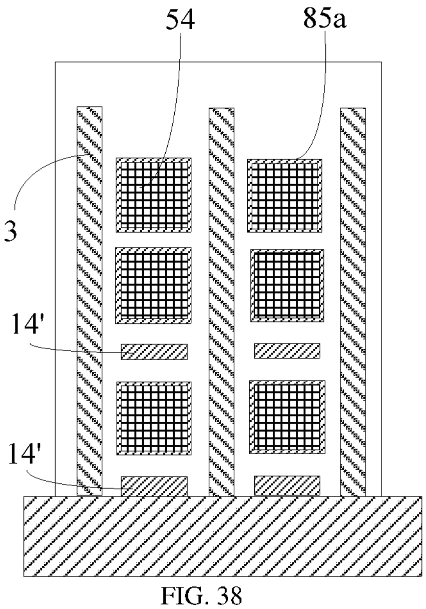
FIG. 38 is a schematic view of a structure at further another specific operation of a manufacturing method of a memory block according to another embodiment of the present disclosure.

The structure of the product after step S332 can be seen in FIGS. 37-38. FIG. 37 is a schematic view of the structure shown in FIG. 36*b* forming the floating gate 54; FIG. 38 is a cross-sectional view of the product corresponding to FIG. 37 in another direction.

Specifically, a floating gate material may be deposited in the floating gate slot to form the floating gate 54, and the floating gate material may include polycrystalline silicon material.

Step S333: forming a second insulating dielectric layer 85*b* on a side wall of each word line hole, and the second insulating dielectric layer 85*b* cooperates with the first insulating dielectric layer 85*a* to wrap any surface of each floating gate 54.

Figure 39A:
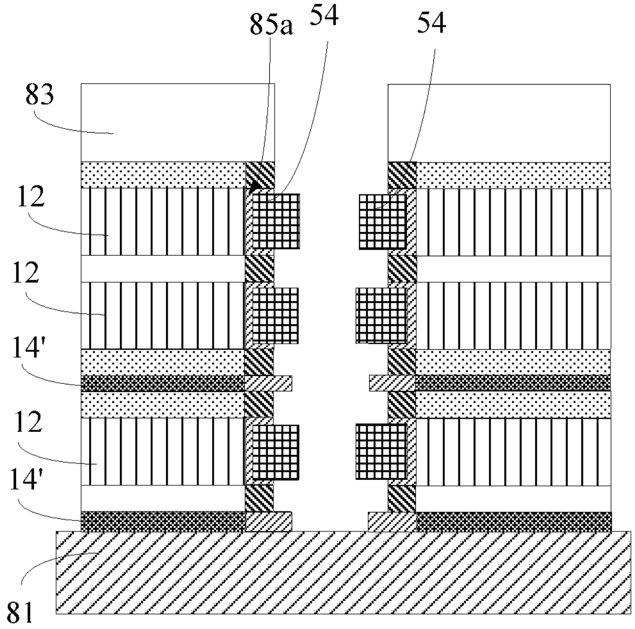
FIG. 39*a* is a schematic view of a structure at further another specific operation of a manufacturing method of a memory block according to another embodiment of the present disclosure.

In some embodiments, referring to FIG. 39*a*, FIG. 39 is a schematic view of the structure after removing a part of the first hard mask layer around each word line hole and a part of the second insulating dielectric in each second recess. Step S333 may specifically include the following.

Step 3331: removing a part of the first hard mask layer 83 around each word line hole 4 and a part of the second insulating dielectric 86 in each second recess 84', to widen the word line hole 4 and expose at least a part of each floating gate 54.

It will be understood that after Step 3331, the first insulating dielectric layer 85*a* wraps only a part of the floating gate 54.

Figure 39B:
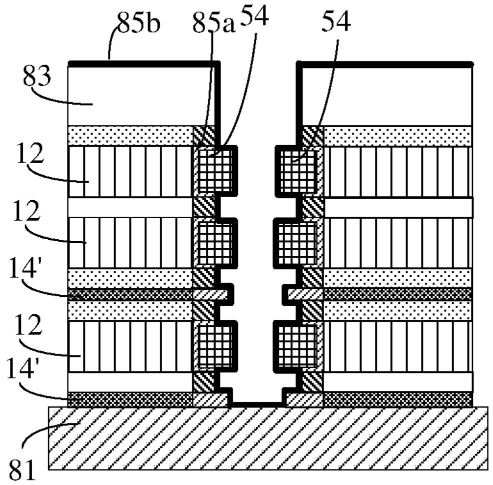
FIG. 39*b* is a schematic view of a structure at further another specific operation of a manufacturing method of a memory block according to another embodiment of the present disclosure.
Figure 40:
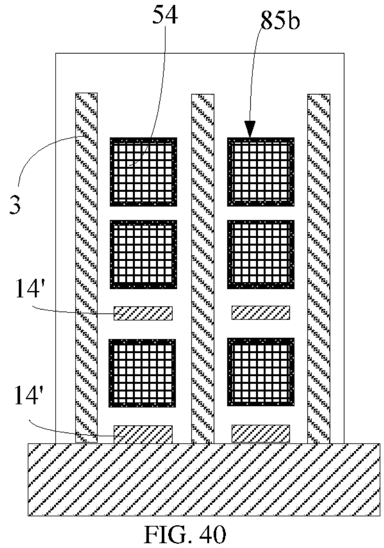
FIG. 40 is a schematic view of a structure at further another specific operation of a manufacturing method of a memory block according to another embodiment of the present disclosure.

Referring to FIGS. 39*b*-40, FIG. 39*b* is a schematic view of the second insulating dielectric layer 85*b*; FIG. 40 is a cross-sectional view of the F-direction of the product corresponding to FIG. 39*b*.

Step 3332: forming the second insulating dielectric layer 85*b* on the side wall of each of widened word line hole 4 such that the second insulating dielectric layer 85*b* wraps around an exposed portion of each floating gate 54.

As can be seen in FIG. 39*b*, the first insulating dielectric layer 85*a* and the second insulating dielectric layer 85*b* completely wrap and isolate various surfaces of the floating gates 54. The second insulating dielectric layer 85*b* includes a multilayer structure including a silicon oxide layer, a silicon nitride layer, and another silicon oxide layer. By widening the word line hole 4, it is ensured that the second insulating dielectric layer 85*b* partially covers each of five surfaces of the floating gate 54. In this way, the second insulating dielectric layer 85*b* and the first insulating dielectric layer 85*a* can wrap any surface of the floating gate 54. Specifically, as shown in FIG. 39*b*, a part of the second insulating dielectric layer 85*b* covers the five surfaces of each floating gate 54, where four of the five surfaces of each floating gate 54 are at least partially covered by the part of the second insulating dielectric layer 85*b* and the remaining one of the five surfaces is fully covered by the second insulating dielectric layer 85*b*. Further, the first insulating dielectric layer 85*a*, in addition to covering the surface of the floating gate 54 near the channel semiconductor strip 12, also covers parts of the other four surfaces of the floating gate 54. Therefore, the first insulating dielectric layer 85*a*, in conjunction with the second insulating dielectric layer 85*b*, may wrap all surfaces of the floating gates 54.

Step S34: filling the gate material in each word line hole to form a gate strip.

Figure 41:
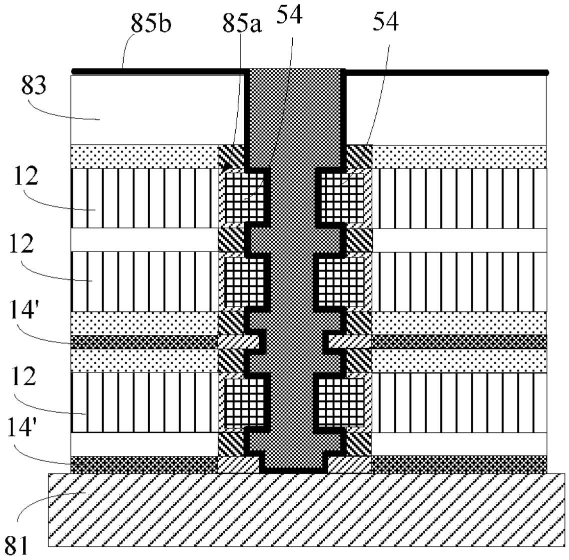
FIG. 41 is a schematic view of a structure at further another specific operation of a manufacturing method of a memory block according to another embodiment of the present disclosure.
Figure 42:
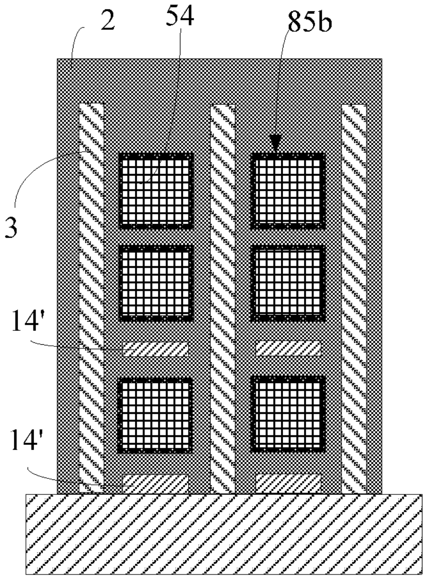
FIG. 42 is a schematic view of a structure at further another specific operation of a manufacturing method of a memory block according to another embodiment of the present disclosure.

The structure of the product after step S34 can be seen in FIGS. 41-42, where FIG. 41 is a schematic view of the formation of gate strips 2; FIG. 42 is a cross-sectional view of the product corresponding to FIG. 41 in another direction. The gate strip 2 wraps all other surfaces of the floating gate 54 other than those wrapped by the first insulating dielectric layer 85*a* to improve the coupling rate. That is, a surface of the gate strip 2 extends in the extension direction of the second insulating dielectric layer 85*b*, thereby sandwiching the second insulating dielectric layer 85*b* and wrapping the five surfaces of the floating gate 54, and four of the five surfaces of the floating gate 54 are at least partially wrapped by the gate strip 2 through the second insulating dielectric layer 85*b*. The specific structure of each memory cell in the memory block 10 produced by this manufacturing method can be seen in FIG. 10.

A projection of at least a part of each gate strip 2 coincides with a projection of a part of a corresponding channel semiconductor strip 12 in each memory subarray layer 1*a* on a projection plane, the projection plane extending along the height direction Z and the column direction Y. A part of the gate strip 2, a corresponding part of the channel semiconductor strip 12, a part of the drain region semiconductor strip 11 adjacent to the corresponding part of the channel semiconductor strip 12, a part of the source region semiconductor strip 13 adjacent to the corresponding part of the channel semiconductor strip 12, and a part of a corresponding floating gate storage structure, form a memory cell.

In the embodiments, the storage structure 5 is a floating gate storage structure, as above, and the floating gate storage structure is characterized by the fact that the charge injected in can be uniformly distributed in the entire floating gate 54, and the charge can move not only in the injection/removal direction (substantially perpendicular to the extension direction of the floating gate), but also in the floating gate 54, particularly in the extension direction of the floating gate 54. Therefore, in the floating gate storage structure, the floating gate 54 of each memory cell is independent, and each surface of each floating gate 54 is required to be covered by an insulating dielectric to be isolated from each other, thereby preventing the charges stored in the floating gates 54 in one memory cell from moving to the floating gates 54 in other memory cells. Therefore, in the manufacturing method thereof, the floating gate 54 of each memory cell is independent, and the insulating dielectric formed by the first insulating dielectric layer 85*a* and the second insulating dielectric layer 85*b* can completely wrap and isolate the various surfaces of the floating gates 54, such that the floating gates 54 of each memory cell are independent and the charge stored in each floating gate 54 cannot move to the floating gates 54 of other memory cells.

Specifically, the manufacturing method may be configured to prepare the memory block involved in the following embodiments. The memory block 10 includes a memory array 1, which includes multiple memory cells distributed in a three-dimensional array. The memory array 1 includes multiple stacked structures 1*b* distributed along the row direction X, each stacked structure 1*b* extending along the column direction Y, and each stacked structure 1*b* includes drain region semiconductor strips 11, channel semiconductor strips 12, and source region semiconductor strips 13 stacked along the height direction Z. Each drain region semiconductor strip 11, channel semiconductor strip 12, and source region semiconductor strip 13 extends along column direction Y, and each drain region semiconductor strip 11, channel semiconductor strip 12, and source region semiconductor strip 13 is a single-crystal semiconductor strip.

Multiple gate strips 2 are arranged on each of two sides of each stacked structure 1*b* along the column direction Y, and each gate strip 2 extends along the height direction Z. In the height direction Z, a projection of at least a part of each gate strip 2 coincides with a projection of a part of a corresponding channel semiconductor strip 12 on a projection plane extending along the height direction Z and the column direction Y. A part of the gate strip 2, a corresponding part of the channel semiconductor strip 12, a part of the drain region semiconductor strip 11 adjacent to the corresponding part of the channel semiconductor bar 12, and a part of the source region semiconductor strip 13 adjacent to the corresponding part of the channel semiconductor bar 12 form a memory cell. Specifically, a floating gate storage structure is arranged between each gate strip 2 and corresponding drain region semiconductor strips 11, channel semiconductor strips 12, and source region semiconductor strips 13 in the multiple memory subarray layers 1*a*. The floating gate storage structure includes multiple first insulating dielectric layers 85*a*, multiple floating gates 54, and the second insulating dielectric layer 85*b*. Each first insulating dielectric layer 85*a* is disposed between at least a corresponding channel semiconductor strip 12 and a corresponding floating gate 54, the floating gate 54 is located disposed a corresponding first insulating dielectric layer 85*a* and the second insulating dielectric layer 85*b*, and the second dielectric layer 85*b* is disposed between the floating gates 54 and the gate strip 2.

Specifically, each stacked structure 1*b* includes multiple stacked substructures, each stacked substructure including a drain region semiconductor strip 11, a channel semiconductor strip 12, a source region semiconductor strip 13, a channel semiconductor strip 12, and a drain region semiconductor strip 11 stacked sequentially along the height direction Z to share the same source region semiconductor strip 13. Specifically, an interlayer isolation layer is arranged between two adjacent stacked substructures to isolate the two adjacent stacked substructures from each other.

Multiple isolation walls 3 distributed along the column direction Y are arranged on each side of each stacked structure 1*b*, and each isolation wall 3 extends along the height direction Z and the row direction X to separate at least part of the two adjacent columns of the stacked structures 1*b*. The isolation walls 3 further serve as support structures to support the two adjacent columns of the stacked structures 1*b*. The isolation wall 3 near an edge of the memory block 10 in the column direction Y is a T-shaped wall to completely isolate the two adjacent columns of the stacked structures 1*b*.

In the column direction Y, a gate strip 2 is arranged between two adjacent isolation walls 3 on the same column; parts of two adjacent columns of the stacked structures 1*b* share the same gate strip 2.

Other structures and functions of the memory block 10 provided in the embodiments can be found in the specific description of the memory block 10 provided in any of the above embodiments where the storage structure is a floating gate storage structure, and will not be repeated herein.

The memory cell corresponding to the above manufacturing method includes: a drain region portion 11', a channel portion 12', a source region portion 13', and a gate portion 2'. The drain region portion 11', the channel portion 12', and the source region portion 13' are stacked along the height direction Z, and the gate portion 2' is disposed on one side of the drain region portion 11', the channel portion 12', and the source region portion 13', and along the height direction Z. In the height direction Z, a projection of the gate portion 2' and a projection the channel portion 12' on a projection plane extending along the height direction Z at least partially coincide, the projection plane being located on a side of the drain region portion 11', the channel portion 12', and the source region portion 13' and extending along the height direction Z and column direction Y. A floating gate storage structure portion is arranged between the gate portion 2' and the drain region portion 11', the channel portion 12', and the source region portion 13'.

The floating gate storage structure portion specifically includes a corresponding first insulating dielectric layer 85*a*, a corresponding floating gate 54, and a part of the second insulating dielectric layer 85*b*. The first insulating dielectric layer 85*a* is disposed between the channel portion 12' and the floating gate 54, the floating gate 54 is disposed between the first insulating dielectric layer 85*a* and the part of the second insulating dielectric layer 85*b*, and the part of the second insulating dielectric layer 85*b* is disposed between the floating gate 54 and the gate strip 2. The part of the second insulating dielectric layer 85*b* covers five surfaces of the floating gate 54. One of the five surfaces of the floating gate 54 is fully covered by the second insulating dielectric layer 85*b*. The part of the second insulating dielectric layer 85*b* includes a multilayer structure including a part of a silicon oxide layer, a part of a silicon nitride layer, and a part of another silicon oxide layer.

Other structures and functions of the memory cell can be found in the description of the memory cell for which the storage structure portion 5' is a floating gate storage structure portion involved in the above-described embodiments, and will not be repeated herein.

Figure 43:
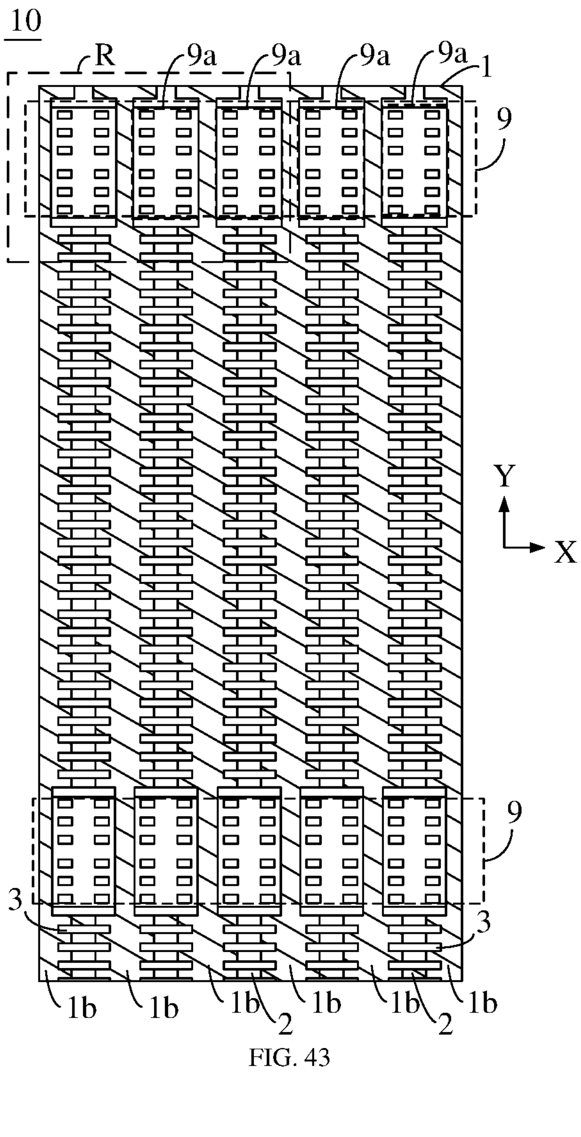
FIG. 43 is a plan schematic view of a memory block according to further another embodiment of the present disclosure.
Figure 44:
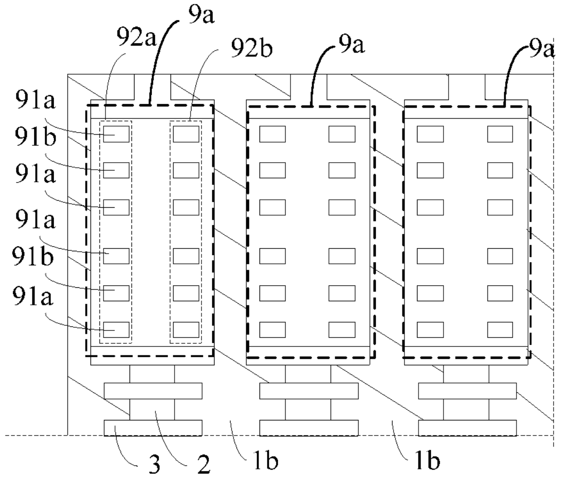
FIG. 44 is an enlarged view of region R circumscribed in FIG. 43.

Referring to FIGS. 1 to 44, FIG. 43 is a plan schematic view of a memory block according to further another embodiment of the present disclosure; and FIG. 44 is an enlarged view of region R in FIG. 43. In the embodiments, another memory block 10 is provided, which differs from the memory block 10 provided in any of the above embodiments in that the memory block 10 further includes multiple drain/source connection terminal arrays 9. The multiple drain/source connection terminal arrays 9 are arranged on the memory array 1, with a drain/source connection terminal array 9 arranged at a predetermined interval of the memory array 1 in the column direction Y. It should be noted that the planar schematic views involved in the present disclosure are only part of the schematic views of the corresponding structure, and the other side edge of the corresponding structure are not shown.

Figure 45:
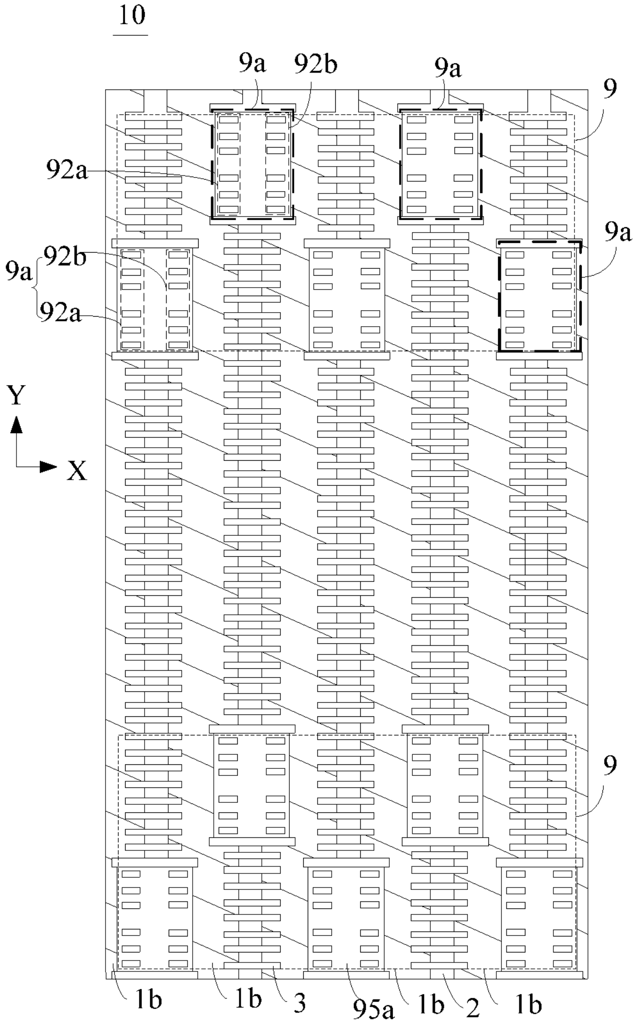
FIG. 45 is a plan schematic view of a memory block according to further another embodiment of the present disclosure.

As shown in FIG. 43, each drain/source connection terminal array 9 includes multiple drain/source connection terminal subarrays 9*a* distributed along the row direction X. The multiple drain/source connection terminal subarrays 9*a* distributed along the row direction X in each drain/source connection terminal array 9 are aligned with each other in column direction Y. Alternatively, as shown in FIG. 45, the multiple drain/source connection terminal arrays 9 are aligned with each other in the column direction Y. Alternatively, as shown in FIG. 45, FIG. 45 is a top schematic view of a memory block according to further another embodiment of the present disclosure. Each drain/source connection terminal array 9 includes multiple drain/source connection terminal subarrays 9*a* distributed along the row direction X, and each two adjacent drain/source connection terminal subarrays 9*a* are staggered with each other in the column direction Y; in this way, it may be avoided that two adjacent drain/source connection terminal subarrays 9*a* in the column direction Y interrupt each other due to the limited size of the memory array 1.

In conjunction with FIG. 44, each drain/source connection terminal subarray 9*a* includes multiple drain/source connection terminals 91*a*/91*b* disposed along the row direction X, i.e., including multiple drain connection terminals 91*a* and multiple source connection terminals 91*b*. Each drain/source connection terminal 91*a*/91*b* is connected to a drain region/source region semiconductor strip 11/13 in a corresponding column of semiconductor strip structures 1*b*, respectively, and each drain/source connection terminal 91*a*/91*b* in each drain/source connection terminal subarray 9*a* is connected to the drain/source region semiconductor strips 11/13 in corresponding two adjacent columns of semiconductor strip structures 1*b*. That is, some of the multiple drain/source ends 91*a*/91*b* in each drain/source end subarray 9*a* are connected to some of the drain/source region semiconductor strips 11/13 in one column of semiconductor strip structures 1*b*, others are connected to some of the drain/source region semiconductor strips 11/13 in another adjacent column of semiconductor strip structures 1*b*.

Figure 46:
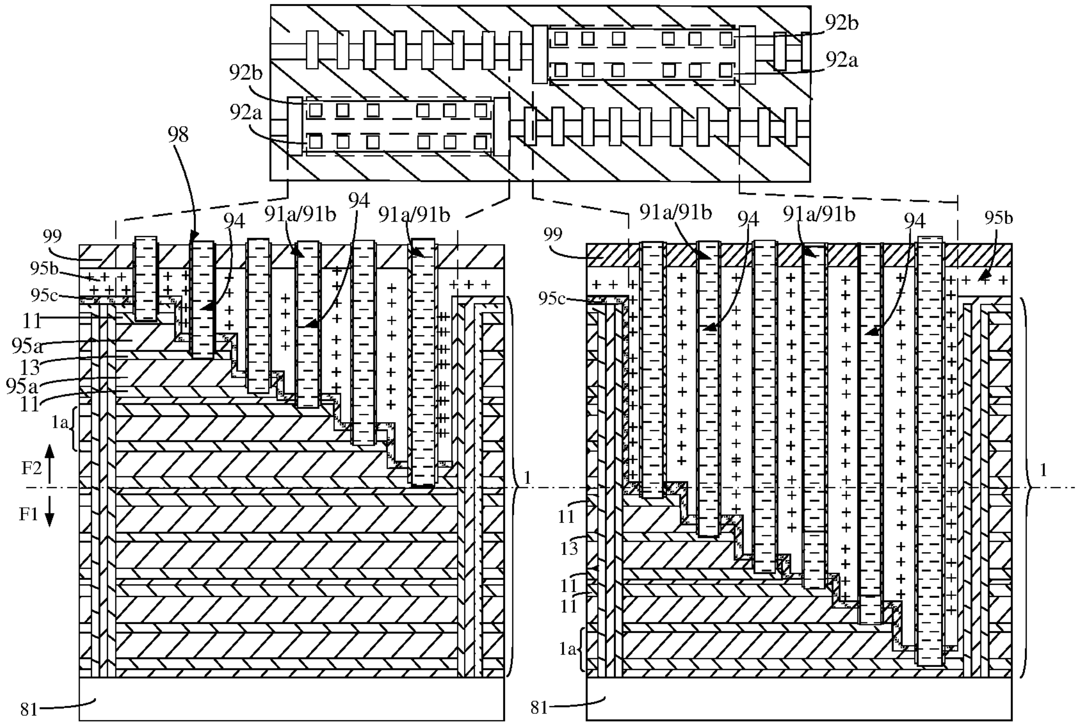
FIG. 46 is a schematic view of a first drain/source connection terminal group and a second drain/source connection terminal group of a drain/source connection terminal subarray, each connected to a corresponding drain/source region semiconductor strip according to an embodiment of the present disclosure.

Referring to FIG. 45 and FIG. 46, FIG. 46 is a schematic view of a first drain/source connection terminal group 92*a* and a second drain/source connection terminal group 92*b* of a drain/source connection terminal subarray 9*a*, each connected to a corresponding drain/source region semiconductor strip 11/13 according to an embodiment of the present disclosure. Each drain/source connection terminal array 9 includes multiple first-type drain/source connection terminal subarrays and multiple second-type drain/source connection terminal subarrays alternately distributed along the row direction X. In the embodiments, as shown in FIG. 45 and FIG. 46, the drain/source connection terminal subarray 9*a* above along the column direction Y in the same drain/source connection terminal array 9 may be a first-type drain/source connection terminal subarray, while the drain/source connection terminal subarray 9*a* below may be a second-type drain/source connection terminal subarray. The first-type drain/source connection terminal subarray is connected drain/source region semiconductor strips 11/13 in a low zone F1 of a corresponding column of semiconductor strip structures 1*b*, and the second-type drain/source connection terminal subarray is connected to drain/source region semiconductor strips 11/13 in a high zone F2 of a corresponding column of semiconductor strip structures 1*b*, and the two above-mentioned columns may be the same or different.

Each drain/source connection terminal subarray 9*a* of the multiple first-type drain/source connection terminal subarrays and the second-type drain/source connection terminal subarrays includes a first drain/source connection terminal group 92*a* and a second drain/source connection terminal group 92*b*. As shown in FIG. 46, the multiple drain/source connection terminals 91*a*/91*b* in the first drain/source connection terminal group 92*a* are each connected to a part of a drain/source region semiconductor strip 11/13 in a corresponding column of semiconductor strip structures 1*b* by a corresponding drain/source connection plug 94; and the multiple drain/source connection terminals 91*a*/91*b* in the second drain/source connection terminal group 92*b* are each connected to a part of a drain/source region semiconductor strip 11/13 in an adjacent column of semiconductor strip structures 1*b* by a corresponding drain/source connection plug 94. Each drain/source connection terminal 91*a*/91*b* in the first drain/source connection terminal group 92*a* corresponds to a drain/source connection plug 94; and each drain/source connection terminal 91*a*/91*b* in the second drain/source connection terminal group 92*b* corresponds to a drain/source connection plug 94.

The multiple drain/source connection terminals 91*a*/91*b* in the first drain/source connection terminal group 92*a* of the first-type drain/source connection terminal subarray correspond to the drain/source region semiconductor strips 11/13 of the low zone F1 of one of the two corresponding adjacent columns of semiconductor strip structures 1*b*; and the multiple drain/source connection terminals 91*a*/91*b* in the first drain/source connection terminal group 92*a* are connected to the drain/source region semiconductor strips 11/13 of the low zone F1 of the corresponding column of semiconductor strip structures 1*b* by multiple drain/source connection plugs 94. Each drain/source connection terminal 91*a*/91*b* of the first drain/source connection terminal group 92*a* corresponds to a drain/source connection plug 94. It will be understood by those skilled in the art that an exposed part of the drain/source connection plugs 94 may serve as the corresponding drain/source connection terminal 91*a*/91*b*.

Those skilled in the art can understand that the same drain/source region semiconductor strip 11/13 in any of the above-mentioned columns of semiconductor strip structures 1*b* corresponds to multiple corresponding drain/source connection terminals 91*a*/91*b* in a corresponding column of one or more drain/source connection terminal arrays 9. For example, in conjunction with FIG. 43, the second column of semiconductor strip structures 1*b* corresponds to two drain/source connection terminal arrays 9 (a first drain/source connection terminal array 9 and a second drain/source connection terminal array 9), and first drain region semiconductor strips 11 in the column of semiconductor strip structures 1*b* are correspondingly connected to a drain connection terminal 91*a* of the first drain/source connection terminal array 9 of the corresponding column in the column direction Y, and correspondingly connected to a drain connection terminal 91*a* of the second drain/source connection terminal arrays 9 of the corresponding column in the column direction Y.

In this way, each drain/source region semiconductor strip 11/13 can be connected to multiple drain/source connection terminals 91*a*/91*b*, such that a part of each drain/source region semiconductor strip 11/13 that is at corresponding positions of two adjacent drain/source connection terminals 91*a*/91*b* may directly transmit signals through the drain/source connection terminals 91*a*/91*b* at the corresponding positions, for performing read (RD), program (PGM), and other operations; compared with leading through a connection line at the end of each drain/source region semiconductor strip 11/13 (i.e., the edge portion of the memory block 10) and performing related operations of the entire drain/source region semiconductor strip 11/13 through the connection line, the resistance may be reduced to facilitate signal transmission and improve the speed of read (RD), program (PGM), and other operations of the memory block 10 in the present disclosure.

The multiple drain/source connection terminals 91*a*/91*b* of the second drain/source connection terminal group 92*b* in the first-type drain/source connection terminal subarray correspond to the drain/source region semiconductor strips 11/13 of the low zone F1 of the other of the two corresponding adjacent columns of semiconductor strip structures 1*b*; and the multiple drain/source connection terminals 91*a*/91*b* in the second drain/source connection terminal group 92*b* are connected the drain/source region semiconductor strips 11/13 of the low zone F1 of the other of the two corresponding adjacent columns of semiconductor strip structures 1*b* through multiple drain/source connection plugs 94.

It should be noted that the drain/source region semiconductor strips 11/13 of the low zone F1 and the high zone F2 of the column of semiconductor strip structures 1*b* involved in the present disclosure may be divided by a middle layer of the column of semiconductor strip structures 1*b* as a dividing line. For example, when the column of semiconductor strip structures 1*b* corresponds to eight layers of memory subarray layer 1*a*, the drain/source region semiconductor strips 11/13 of the low zone F1 of the column of semiconductor strip structures 1*b* refers to the drain/source region semiconductor strip 11/13 corresponding to the fifth memory subarray layer 1*a* to the eighth memory subarray layer 1*a* counting from top to bottom, and the drain/source region semiconductor strip 11/13 of the high zone F2 of the column of semiconductor strip structures 1*b* refers to the drain/source region semiconductor strips 11/13 corresponding to the first memory subarray layer 1*a* to the fourth memory subarray layer 1*a* from top to bottom.

The multiple drain/source connection terminals 91*a*/91*b* in the first drain/source connection terminal group 92*a* of the second-type drain/source connection terminal subarray correspond to the drain/source region semiconductor strips 11/13 of the high zone F2 of one of the two corresponding adjacent columns of semiconductor strip structures 1*b*; and the multiple drain/source connection terminals 91*a*/91*b* in the first drain/source connection terminal group 92*a* are connected to the drain/source region semiconductor strips 11/13 of the high zone F2 of the corresponding column of semiconductor strip structures 1*b* by multiple drain/source connection plugs 94. Each drain/source connection terminal 91*a*/91*b* of the first drain/source connection terminal group 92*a* corresponds to a drain/source connection plug 94.

The multiple drain/source connection terminals 91*a*/91*b* of the second drain/source connection terminal group 92*b* in the second-type drain/source connection terminal subarray correspond to the drain/source region semiconductor strips 11/13 of the high zone F2 of the other of the two corresponding adjacent columns of semiconductor strip structures 1*b*; and the multiple drain/source connection terminals 91*a*/91*b* in the second drain/source connection terminal group 92*b* are connected the drain/source region semiconductor strips 11/13 of the high zone F2 of the other of the two corresponding adjacent columns of semiconductor strip structures 1*b* through multiple drain/source connection plugs 94. Each drain/source connection terminal 91*a*/91*b* of the second drain/source connection terminal group 92*b* corresponds to a drain/source connection plug 94.

For example, in conjunction with FIG. 44, the drain/source connection terminal array 9 includes a first-type drain/source connection terminal subarray, a second-type drain/source connection terminal subarray, and a first-type drain/source connection terminal subarray alternately distributed along the row direction X. Therein, from left to right, the multiple drain/source connection terminals 91*a*/91*b* in the first drain/source connection terminal group 92*a* of the first first-type drain/source connection terminal subarray are correspondingly connected to the drain/source region semiconductor strips 11/13 of the low zone F1 of the first column of semiconductor strip structures 1*b*; the multiple drain/source connection terminals 91*a*/91*b* in the second drain/source connection terminal group 92*b* of the first first-type drain/source connection terminal subarray are correspondingly connected to the drain/source region semiconductor strips 11/13 of the low zone F1 of the second column of semiconductor strip structures 1*b*. For the first second-type drain/source connection terminal subarray adjacent to the first first-type drain/source connection terminal subarray, the multiple drain/source connection terminals 91*a*/91*b* in the first drain/source connection terminal group 92*a* of the first second-type drain/source connection terminal subarray are correspondingly connected to the drain/source region semiconductor strips 11/13 of the high zone F2 of the second column of semiconductor strip structures 1*b*; the multiple drain/source connection terminals 91*a*/91*b* in the second drain/source connection terminal group 92*b* of the first second-type drain/source connection terminal subarray are correspondingly connected to the drain/source region semiconductor strips 11/13 of the high zone F2 of the third column of semiconductor strip structures 1*b*.

In other embodiments, referring further to FIG. 45, the multiple drain/source connection terminal arrays 9 includes multiple first-type drain/source connection terminal arrays and multiple second-type drain/source connection terminal arrays alternately distributed along the column direction Y in the same column. In the embodiments, as shown in FIG. 45, the upper drain/source connection terminal arrays 9 may be the first-type drain/source connection terminal arrays, and the lower drain/source connection terminal arrays 9 may be the second-type drain/source connection terminal arrays.

The first drain/source connection terminal group 92*a* in each drain/source connection terminal subarray 9*a* of each first-type drain/source connection terminal array (e.g., an upper drain/source connection terminal array 9) is configured to be connected to drain/source region semiconductor strips 11/13 of the low zone F1 in a corresponding column of semiconductor strip structures 1*b*. The second drain/source connection terminal group 92*b* in each drain/source connection terminal subarray 9*a* of each first-type drain/source connection terminal array is configured to be connected to drain/source region semiconductor strips 11/13 of the low zone F1 in another adjacent corresponding column of semiconductor strip structures 1*b*. That is, each drain/source connection terminal group 92*a*/92*b* in the same drain/source connection terminal array 9 is configured to be connected to drain/source region semiconductor strips 11/13 of either the low zone F1 or the high zone F2.

The first drain/source connection terminal group 92*a* in each drain/source connection terminal subarray 9*a* in each second-type drain/source connection terminal array (e.g., the lower drain/source connection terminal array 9) is configured to be connected to drain/source region semiconductor strips 11/13 of the high zone F2 in a corresponding column of semiconductor strip structures 1*b*; the second drain/source connection terminal group 92*b* in each drain/source connection terminal subarray 9*a* in each second-type drain/source connection terminal array is configured to be connected to drain/source region semiconductor strips 11/13 of the high zone F2 in another adjacent corresponding column of semiconductor strip structures 1*b*.

It will be understood by those skilled in the art that each of the drain/source connection terminal groups 92*a*/92*b* in one of the two adjacent drain/source connection terminal arrays 9 is configured to be connected to the drain/source region semiconductor strip 11/13 of the low zone F1; each of the drain/source connection terminal groups 92*a*/92*b* in the other drain/source connection terminal array 9 is configured to be connected to the drain/source region semiconductor strips 11/13 of the high zone F2.

As described above, in the above embodiments of the present disclosure, the drain/source region semiconductor strips 11/13 in each column of semiconductor strip structures 1*b* are connected to the drain/source connection terminals 91*a*/91*b* in corresponding two adjacent drain/source connection terminal subarrays 9*a* distributed in the row direction X, respectively; and/or, the drain/source region semiconductor strips 11/13 in each column of semiconductor strip structures 1*b* are connected to the drain/source connection terminals 91*a*/91*b* in corresponding two adjacent drain/source connection terminal subarrays 9*a* distributed in the column direction Y, respectively.

Of course, in other embodiments, it will be understood by those skilled in the art that each drain/source connection terminal subarray 9*a* in the drain/source connection terminal array 9 may have other designs as long as the drain/source connection terminals 91*a*/91*b* in the drain/source connection terminal subarray 9*a* may lead out the drain/source region semiconductor strips 11/13 in each corresponding column of semiconductor strip structures 1*b*.

For example, in some embodiments, each drain/source connection terminal array 9 includes multiple drain/source connection terminal subarrays 9*a* distributed in the X direction, each drain/source connection terminal subarray 9*a* including a first drain/source connection terminal group 92*a* and a second drain/source connection terminal group 92*b*, where multiple drain/source connection terminals 91*a*/91*b* in the first drain/source connection terminal group 92*a* correspond to drain/source region semiconductor strip 11/13 of the low zone F1 of one of corresponding two adjacent columns of semiconductor strip structures 1*b*; and multiple drain/source connection terminals 91*a*/91*b* in the second drain/source connection terminal group 92*b* corresponding to drain/source region semiconductor strips 11/13 of the high zone F2 of the other of the corresponding two adjacent columns of semiconductor strip structures 1*b*.

It will be understood by those skilled in the art that the above embodiments are merely examples, and that those skilled in the art may reasonably design based on the above principles.

Furthermore, it will be understood by those skilled in the art that the drain/source region semiconductor strips 11/13 corresponding to the high zone F2 and the low zone F1 may be selected to be connected to either drain/source connection terminal 91*a*/91*b*, as long as all of the drain/source region semiconductor strips 11/13 (S/D) are led out. For example, in the second drain/source connection terminal group 92*b*, the drain/source connection terminals 91*a*/91*b* may be connected to the drain/source region semiconductor strips 11/13 in the 1st, 5th, 6th, and 8th memory subarray layers 1*a* of a column of semiconductor strip structures 1*b*; while in the first drain/source connection terminal group 92*a*, the drain/source connection terminals 91*a*/91*b* may be connected to the drain/source region semiconductor strips 11/13 in the 2nd, 3rd, 4th, and 7th memory subarray layers 1*a* of a column of semiconductor strip structures 1*b*. The present disclosure is not limited in this respect.

Referring further to FIG. 46, the exposed parts of the drain/source connection plug 94 may serve as the drain/source connection terminals 91*a*/91*b*. In some embodiments, to further increase the signal transmission speed, the drain/source connection plug 94 may be made of a material with a much less resistance than the drain/source region semiconductor strip 11/13. For example, the drain/source connection plug 94 may be made of any one or more of four metals: copper/titanium/tin/tungsten.

In order to prevent the contact between the channel semiconductor strip 12 and the drain/source connection plug 94 from causing a short circuit, a first insulating material 95*a* (as described in FIG. 53 below and related descriptions) may be arranged between the drain/source connection plugs 94 and the channel semiconductor strips 12, and the first insulating material 95*a* may be made of silicon oxide.

Further, in order to save the photomask and lead out the drain/source region semiconductor strips 11/13 at different heights in each column of the semiconductor strip structures 1*b*, as shown in FIG. 46, in each column of semiconductor strip structures 1*b*, positions of the drain/source region semiconductor strips 11/13 configured to be connected to the drain/source connection terminal subarray 9*a* are distributed in a step-like manner from top to bottom. In this way, each layer of first insulating material 95*a* and the corresponding drain/source region semiconductor strip 11/13 of the high zone F2 and the low zone F1 are at least partially exposed relative to the first insulating material 95*a* and drain/source region semiconductor strip 11/13 in the upper layer.

The first insulating material 95*a* is arranged between the adjacent drain region semiconductor strip 11 and the source region semiconductor strip 13. A filling material 95*b* and a second hard mask layer 99 are arranged on the step-like drain/source region semiconductor strips 11/13. The second hard mask layer 99 is disposed on a side surface of the filling material 95*b* away from the column of semiconductor strip structures 1*b*. Drain/source connection terminal holes 98 are defined in the filling material 95*b*, and each drain/source connection terminal hole 98 is filled with a conductive material to form the drain/source connection terminal 91*a*/91*b* and the drain/source connection plug 94. Since polycrystalline silicon has better fillability, the filling material 95*b* may be selected from polycrystalline silicon. When the filling material 95*b* is made of polysilicon, an insulating layer 95*c* may be further arranged on the step-like drain/source region semiconductor strips 11/13 and the filling material 95*b* is specifically arranged on the insulating layer 95*c*. It is understood by those skilled in the art that when the filling material 95*b* is made of an insulating material, such as silicon oxide, it is not necessary to form the insulating layer 95*c* on the step-like drain/source region semiconductor strips 11/13 and it is sufficient to fill the filling material 95*b* directly; in this case, a spacing dielectric layer on a side wall of the drain/source connection terminal hole 98 is not necessarily arranged.

It can be understood that the drain/source connection plug 94 is specifically inserted in the filling material 95*b* and extends to a surface of the corresponding drain/source region semiconductor strip 11/13 to be connected with it. The drain/source connection terminals 91*a*/91*b* are specifically disposed in the second hard mask layer 99 and are exposed through a side surface of the second hard mask layer 99 away from the filling material 95*b*. The position of a drain/source connection terminal 91*a*/91*b* corresponds to the position of a corresponding drain/source connection plug 94.

Specifically, as shown in FIG. 45, among the multiple gate strips 2, each gate strip in the column and the gate strip in the adjacent column are staggered in the row direction X. For example, each gate strip 2 in the first column and each gate strip 2 in the second column are staggered from each other in the column direction Y. Of course, each gate strip 2 in the same column and a corresponding gate strip 2, in an adjacent column, corresponding to the gate strip 2 in the row direction X, may be aligned with each other in the column direction Y. The staggered arrangement reduces the influence of the electric field between the corresponding two gate strips 2 in adjacent columns.

Specifically, further referring to FIG. 45, multiple isolation walls 3 distributed along the column direction Y are arranged on each of two sides of each column of semiconductor strip structures 1*b*. Each isolation wall 3 extends along the height direction Z to the substrate 81 to separate at least a part of two adjacent columns of semiconductor strip structures 1*b*. Each isolation wall 3 of each column of isolation walls 3, and a corresponding isolation wall 3, in an adjacent column, are staggered from each other in the column direction Y. For example, each isolation wall 3 of the multiple isolation walls 3 of the first column and each isolation wall 3 of the multiple isolation walls 3 of the second column are staggered from each other in the column direction Y. Of course, each isolation wall 3 of the multiple isolation walls 3 in each column may be aligned with a corresponding isolation wall 3, in an adjacent column, corresponding to the isolation wall 3 in the row direction X.

Specifically, in conjunction with FIG. 45 and FIG. 46, multiple drain/source holes 96 may be defined on the memory array 1 at a predetermined interval along the column direction Y (referring to FIGS. 49 and 50 below). Specifically, each drain/source hole 96 may be defined at a position of the memory array 1 distinct from the isolation wall 3 and the gate strip 2 to avoid the first insulating material 95*a* within the drain/source hole 96 from affecting the signal transmission of the drain/source region semiconductor strip 11/13.

Figure 49:
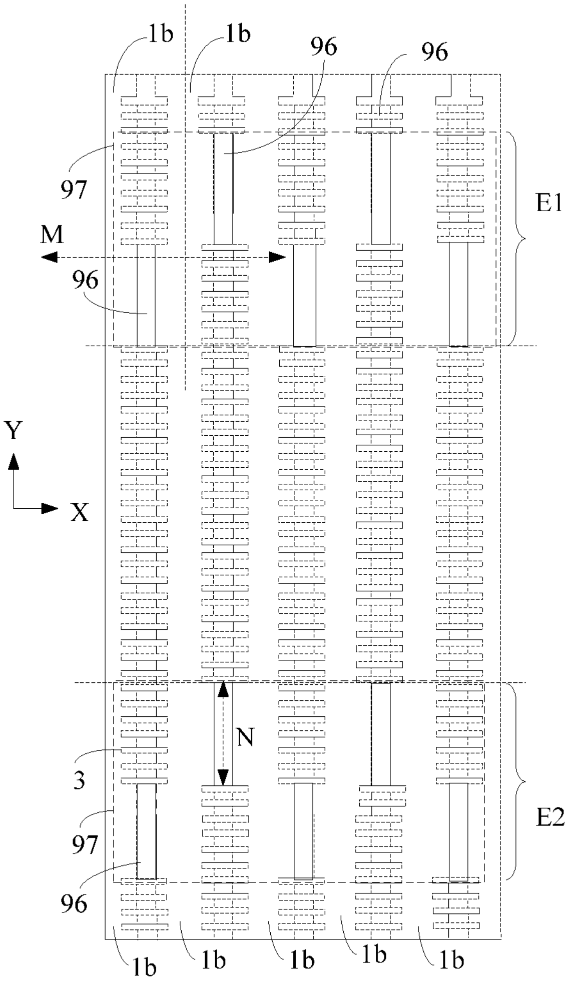
FIG. 49 is a schematic view of a structure at further another specific operation of a manufacturing method of a memory block according to further another embodiment of the present disclosure.

Specifically, as shown in FIG. 46 and FIG. 49, the first drain/source connection terminal group 92*a* and the second drain/source connection terminal group 92*b* in the drain/source connection terminal subarray 9*a* corresponding to two adjacent columns of semiconductor strip structures 1*b* share the same drain/source hole 96.

The memory block 10 in the embodiments is provided by arranging a drain/source connection terminal array 9 at a predetermined interval in the column direction Y; each drain/source connection terminal array 9 includes multiple drain/source connection terminal subarrays 9*a*, each drain/source connection terminal subarray 9*a* corresponding to two adjacent columns of semiconductor strip structures 1*b*. Each drain/source connection terminal subarray 9*a* includes multiple drain/source connection terminals 91*a*/91*b*, and each drain/source connection terminal 91*a*/91*b* is connected to a drain/source region semiconductor strip 11/13 in a corresponding column of semiconductor strip structures 1*b*, respectively. Each drain/source connection terminal 91*a*/91*b* in each drain/source connection terminal subarray 9*a* is connected to a corresponding drain/source region semiconductor strip 11/13 in a corresponding column of semiconductor strip structures 1*b*; that is, the same drain/source region semiconductor strip 11/13 of any column of semiconductor strip structures 1*b* of the memory block 10 is connected to multiple corresponding drain/source connection terminals 91*a*/91*b* of multiple corresponding drain/source connection terminals 9*a* of corresponding columns of one or more drain/source connection terminal arrays 9. In this way, a part of the same drain/source region semiconductor strip 11/13 that is between two adjacent drain/source connection terminals 91*a*/91*b* may perform read (RD), program (PGM), and other operations directly through the drain/source connection terminals 91*a*/91*b* at corresponding positions. In contrast to leading through a connection line at the end of each drain/source region semiconductor strip 11/13 (i.e., the edge portion of the memory block 10) and performing related operations of the entire drain/source region semiconductor strip 11/13 through the connection line in the related art, the resistance may be reduced to facilitate signal transmission and improve the read (RD), program (PGM), and other operations of the memory block 10 in the present disclosure. In addition, by making the drain/source connection plug 94 made of any one or more of the four metals, copper/titanium/tin/tungsten, with better electrical conductivity, the effect of the resistance of the drain/source connection plug 94 on the signal transmission speed may be reduced.

In addition, the memory block 10 as shown in the above embodiments is arranged with multiple drain/source connection terminal arrays 9, each of which includes multiple drain/source connection terminal subarrays 9*a*, to achieve connection of the drain/source region semiconductor strips 11/13 in each column of the semiconductor strip structures 1*b* to the multiple drain/source connection terminals 91*a*/91*b* in the multiple drain/source connection terminal subarrays 9*a*, respectively, thereby achieving improvement of electrical performance.

However, it will be understood by those skilled in the art that the memory block 10 of the present disclosure may be arranged with only one drain/source connection terminal array 9, which may include multiple drain/source connection terminal subarrays 9*a*, to achieve connection of the drain/source region semiconductor strips 11/13 in each column of the semiconductor strip structures 1*b* to one drain/source connection terminal 9*a*/9*b* in one drain/source connection terminal subarray 9*a*. Therein, the drain/source connection terminal array 9 may be arranged at a non-edge position of the column of semiconductor strip structures 1*b* in the column direction Y, i.e., at a position of the column of semiconductor strip structures 1*b* in the column direction Y that is distinct from the first end and the last end. Since the drain/source connection terminal array 9 may be arranged at a position of the middle region of the column of semiconductor strip structures 1*b* in the column direction Y, its provision of the drain/source lead region relative to the edge also improves the electrical performance, reduces the resistance, facilitates the signal transmission, and improves the speed of the read (RD), programming (PGM), and other operations performed by the memory block 10.

Specifically, the memory block 10 corresponding to FIGS. 43 to 46 can be made by the following manufacturing method.

Figure 47:
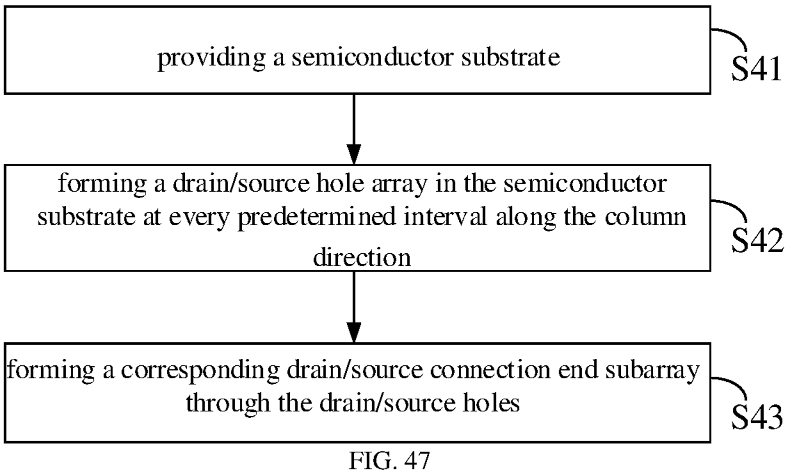
FIG. 47 is a flowchart of a manufacturing method of a memory block according to further another embodiment of the present disclosure.

Referring to FIG. 47, FIG. 47 is a flowchart of a manufacturing method of a memory block according to further another embodiment of the present disclosure. The manufacturing method includes operations at blocks illustrated herein.

At step S41: providing a semiconductor substrate.

Figure 48A:
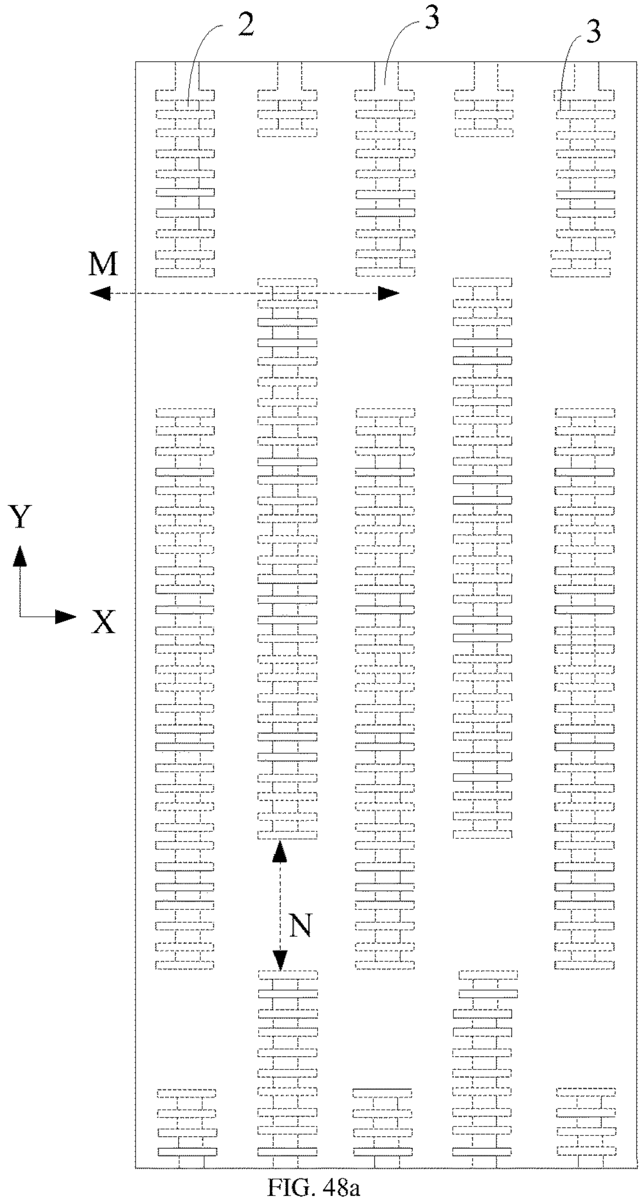
FIG. 48*a* is a schematic view of a structure at a specific operation of a manufacturing method of a memory block according to further another embodiment of the present disclosure.
Figure 48B:
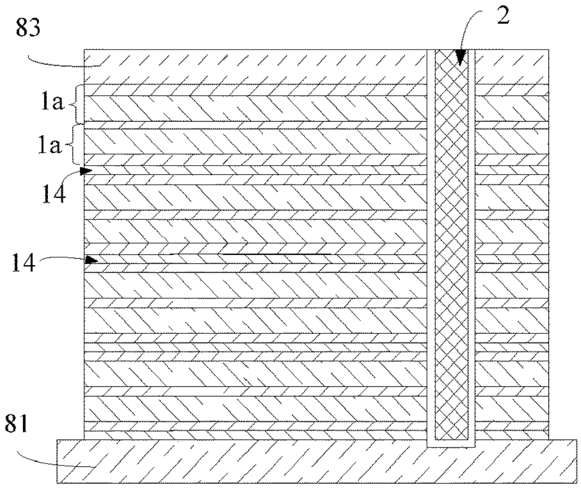
FIG. 48*b* is a schematic view of a structure at another specific operation of a manufacturing method of a memory block according to further another embodiment of the present disclosure.

Referring to FIG. 48*a* and FIG. 48*b*, FIG. 48*a* is a top view of a semiconductor substrate according to an embodiment of the present disclosure; and FIG. 48*b* is a cross-sectional view of the semiconductor substrate shown in FIG. 48*a* along line M. The semiconductor substrate includes a substrate 81, multiple memory subarray layers 1*a* formed on the substrate 81, and a first hard mask layer 83 arranged on a side surface of the multiple memory subarray layers 1*a* away from the substrate 81.

The multiple memory subarray layers 1*a* are sequentially stacked along a height direction Z perpendicular to the substrate 81. Each memory subarray layer 1*a* includes a drain region semiconductor layer, a channel semiconductor layer, and a source region semiconductor layer stacked along the height direction Z. The drain region semiconductor layer, channel semiconductor layer, and source region semiconductor layer in each memory subarray layer 1*a* include multiple drain region semiconductor strips 11, channel semiconductor strips 12, and source region semiconductor strips 13, respectively, distributed along a row direction X. Each drain region semiconductor strip 11, channel semiconductor strip 12, and source region semiconductor strip 13 extends along a column direction Y, respectively. Multiple gate strips 2 distributed in the column direction Y are arranged between two adjacent columns of drain region semiconductor strips 11, channel semiconductor strips 12, and source region semiconductor strips 13, and each gate strip 2 extends along the height direction Z.

Multiple isolation walls 3 and multiple gate strips 2 may be further arranged on the semiconductor substrate, the multiple isolation walls 3 and multiple gate strips 2 extending along the height direction Z to the substrate 81, respectively. Other specific structures and manufacturing methods of the semiconductor substrate can be described in the specific structures and manufacturing methods of the memory block provided in any of the above embodiments, which will not be repeated herein.

At step S42: forming a drain/source hole array in the semiconductor substrate at every predetermined interval along the column direction.

Figure 50:
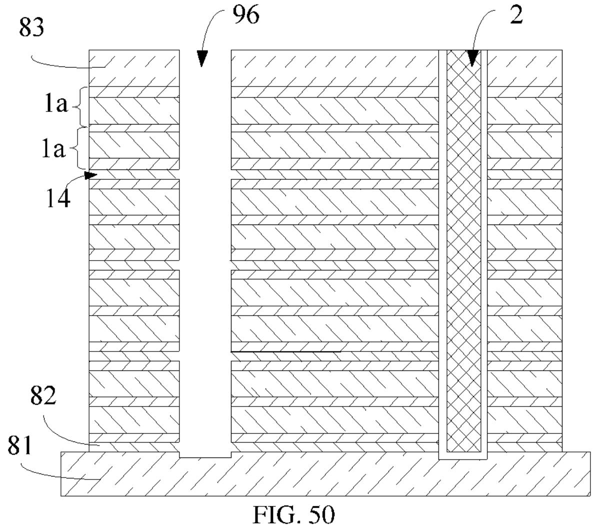
FIG. 50 is a schematic view of a structure at further another specific operation of a manufacturing method of a memory block according to further another embodiment of the present disclosure.

Referring to FIG. 49 to FIG. 50, FIG. 49 is a top view of defining drain/source holes 96 in the semiconductor substrate; FIG. 50 is a cross-sectional view of the semiconductor substrate shown in FIG. 49 along line M. Specifically, multiple drain/source holes 96 may be defined in the semiconductor substrate by etching at positions distinct from the gate strips 2 and the isolation walls 3; that is, the semiconductor substrate is not arranged with the isolation walls 3 at positions corresponding to the drain/source holes 96 to leave specific regions for defining the drain/source holes 96. Each drain/source hole 96 extends along the height direction Z to the substrate 81, and multiple gate strips 2, multiple isolation walls 3, and multiple drain/source holes 96 of multiple drain/source hole arrays 97 in the same column form a spacing structure. Along the row direction X, multiple spacing structures are distributed for dividing each memory subarray layer 1*a* into multiple columns of drain region semiconductor strips 11, channel semiconductor strips 12, and source region semiconductor strips 13 along the row direction X. A column of drain region semiconductor strips 11, channel semiconductor strips 12, and source region semiconductor strips 13 in the multiple memory subarray layers 1*a* is defined as a column of semiconductor strip structures 1*b*.

Specifically, multiple drain/source holes 96 in each drain/source holes array 97 distributed along the row direction X are aligned with each other in the column direction Y. Alternatively, as shown in FIG. 49, for the multiple drain/source holes 96 in each drain/source holes array 97 distributed along the row direction X, two adjacent drain/source holes 96 are staggered with each other in the column direction Y. Based on this staggered arrangement, an overall high resistance caused by the column of semiconductor strip structures 1*b* being too narrow in localized places may be avoided.

In some embodiments, multiple drain/source holes 96 may be defined in the semiconductor substrate at intervals of N rows of memory cells to form multiple drain/source holes arrays 97; that is, N rows of memory cells may be arranged between two adjacent regions of the memory cells, such as regions E1 and E2. N may be a natural number greater than or equal to 1. In other embodiments, M rows of memory cells are arranged between two adjacent drain/source holes 96 in the same column, and M may be a natural number greater than or equal to 1. Of course, the distance between each adjacent two regions along the column direction Y may be unequal, i.e., the multiple drain/source holes array 97 may be arranged at non-equal spacing. Alternatively, some of the regions are arranged equally spaced between each adjacent two regions, and the remaining part of the regions are arranged non-equally spaced between each adjacent two regions.

In some embodiments, in the same region (e.g., E1), two adjacent columns (e.g., the first and second columns) of semiconductor strip structures 1*b* share the same drain/source hole 96. Another drain/source hole 96 is also defined in two adjacent columns (e.g., the first and second columns) of semiconductor strip structures 1*b* in a region E2 of the semiconductor substrate spaced at a predetermined distance L from region E1.

In conjunction with FIG. 49, in the same row region (e.g., E1), either column of semiconductor strip structures 1*b* shares a drain/source hole 96 with the left column of semiconductor strip structures 1*b*, relative to the left column of semiconductor strip structures 1*b*, and shares another drain/source hole 96 with the right column of semiconductor strip structures 1*b*, relative to the right column of semiconductor strip structures 1*b*. That is, for either column of semiconductor strip structures 1*b*, in the same horizontal region, a left part thereof shares one drain/source hole 96 with one column of semiconductor strip structures 1*b*, and a right part thereof shares another drain/source hole 96 with another column of semiconductor strip structures 1*b*.

As shown in FIG. 49, in some embodiments, memory cells in the column of semiconductor strip structures 1*b* at the edge do not function as storage and are used as virtual memory cells. As described above, the column of semiconductor strip structure 1*b* at the edge shares the same drain/source hole 96 with the adjacent column of semiconductor strip structures 1*b* to make the corresponding drain/source connection terminal subarray 9. Therefore, the drain/source connection terminal subarray 9*a* may include only drain/source connection terminals 91*a*/91*b* corresponding to a non-edge column of semiconductor strip structures 1*b*, and drain/source connection terminals 91*a*/91*b* corresponding to the non-edge column of semiconductor strip structures 1*b* will be led out. Of course, it is understood by those skilled in the art that, in order to ensure the consistency of the manufacturing process of the drain/source connection terminal subarray 9*a*, the drain/source connection terminal subarray 9*a* may further include drain/source connection terminals 91*a*/91*b* corresponding to the column of semiconductor strip structures 1*b* at the edges, and a part of the drain/source region semiconductor strips 11/13 of the non-edge column of semiconductor strip structures 1*b* is led out. The drain/source connection terminals 91*a*/91*b* corresponding to the column of semiconductor strip structures 1*b* at the edges may not be connected to the connection line and are not involved in the actual storage operation.

At step S43: forming a corresponding drain/source connection terminal subarray through the drain/source holes.

Each drain/source hole 96 correspondingly forms a corresponding drain/source connection terminal subarray 9*a*, and multiple drain/source connection terminal subarrays 9*a* correspondingly formed by multiple drain/source holes 96 in each drain/source hole array 97 constitute a drain/source connection terminal array 9, and each drain/source connection terminal subarray 9*a* includes multiple drain/source connection terminals 91*a*/91*b*. Each drain/source connection terminal 91*a*/91*b* is configured to be connected to a corresponding drain/source region semiconductor strip 11/13 of a corresponding column of semiconductor strip structures 1*b*.

The same drain/source region semiconductor strip 11/13 in each column of semiconductor strip structures 1*b* is connected to multiple drain/source connection terminals 91*a*/91*b* of multiple drain/source connection terminal subarrays 9*a* in multiple drain/source connection terminal arrays 9.

The same drain/source region semiconductor strip 11/13 in each column of semiconductor strip structures 1*b* is correspondingly connected to multiple corresponding drain/source connection terminals 91*a*/91*b* of multiple corresponding drain/source connection terminal subarrays 9*a* in corresponding columns in the multiple drain/source connection terminal arrays 9, thereby reducing resistance, facilitating signal transmission, and increasing the speed of this memory block 10 for read (RD), programming (program. PGM) and other operations.

Referring to FIGS. 51-FIG. 60, FIGS. 51-FIG. 60 illustrate structural schematic views of specific processes of step S43.

In some embodiments, as shown in FIG. 48*b*, a first single-crystal sacrificial semiconductor layer 82 or a virtual memory subarray layer is epitaxially grown on the substrate 81 of the semiconductor substrate; two memory subarray layers 1*a* and a second single-crystal sacrificial semiconductor layer 14 are formed on the first single-crystal sacrificial semiconductor layer 82 by epitaxial growth alternately in sequence until uppermost two memory subarray layers 1*a* are formed; or the second single-crystal sacrificial semiconductor layer 14 and the two memory subarray layers 1*a* are formed by epitaxial growth alternately in sequence on the virtual memory subarray layer; during the formation of the gate strips 2 through the word line holes 4, a part of the first single-crystal sacrificial semiconductor layer 82 and/or the second single-crystal sacrificial semiconductor layer 14 is replaced with an insulating barrier layer through the word line holes 4.

In some embodiments, step S43 specifically includes the following.

Figure 51:
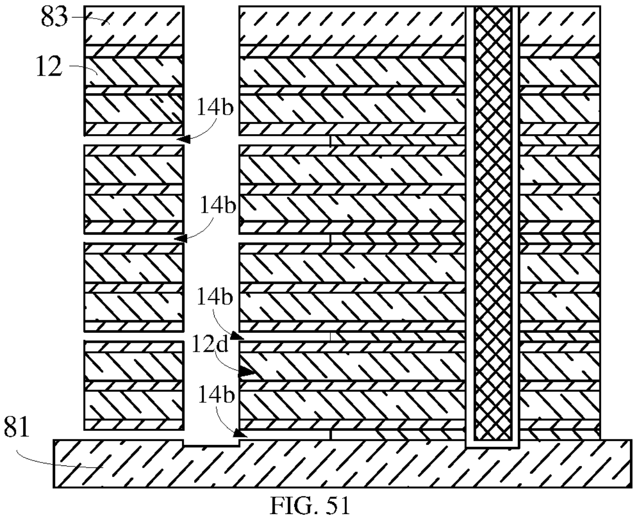
FIG. 51 is a schematic view of a structure at further another specific operation of a manufacturing method of a memory block according to further another embodiment of the present disclosure.
Figure 52:
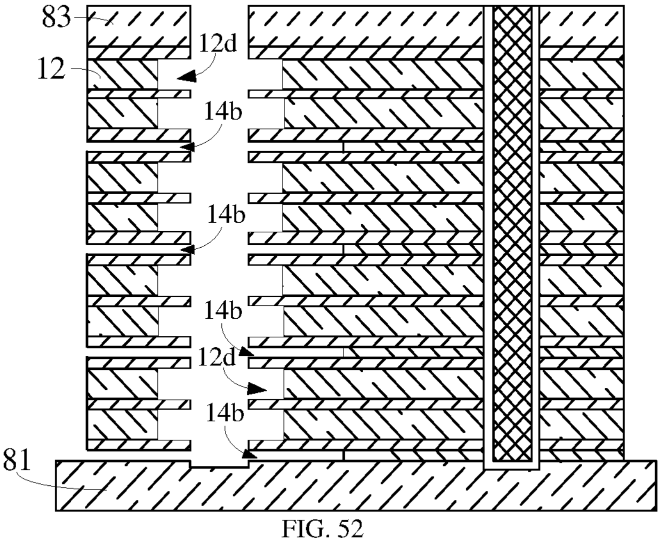
FIG. 52 is a schematic view of a structure at further another specific operation of a manufacturing method of a memory block according to further another embodiment of the present disclosure.

Step S431: removing a remaining part of the first single-crystal sacrificial semiconductor layer 82 and/or the second single-crystal sacrificial semiconductor layer 14 by the drain/source holes 96, as shown in FIG. 51. After removing the remaining part of the first single-crystal sacrificial semiconductor layer 82 and/or the second single-crystal sacrificial semiconductor layer 14, multiple first filling slots 14*b* are defined.

Step S432: etching parts of the channel semiconductor strips 12 in the columns of semiconductor strip structures 1*b* through the drain/source holes 96 to remove the parts of the channel semiconductor strips 12 and expose parts of the drain/source region semiconductor strips 11/13.

The specific process of step S432 can be referred to the specific process of step A involved in the above embodiments and can achieve the same or similar technical effect. The structure of the product after processing by step S432 can be seen in FIG. 52, which is a schematic view of the structure shown in step S56 after partial removal of the channel semiconductor strips 12. The space defined after partial removal of the channel semiconductor strips 12 are defined hereinafter as second filling slots 12*d*.

Step S433: filling a first insulating material 95*a* in the drain/source holes 96 to cover the exposed channel semiconductor strips 12.

Figure 53:
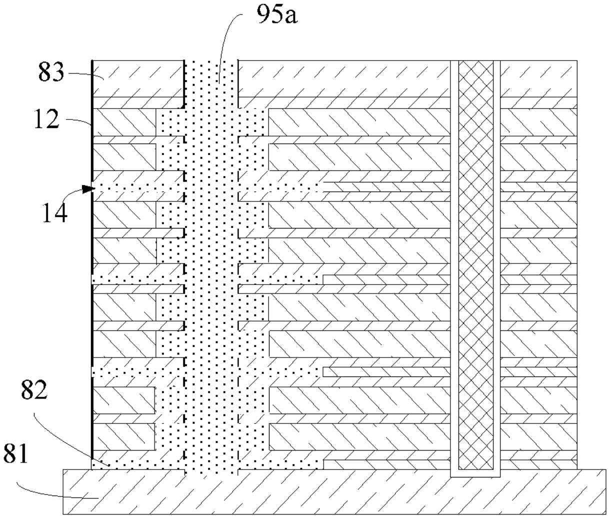
FIG. 53 is a schematic view of a structure at further another specific operation of a manufacturing method of a memory block according to further another embodiment of the present disclosure.

As shown in FIG. 53, FIG. 53 is a schematic view of the structure after filling the first insulating material 95*a* in the drain/source holes 96. In some embodiments, the region where the remaining parts after removal of the first single-crystal sacrificial semiconductor layer 82 and the second single-crystal sacrificial semiconductor layer 14 were located (i.e., the first filling slots 14*b*) is filled with the first insulating material 95*a* to replace the remaining parts of the first single-crystal sacrificial semiconductor layer 82 and the second single-crystal sacrificial semiconductor layer 14 with the first insulating material 95*a*. In addition, each of the second filling slots 12*d* is filled with the first insulating material 95*a* to cover the exposed part of the channel semiconductor strips 12, thereby isolating the channel semiconductor strips 12 from the drain region semiconductor strips 11 and the source region semiconductor strips 13 by the first insulating material 95*a* filled in the second filling slots 12*d*.

In some embodiments, after step S433, the method may further include: thinning the first hard mask layer 83. For example, the first hard mask layer 83 may be thinned by chemical mechanical polishing.

Step S434: etching a drain/source connection terminal subarray region corresponding to each drain/source hole 96 to form a step-like structure.

The step-like structure includes multiple steps, each step including a part of a corresponding drain/source region semiconductor strip 11/13. The formation of the step-like structure facilitates the subsequent formation of the drain/source connection plugs 94 to connect the corresponding drain/source region semiconductor strips 11/13.

Figure 58:
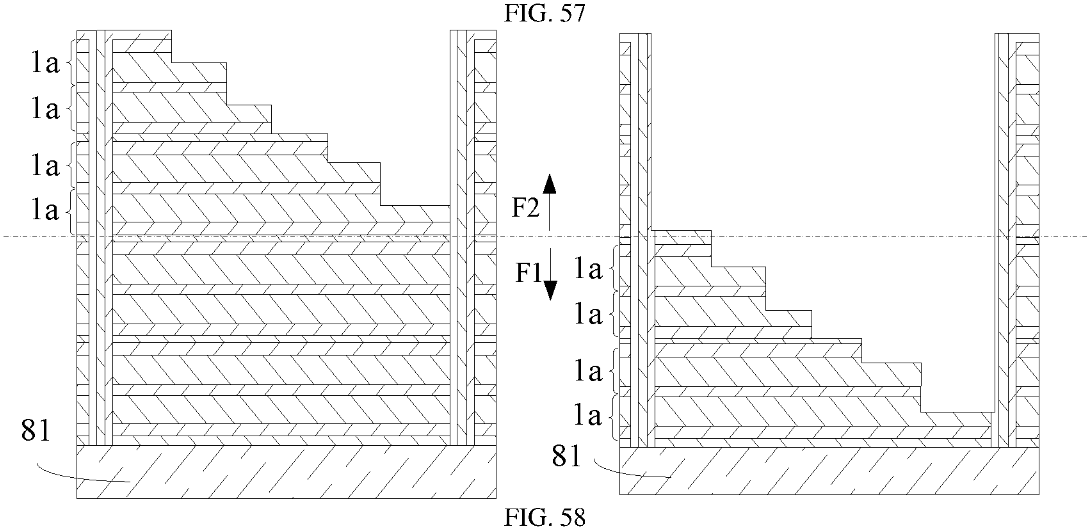
FIG. 58 is a schematic view of a structure at further another specific operation of a manufacturing method of a memory block according to further another embodiment of the present disclosure.

As shown in FIG. 58, the step-like structure formed by the etched drain/source connection terminal subarray region corresponding to the drain/source hole 96 will form the drain/source connection terminals of the high zone F2 and low zone F1 in the drain/source hole 96.

In some embodiments, the drain/source connection terminal subarray region corresponding to the drain/source hole 96 is etched, the drain/source region semiconductor strips 11/13 in the step-like structure may be all drain/source region semiconductor strips 11/13 of the low zone F1 or all drain/source region semiconductor strips 11/13 of the high zone F2. For example, in a second drain/source end group 92*b*, the drain/source ends 91*a*/91*b* may be connected to a drain/source region semiconductor strip 11/13 of the low zone F1 of a column of semiconductor strip structures 1*b*; and in a first drain/source end group 92*a*, the drain/source ends 91*a*/91*b* may be connected to a drain/source region semiconductor strip 11/13 of the low zone F1 of another column of semiconductor strip structures 1*b*. Alternatively, in a second drain/source end group 92*b*, the drain/source ends 91*a*/91*b* may be connected to a drain/source region semiconductor strip 11/13 of the high zone F2 of a column of semiconductor strip structures 1*b*; and in a first drain/source connection terminal group 92*a*, the drain/source connection terminals 91*a*/91*b* may be connected to a drain/source region semiconductor strip 11/13 of the high zone F2 of another column of semiconductor strip structures 1*b*.

In other embodiments, some of the drain/source region semiconductor strips 11/13 in the step-like structure are drain/source region semiconductor strips 11/13 of the low zone F1 and the others are drain/source region semiconductor strips 11/13 of the high zone F2. That is, the drain/source region semiconductor strip 11/13 corresponding to the high zone F2 and the low zone F1 may be connected to either drain/source connection 91*a*/91*b* selectively, as long as all the drain/source region semiconductor strips 11/13 (S/D) are led out. For example, in the second drain/source connection terminal group 92*b*, the drain/source connection terminals 91*a*/91*b* may be connected to the drain/source region semiconductor strips 11/13 in the 1st, 5th, 6th, and 8th memory subarray layers 1*a* of a column of semiconductor strip structures 1*b*; while in the first drain/source connection terminal group 92*a*, the drain/source connection terminals 91*a*/91*b* may be connected to the drain/source region semiconductor strips 11/13 in the 2nd, 3rd, 4th, and 7th memory subarray layers 1*a* of a column of semiconductor strip structures 1*b*.

The following is an example of forming the step-like structure shown in FIG. 58, in which the drain/source connection terminals of the high zone F2 and the low zone F1 are formed in the drain/source hole 96. There are various methods to form the step-like structure shown in FIG. 58, and it is only required to adjust the lithography and etching processes. One of the embodiments is shown below.

Step S434 specifically includes the following.

Step A': removing parts of the first insulating material 95*a* and the drain/source region semiconductor strip 11/13 in the high zone F2 of the drain/source connection terminal subarray region corresponding to the drain/source hole 96.

Figure 54:
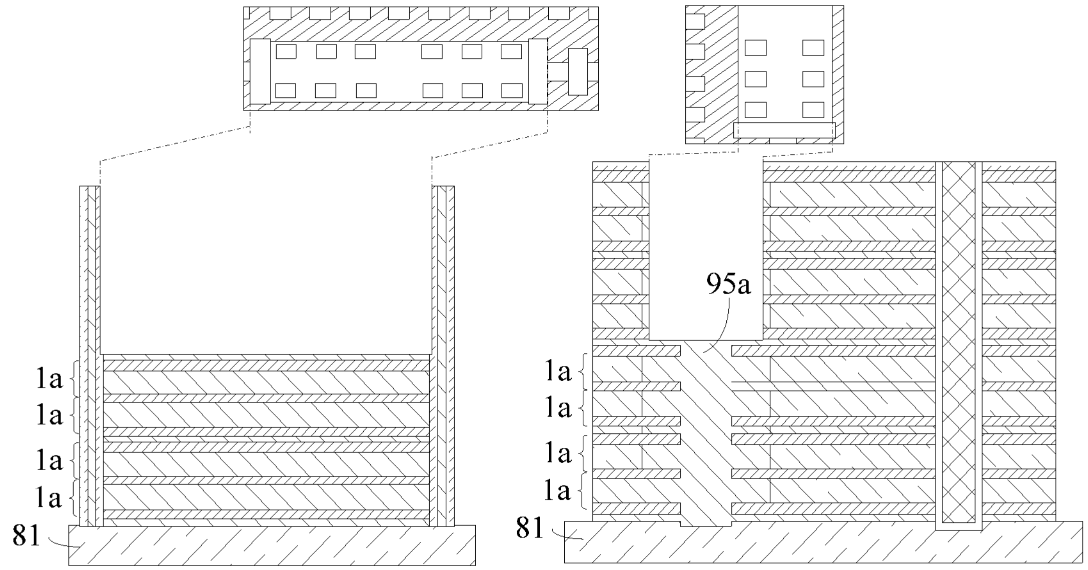
FIG. 54 is a schematic view of a structure at further another specific operation of a manufacturing method of a memory block according to further another embodiment of the present disclosure.

Referring to FIG. 54, FIG. 54 is a schematic view of the structure of the semiconductor substrate after removal of parts of the first insulating material 95*a* and the drain/source region semiconductor strip 11/13 in the high zone F2 of the drain/source hole 96. The first insulating material 95*a* and the drain/source region semiconductor strip 11/13 may be removed by etching to expose the first insulating material 95*a* of the low zone F1.

The drain/source connection terminal subarray region of the first insulating material 95*a* and the drain/source region semiconductor strip 11/13 of the high zone F2 being a first-type drain/source connection terminal subarray region is removed, and the drain/source connection terminal subarray region of the first insulating material 95*a* and the drain/source region semiconductor strip 11/13 of the high zone F2 being a second-type drain/source connection terminal subarray region is not removed.

Step B': simultaneously performing multi-step etching on the first insulating material 95*a* and the drain/source region semiconductor strip 11/13 of the low zone F1 in the first-type drain/source connection terminal subarray region, and the first insulating material 95*a* and the drain/source region semiconductor strip 11/13 of the high zone F2 in the second-type drain/source connection terminal subarray region, to form the step-like structure.

Each step-like structure includes multiple steps, each step including a part of a corresponding drain/source region semiconductor strip 11/13 and a part of the first insulating material 95*a* wrapping the part of the drain/source region semiconductor strip 11/13. Each step of the high zone F2 and the low zone F1 extends at least partially relative to a previous step.

Figure 55:
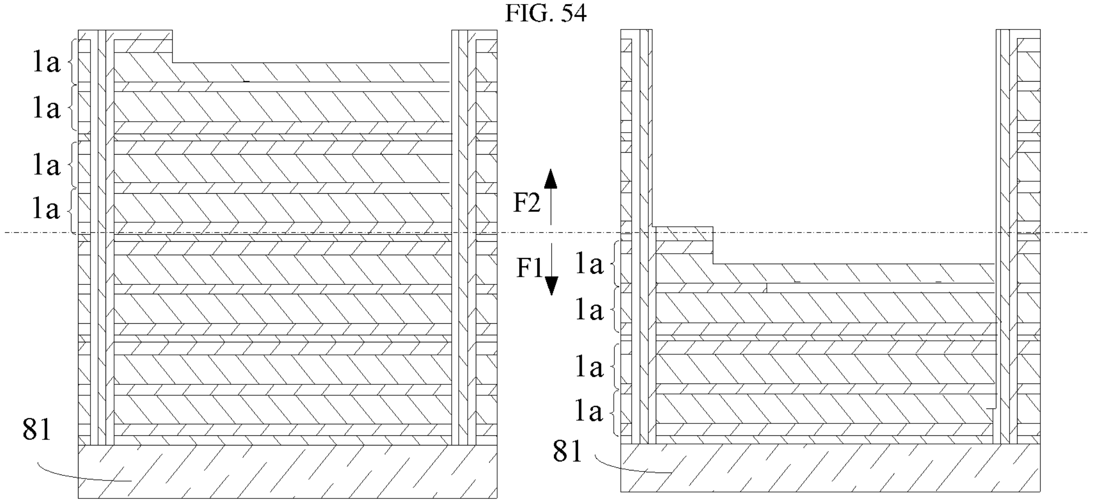
FIG. 55 is a schematic view of a structure at further another specific operation of a manufacturing method of a memory block according to further another embodiment of the present disclosure.
Figure 56:
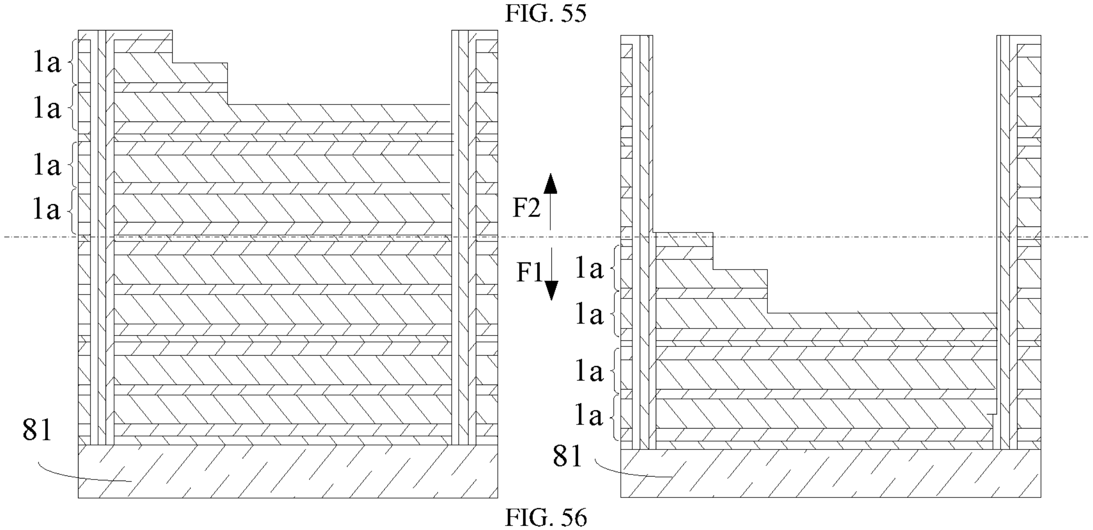
FIG. 56 is a schematic view of a structure at further another specific operation of a manufacturing method of a memory block according to further another embodiment of the present disclosure.
Figure 57:
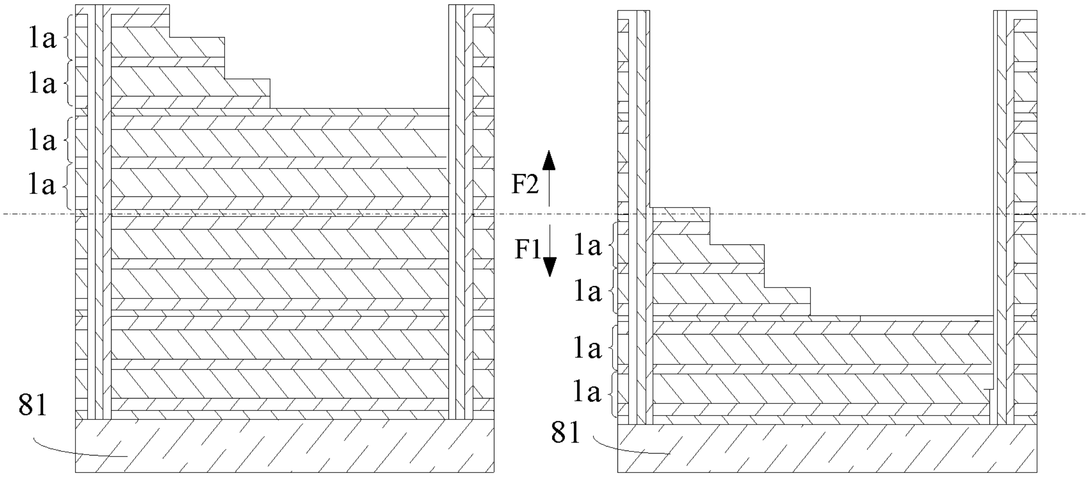
FIG. 57 is a schematic view of a structure at further another specific operation of a manufacturing method of a memory block according to further another embodiment of the present disclosure.

In some embodiments, referring to FIGS. 55-58, FIGS. 55-58 illustrate structural schematic views of specific processes for multi-step etching of the structure shown in FIG. 54. The semiconductor substrate including eight memory subarray layers 1*a*, with two adjacent memory subarray layers 1*a* including sequentially stacked drain region semiconductor layer, channel semiconductor layer, source region semiconductor layer, channel semiconductor layer, and drain region semiconductor layer to share the same source region semiconductor layer, is taken as an example. As shown in FIG. 55, the first insulating material 95*a* and the drain/source region semiconductor strip 11/13 of the low zone F1 of the semiconductor substrate, and the first insulating material 95*a* and the drain/source region semiconductor strip 11/13 of the high zone F2 of the semiconductor substrate are etched simultaneously using a first mask to form a first step. Afterwards, as shown in FIG. 56, the first insulating material 95*a* and the drain/source region semiconductor strip 11/13 of the low zone F1, and the first insulating material 95*a* and the drain/source region semiconductor strip 11/13 of the high zone F2 of the structure shown in FIG. 55 are simultaneously etched for a second time using a second mask to form a second step. Then, as shown in FIG. 57, the first insulating material 95*a* and the drain/source region semiconductor strip 11/13 of the low zone F1, and the first insulating material 95*a* and the drain/source region semiconductor strip 11/13 of the high zone F2 in the structure shown in FIG. 56 are simultaneously etched for a third time using a third mask to form a third step. In this way, fourth and fifth etchings are continued to be executed using different masks to form a step-like structure with six steps as shown in FIG. 58.

It will be understood by those skilled in the art that the present disclosure requires a total of six etching steps (one step in step A' and five steps in step B') to form the six-step step-like structure.

It is understood by those skilled in the art that if the drain/source region semiconductor strips 11/13 in the eight memory subarray layers 1*a* are etched in a step-like manner without dividing the low zone F1 and high zone F2, 11 steps are required to be formed since the same column of drain/source region semiconductor strips of the eight memory subarray layers 1*a* include 12 drain/source region semiconductor strips 11/13, i.e., 11 steps of etching are required. Therefore, the above method of the present disclosure can simplify the process steps and reduce the preparation cost.

Among them, the specific process of photomask etching is the same or similar to the related art, which can be found in the related art and will not be repeated herein. The structure of the product after step S434 can be shown in FIG. 59, where each layer of the first insulating material 95*a* and the drain/source region semiconductor strip 11/13 in each of the high zone F2 and the low zone F1 is at least partially exposed with respect to the first insulating material 95*a* and the drain/source region semiconductor strip 11/13 in the previous layer.

Step S435: filling the step-like structure with a filling material 95*b*, and forming a second hard mask layer 99 on the filling material 95*b*.

Figure 59:
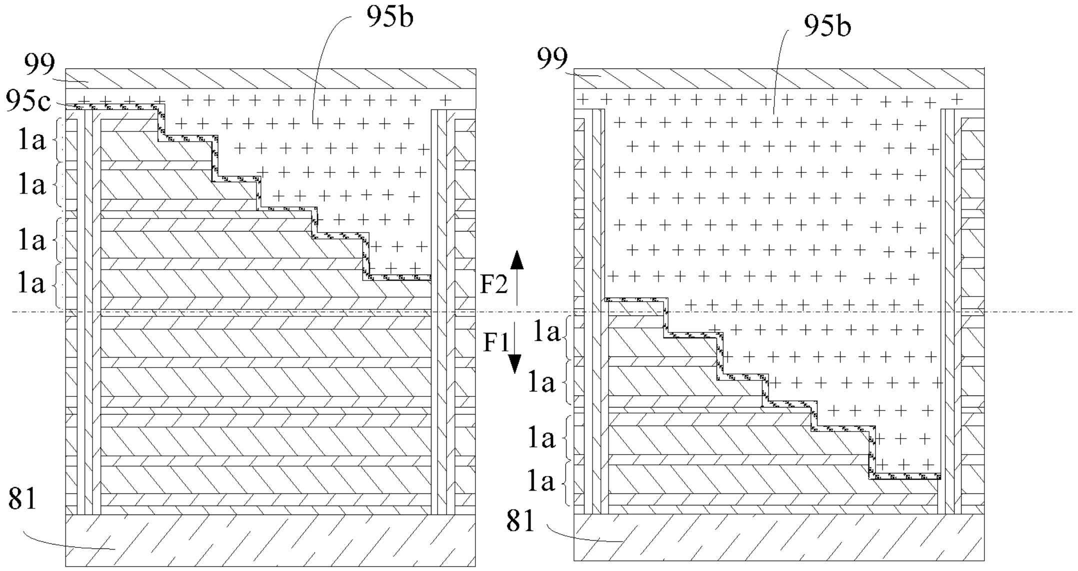
FIG. 59 is a schematic view of a structure at further another specific operation of a manufacturing method of a memory block according to further another embodiment of the present disclosure.

The structure of the product after processing by step S435 can be seen in FIG. 59, which is a schematic view of the structure filled with a filling material 95*b* in the structure shown in FIG. 58 and forming a second hard mask layer 99 on the filling material 95*b*. Since polycrystalline silicon has better fillability, the filling material 95*b* may be selected from polycrystalline silicon. When the filling material 95*b* is selected to be made of polysilicon, before step S435, the method may further include: depositing an insulating layer 95*c* on the step-like structure such that the insulating layer 95*c* wraps around an end of a part of the drain region/source region semiconductor strip 11/13 in the step-like structure, thereby preventing leakage problems between the filling material 95*b* and the step-like structure. Of course, the filling material 95*b* may be made of an insulating material, such as silicon oxide. It is understood by those skilled in the art that when the filling material 95*b* is made of an insulating material, depositing an insulating layer 95*c* on the step-like structure becomes an optional step.

Step S436: defining multiple drain/source connection terminal holes 98 in each drain/source connection terminal subarray region, and filling each drain/source connection terminal hole with a conductive material to form a drain/source connection plug.

Figure 60:
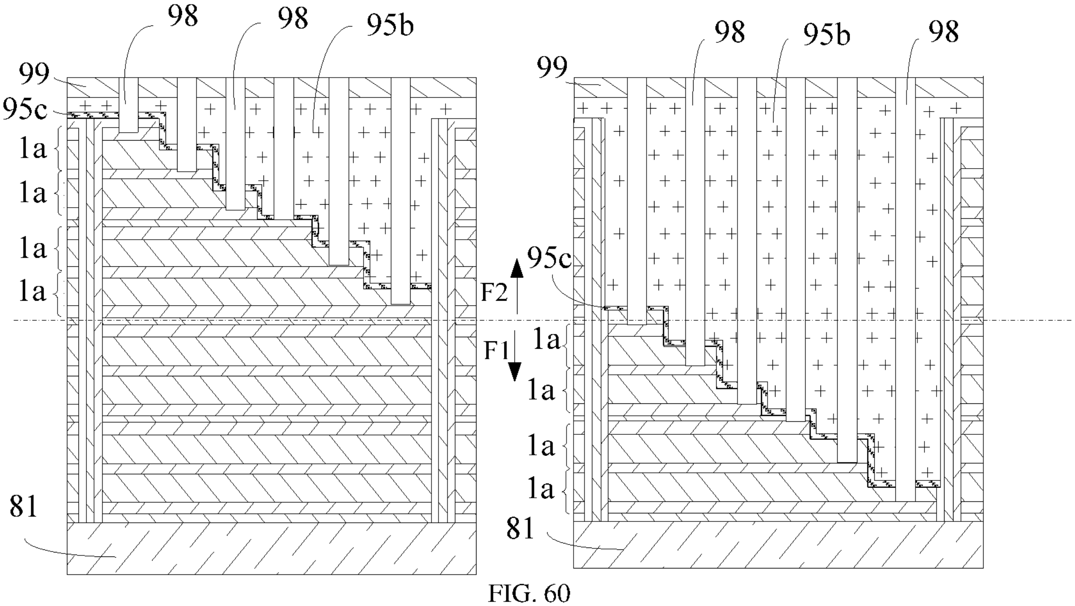
FIG. 60 is a schematic view of a structure at further another specific operation of a manufacturing method of a memory block according to further another embodiment of the present disclosure.

Referring to FIG. 60, FIG. 60 is a schematic view of the structure with multiple drain/source connection terminal holes 98 defined on the structure shown in FIG. 59. Each drain/source connection terminal hole 98 extends from a side surface of the second hard mask layer 99 away from the filling material 95*b* to the surface of a corresponding drain/source region semiconductor strip 11/13.

In some embodiments, when the filling material 95*b* is selected to be made of polycrystalline silicon, after the defining the multiple drain/source connection terminal holes 98 and before the filling with the conductive material, step S436 may further include: forming a spacing dielectric layer on a side wall of each drain/source connection terminal hole 98. In other words, the spacing dielectric layer is formed on the side wall of the drain/source connection terminal hole 98 before filling the filling material 95*b*. It is understood by those skilled in the art that when the filling material 95*b* is made of an insulating material, such as silicon oxide, then forming the spacing dielectric layer on the surface of the side wall of each drain/source connection terminal hole 98 becomes an optional step, and only filling the drain/source connection terminal hole 98 directly with the filling material 95*b* is sufficient.

A part of the drain/source connection plug 94 exposed outside of the second hard mask layer 99 may serve as the drain/source connection terminal 91*a*/91*b*. An end of each drain/source connection plug 94 is connected to a corresponding drain/source region semiconductor strip 11/13 in a step-like structure. In the embodiments, the drain/source connection terminal subarray region with the first insulating material 95*a* and the drain/source region semiconductor strip 11/13 of the high zone F2 removed is the first-type drain/source connection terminal subarray region; the drain/source connection terminal subarray region without the first insulating material 95*a* and the drain/source region semiconductor strip 11/13 of the high zone F2 removed is the second-type drain/source connection terminal subarray region. Multiple drain/source connection terminals 91*a*/91*b* formed in the first-type drain/source connection terminal subarray region constitute the first-type drain/source connection terminal subarray, configured to be connected to the drain/source region semiconductor strips 11/13 of the low zone F1 (such as the drain/source region semiconductor strips 11/13 corresponding to the 5th-8th memory subarray layer 1*a*), respectively; multiple drain/source connection terminals 91*a*/91*b* formed in the second-type drain/source connection terminal subarray region constitute the second-type drain/source connection terminal subarray, configured to be connected to the drain/source region semiconductor strips 11/13 of the high zone F2 (such as the drain/source region semiconductor strips 11/13 corresponding to the 1st-4th memory subarray layer 1*a*), respectively. It is understood that the column of semiconductor strip structures 1*b* in which a corresponding drain/source region semiconductor strip 11/13 of the high zone F2 is located is in the same column as the column of semiconductor strip structures 1*b* in which a corresponding drain/source region semiconductor strip 11/13 of the low zone F1 is located.

Based on the above features of the memory block 10, the present disclosure further proposes a memory block 10 including a buried layer and a manufacturing method thereof. In some embodiments, referring to FIG. 62 and FIG. 63, FIG. 62 is a plan view of a memory block provided in some embodiments of the present disclosure, and FIG. 63 is a row-direction cross-sectional view of a memory block provided in some embodiments of the present disclosure. The memory block 10 includes: a memory array 1 including multiple columns of semiconductor stacked strip structures 1*c* that are spaced apart along a row direction, where each column of stacked strip structure 1*c* extends along a column direction and includes at least one drain region semiconductor strip 11, at least one channel semiconductor strip 12, and at least one source region semiconductor strip that are stacked in a height direction 13. The drain region semiconductor strip 11 and/or the source region semiconductor strip 13 in the semiconductor stacked strip structure 1*c* includes a low-resistance conductive structure 101.

It is understood by those skilled in the art that the low-resistance conductive structure 101 provided by the embodiments of the present disclosure may be any kind of conductive structure with a resistance value lower than that of monocrystalline silicon, polycrystalline silicon. The material of the low-resistance conductive structure 101 may be a metal, a metal silicide, a metal nitride, or a combination thereof, etc., and the specific material of the low-resistance conductive structure 101 is not limited herein.

Specifically, the low-resistance conductive structure 101 is embedded in the drain region semiconductor strip 11 and/or the source region semiconductor strip 13 of the semiconductor stacked strip structure 1*c*. By such a design, the drain region semiconductor strip 11 and/or the source region semiconductor strip 13 of the semiconductor stacked strip structure 1*c* has a low internal resistance, which may enhance the conductivity of the drain region semiconductor strip 11 and/or the source region semiconductor strip 13, thereby enhancing the conductivity of the semiconductor stacked structure 1*c*, enhancing the response speed of the memory array, and optimizing the performance of the memory block.

Specifically, in some embodiments, continuing to refer to FIGS. 62 and 63, the memory array 1 includes multiple memory subarray layers 1*a* sequentially stacked along the height direction, and each memory subarray layer 1*a* includes a drain region semiconductor layer 11*c*, a channel semiconductor layer 12*c*, and a source region semiconductor layer 13*c* stacked along the height direction. The drain region semiconductor layer 11*c*, the channel semiconductor layer 12*c*, and the source region semiconductor layer 13*c* may each be a semiconductor layer grown by epitaxy. The height direction is a direction perpendicular to a substrate 81. In each memory subarray layer 1*a*, the drain region semiconductor layer 11*c* includes multiple drain region semiconductor strips 11 spaced apart along the row direction, each drain region semiconductor strip 11 extending along the column direction. The channel semiconductor layer 12*c* includes multiple channel semiconductor strips 12 spaced apart along the row direction, each channel semiconductor strip 12 extending along the column direction. The source region semiconductor layer 13*c* includes multiple source region semiconductor strips 13 spaced apart along the row direction, each source region semiconductor strip 13 extending along the column direction. Each of the drain region semiconductor strip 11, the channel semiconductor strip 12, and the source region semiconductor strip 13 is a semiconductor strip, respectively.

The drain region semiconductor strips 11, the channel semiconductor strips 12, and the source region semiconductor strips 13 that are in the same column are stacked to form a column of semiconductor stacked strip structure 1*c*. In the embodiments, the column of semiconductor stacked strip structure 1*c* is formed by stacking multiple drain region semiconductor strips 11, multiple channel semiconductor strips 12, and multiple source region semiconductor strips 13 that are in the same column. However, it may be appreciated by those skilled in the art that in the present disclosure, the memory array 1 may include only one memory subarray layer 1*a*, i.e., the column of semiconductor stacked strip structure 1*c* is formed by stacking one drain region semiconductor strip 11, one channel semiconductor strip 12, and one source region semiconductor strip 13 that are in the same column. The memory array 1 of the present disclosure is not limited to a three-dimensional memory array described by the above embodiments, including multiple memory cells distributed in a three-dimensional array; alternatively, the memory array 1 may be of a two-dimensional structure, such as a two-dimensional NOR Flash, with the source and drain located in the substrate, and a floating gate and a control gate located above between the source and drain, where the low-resistance conductive structure 101 is located, at least partially, in the source and/or the drain. This structure may be realized by processes such as etching, deposition, etc., and is not described herein.

It will be appreciated by those skilled in the art that each drain region semiconductor strip 11, channel semiconductor strip 12, and source region semiconductor strip 13 may be a semiconductor strip formed by processing the drain region semiconductor layer 11*c*, channel semiconductor layer 12*c*, and source region semiconductor layer 13*c* formed by epitaxial generation, respectively. Multiple gate strips 2 are arranged on each side of each column of drain region semiconductor strips 11, channel semiconductor strips 12, and source region semiconductor strips 13, respectively; the multiple gate strips 2 distributed on a side of each column of drain region semiconductor strips 11, channel semiconductor strips 12, and source region semiconductor strips 13 are spaced along the column direction; and each gate strip 2 extends along the height direction, such that corresponding parts of the multiple drain region semiconductor strips 11, channel semiconductor strips 12, and source region semiconductor strips 13 in the same column in the multiple memory subarray layers 1*a* share a same gate strip 2.

In some embodiments, each drain region semiconductor strip 11 and/or each source region semiconductor strip 13 in each column of semiconductor stacked strip structure 1*c* at a non-edge position includes a low-resistance conductive structure.

Specifically, the low-resistance conductive structure 101 is embedded in the drain region semiconductor strip 11 and/or source region semiconductor strip 13 in each column of semiconductor stacked strip structure 1*c* at a non-edge position; and the drain region semiconductor strip 11 and/or source region semiconductor strip 13 in the semiconductor stacked strip structure 1*c* at an edge position is not embedded with the low-resistance conductive structure 101. As described in the above embodiments, since the memory cell corresponding to the semiconductor stacked strip structure 1*c* at an edge position serves as a virtual memory cell in some embodiments, the drain region semiconductor strip 11 and/or the source region semiconductor strip 13 in the semiconductor stacked strip structure 1*c* at an edge position is not required to be arranged with the low-resistive conductive structure 101. Whereas in each column of semiconductor stacked strip structure 1*c* at a non-edge position, each drain region semiconductor strip 11 and/or source region semiconductor strip 13 includes the low-resistive conductive structure 101, such that each drain region semiconductor strip 11 and/or source region semiconductor strip 13 in each column of semiconductor stacked strip structure 1*c* at a non-edge position corresponding to an actual memory cell has a lower internal resistance, which may enhance the conductivity of each drain region semiconductor strip 11 and/or source region semiconductor strip 13, thereby enhancing the conductivity of the semiconductor stacked structure 1*c*, enhancing the response speed of the memory array and optimizing the performance of the memory block. Furthermore, it is more easily implemented in the manufacturing process and improves the yield rate due to the fact that it is not necessary to process the semiconductor stacked strip structure 1*c* at an edge position. Of course, it can be understood by those skilled in the art that, in some embodiments, each drain region semiconductor strip 11 and/or source region semiconductor strips 13 in the semiconductor stacked strip structure 1*c* at an edge position may be arranged with the low-resistance conductive structure 101.

The memory array 1 of the present disclosure is formed with multiple memory cells arranged in an array, and the multiple memory cells are included by the drain region semiconductor strips 11, the channel semiconductor strips 12, the source region semiconductor strips 13, and the gate strips 2. In particular, the memory array 1 of the present disclosure includes multiple memory subarray layers 1*a* stacked sequentially along the height direction. Each memory subarray layer 1*a* includes a layer of drain region semiconductor strips 11, a layer of channel semiconductor strips 12, a layer of source region semiconductor strips 13, and parts of gate strips 2 matching the above layers, such that each memory subarray layer 1*a* includes a layer of array-arranged memory cells along the height direction, and the stacked multiple memory subarray layers 1*a* constitute multiple layers of memory cells arrayed along the height direction.

Figure 62A:
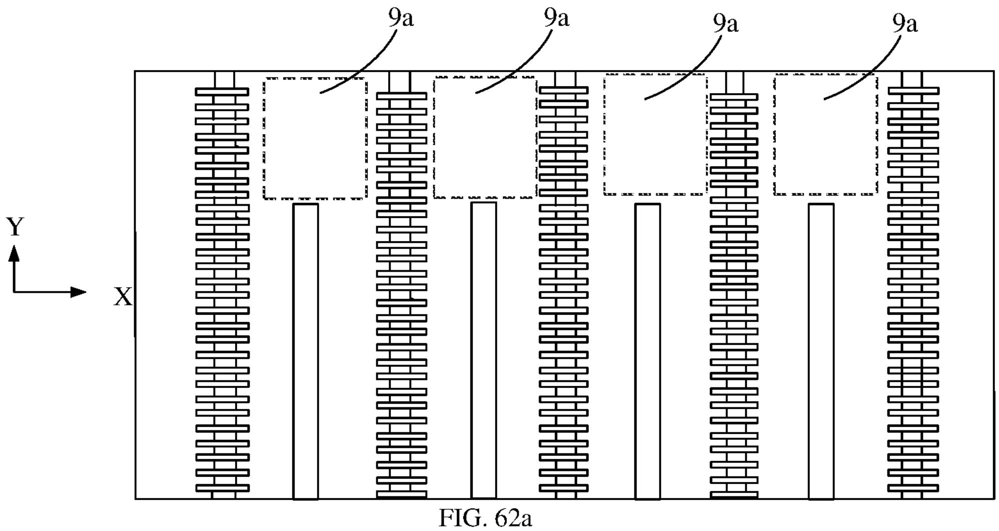
FIG. 62*a* is a top plan schematic view of a memory block according to still another embodiment of the present disclosure.
Figure 63:
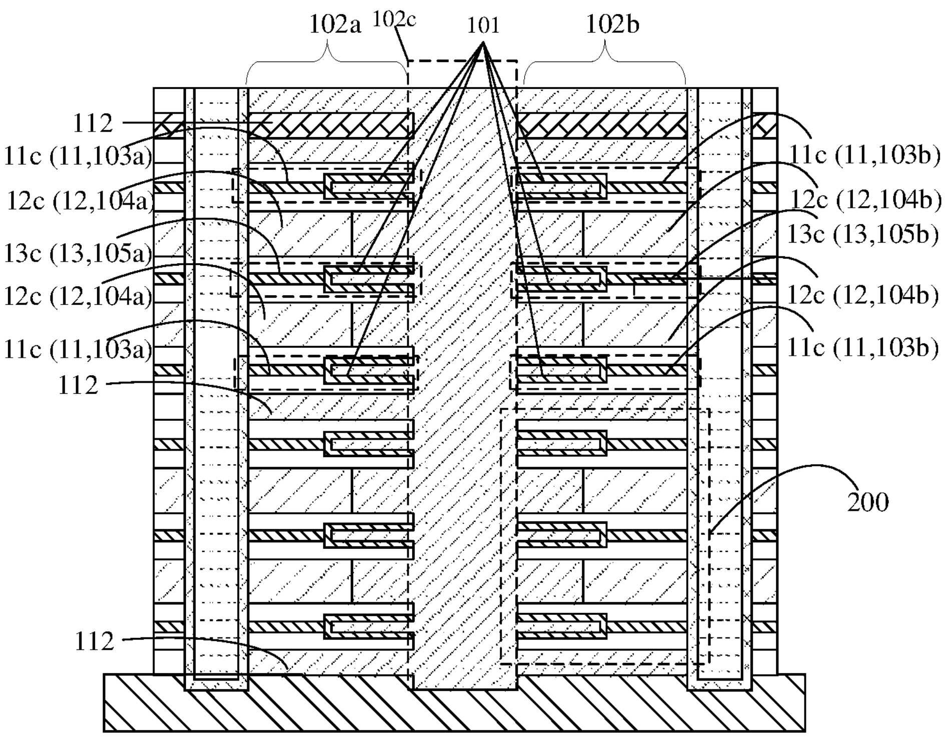
FIG. 63 is a schematic view of a row direction cross-section of a memory block according to still another embodiment of the present disclosure.

In a specific embodiment, referring to FIG. 62*a* and FIG. 63, FIG. 62*a* is a top plan schematic view of a memory block provided in some embodiments of the present disclosure; and FIG. 63 is a cross-sectional schematic view along a row direction X of a memory block provided in some embodiments of the present disclosure. Each column of semiconductor stacked strip structure 1*c* of the memory block 10 at a non-edge position includes a first semiconductor substructure 102*a*, a second semiconductor substructure 102*b*, and an insulating isolation structure 102*c* arranged between the first semiconductor substructure 102*a* and the second semiconductor substructure 102*b*. Each drain region semiconductor strip 11 in each column of semiconductor stacked strip structure 1*c* at a non-edge position is divided into a first drain region semiconductor sub-strip 103*a* and a second drain region semiconductor sub-strip 103*b*; each channel semiconductor strip 12 in each column of semiconductor stacked strip structure 1*c* at a non-edge position is divided into a first channel semiconductor sub-strip 104*a* and a second channel semiconductor sub-strip 104*b*; and each source region semiconductor strip 13 in each column of semiconductor stacked strip structure 1*c* at a non-edge position is divided into a first source region semiconductor sub-strip 105*a* and a second source region semiconductor sub-strip 105*b*.

Specifically, the first semiconductor substructure 102*a* and the second semiconductor substructure 102*b* are two identical semiconductor substructures of the same column of semiconductor strip structure divided by the insulating isolation structure 102*c* along the column direction Y perpendicular to the substrate 81. The first semiconductor substructure 102*a* includes a first drain region semiconductor sub-strip 103*a*, a first channel semiconductor sub-strip 104*a*, and a first source region semiconductor sub-strip 105*a*; and the second semiconductor substructure 102*b* includes a second drain region semiconductor sub-strip 103*b*, a second channel semiconductor sub-strip 104*b*, and a second source region semiconductor sub-strip 105*b*. In addition, the first semiconductor substrate 102*a* and the second semiconductor substructure 102*b* further each include an interlayer isolation structure 112.

Figure 64:
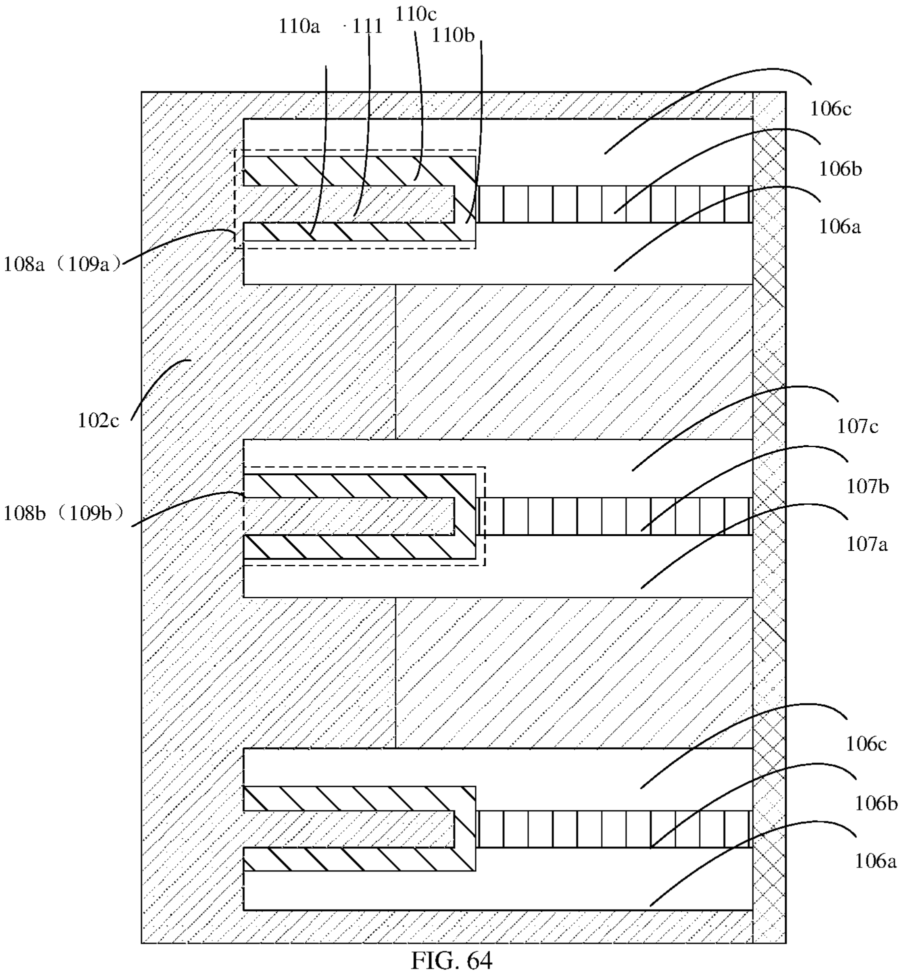
FIG. 64 is an enlarged schematic view of a portion 200 in FIG. 63.

In a specific embodiment, referring to FIG. 64, FIG. 64 is an enlarged schematic view of a portion 200 in FIG. 63. The first drain region semiconductor sub-strip 103*a* and the second drain region semiconductor sub-strip 103*b* in the memory block 10 each include a first drain region semiconductor layer structure 106*a*, a second drain region semiconductor layer structure 106*b*, and a third drain region semiconductor layer structure 106*c*. The second drain region semiconductor layer structure 106*b* is arranged between the first drain region semiconductor layer structure 106*a* and the third drain region semiconductor layer structure 106*c*; the first drain region semiconductor layer structure 106*a* and the third drain region semiconductor layer structure 106*c* are each a single-crystal silicon (Si) semiconductor layer structure, and the second drain region semiconductor layer structure 106*b* is a single-crystal silicon germanium (SiGe) semiconductor layer structure. In addition, in some embodiments, the first drain region semiconductor layer structure 106*a* and the third drain region semiconductor layer structure 106*c* may be of polycrystalline silicon semiconductor layer structures, and the second drain region semiconductor layer structure 106*b* may be of a polycrystalline silicon germanium semiconductor layer structure. The first source region semiconductor sub-strip 105*a* and/or the second source region semiconductor sub-strip 105*b* include a first source region semiconductor layer structure 107*a*, a second source region semiconductor layer structure 107*b*, and a third source region semiconductor layer structure 107*c*, respectively. The second source region semiconductor layer structure 107*b* is arranged between the first source region semiconductor layer structure 107*a* and the third source region semiconductor layer structure 107*c*. The first source region semiconductor layer structure 107*a* and the third source region semiconductor layer structure 107*c* may be of single-crystal silicon (Si) semiconductor layer structures, and the second source region semiconductor layer structure 107*b* is of a single-crystal silicon germanium (SiGe) semiconductor layer structure. Similarly, in some embodiments, the first source region semiconductor layer structure 107*a* and the third source region semiconductor layer structure 107*c* may have a polycrystalline silicon semiconductor layer structure, and the second source region semiconductor layer structure 107*b* may have a polycrystalline silicon germanium semiconductor layer structure.

It should be noted that the second drain/source region semiconductor layer structure 106*b*/107*b* is of a single-crystal silicon germanium (SiGe) semiconductor structure, and compared to other materials, the single-crystal silicon germanium (SiGe) semiconductor structure has a lattice structure similar to that of a single-crystal silicon (Si) semiconductor structure, capable of epitaxial growth on a single-crystal silicon (Si) semiconductor structure at a high quality, and the single-crystal silicon (Si) semiconductor structure is also capable of epitaxial growth on a single crystal silicon germanium (SiGe) semiconductor structure at a high quality. Therefore, the above material features are favorable for the second drain region semiconductor layer structure 106*b* to be arranged between the first drain region semiconductor layer structure 106*a* and the third drain region semiconductor layer structure 106*c*; and also for the second source region semiconductor layer structure 107*b* to be arranged between the first source region semiconductor layer structure 107*a* and the third source region semiconductor layer structure 107*c*.

In a specific embodiment, continuing to refer to FIG. 64, the length of the second drain region semiconductor layer structure 106*b* in the memory block 10 in the row direction X is less than the length of the first drain region semiconductor layer structure 106*a* and the length of the third drain region semiconductor layer structure 106*c* in the row direction X, to define a drain region filling space 108*a* (referring to, for example, FIG. 79 below) between the first drain region semiconductor layer structure 106*a*, the second drain region semiconductor layer structure 106*b*, and the third drain region semiconductor layer structure 106*c*. A drain region low-resistance conductive layer structure 109*a* is formed in the drain region filling space 108*a*, and the low-resistance conductive structures 101 in the first drain region semiconductor sub-strip 103*a* and the second drain region semiconductor sub-strip 103*b* further include the drain region low-resistance conductive layer structure 109*a*. The length of the second source region semiconductor layer structure 107*b* in the row direction X is less than the length of the first source region semiconductor layer structure 107*a* and the length of the third source region semiconductor layer structure 107*c* in the row direction X, to define a source region filling space 108*b* (referring to, for example, FIG. 79, below) between the first source region semiconductor layer structure 107*a*, the second source region semiconductor layer structure 107*b*, and the third source region semiconductor layer structure 107*c*. A source region low-resistance conductive layer structure 109*b* is deposited in the source region filling space 108*b*, and the low-resistance conductive structures 101 in the first source region semiconductor sub-stripe 105*a* and the second source region semiconductor sub-strip 105*b* include the source region low-resistance conductive layer structure 109*b*.

The lengths of the second drain/source region semiconductor layer structure 106*b*/107*b* may be greater than, less than, or equal to the lengths of the drain/source region filling space 108*a*/108*b*. The lengths of the second drain/source region semiconductor layer structure 106*b*/107*b* is not limited herein. The drain region low-resistance conductive layer structure 109*a*, within the drain region filling space 108*a*, may reduce the resistance of the first drain region semiconductor sub-strip 103*a* and the second drain region semiconductor sub-strip 103*b*, thereby enhancing the conductivity of the drain region semiconductor layer 11*c*; the source region low-resistance conductive layer structure 109*a*, within the source region filling space 108*b*, may reduce the resistance of the first source region semiconductor sub-strip 105*a* and the second source region semiconductor sub-strip 105*b*, thereby enhancing the conductivity of the source region semiconductor layer 13*c*.

In a specific embodiment, in the memory block 10, the drain region low-resistance conductive layer structure 109*a* and/or the source region low-resistance conductive layer structure 109*a* is a low-resistance conductive layer structure 109 made of a high-conductivity material. The high-conductivity material includes a metal and/or a metal-silicide material.

Specifically, the highly conductive material may be metal, metal silicide, metal nitride, or combinations thereof, etc. The specific material of the high-conductivity material is not limited herein, and may be any conductive material with a lower resistance than monocrystalline (doped) or polycrystalline (doped) silicon. In some embodiments, the high-conductivity material or the low-resistance conductive layer refers to the material type that is different from the source/drain material (the difference herein does not refer to the difference in material caused by doping) and has a lower resistance than the source/drain material. The low-resistance conductive layer structure 109 is prepared using the high-conductivity material, such that a large amount of charge is transmitted between the first drain region semiconductor layer structure 106*a* and the third drain region semiconductor layer structure 106*c* through the drain region low-resistance conductive layer structure 109*a*; and a large amount of charge is transmitted between the first source region semiconductor layer structure 107*a* and the third source region semiconductor layer structure 107*c* through the source region low-resistance conductive layer structure 109*a*, thereby reducing the resistance of the first drain/source region semiconductor sub-strips 103*a*/105*a* and the second drain/source region semiconductor sub-strips 103*b*/105*b*, thereby enhancing the electrical conductivity, enhancing the electrical conductivity, and enhancing the responsiveness of the memory block 10.

In a specific embodiment, continuing to referring to FIG. 64, in the memory block 10, the drain region low-resistance conductive layer structure 109*a* or the source region low-resistance conductive layer structure 109*a* includes a first conductive layer structure 110*a*, a second conductive layer structure 110*b*, and a third conductive layer structure 110*c*, where the first conductive layer structure 110*a*, the second conductive layer structure 110*b*, and the third conductive layer structure 110*c* may be of a one-piece structure; the first conductive layer structure 110*a* is formed on a portion of an upper surface of the first drain region semiconductor layer structure 106*a* or the first source region semiconductor layer structure 107*a*, the second conductive layer structure 110*b* is formed on four sides of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*. The first conductive layer structure 110*a* and the third conductive layer structure 110*c* are spaced apart from each other so as to cooperate with the second conductive layer structure 110*b* to define a first space 111 (referring to FIG. 88 below) to be filled with an insulating substance.

It should be noted that, ideally, the conductive layer structure 110 may fill the drain region filling space 108*a* or the source region filling space 108*b* in its entirety.

Specifically, a first side of the first conductive layer structure 110*a* is connected to a surface of the second conductive layer structure 110*b* facing the insulating isolation structure 102*c*, a second side of the first conductive layer structure 110*a* is connected to the insulating isolation structure 102*c*, and the first side of the first conductive layer structure 110*a* and the second side of the first conductive layer structure 110*a* are opposite each other. A first side of the third conductive layer structure 110*c* is connected to a surface of the second conductive layer structure 110*b* facing the insulating isolation structure 102*c*, a second side of the third conductive layer structure 110*c* is connected to the insulating isolation structure 102*c*, and the first side of the third conductive layer structure 110*c* and the second side of the third conductive layer structure 110*c* are opposite each other. An upper surface of the first conductive layer structure 110*a* and a lower surface of the third conductive layer structure 110*c* are spaced apart from each other. During the operation of the memory, charges passing through the drain/source region low-resistance conductive layer structure 109*a*/109*b* may move between the corresponding first conductive layer structure 110*a*, second conductive layer structure 110*b*, and third conductive layer structure 110*c* to form a charge channel, thereby enhancing the conductivity of the second drain/source region semiconductor layer structure 106*b*/107*b*.

In addition, according to the different manufacturing methods described below, the drain region low-resistance conductive layer structure 109*a* or the source region low-resistance conductive layer structure 109*b* of the present disclosure may be formed into corresponding different structures according to the different manufacturing methods, and the structure of the drain region low-resistance conductive layer structure 109*a* or the source region low-resistance conductive layer structure 109*b* illustrated in FIG. 64 is merely schematic in nature, which illustrates one of implementations of the drain region low-resistance conductive layer structure 109*a* or the source region low-resistance conductive layer structure 109*b*.

Specifically, referring to FIGS. 80-84 below, in a first manufacturing method (relevant process steps are described subsequently), the drain region low-resistance conductive layer structure 109*a* or the source region low-resistance conductive layer structure 109*b* includes a first conductive layer structure 110*a*, a second conductive layer structure 110*b*, a third conductive layer structure 110*c*, a fourth conductive layer structure 110*d*, and a fifth conductive layer structure 110*e*, where the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, the third conductive layer structure 110*c* is formed on a portion of a lower surface of the third drain region semiconductor layer structure 106*c* or the third source region semiconductor layer structure 107*c*, the fourth conductive layer structure 110*d* is formed on a side of the first drain region semiconductor layer structure 106*a* or the first source region semiconductor layer structure 107*a*, and the fifth conductive layer structure 110*e* is formed on a side of the third drain region semiconductor layer structure 106*c* or the third source region semiconductor layer structure 107*c*; the first conductive layer structure 110*a*, the second conductive layer structure 110*b*, the third conductive layer structure 110*c*, the fourth conductive layer structure 110*d*, and the fifth conductive layer structure 110*e* are made of materials including metal silicides.

It should be noted that the first conductive layer structure 110*a*, the second conductive layer structure 110*b*, the third conductive layer structure 110*c*, the fourth conductive layer structure 110*d*, and the fifth conductive layer structure 110*e* may be conductive layer structures connected together. In this manner, the process complexity of the first conductive layer structure 110*a*, the second conductive layer structure 110*b*, the third conductive layer structure 110*c*, the fourth conductive layer structure 110*d*, and the fifth conductive layer structure 110*e* during processing can be reduced, thereby increasing productivity.

In another specific embodiment, referring to FIGS. 85-89 below, in a second manufacturing mode (relevant process steps are described subsequently), the drain region low-resistance conductive layer structure 109*a* or the source region low-resistance conductive layer structure 109*b* includes a first conductive layer structure 110*a*, a second conductive layer structure 110*b*, and a third conductive layer structure 110*c*, where the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*; each of the first conductive layer structure 110*a*, the second conductive layer structure 110*b*, and the third conductive layer structure 110*c* includes at least a first low-resistance layer 110*f*; the material of the first low-resistance layer 110*f* includes titanium nitride or tantalum nitride.

In addition, in the above embodiments, the first conductive layer structure 110*a*, the second conductive layer structure 110*b*, and the third conductive layer structure 110*c* may each further include a second low-resistance layer 110*g*, where the second low-resistance layer 110*g* is attached to a surface of the first low-resistance layer 110*f*; the material of the second low-resistance layer 110*g* includes titanium or tantalum, or the material of the second low-resistance layer 110*g* includes a combination layer of titanium and another metal, or a combination layer of tantalum and another metal.

It should be noted that the first conductive layer structure 110*a*, the second conductive layer structure 110*b*, and the third conductive layer structure 110*c* may be conductive layer structures connected together. That is, the first low-resistance layer 110*f* and the second low-resistance layer 110*g* may each be an integrated conductive layer structure. In this manner, the process complexity of the first conductive layer structure 110*a*, the second conductive layer structure 110*b*, and the third conductive layer structure 110*c* during processing may be reduced, and the production efficiency may be improved. For specific manufacturing processes, reference may be made to the following.

Alternatively, in further another specific embodiment, referring to FIGS. 90-92 below, in a third manufacturing mode (relevant process steps are described subsequently), the drain region low-resistance conductive layer structure 109*a* or the source region low-resistance conductive layer structure 109*b* includes an conductive layer structure, which is filled in the drain/source region filling space 108*a*/108*b*. For example, the conductive layer structure includes a first conductive layer structure 110*a*, a second conductive layer structure 110*b*, and a third conductive layer structure 110*c*, where the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*; the first conductive layer structure 110*a*, the second conductive layer structure 110*b*, and the third conductive layer structure 110*c* are metal layer structures, respectively. Alternatively, the drain region low-resistance conductive layer structure 109a or the source region low-resistance conductive layer structure 109b may be a one-piece conductive layer structure that fills the drain/source region filling space 108a/108b, and the material of the conductive layer structure includes metal.

It is noted that an isolation layer may be arranged between the first conductive layer structure 110a, the second conductive layer structure 110b, and the third conductive layer structure 110c and the drain/source region semiconductor layer structure, to prevent the metal from diffusing in the silicon. The material of the isolation layer is not limited herein.

In a specific embodiment, the structure made by each of the methods described above has the first conductive layer structure 110a and the third conductive layer structure 110c spaced apart from each other so as to define a first space 111 in conjunction with the second conductive layer structure 110b to be filled with an insulating substance. In this manner, a morphologically complete and compact low-resistance conductive structure 101 is formed.

In a specific embodiment, continuing to refer to FIG. 62a and FIG. 63, FIG. 62a is a top plan schematic view of a memory block provided in some embodiments of the present disclosure. The semiconductor stacked strip structure 1c is etched into a stepped structure at an edge position thereof, for leading out each drain region semiconductor strip 11 and each source region semiconductor strip 12 in the semiconductor stacked strip structure 1c. The stepped structure formed by etching is similar to the stepped structure shown in FIG. 58 formed at an edge position of the semiconductor stacked strip structure 1c.

It is noted that the memory block 10 further includes a drain/source connection terminal subarray 9a between each adjacent two columns of semiconductor stacked strip structures 1c. In the embodiments, the drain/source connection terminal subarray 9a is connected to a column of first semiconductor substructures 102a and a column of second semiconductor substructures 102b. The drain/source connection terminal subarray 9a includes multiple drain/source connection terminals 91a/91b, where each of the drain/source connection terminals 91a/91b is connected to a corresponding drain region semiconductor strip 11 or source region semiconductor strip 13, respectively, in a corresponding semiconductor stacked strip structure 1c.

Figure 62B:
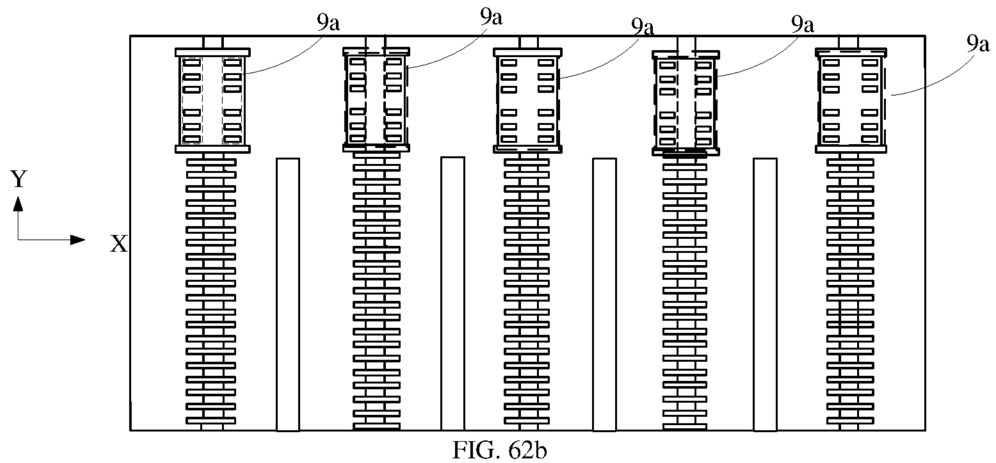
FIG. 62*b* is a top plan schematic view of a memory block according to still another embodiment of the present disclosure.
Figure 62C:
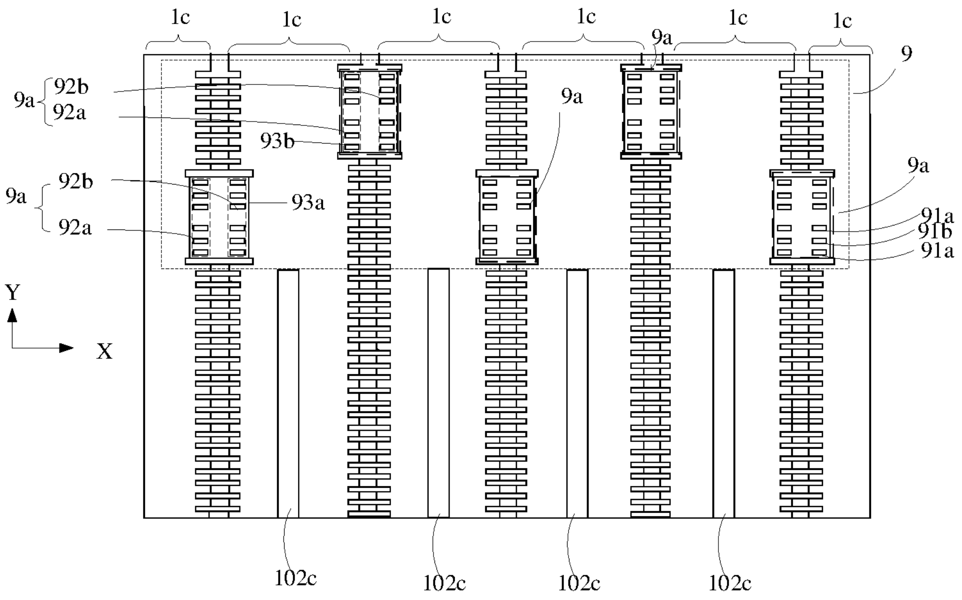
FIG. 62*c* is a top plan schematic view of a memory block according to still another embodiment of the present disclosure.

Specifically, referring to FIG. 62c, FIG. 62c is a top plan schematic view of a memory block provided in some embodiments of the present disclosure. The arrangement order of the multiple drain/source connection terminals 91a/91b in the drain/source connection terminal subarray 9a may correspond to the arrangement order of the drain/source region semiconductor strips 11/13, i.e., alternatingly in the order of the drain connection terminal 91a, the source connection terminal 91b, and the drain connection terminal 91a, to form a set of drain/source connection terminals 91a/91b. With this arrangement, the multiple drain/source connection terminals 91a/91b in the drain/source connection region semiconductor substructure 9a can be made to effectively correspond to the drain/source region semiconductor strips 11/13, such that the connection lines are arranged in a regular manner to enhance the utilization rate of the internal space of the device and to facilitate understanding by a user. In addition, as described in any of the above embodiments, each two adjacent drain/source connection terminal subarrays 9a of the present embodiment are connected to corresponding drain/source region semiconductor strips 11/13 of the low zone F1 and drain/source region semiconductor strips 11/13 of the high zone F2 within the memory block 10, and each two adjacent drain/source connection terminal subarrays 9a are arranged in an alternating manner to economize on photolithographic process flow and save costs.

Under this structure, continuing to refer to FIG. 62c, in the memory block 10, two adjacent drain/source connection subarrays 9a correspond to a first drain/source connection terminal subarray 93a and a second drain/source connection terminal subarray 93b. A portion of the first drain/source connection terminal subarray 93a is connected correspondingly to the first semiconductor substructure 102a in a column of semiconductor stacked strip structure 1c; a portion of the second drain/source connection terminal subarray 93b is connected correspondingly to the second semiconductor substructure 102b in the same column of semiconductor stacked strip structure 1c. The insulating isolation structure 102c extends in the column direction Y, and the insulating isolation structure 102c does not extend to an extent between the first drain/source connection terminal subarray 93a and the second drain/source connection terminal subarray 93b. The first drain/source connection terminal subarray 93a includes a first drain/source connection terminal group 92a and a second drain/source connection terminal group 92b; and the second drain/source connection terminal subarray 93b includes a first drain/source connection terminal group 92a and a second drain/source connection terminal group 92b. Each drain/source connection terminal group 92a/92b includes multiple drain/source connection terminals 91a/91b. In the first semiconductor substructure 102a, the first drain region semiconductor sub-strip 103a is connected to the drain connection terminal 91a in the first drain/source connection terminal subarray 93a; the first source region semiconductor sub-strip 105a is connected to the source connection terminal 91b in the first drain/source connection terminal subarray 93a. In the second semiconductor substructure 102b, the second drain region semiconductor sub-strip 103b is connected to the drain connection terminal 91a in the second drain/source connection terminal subarray 93b; and the second source region semiconductor sub-strip 105b is connected to the source connection terminal 91b in the second drain/source connection terminal subarray 93b.

Specifically, continuing to referring to FIG. 62c, a column of semiconductor stacked strip structure 1c corresponds to a first drain/source connection terminal group 92a and a second drain/source connection terminal group 92b. In the column of semiconductor stacked strip structures 1c, the first drain region semiconductor sub-strip 103a in the first semiconductor substructure 102a is connected to the drain connection terminal 91a in a corresponding first drain/source connection terminal group 92a; the first source region semiconductor sub-strip 105a is connected to the source connection terminal 91b in a corresponding first drain/source connection terminal group 92a. In the same column of semiconductor stacked strip structure 1c, the first drain region semiconductor sub-strip 103a in the second semiconductor substructure 102b is connected to the drain connection terminal 91a in a corresponding second drain/source connection terminal group 92b; the first source region semiconductor sub-strip 105a is connected to the source connection terminal 91b in a corresponding second drain/source connection terminal group 92b. It should be noted that the first drain/source connection terminal group 92a and the second drain/source connection terminal group 92b corresponding to the column of semiconductor stacked strip structure 1c are not within the same drain/source connection subarray 9a. That is, the first drain/source connection terminal group 92a and the second drain/source connection terminal group 92*b* corresponding to the column of semiconductor stacked strip structure 1*c* are within two adjacent drain/source connection subarrays 9*a*, i.e., the first drain/source connection terminal group 92*a* is within the second drain/source connection terminal subarray 93*b*, and the second drain/source connection terminal group 92*b* is within the first drain/source connection terminal subarray 93*a*.

In contrast to the memory block 10 shown in FIG. 45, since the present embodiments utilize the insulating isolation structure 102*c* to divide the semiconductor stacked strip structure 1*c* into the first semiconductor substructure 102*a* and the second semiconductor substructure 102*b*, the width of the semiconductor stacked strip structure 1*c* of the memory block 10 provided by the present embodiments in the row direction X is greater than the width of the semiconductor stacked strip structure 1*c* of the memory block 10 shown in FIG. 45 in the row direction X. This structure may reserve space for the subsequent formation of the low-resistance conductive structure 101 and facilitate the subsequent formation of the low-resistance conductive structure 101.

That is, similar to the embodiment shown in FIGS. 45-46, in the embodiments, each column the semiconductor stacked strip structure 1*c* at a non-edge position corresponds to two drain/source connection terminal subarrays 9*a*, each of the drain/source connection terminal arrays 9*a* including multiple drain/source connection terminals 91*a*/91*b*. A portion of the drain/source connection terminals 91*a*/91*b* in one the drain/source connection terminal subarray 9*a* is connected to the drain region semiconductor strip 11 or the source region semiconductor strip 13 of the high zone F2 in the column of semiconductor stacked strip structure 1*c*, and a portion of the drain/source connection terminals 91*a*/91*b* in the other drain/source connection terminal subarray 9*a* is connected to the drain region semiconductor strip or the source region semiconductor strip of the low zone F1 in the column of semiconductor stacked strip structure.

Furthermore, referring to FIG. 62*b*, FIG. 62*b* is a top plan schematic view of a memory block provided in other embodiments of the present disclosure. Each two adjacent drain/source connection terminal subarrays 9*a* may be connected to the drain/source region semiconductor strip 11/13 of the low zone F1 and the drain/source region semiconductor strip 11/13 of the high zone F2 within the memory block 10, respectively, and each two adjacent drain/source connection terminal subarrays 9*a* may be arranged in a parallel manner in order to conserve the space for the use of the drain/source connection terminal subarrays 9*a*, thereby enhancing the space utilization of the memory block.

In this case, continuing to refer to FIG. 62*b*, it is understood by those skilled in the art that a corresponding row of drain/source connection terminal subarrays 9*a* may be arranged only at an edge position of the semiconductor stacked strip structure 1*c*. That is, for the memory block 10 of the present embodiments, under the effect of the low-resistance conductive structure 101, the drain region semiconductor strips 11 and the source region semiconductor strips in the memory block 10 13 in the memory block 10 have reduced resistance and enhanced conductivity, and therefore it is not necessary to arrange multiple drain/source connection terminal subarrays 9*a* on each column of the semiconductor stacked strip structure 1*c* as voltage continuation points. It is only necessary to arrange the corresponding drain/source connection terminal subarrays 9*a* at an edge position of each column of semiconductor stacked strip structure 1*c*, suppling voltage to the drain region semiconductor strips 11 and the source region semiconductor strips 13 in each column of semiconductor stacked strip structure 1*c* using the drain/source connection terminal subarrays 9*a* at the edge position.

Furthermore, as described above, the correspondence between the drain/source connection terminal subarray 9*a* and the drain region semiconductor strip 11 and the source region semiconductor strip 13 in each column of semiconductor stacked strip structure 1*c* is similar to that of FIGS. 45-46. However, it is understood by those skilled in the art that, as shown in FIG. 62*a*, instead of utilizing the drain/source hole 96 described in the above embodiments to form the drain/source connection terminal subarray 9*a* for each column of semiconductor stacked strip structure 1*c* at a non-edge position, a corresponding drain/source connection terminal subarray 9*a* may be formed directly at an edge position of each column of semiconductor stacked strip structure 1*c*, with all the drain region semiconductor strips 11 and the source region semiconductor strips 13 of the semiconductor stacked strip structure 1*c* being etched into a stepped structure, and each drain region semiconductor strip 11 and each source region semiconductor strip 13 of the column of semiconductor stacked strip structure 1*c* are respectively connected to a drain/source connection terminal in this drain/source connection terminal subarray 9*a*, i.e., a commonly used method for leading in the drain/source connection terminal 91*a*/91*b* is adopted.

That is, in the embodiments shown in FIG. 62*a*, each column of semiconductor stacked strip structure 1*c* may correspond to only one drain/source connection terminal subarray 9*a*. Each drain region semiconductor strip 11 and each source region semiconductor strip 13 in the column of semiconductor stacked strip structure 1*c* is connected to one of the drain/source connection terminals 91*a*/91*b* in this drain/source connection terminal subarray 9*a* respectively, which is not like the above embodiments as being divided into a first zone F2 and a second zone F1. Rather, all of the drain region semiconductor strips 11 and the source region semiconductor strips 13 of the semiconductor stacked strip structure 1*c* form a stepped structure in a region where the drain/source connection terminal subarray 9*a* is located in sequence so as to be respectively connected to the drain/source connection terminals 91*a*/91*b* in this drain/source connection terminal subarray 9*a*.

For example, for an 8-layer memory subarray layer 1*a*, each column of semiconductor stacked strip structure 1*c* includes 8 drain region semiconductor strips 11 and 4 source region semiconductor strips 13, for a total of 12 drain/source semiconductor strips. Therefore, it is necessary to form a 12-step ladder to lead out each drain/source region semiconductor strip separately.

In a specific embodiment, continuing to refer to FIG. 63, two adjacent memory subarray layers 1*a* in the memory block 10 include a drain region semiconductor layer 11*c*, a channel semiconductor layer 12*c*, a source region semiconductor layer 13*c*, a channel semiconductor layer 12*c*, and a drain region semiconductor layer 11*c*, in a sequential cascade in the height direction Z, so as to share the same source region semiconductor layer 13*c*. In addition, an interlayer isolation layer 112 is arranged on every two memory subarray layers 1*a* to be isolated from another two memory subarray layers 1*a*.

Specifically, each memory subarray layer 1*a* correspondingly includes a drain region semiconductor layer 11*c*, a source region semiconductor layer 13*c*, and a drain region semiconductor layer 11*c* that are spaced apart. In each memory subarray layer 1*a*, a channel semiconductor layer 12*c* is arranged between the drain region semiconductor layers lie and the source region semiconductor layers 13*c* adjacent to the drain region semiconductor layers 11*c*. As a result, each of the memory subarray layers 1*a* may correspond to a set of drain/source connection terminals 91*a*/91*b* in the drain/source connection terminals 9*a*. In addition, by means of the interlayer isolation layer 112 arranged on every two memory subarray layers 1*a*, the two adjacent memory subarray layers 1*a* may be isolated to prevent the crosstalk of signals from the different drain region semiconductor layers 11*c* caused by the drain region semiconductor layer 11*c* of the multiple memory subarray layers 1*a* contacting with each other, so as to protect the function of the adjacent memory subarray layer 1*a* for maintaining the performance of the memory block 10. The interlayer isolation layer 112 is made of an insulating oxide, such as silicon dioxide ($SiO_2$). The insulating oxide as the interlayer isolation layer 112 is formed by replacing silicon germanium (SiGe) of the first single-crystal sacrificial semiconductor layer 82 and the second single-crystal sacrificial semiconductor layer 14, as described in the above embodiments.

In combination with the structure of the memory block 10 of the above embodiments, under the action of the low-resistance conductive structure 101, the resistance of the drain region semiconductor layer 11*c* and the source region semiconductor layer 13*c* in the memory block 10 is reduced, the conductivity is enhanced, the response speed is increased, and the performance is enhanced. Due to the enhanced electrical properties of the drain region semiconductor layer 11*c* and the source region semiconductor layer 13*c*, the distance for electrical signal conduction thereof may be longer, and therefore, comparing with the memory array 1*a* shown in FIG. 45, in the present memory block 10, the distance between two adjacent drain/source connection terminal subarrays 9*a* in the column direction Y may be greater, thereby effectively reducing the number of drain/source connection terminal subarrays 9*a* to be set up; or even, it may be possible to arrange a row of drain/source connection terminal subarrays 9*a* only at an edge position.

Figure 61:
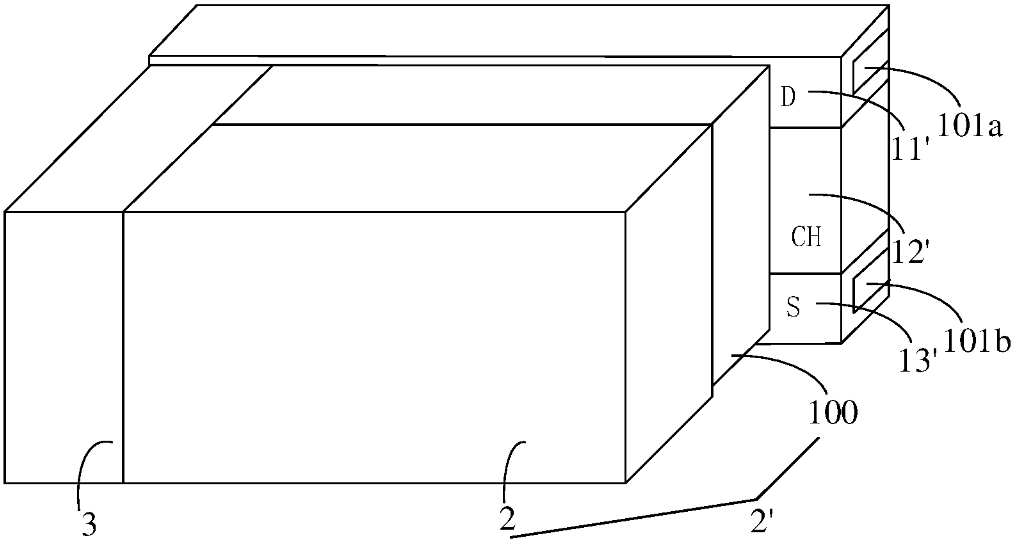
FIG. 61 is a perspective structural schematic view of a memory cell according to still another embodiment of the present disclosure.

Based on the above memory block 10, the present disclosure provides a memory cell which corresponds to the smallest working unit of the memory block 10. Referring to FIG. 61, FIG. 61 is a perspective structural schematic view of a memory cell according to still another embodiment of the present disclosure. The memory cell includes a drain region portion 11', a channel portion 12', and a source region portion 13' that are stacked perpendicular to the substrate 81. A side of the drain region portion 11', the channel portion 12', and the source region portion of the stacked stack 13' is arranged with a gate portion 2', where the drain region portion 11' and/or the source region portion 13' are arranged with a low-resistance conductive structure 101.

Specifically, continuing to refer to FIG. 61, the memory cell includes a drain region portion 11', a channel portion 12', a source region portion 13', and a gate portion 2'; the drain region portion 11' includes a drain region low-resistance conductive structure 101*a*, and the source region portion 13' includes a source region low-resistance conductive structure 101*b*; the drain region portion 11', the channel portion 12', and the source region portion 13' are stacked along the height direction Z; the channel portion 12' is disposed between the drain region portion 11' and the source region portion 13', the drain region low-resistance conductive structure 101*a* is embedded in the drain region portion 11', and the source region low-resistance conductive structure 101*b* is embedded in the source region portion 13'. The gate portion 2' is disposed on the side of the drain region portion 11', the channel portion 12', and the source region portion 13' and extends in the height direction Z. The gate portion 2' includes a portion of a gate strip 2 and an insulating medium structure 100. The gate portion 2' of each memory cell is isolated in the row direction X by an isolation wall 3. The memory cell may store charges by means of a storage structure portion 5' formed between the gate portion 2' and the drain portion 11', the channel portion 12', and the source portion 13', and indicate logical data 1 or logical data 0 by a state whether any storage charge is stored or not in the storage structure portion 5', thereby enabling storage of data. The storage structure portion 5' may include a charge trapping storage structure portion, a floating gate storage structure portion, or other types of capacitive storage structure portions. The drain region low-resistance conductive structure 101*a* and the source region low-resistance conductive structure 101*b* may enhance the conductivity of the drain region and the source region, respectively, and increase the electron mobility of the drain region portion 11' and the source region portion 13', thereby reducing the resistance of the drain region portion 11' and the source region portion 13', and improving the response speed of the memory cell.

In a specific embodiment, in the memory cell provided by the present disclosure, continuing to refer to FIGS. 61 and 64, the drain region portion 11' includes a first drain region semiconductor layer structure 106*a*, a second drain region semiconductor layer structure 106*b*, and a third drain region semiconductor layer structure 106*c*. The second drain region semiconductor layer structure 106*b* is disposed between the first drain region semiconductor layer structure 106*a* and the third-drain region semiconductor layer structure 106*c*, the first-drain region semiconductor layer structure 106*a* and the third-drain region semiconductor layer structure 106*c* are silicon semiconductor layer structures, respectively, and the second-drain region semiconductor layer structure 106*b* is a silicon germanium semiconductor layer structure. The source region portion 13' includes a first source region semiconductor layer structure 107*a*, a second source region semiconductor layer structure 107*b*, and a third source region semiconductor layer structure 107*c*. The second source region semiconductor layer structure 107*b* is disposed between the first source region semiconductor layer structure 107*a* and the third source region semiconductor layer structure 107*c*, the first source region semiconductor layer structure 107*a* and the third source region semiconductor layer structure 107*c* are silicon semiconductor layer structures, respectively, and the second source region semiconductor layer structure 107*b* is a silicon germanium semiconductor layer structure.

It is understood by those skilled in the art that since the memory cell is a part of the structure of the memory block 10, the specific structure and effect of action within the drain region portion 11' and the source region portion 13' within the memory cell are the same as those of the first drain/source region semiconductor sub-strip 103*a*/105*a* and the second drain/source region semiconductor sub-strip 103*b*/105*b*, which will not be repeated herein.

In a specific embodiment, continuing to refer to FIG. 64, in the memory cell provided by the present disclosure, the length of the second drain region semiconductor layer structure 106*b* in the first direction X is less than the length of the first drain region semiconductor layer structure 106*a* and the length of the third drain region semiconductor layer structure 106*c* in the first direction X, so as to define a drain region filling space 108*a* between the first drain region semiconductor layer structure 106*a*, the second drain region semiconductor layer structure 106*b*, and the third drain region semiconductor layer structure 106*c*. The second drain region semiconductor layer structure 106*b* includes a drain region low-resistance conductive layer structure 109*a* formed in the drain region filling space 108*a*. The length of the second source region semiconductor layer structure 107*b* in the first direction X is less than the length of the first source region semiconductor layer structure 107*a* and the length of the third source region semiconductor layer structure 107*c* in the first direction X to define a source region filling space 108*b* between the first source region semiconductor layer structure 107*a*, the second source region semiconductor layer structure 107*b*, and the third source region semiconductor layer structure 107*c*. The second source region semiconductor layer structure 107*b* includes a source region low-resistance conductive layer structure 109*b* formed in the source region filling space 108*b*.

It is understood by those skilled in the art that since the memory cell is a part of the structure of the memory block 10, the specific structure and effect of the drain region low-resistance conductive layer structure 109*a* and the source region low-resistance conductive layer structure 109*b* within the memory cell are similar to those of the drain region low-resistance conductive layer structure 109*a* and the source region low-resistance conductive layer structure 109*b* within the memory block 10, which will not be further described herein.

In a specific embodiment, in the memory cell provided by the present disclosure, continuing to refer to FIG. 64, the drain region low-resistance conductive layer structure 109*a* or the source region low-resistance conductive layer structure 109*a* includes a first conductive layer structure 110*a*, a second conductive layer structure 110*b*, and a third conductive layer structure 110*c*; the first conductive layer structure 110*a*, the second conductive layer structure 110*b*, and the third conductive layer structure 110*c* may be of a one-piece structure; the first conductive layer structure 110*a* is formed on a portion of an upper surface of the first drain region semiconductor layer structure 106*a* or the first source region semiconductor layer structure 107*a*, the second conductive layer structure 110*b* is formed on four sides of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*. The first conductive layer structure 110*a* and the third conductive layer 110*c* structure are spaced apart from each other so as to cooperate with the second conductive layer structure 110*b* to define a first space 111 (referring to FIG. 88 below) to be filled with an insulating substance.

It should be noted that, ideally, the conductive layer structure 110 may fill the drain region filling space 108*a* or the source region filling space 108*b* in its entirety. The specific effects of the conductive layer structure 110 in the memory cell are similar to the specific effects of the conductive layer structure in the memory block described above, and will not be repeated herein. According to the different manufacturing methods described below, the drain region low-resistance conductive layer structure 109*a* or the source region low-resistance conductive layer structure 109*b* in the memory cell provided by the present disclosure may be formed into corresponding different structures according to the different manufacturing methods, and the structure of the drain region low-resistance conductive layer structure 109*a* or the source region low-resistance conductive layer structure 109*b* illustrated in FIG. 64 is merely schematic in nature, which illustrates one of implementations of the drain region low-resistance conductive layer structure 109*a* or the source region low-resistance conductive layer structure 109*b*.

Specifically, referring to FIGS. 80-84 below, in a first manufacturing method (relevant process steps are described subsequently), the drain region low-resistance conductive layer structure 109*a* or the source region low-resistance conductive layer structure 109*b* includes a first conductive layer structure 110*a*, a second conductive layer structure 110*b*, a third conductive layer structure 110*c*, a fourth conductive layer structure 110*d*, and a fifth conductive layer structure 110*e*, where the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, the third conductive layer structure 110*c* is formed on a portion of a lower surface of the third drain region semiconductor layer structure 106*c* or the third source region semiconductor layer structure 107*c*, the fourth conductive layer structure 110*d* is formed on a side of the first drain region semiconductor layer structure 106*a* or the first source region semiconductor layer structure 107*a*, and the fifth conductive layer structure 110*e* is formed on a side of the third drain region semiconductor layer structure 106*c* or the third source region semiconductor layer structure 107*c*; the first conductive layer structure 110*a*, the second conductive layer structure 110*b*, the third conductive layer structure 110*c*, the fourth conductive layer structure 110*d*, and the fifth conductive layer structure 110*e* are made of materials including metal silicides.

It should be noted that the first conductive layer structure 110*a*, the second conductive layer structure 110*b*, the third conductive layer structure 110*c*, the fourth conductive layer structure 110*d*, and the fifth conductive layer structure 110*e* may be conductive layer structures connected together. In this manner, the process complexity of the first conductive layer structure 110*a*, the second conductive layer structure 110*b*, the third conductive layer structure 110*c*, the fourth conductive layer structure 110*d*, and the fifth conductive layer structure 110*e* during processing can be reduced, thereby increasing productivity.

In another specific embodiment, referring to FIGS. 85-89 below, in a second manufacturing mode (relevant process steps are described subsequently), the drain region low-resistance conductive layer structure 109*a* or the source region low-resistance conductive layer structure 109*b* includes a first conductive layer structure 110*a*, a second conductive layer structure 110*b*, and a third conductive layer structure 110*c*, where the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*; each of the first conductive layer structure 110*a*, the second conductive layer structure 110*b*, and the third conductive layer structure 110*c* includes at least a first low-resistance layer 110*f*; the first low-resistance layer 110*f* is made of a material including titanium nitride or tantalum-titanium nitride, and the first low-resistance layer 110*f* is configured to improve the source-drain resistance.

In addition, in the above embodiments, the first conductive layer structure 110*a*, the second conductive layer structure 110*b*, and the third conductive layer structure 110*c* may further include a second low-resistance layer 110*g*, where the second low-resistance layer 110*g* is attached to a surface of the first low-resistance layer 110*f*; the material of the second low-resistance layer 110*g* includes titanium or tantalum, or the material of the second low-resistance layer 110*g* includes a combination layer of titanium and another metal, or a combination layer of tantalum and another metal. The first low-resistance layer has a lower electrical conductivity than the second low-resistance layer.

It should be noted that the first conductive layer structure 110*a*, the second conductive layer structure 110*b*, and the third conductive layer structure 110*c* may be conductive layer structures connected together. That is, the first low-resistance layer 110*f* and the second low-resistance layer 110*g* may each be an integrated conductive layer structure. In this manner, the process complexity of the first conductive layer structure 110*a*, the second conductive layer structure 110*b*, and the third conductive layer structure 110*c* during processing may be reduced, and the production efficiency may be improved. For specific manufacturing processes, reference may be made to the following.

Alternatively, in further another specific embodiment, referring to FIGS. 90-92 below, in a third manufacturing mode (relevant process steps are described subsequently), the drain region low-resistance conductive layer structure 109*a* or the source region low-resistance conductive layer structure 109*b* includes an conductive layer structure, which is filled in the drain/source region filling space 108*a*/108*b*. For example, the conductive layer structure includes a first conductive layer structure 110*a*, a second conductive layer structure 110*b*, and a third conductive layer structure 110*c*, where the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*; the first conductive layer structure 110*a*, the second conductive layer structure 110*b*, and the third conductive layer structure 110*c* are metal layer structures, respectively. Alternatively, the drain region low-resistance conductive layer structure 109*a* or the source region low-resistance conductive layer structure 109*b* may be a one-piece conductive layer structure that fills the drain/source region filling space 108*a*/108*b*, and the material of the conductive layer structure includes metal.

It is noted that an isolation layer may be arranged between the first conductive layer structure 110*a*, the second conductive layer structure 110*b*, and the third conductive layer structure 110*c* and the drain/source region semiconductor layer structure, to prevent the metal from diffusing in the silicon. The material of the isolation layer is not limited herein.

Figure 65:
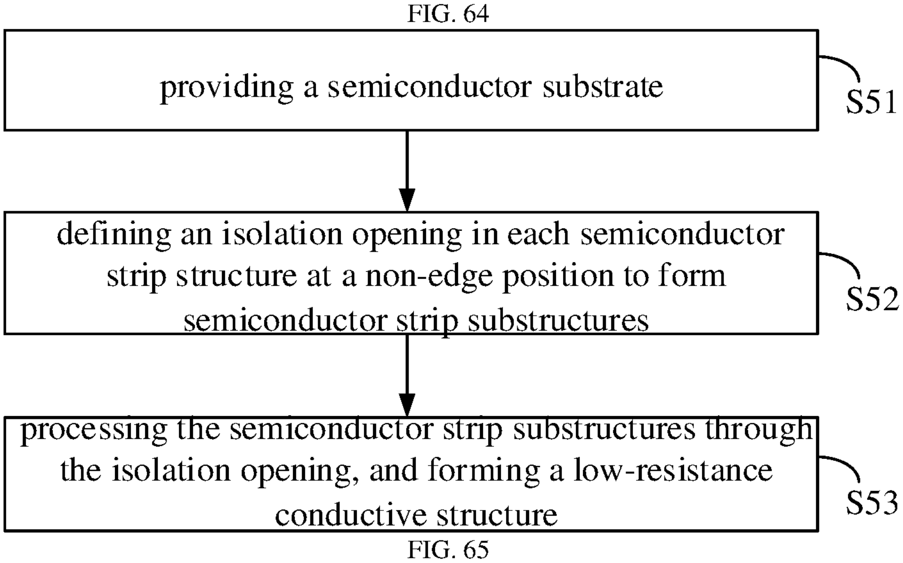
FIG. 65 is a flowchart of a manufacturing method of a memory block according to still another embodiment of the present disclosure.

Referring to FIG. 65, FIG. 65 is a flowchart of a manufacturing method of a memory block according to still another embodiment of the present disclosure. In the embodiments, a manufacturing method for a memory block

10 is provided, which may be applied to prepare the memory block 10 provided in the above embodiments illustrated in FIGS. 62-63. The memory block 10 is arranged with a low-resistance conductive structural body 101. Specifically, the method includes the following operations at blocks.

At block S51: providing a semiconductor substrate.

Figure 66:
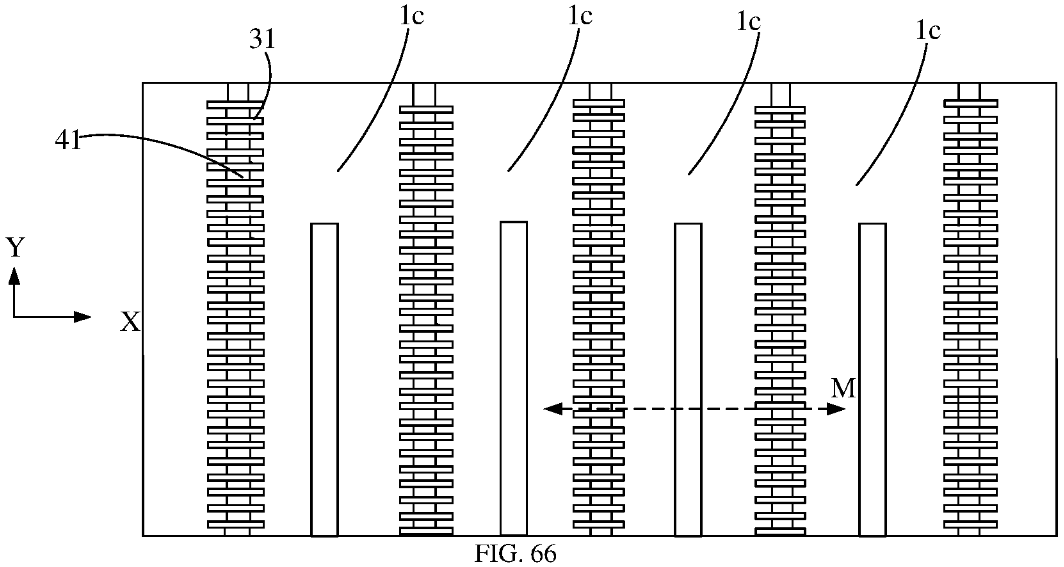
FIG. 66 is a top view of a semiconductor substrate according to an embodiment of the present disclosure.
Figure 67A:
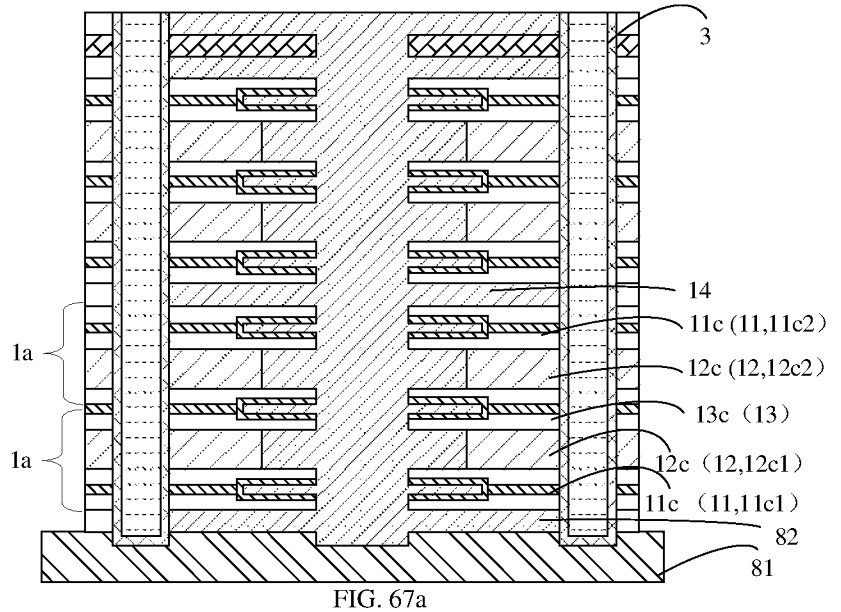
FIG. 67*a* is a transverse cross-sectional view at M of the semiconductor substrate shown in FIG. 66.

Referring to FIG. 66 and FIG. 67, FIG. 66 is a top view of a semiconductor substrate according to an embodiment of the present disclosure, and FIG. 67*a* is a transverse cross-sectional view at M of the semiconductor substrate shown in FIG. 66. The semiconductor substrate includes a substrate 81, and multiple columns of semiconductor stacked strip structures 1*c* formed on the substrate; where the multiple columns of semiconductor stacked strip structures 1*c* are spaced apart along a row direction X, each column of stacked strip structure 1*c* extends along a column direction Y, and each column of stacked strip structure 1*c* includes at least one drain region semiconductor strip 11, at least one channel semiconductor strip 12, and at least one source region semiconductor strip 13 stacked in a height direction Z.

Subsequently, the embodiments shown in FIG. 62*c* are taken as an example to introduce the relevant contents of the present disclosure, i.e., at a non-edge position of each column of semiconductor stacked strip structure 1*c*, a corresponding drain/source connection terminal subarray 9*a* is formed, and all of the drain region semiconductor strips 11 and source region semiconductor strips 13 of the semiconductor stacked strip structure 1*c* are etched to form a stepped structure. Of course, it will be appreciated by those skilled in the art that what is subsequently described is equally applicable in the embodiments shown in FIGS. 62*a*-62*b*.

In a specific embodiment, step S51 may specifically include the following.

Step S511: providing a substrate 81.

The substrate 81 may be made of silicon (Si).

Step S512: forming multiple memory subarray layers 1*a* sequentially on the substrate 81 along a height direction Z, where each memory subarray layer 1*a* includes a drain region semiconductor layer 11*c*, a channel semiconductor layer 12*c*, and a source region semiconductor layer 13*c* stacked along the height direction Z.

Step S512 may specifically include the following.

Step S512*a*: referring to FIG. 67*a*, forming a first sacrificial semiconductor layer 82 or virtual memory subarray layer by epitaxial growth on the substrate 81.

Step S512*b*: forming two memory subarray layers 1*a* and a second sacrificial semiconductor layer 14 on the first sacrificial semiconductor layer 82 by epitaxial growth sequentially and alternately, until another two memory subarray layers 1*a* and another second sacrificial semiconductor layer 14 are formed uppermost; or, forming a second sacrificial semiconductor layer 14 and two memory subarray layers 1*a* on the virtual memory subarray layer 1*a* by epitaxial growth sequentially and alternately.

Adjacent two memory subarray layers 1*a* share a common source region, and the formation of each two memory subarray layers 1*a* sharing a common source includes the following.

Step S512*ba*: forming a first drain region semiconductor layer 11*c*1 by epitaxial growth on the first sacrificial semiconductor layer 82 or the second sacrificial semiconductor layer 14 of the lower layer.

Step S512*bb*: forming a first channel semiconductor layer 12*c*1 by epitaxial growth on the drain region semiconductor layer 11*c*.

Step S512*bc*: forming a source region semiconductor layer 13*c* by epitaxial growth on the first channel semiconductor layer 12*c*1.

Step S512*bd*: forming a second channel semiconductor layer 12*c*2 by epitaxial growth on the source region semiconductor layer 13*c*.

Step S512*be*: forming a second drain region semiconductor layer 11*c*2 by epitaxial growth on the second channel semiconductor layer 12*c*2.

The first drain region semiconductor layer 11, the first channel semiconductor layer 12*c*1, and the source region semiconductor layer 13*c* form one memory subarray layer 1*a*; the source region semiconductor layer 13*c*, the second channel semiconductor layer 12*c*2, and the second drain region semiconductor layer 11*c*2 form another memory subarray layer 1*a*; and the source region semiconductor layer 13*c* is shared by the two memory subarray layers 1*a*.

Figure 67B:
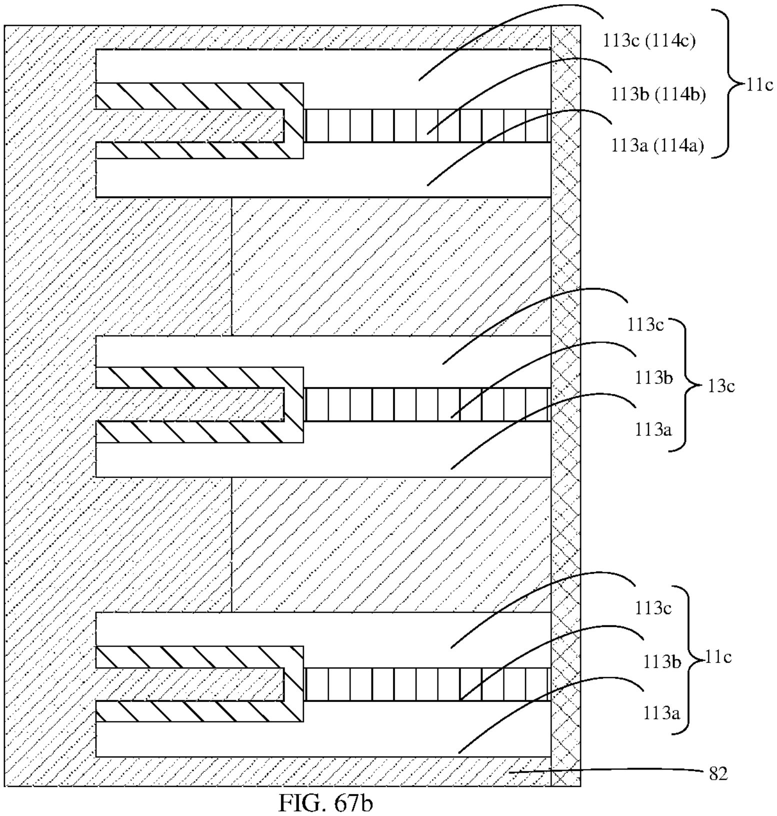
FIG. 67*b* is a partial schematic view of a transverse cross-section at M of the semiconductor substrate shown in FIG. 66.
Figure 68:
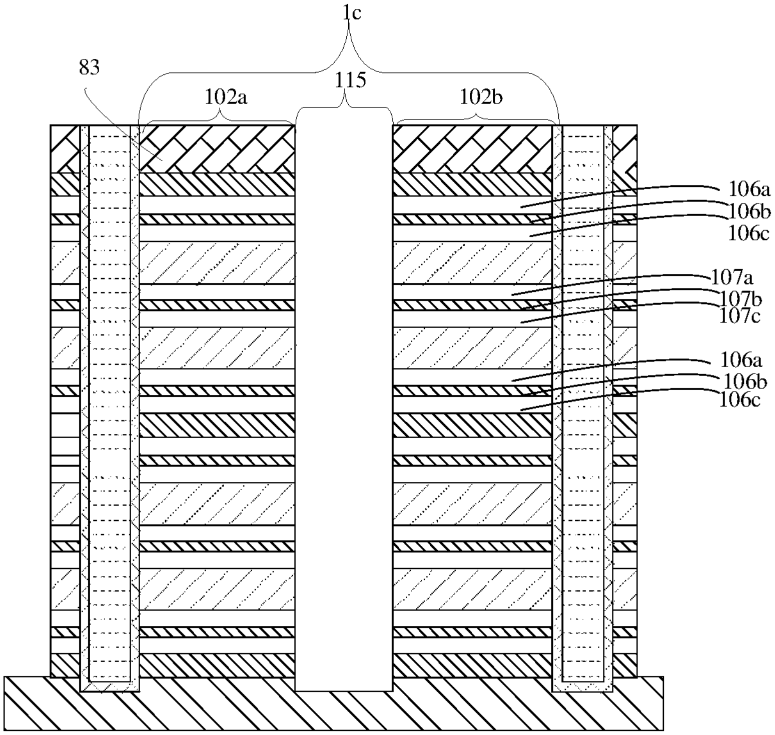
FIG. 68 is a schematic view of a structure at a specific operation of a manufacturing method of a memory block according to still embodiment of the present disclosure.

Referring to FIG. 67*b*, FIG. 67*b* is a partial schematic view of a transverse cross-section at M of the semiconductor substrate shown in FIG. 66. The formation of each drain/source region semiconductor layer 11*c*/13*c* specifically includes the following sub-steps.

Sub-step a: forming a first drain/source semiconductor sublayer 113*a* by epitaxial growth, where the first drain/source semiconductor sublayer 113*a* is a semiconductor sublayer made of silicon (Si).

Sub-step b: forming a second drain/source semiconductor sublayer 113*b* by epitaxial growth on the first drain/source semiconductor sublayer 113*a*, where the second drain/source semiconductor sublayer 113*b* is a semiconductor sublayer made of silicon germanium (SiGe).

Sub-step c: forming a third drain/source semiconductor sublayer 113*c* by epitaxial growth on the second drain/source semiconductor sublayer 113*b*, where the third drain/source semiconductor sublayer 113*c* is a semiconductor sublayer made of silicon (Si).

Step S513: forming a first hard mask layer 83 on the multiple memory subarray layers 1*a*, and defining multiple isolation wall holes 31 and word line holes 4 on the first hard mask layer 83 and the multiple memory subarray layers 1*a*, for causing the drain region semiconductor layer 11*c*, channel semiconductor layer 12*c*, and source region semiconductor layer 13*c*, of each memory subarray layer, to include or be divided into drain region semiconductor strips 11, channel semiconductor strips 12, and source region semiconductor strips 13 along the row direction X, respectively; each of the drain region semiconductor strips 11, channel semiconductor strips 12, and source region semiconductor strips 13 extends along the column direction Y, and a column of the drain region semiconductor strips 11, channel semiconductor strips 12, and source region semiconductor strips 13 in the multiple memory subarray layers 9*a* constitutes the column of semiconductor stacked strip structure 1*c*. The isolation wall holes 31 are filled with isolation material to form multiple isolation walls 3 and the word line holes 4 are filled with gate material to form multiple gate strips 2, thereby forming a semiconductor substrate.

The first hard mask layer 83 may be made of silicon dioxide ($SiO_2$) or silicon nitride (SiN).

Specifically, after the multiple memory subarray layers 1*a* are divided into multiple columns of semiconductor stacked strip structures 1*c* along the row direction X, the first drain/source semiconductor sublayer 113*a*, the second drain/source semiconductor sublayer 113*b*, and the third drain/source semiconductor sublayer 113*c* are divided into multiple columns of first drain/source semiconductor sublayer strips 114*a*, second drain/source semiconductor sublayer strips 114*b*, and third drain/source semiconductor sublayer strips 114*c*, respectively. Each drain region semiconductor strip 11 and/or each source region semiconductor strip 13 in the semiconductor stacked strip structure 1*c* includes a corresponding first drain/source semiconductor sublayer strip 114*a*, a second drain/source semiconductor sublayer strip 114*b*, and a third drain/source semiconductor sublayer strip 114*c*, respectively.

At block S52: referring to FIG. 68, FIGS. 68-81 are structural schematic views of a specific flow of a partial manufacturing method of the memory block 10 shown in some embodiments of the present disclosure; defining an isolation opening 115 in the semiconductor stacked strip structure 1*c*, where the isolation opening 115 divides the corresponding semiconductor stacked strip structure 1*c* into a first semiconductor substructure 102*a* and a second semiconductor substructure 102*b*.

By etching, the semiconductor stacked strip structure 1*c* defines the isolation opening 115, thereby obtaining the semiconductor stacked strip structure 1*c* having the isolation opening 115, the first semiconductor substructure 102*a*, and the second semiconductor substructure 102*b*. The depth of the isolation opening 115 starts from the first hard mask layer 83, and is along the height direction Z up to the interior of the substrate 81. Specifically, after defining the isolation opening 115 in each column of semiconductor stacked strip structure 1*c* at a non-edge position to divide the corresponding semiconductor stacked strip structure 1*c* into the first semiconductor substructure 102*a* and the second semiconductor substructure 102*b*, each drain region semiconductor sub-strip and each source region semiconductor sub-strip in the first semiconductor substructure 102*a* includes a corresponding first drain/source semiconductor layer structure 106*a*/107*a*, a second drain/source semiconductor layer structure 106*b*/107*b*, and a third drain/source semiconductor layer structure 106*c*/107*c*, respectively; each drain region semiconductor sub-strip and each source region semiconductor sub-strip in the second semiconductor substructure 102*b* includes a corresponding first drain/source semiconductor layer structure 106*a*/107*a*, a second drain/source semiconductor layer structure 106*b*/107*b*, and a third drain/source semiconductor layer structure 106*c*/107*c*, respectively.

At block S53: defining a filling opening in a drain/source region semiconductor sub-strip in each of the first semiconductor substructure 102*a* and the second semiconductor substructure 102*b* through the isolation opening 115, and forming a low-resistance conductive structure 101 in the filling opening.

In a specific embodiment, step S53 may specifically include the following.

Figure 69:
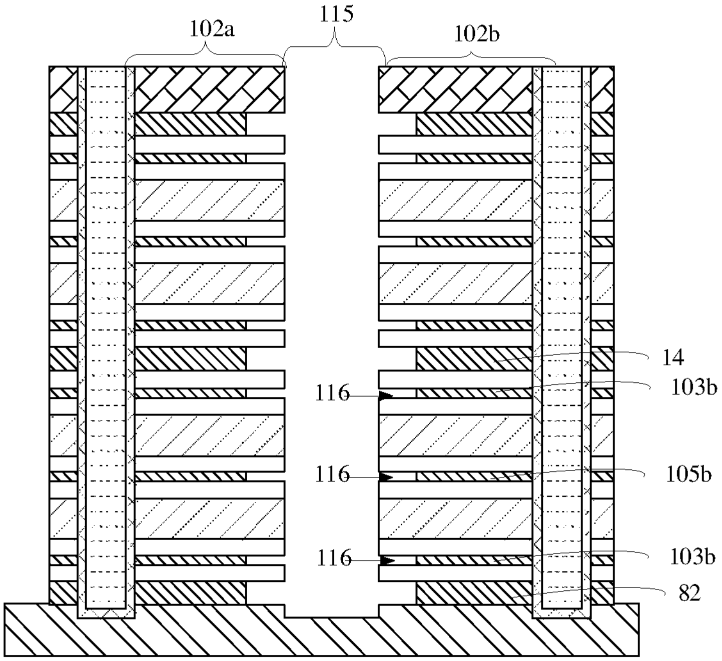
FIG. 69 is a schematic view of a structure at another specific operation of a manufacturing method of a memory block according to still embodiment of the present disclosure.
Figure 70:
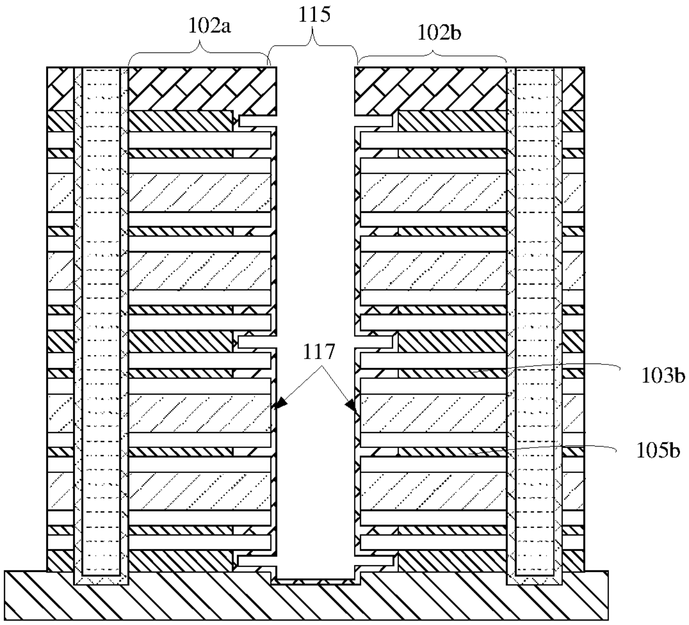
FIG. 70 is a schematic view of a structure at further another specific operation of a manufacturing method of a memory block according to still embodiment of the present disclosure.

Step S531: referring to FIGS. 69-70, in the isolation opening 115, replacing each of the first sacrificial semiconductor layer 82 and the second sacrificial semiconductor layer 14 in the first semiconductor substructure 102*a* and the second semiconductor substructure 102*b* with an insulating isolation layer 14' through a first recessed groove 116; replacing a portion of each of the second drain/source semiconductor layer structure 103*b*/105*b* in each of the first semiconductor substructure 102*a* and the second semiconductor substructure 102*b* with a protective dielectric layer 117, and replacing a portion of each of the channel semiconductor sub-strip 104*a*/104*b* in each of the first semiconductor substructure 102*a* and the second semiconductor substructure 102*b* with an insulating isolation layer 14'.

In a specific embodiment, in conjunction with FIG. 69, step S531 may specifically include the following.

Step S5311: in the isolation opening 115, etching the portion of each of the first sacrificial semiconductor layer 82, the second sacrificial semiconductor layer 14, and the second drain/source semiconductor layer structure 103*b*/105*b* in each of the first semiconductor substructure 102*a* and the second semiconductor substructure 102*b* to remove the portion of each of the first sacrificial semiconductor layer 82, the second sacrificial semiconductor layer 14, and the second drain/source semiconductor layer structure 103*b*/105*b*.

It is noted that the first sacrificial semiconductor layer 82, the second sacrificial semiconductor layer 14, and the second drain/source semiconductor layer structure 103*b*/105*b* may be made of the same material.

Specifically, the portion of each of the first sacrificial semiconductor layer 82, the second sacrificial semiconductor layer 14, and the second drain/source semiconductor layer structure 103*b*/105*b* in each of the first semiconductor substructure 102*a* and the second semiconductor substructure 102*b* are etched in a direction from the isolation opening 115 toward a corresponding one of the first semiconductor substructure 102*a* and the second semiconductor substructure 102*b*, to remove a portion of silicon germanium (SiGe) in the first sacrificial semiconductor layer 82, the second sacrificial semiconductor layer 14, and the second drain/source semiconductor layer structure 103*b*/105*b*. At the isolation opening 115, each of the first sacrificial semiconductor layer 82, the second sacrificial semiconductor layer 14, and the second drain/source semiconductor layer structure 103*b*/105*b* defines the first recessed groove 116, and the first recessed groove 116 is opened toward the isolation opening 115.

It will be appreciated by those skilled in the art that the first semiconductor substructure 102*a* and the second semiconductor substructure 102*b* each defines the first recessed groove 116 in each of the first sacrificial semiconductor layer 82, the second sacrificial semiconductor layer 14, and the second drain/source semiconductor layer structure 103*b*/105*b* at the location of the isolation opening 115. That is, the first semiconductor substructure 102*a* and the second semiconductor substructure 102*b* are simultaneously subjected to etching at the same height to define the first recessed grooves 116, respectively. Subsequent steps will all be performed simultaneously in the first semiconductor substructure 102*a* and the second semiconductor substructure 102*b*.

Step S5312: referring to FIG. 70, forming the protective dielectric layer 117 in the first recessed groove 116 in the portion of each of the first sacrificial semiconductor layer 82, the second sacrificial semiconductor layer 14, and the second drain/source semiconductor layer structure 103*b*/105*b*.

Specifically, the protective dielectric layer 117 may be made of silicon nitride (SiN). The protective dielectric layer 117 covers exposed surfaces of the first semiconductor substructure 102*a* and the second semiconductor substructure 102*b* by deposition, i.e., in the removed portions of the first sacrificial semiconductor layer 82 and the second sacrificial semiconductor layer 14, the protective dielectric layer 117 is formed in the shape of a groove as a first protective recess 118; the removed portions of the second drain/source semiconductor layer structure 103*b*/105*b* are filled with the protective dielectric layer 117; a surface of the isolation opening 115 is formed with the protective dielectric layer 117. Of course, in other embodiments, the protective dielectric layer 117 may further be formed on the first hard mask layer 83.

The protective dielectric layer 117 may be formed by chemical vapor deposition (CVD), which may specifically be plasma-enhanced chemical vapor deposition (PECVD) or low-pressure chemical vapor deposition (LPCVD). The specific method of chemical vapor deposition is not limited herein.

Figure 71:
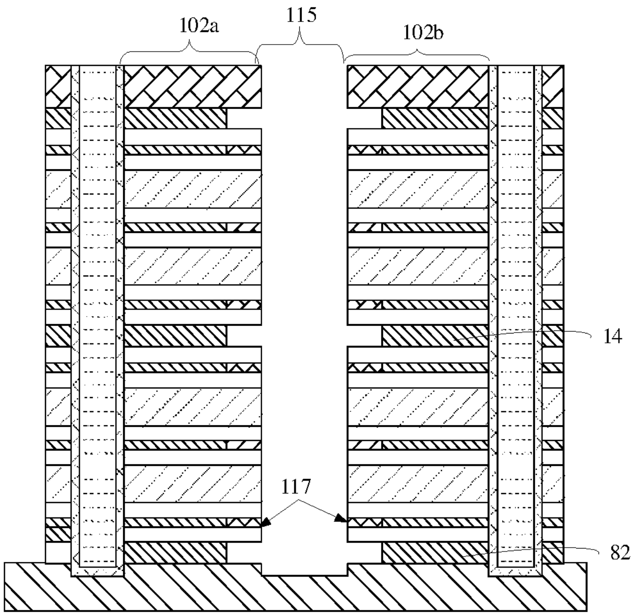
FIG. 71 is a schematic view of a structure at further another specific operation of a manufacturing method of a memory block according to still embodiment of the present disclosure.

Step S5313: referring to FIG. 71, removing the protective dielectric layer 117 in the first recessed grooves 116 corresponding to the first sacrificial semiconductor layer 82 and the second sacrificial semiconductor layer 14 to expose a residual part of the first sacrificial semiconductor layer 82 and the second sacrificial semiconductor layer 14.

Specifically, the method of removing the protective dielectric layer 117 in the first recessed grooves 116 corresponding to the first sacrificial semiconductor layer 82 and the second sacrificial semiconductor layer 14 is to etch the first semiconductor substructure 102*a* and the second semiconductor substructure 102*b* in the direction from the isolation opening 115 toward a corresponding one of the first semiconductor substructure 102*a* and the second semiconductor substructure 102*b*. In the process of removing the protective dielectric layer 117 in the first recessed grooves 116 corresponding to the first sacrificial semiconductor layer 82 and the second sacrificial semiconductor layer 14, the protective dielectric layer 117 on the surface of the isolation opening 115 and the protective dielectric layer 117 on the first hard mask layer 83 may further be removed. The protective dielectric layer 117 in the first recessed groove 116 that is removed is the first protective recess 118, to expose the residual part of the first sacrificial semiconductor layer 82 and second sacrificial semiconductor layer 14.

Figure 72:
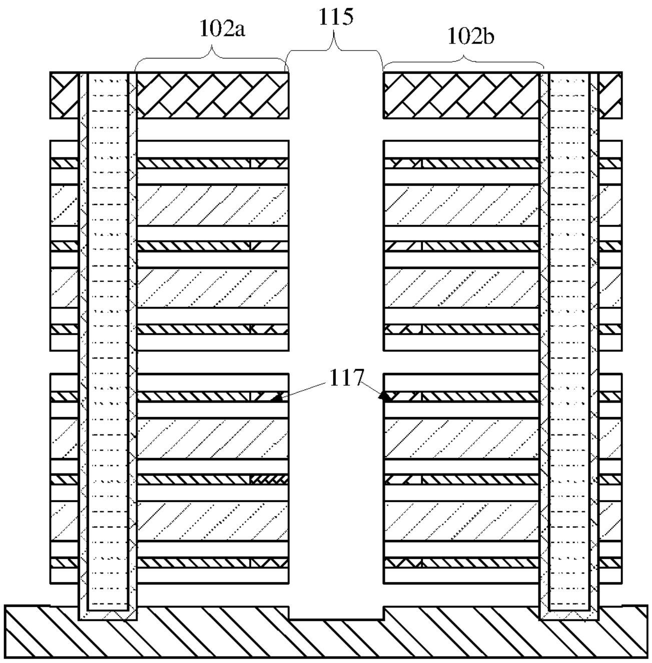
FIG. 72 is a schematic view of a structure at further another specific operation of a manufacturing method of a memory block according to still embodiment of the present disclosure.

Step S5314: removing the residual part of the first sacrificial semiconductor layer 82 and the second sacrificial semiconductor layer 14, referring to FIG. 72.

Specifically, silicon germanium (SiGe) remaining in the first sacrificial semiconductor layer 82 and the second sacrificial semiconductor layer 14 is removed by etching. The etching method may be dry etching or wet etching, which is not limited herein.

Steps S5311-S5314 aim to remove the silicon germanium (SiGe) of the first sacrificial semiconductor layer 82 and the second sacrificial semiconductor layer 14 while retaining a portion of the silicon germanium (SiGe) in the second drain/source semiconductor layer structure 103*b*/105*b*, and to define the first recessed groove 116 in the second drain/source semiconductor layer structure 103*b*/105*b* proximate the isolation opening 115. In this manner, the function of the second drain/source semiconductor layer 103*b*/105*b* in stabilizing the structure and enhancing the electrical conductivity in the memory cell structure may be maintained, and space may be reserved for the subsequent introduction of the low-resistance conductive structure 101.

Figure 73:
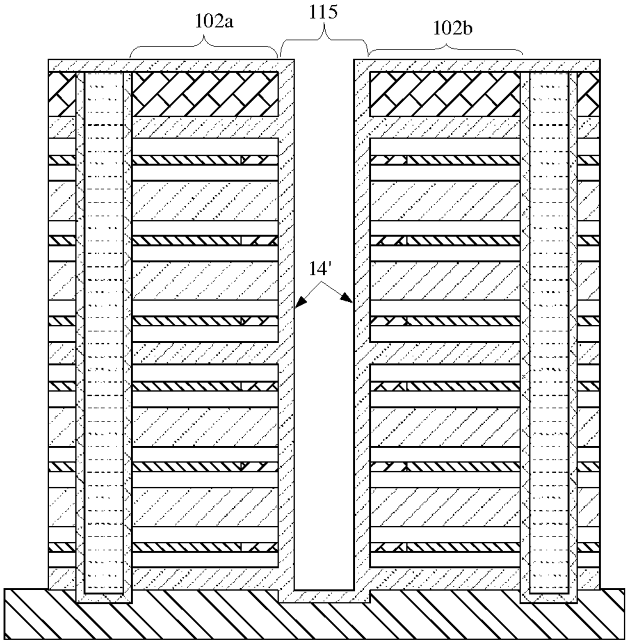
FIG. 73 is a schematic view of a structure at further another specific operation of a manufacturing method of a memory block according to still embodiment of the present disclosure.

Step S5315: referring to FIG. 73, performing deposition in a region where the removed first sacrificial semiconductor layer 82 and the second sacrificial semiconductor layer 14 are located to fill with an insulating material, thereby replacing the first sacrificial semiconductor layer 82 and the second sacrificial semiconductor layer 14 with the insulating isolation layer 14', and forming the insulating isolation layer 14' on a sidewall of the isolation opening 115.

Specifically, the insulating material of the insulating isolation layer 14' may be an oxide, such as silicon dioxide ($SiO_2$). The insulating isolation layer 14' is covered on the exposed surfaces of the first semiconductor substructure 102*a* and the second semiconductor substructure 102*b* by deposition, i.e., the positions of the first sacrificial semiconductor layer 82 and the second sacrificial semiconductor layer 14 are filled with the insulating material, and the first sacrificial semiconductor layer 82 and the second sacrificial semiconductor layer 14 are replaced with the insulating isolation layer 14'; the insulating isolation layer 14' is formed on the surface of the isolation opening 11; and the insulating isolation layer 14' is formed on the first hard mask layer 83. The insulating isolation layer 14' may be formed by atomic layer deposition (ALD), and the specific deposition method is not limited herein.

Figure 74:
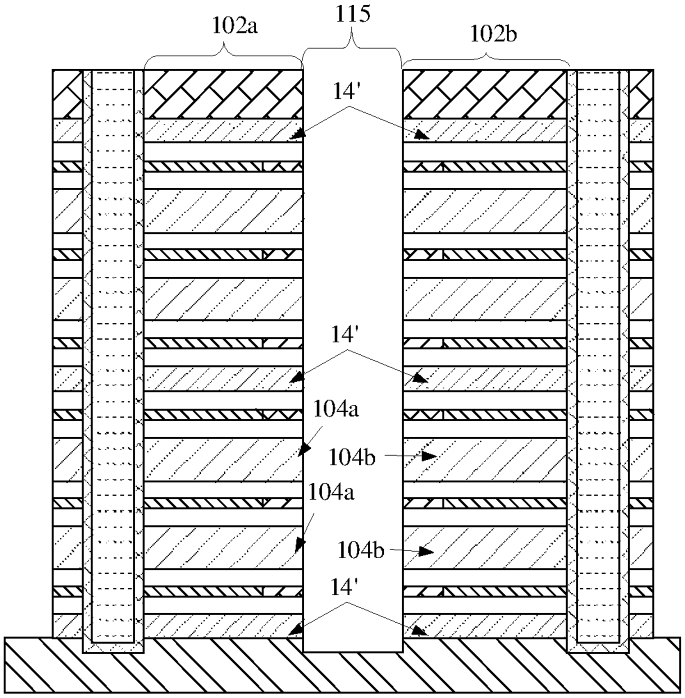
FIG. 74 is a schematic view of a structure at further another specific operation of a manufacturing method of a memory block according to still embodiment of the present disclosure.

Step S5316: removing the insulating isolation layer 14' formed on the sidewall of the isolation opening 115, referring to FIG. 74.

Specifically, the insulating isolation layer 14' formed on the sidewall of the isolation opening 115 and the insulating isolation layer 14' formed on the first hard mask layer 83 are removed by wet etching, and the insulating isolation layer 14' for replacing the first sacrificial semiconductor layer 82 and the second sacrificial semiconductor layer 14 is retained. In the process of removing the insulating isolation layer 14' formed on the sidewall of the isolation opening 115, a solution applied for wet etching may be a hydrofluoric acid (HF) solution, and the specific wet etching method is not limited herein.

Steps S5315-S5316 aim to form the insulating isolation layer 14' with an oxide as an insulating material, for replacing the first sacrificial semiconductor layer 82 and the second sacrificial semiconductor layer 14 and spacing adjacent two layers memory subarray layers 1*a* that are not co-sourced, so as to enable each of two co-sourced memory subarray layers 1*a* to form an independent workspace, thereby preventing the memory cell from inter-cell signal crosstalk.

Figure 75:
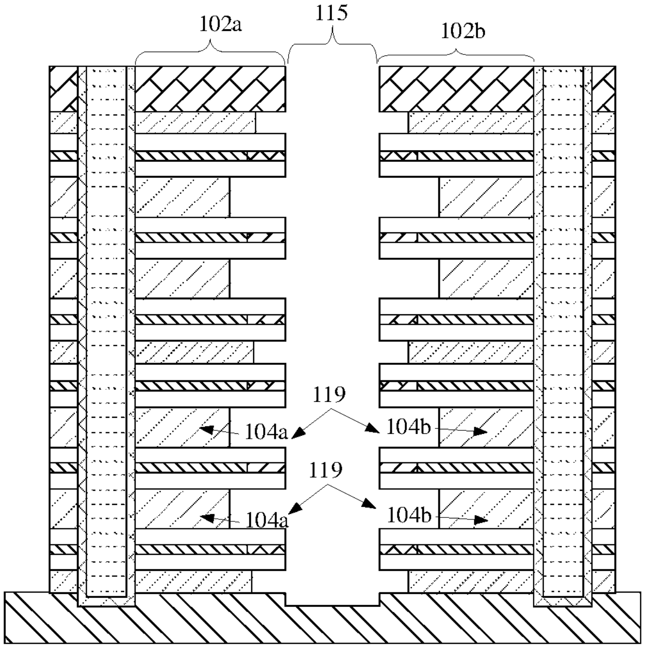
FIG. 75 is a schematic view of a structure at further another specific operation of a manufacturing method of a memory block according to still embodiment of the present disclosure.

Step S5317: referring to FIG. 75, etching the portion of each of the channel semiconductor sub-strips 104*a*/104*b* in each of the first semiconductor substructure 102*a* and the second semiconductor substructure 102*b* to remove a portion of the channel semiconductor sub-strips 104*a*/104*b*, and defining a second recessed groove 119 in the removed portion of the channel semiconductor sub-strips 104*a*/104*b*.

Specifically, the portion of each of the channel semiconductor sub-strips 104*a*/104*b* in each of the first semiconductor substructure 102*a* and the second semiconductor substructure 102*b* are etched in a direction from the surface of the isolation opening 115 toward the isolation wall 3 to remove the portions of the channel semiconductor sub-strips 104*a*/104*b*. The second recessed grooves 119 are defined in the portions of the channel semiconductor sub-strips 104*a*/104*b* that have been removed. In addition, since the etching process also acts on the oxide therefore a portion of the insulating isolation layer 14' is also removed in the direction from the surface of the isolation opening 115 toward the isolation wall 3.

Figure 76:
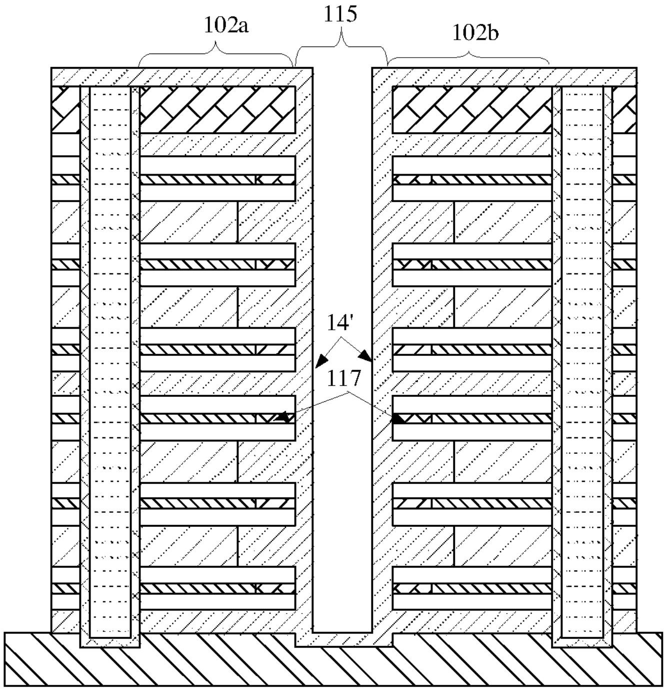
FIG. 76 is a schematic view of a structure at further another specific operation of a manufacturing method of a memory block according to still embodiment of the present disclosure.

Step S5318: referring to FIG. 76, performing deposition in a region where the second recessed groove 119 is located to fill with an insulating material, and forming the insulating isolation layer 14' in the second recessed groove 119 and on the sidewall of the isolation opening 115.

Specifically, the insulating material of the insulating isolation layer 119 may be an oxide, such as silicon dioxide ($SiO_2$). The insulating isolation layer 119 is covered on the exposed surfaces of the first semiconductor substructure 102*a* and the second semiconductor substructure 102*b* by deposition, i.e., the insulating isolation layer 14' is formed by filling the second recessed groove 119 with the insulating material; at the removed portion of the insulating isolation layer 14', the insulating isolation layer 14' is formed again; on the surface of the isolation opening 115, the insulating isolation layer 14' is formed; and on the first hard mask layer 83, the insulating isolation layer 14' is formed. The insulating isolation layer 14' may be formed by atomic layer deposition (ALD), and the specific deposition method is not limited herein.

Step S532: removing the protective dielectric layer 117 in the first recessed groove 116 in each of the first semiconductor substructure 102*a* and the second semiconductor substructure 102*b*, and deepening the first recessed groove 116 to form a drain/source region filled space 108*a*/108*b*.

In a specific embodiment, step S532 may specifically include the following.

Figure 77:
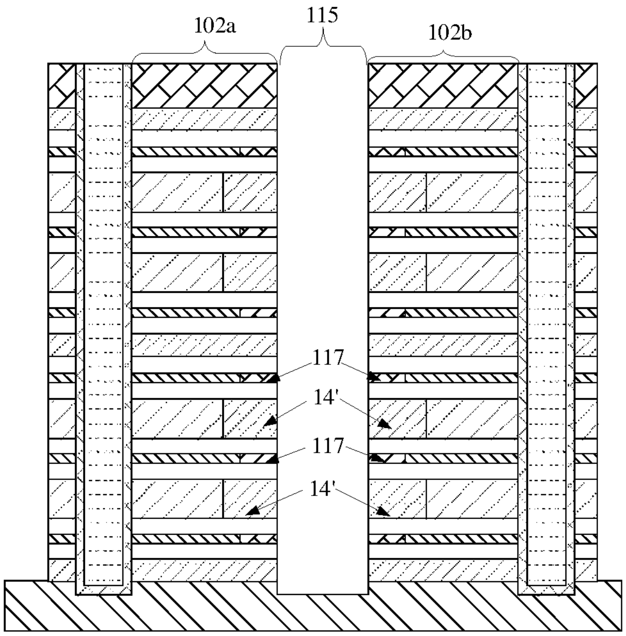
FIG. 77 is a schematic view of a structure at further another specific operation of a manufacturing method of a memory block according to still embodiment of the present disclosure.

Step S5321: removing the insulating isolation layer 14' formed on the sidewall of the isolation opening 115, referring to FIG. 77.

Specifically, the insulating isolation layer 14' formed on the sidewall of the isolation opening 115 is removed by wet etching. A solution applied for wet etching in the process of removing the insulating isolation layer 115 formed on the sidewall of the isolation opening 115 may be a hydrofluoric acid (HF) solution, and the specific wet etching method is not limited herein.

Figure 78:
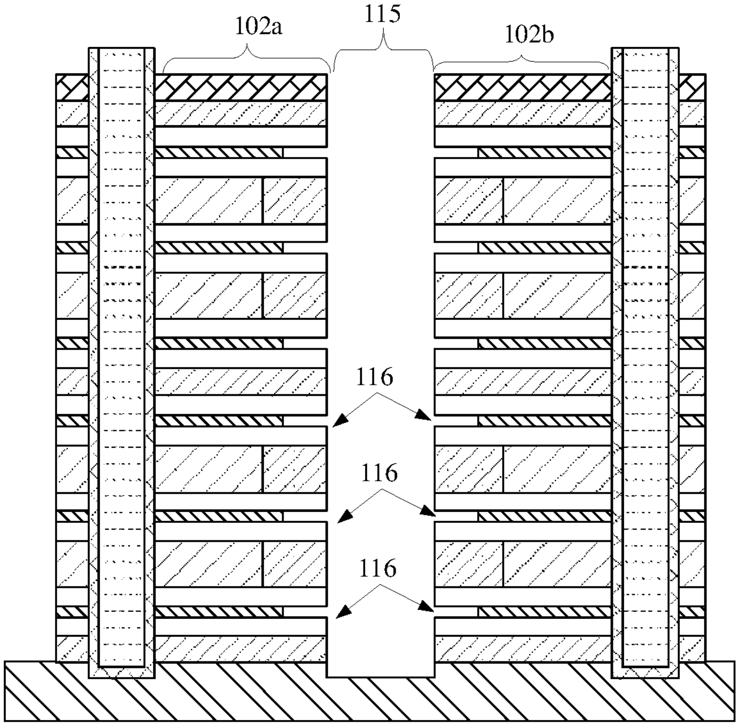
FIG. 78 is a schematic view of a structure at further another specific operation of a manufacturing method of a memory block according to still embodiment of the present disclosure.

Step S5322: removing the protective dielectric layer in the first recessed groove 116, referring to FIG. 78.

Specifically, the protective dielectric layer 117 in the first recessed groove 116 is removed by wet etching to expose the second drain/source region semiconductor layer structure 106*b*/107*b*.

Figure 79:
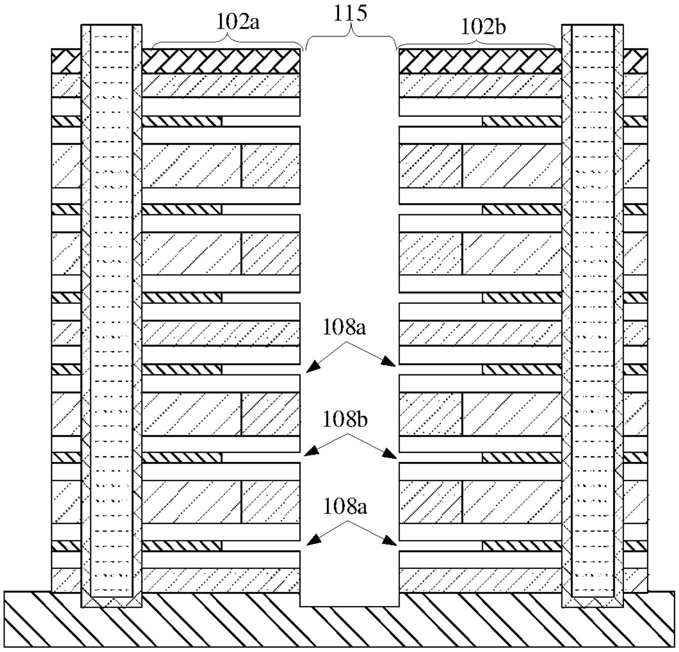
FIG. 79 is a schematic view of a structure at further another specific operation of a manufacturing method of a memory block according to still embodiment of the present disclosure.

Step S5323: referring to FIG. 79, continuing to etching the portions of the first semiconductor substructure 102*a* and the second semiconductor substructure 102*b* within the first recessed groove 116 to remove a portion of the second drain/source region semiconductor layer structure, deepening the first recessed groove 116, and forming the drain/source region filling space 108*a*/108*b*.

Specifically, the silicon germanium (SiGe) material of the exposed second drain/source semiconductor layer structure 106*b*/107*b* is removed by wet etching in a direction from the isolation opening toward the isolation wall 3.

Step S533: depositing a high-conductivity material in the drain/source region filling space 108*a*/108*b* to form a low-resistance conductive structure 101.

In a specific embodiment, step S533 may specifically include three different ways: S533*a*, S533*b* and S533*c*, respectively.

Referring to FIGS. 80-84, which are schematic structural views corresponding to a specific process of step S533, S533*a* includes the following.

Figure 80:
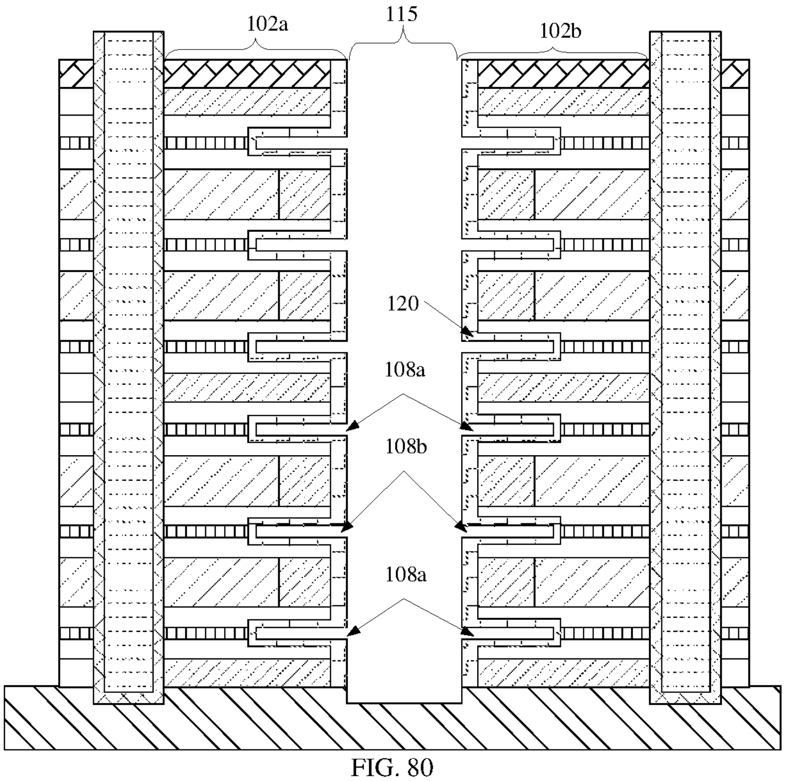
FIG. 80 is a schematic view of a structure at further another specific operation of a manufacturing method of a memory block according to still embodiment of the present disclosure.

Step S5331*a*: depositing a metal 120 on an inner surface of the drain/source filled space 108*a*/108*b* and on the sidewall of the isolation opening 115, referring to FIG. 80.

Specifically, with continued reference to FIG. 80, the metal 120 is deposited on the inner surface of the drain/source filled space 108*a*/108*b* and the sidewall of the isolation opening 115, the metal 120 may be cobalt (Co), nickel (Ni), or tungsten (W), and the specific material deposited is not limited herein. The method of deposition may be atomic layer deposition (ALD), and the specific deposition method is also not limited herein.

Figure 81:
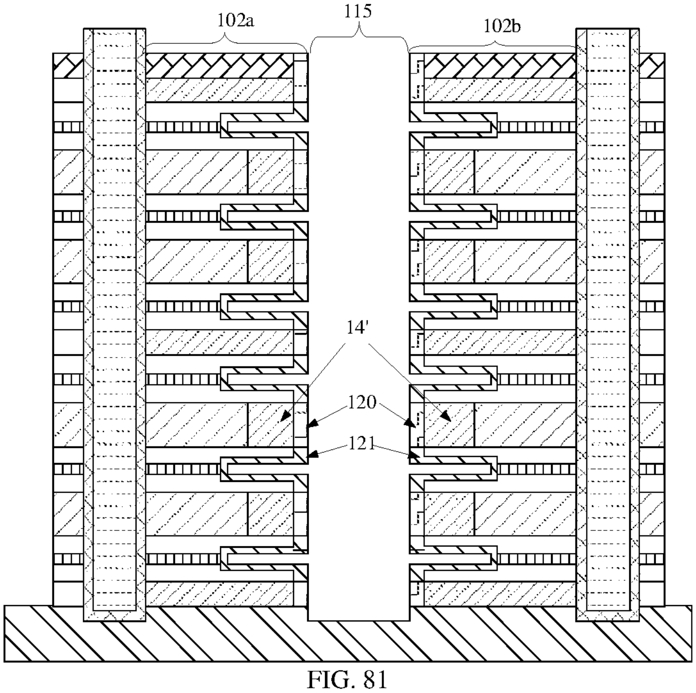
FIG. 81 is a schematic view of a structure at further another specific operation of a manufacturing method of a memory block according to still embodiment of the present disclosure.

Step S5332*a*: referring to FIG. 81, performing a heat treatment to react the metal 120 with the silicon material of the drain/source region semiconductor sub-strip in each of the first semiconductor substructure 102*a* and the second semiconductor substructure 102*b* to form a metal-silicide layer 121, where the metal 120 remains on a sidewall of the insulating isolation layer 14'.

It should be noted that the temperature of the heat treatment is determined by the reaction temperature required for different metals to react with the silicon material and is not limited herein.

Figure 82:
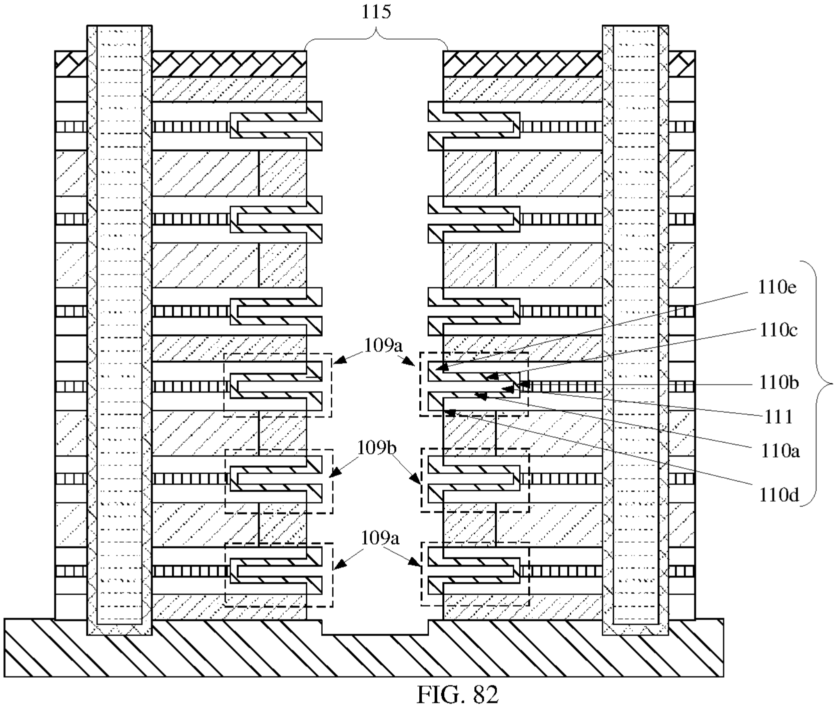
FIG. 82 is a schematic view of a structure at further another specific operation of a manufacturing method of a memory block according to still embodiment of the present disclosure.

Step S5333*a*: referring to FIG. 82, removing the metal remaining on the sidewall of the insulating isolation layer 14', and retaining the metal-silicide layer to form the low-resistance conductive structure 101, where the low-resistance conductive structure 101 includes a first conductive layer structure 110*a*, a second conductive layer structure 110*b*, a third conductive layer structure 110*c*, a fourth conductive layer structure 110*d*, and a fifth conductive layer structure 110*e*; the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, the third conductive layer structure 110*c* is formed on a portion of a lower surface of the third drain region semiconductor layer structure 106*c* or the third source region semiconductor layer structure 107*c*, the fourth conductive layer structure 110*d* is formed on a side of the first drain region semiconductor layer structure 106*a* or the first source region semiconductor layer structure 107*a*, and the fifth conductive layer structure 110*e* is formed on a side of the third drain region semiconductor layer structure 106*c* or the third source region semiconductor layer structure 107*c*.

Specifically, with continued reference to FIG. 82, since the insulating isolation layer 14' does not react with the deposited metal during the heat treatment process, the residual metal in the removal process is mainly the metal adhered to the insulating isolation layer 14'. The first conductive layer structure 110*a*, the second conductive layer structure 110*b*, the third conductive layer structure 110*c*, the fourth conductive layer structure 110*d*, and the fifth conductive layer structure 110*e* are formed into a metal-silicide material because of the heat treatment and possess a high electrical conductivity, constituting a low-resistance conductive structure body.

Figure 83:
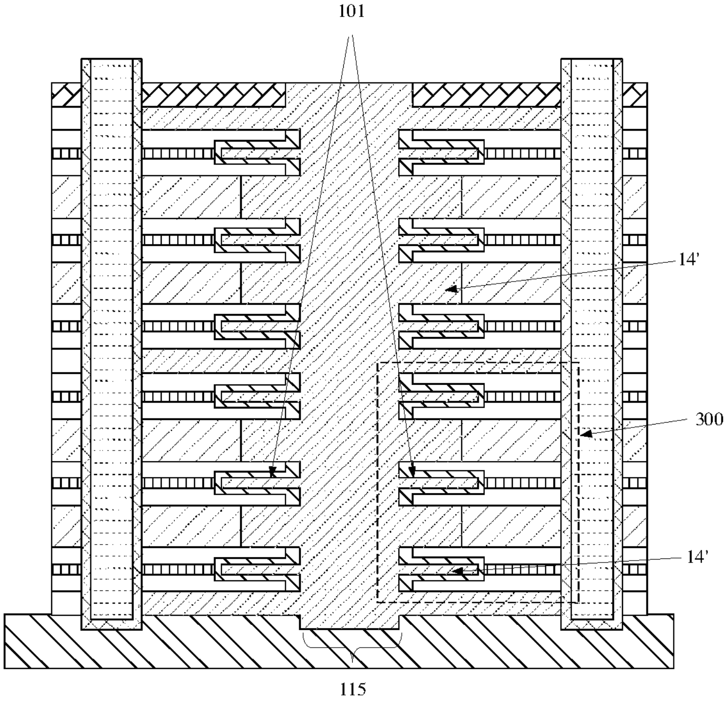
FIG. 83 is a schematic view of a structure at further another specific operation of a manufacturing method of a memory block according to still embodiment of the present disclosure.
Figure 84:
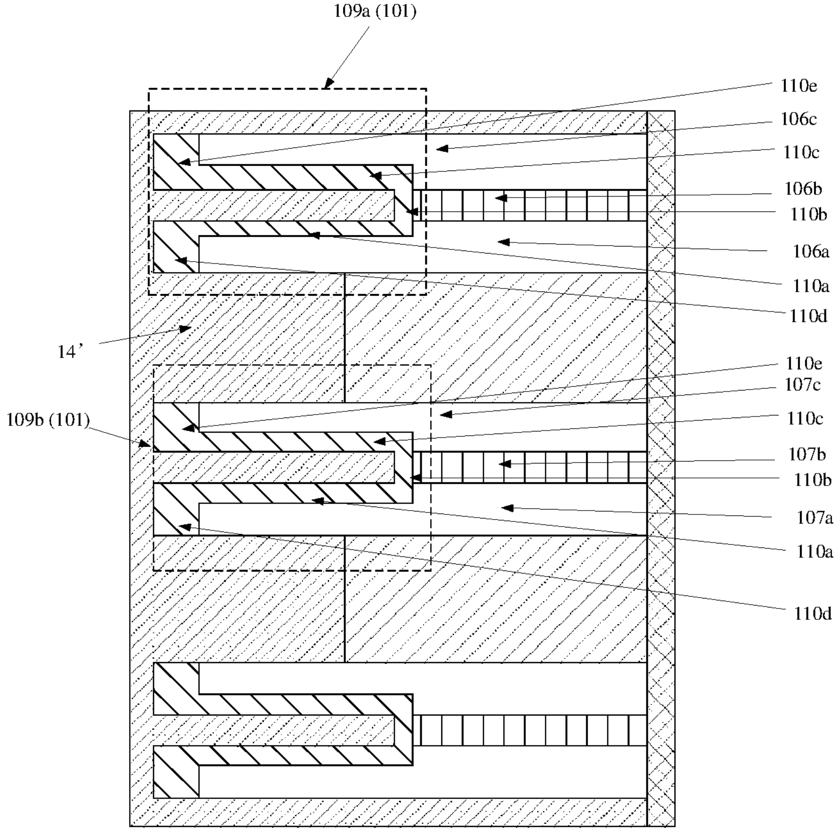
FIG. 84 is a schematic view of a structure at further another specific operation of a manufacturing method of a memory block according to still embodiment of the present disclosure.

Step S5334*a*: referring to FIGS. 83 and 84, filling an insulating material in a first space 111 between the first conductive layer structure 110*a* and the third conductive layer structure 110*c* and the isolation opening 115 to form the insulating isolation layer 14'.

Specifically, with continued reference to in FIG. 83 and FIG. 84, the insulating material deposited may be an oxide, such as silicon dioxide ($SiO_2$), or the like. The insulating material is deposited to fill the insulating material in the region of the first space 111 and the isolation opening 115 and to form a one-piece insulating isolation layer 14' in conjunction with the pre-existing insulating isolation layer at the channel semiconductor. The insulating isolation layer 14' covers the first space 111 and the isolation opening 115 to form the memory block 10 having the low-resistance conductive structural 101.

Referring to FIGS. 85-89, which are schematic structural views corresponding to another specific process of step S533, S533*b* includes the following.

Figure 85:
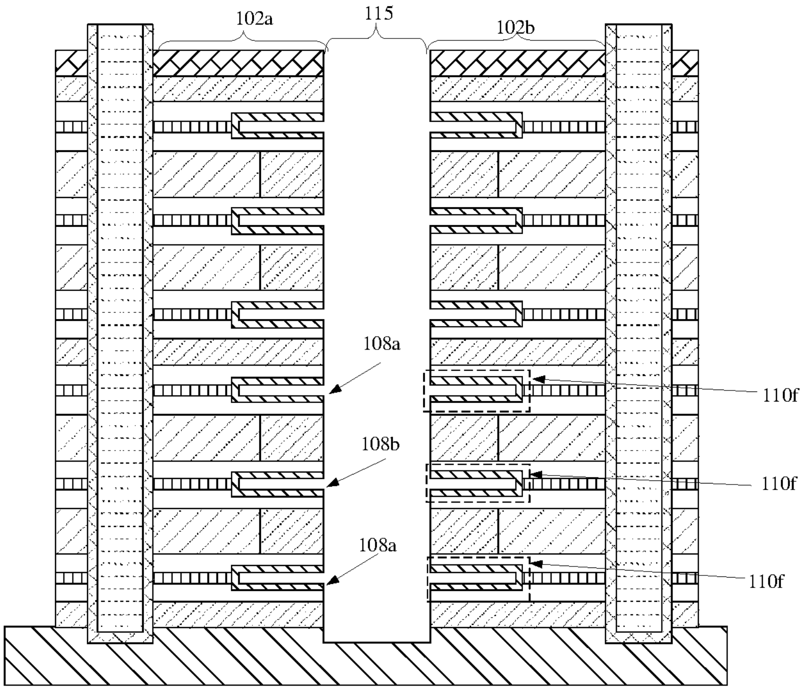
FIG. 85 is a schematic view of a structure at further another specific operation of a manufacturing method of a memory block according to still embodiment of the present disclosure.

S5331*b*: depositing a first low-resistance layer 110*f* on an inner surface of the drain/source region filling space 108*a*/108*b*, referring to FIG. 85, where the material of the first low-resistance layer 110*f* includes titanium nitride (TiN) and tantalum nitride (TaN).

Specifically, with continued reference to FIG. 85, the material for depositing the first low-resistance layer 110*f* on the inner surface of the drain/source filled space 108*a*/108*b* includes titanium nitride (TiN) or tantalum nitride (TaN). The method of depositing the material of the first low-resistance layer 110*f* may be atomic layer deposition (ALD), and the specific deposition method is not limited herein. In this manner, by depositing the titanium nitride (TiN) or tantalum nitride (TaN) material on the silicon material by ALD, the first low-resistance layer 110*f* with a better surface quality may be obtained, thereby improving the source/drain resistance, helping to ensure the effectiveness of the low-resistance conductive structure 101 formed subsequently, and enhancing the performance of the memory block 10.

Figure 86:
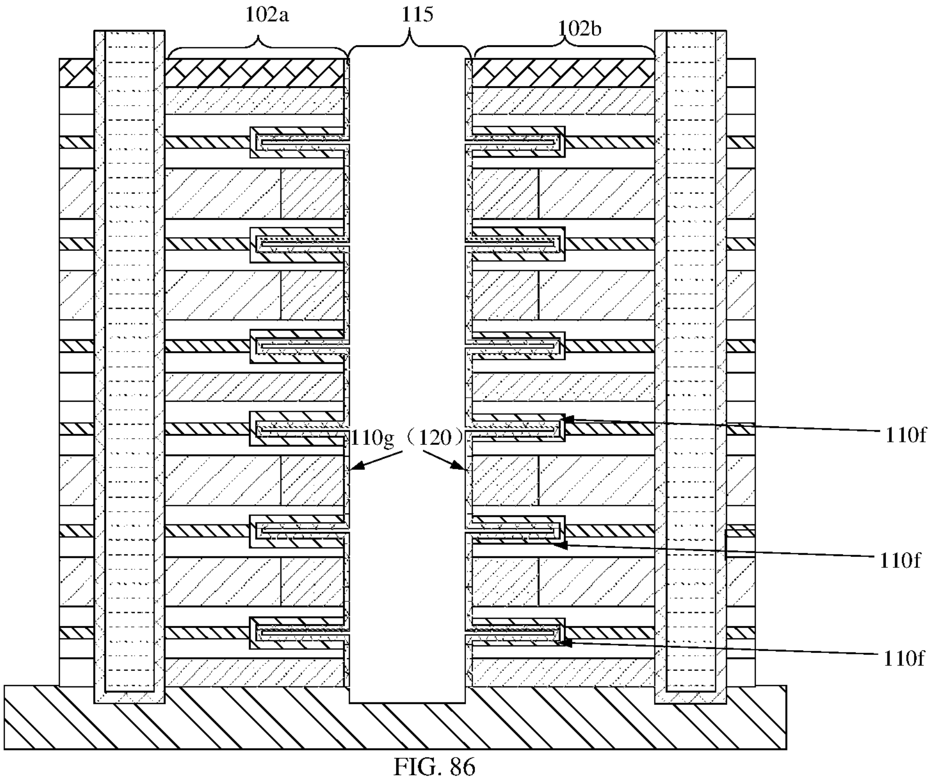
FIG. 86 is a schematic view of a structure at further another specific operation of a manufacturing method of a memory block according to still embodiment of the present disclosure.

S5332*b*: referring to FIG. 86, depositing a second low-resistance layer 110*g* on the first low-resistance layer 110*f* deposited in the drain/source region filling space 108*a*/108*b* and on the sidewall of the isolation opening 115, where the material of the second low-resistance layer 110*g* is a metal 120 of titanium (Ti) or tantalum (Ta), a combination layer of titanium (Ti) and other metal 120, or a combination layer of tantalum (Ta) and other metal 120.

Specifically, with continued reference to FIG. 86, the second low-resistance layer 110*g* is deposited on the first low-resistance layer 110*f* deposited within the drain/source filled space 108*a*/108*b* and on the sidewall of the isolation opening 115. The second low-resistance layer 110*g* is made of a metal 120 such as titanium (Ti) and tantalum (Ta), a combination layer of titanium (Ti) and tungsten (W), or a combination layer of tantalum (Ta) and tungsten (W), etc. The specific material of the combination layer metal 120 is not limited herein. The method of deposition of the second low-resistance layer 110*g* material may be chemical vapor deposition (CVD) or physical vapor deposition (PVD), and the specific deposition method is not limited herein.

In some embodiments, the titanium (Ti) or tantalum (Ta) material is deposited on its metal nitride, i.e., when the first low-resistance layer 110*f* is made of titanium nitride (TiN), the material of the second low-resistance layer 110*g* corresponds to the titanium (Ti) metal 120; and when the first low-resistance layer 110*f* is made of titanium nitride (TaN), the material of the second low-resistance layer 110*g* corresponds to the titanium (Ta) metal 120. The first low-resistance layer may improve the drain resistance on one hand, and on the other hand, provide a more suitable deposition surface for the deposition of the second low-resistance layer 110*g* (if any).

Figure 87:
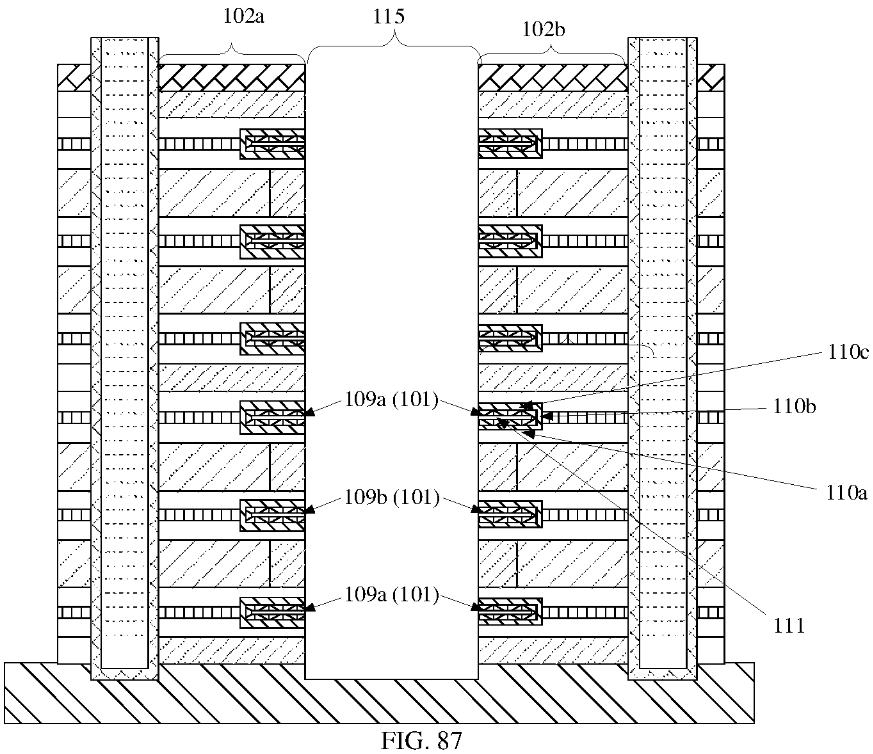
FIG. 87 is a schematic view of a structure at further another specific operation of a manufacturing method of a memory block according to still embodiment of the present disclosure.
Figure 88:
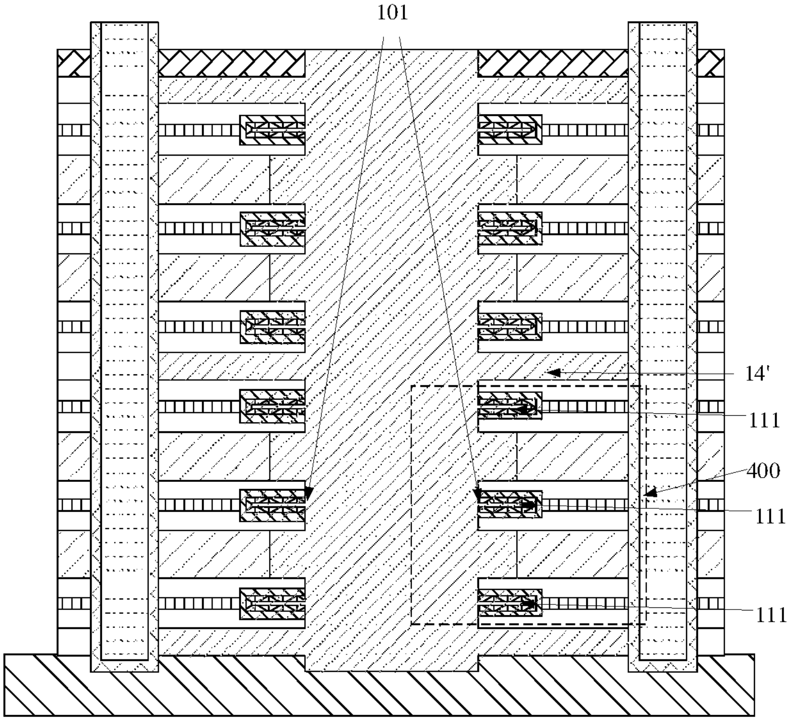
FIG. 88 is a schematic view of a structure at further another specific operation of a manufacturing method of a memory block according to still embodiment of the present disclosure.
Figure 89:
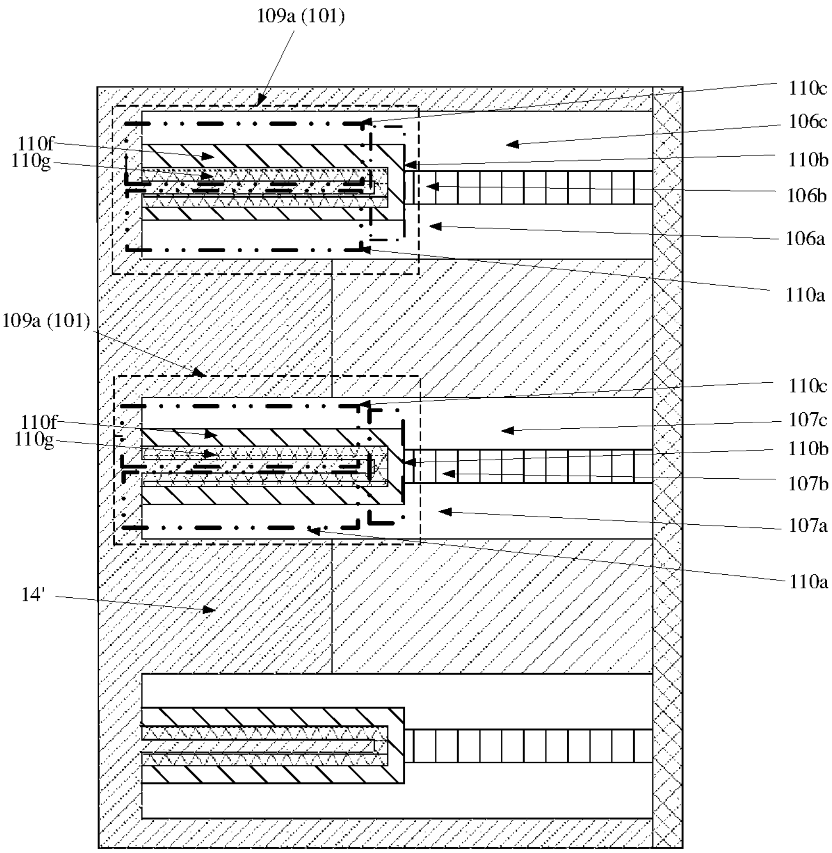
FIG. 89 is a schematic view of a structure at further another specific operation of a manufacturing method of a memory block according to still embodiment of the present disclosure.

S5333*b*: referring to FIGS. 87-89, removing the second low-resistance layer 110*g* on the sidewall of the isolation opening 115 by etching in a direction from the isolation opening 115 toward a corresponding one of the first semiconductor substructure 102*a* and the second semiconductor substructure 102*b*, so as to form the low-resistance conductive structure 101, wherein the low-resistance conductive structure 101 includes a first conductive layer structure 110*a*, a second conductive layer structure 110*b*, and a third conductive layer structure 110*c*, wherein the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*; each of the first conductive layer structure 110*a*, the second conductive layer structure 110*b*, and the third conductive layer structure 110*c* includes at least the first low-resistance layer 110*f* and the second low-resistance layer 110*g*.

Specifically, with continued reference to FIGS. 87-89, by etching in a direction from the isolation opening 115 toward a corresponding one of the first semiconductor substructure 102*a* and the second semiconductor substructure 102*b*, i.e., widening the width of the isolation opening 115. That is, by etching the sidewall of the isolation opening 115, the second low-resistance layer 110*g* on the sidewall of the isolation opening 115 is removed during the etching process. The residual first low-resistance layer 110*f* and the second low-resistance layer 110*g* are disposed within the drain/source region filling spaces 108*a*/108*b*, forming the low-resistance conductive structure 101. In addition, the width of the isolation opening 115 is increased.

S5334*b*: referring to FIGS. 87-89, filling an insulating material in the first space 111 between the first conductive layer structure 110*a* and the third conductive layer structure 110*c*, and the isolation opening 115 to form the insulating isolation layer 14'.

Specifically, with continued reference to FIGS. 87-89, the insulating material deposited may be an oxide, such as silicon dioxide ($SiO_2$), or the like. The insulating material is deposited to fill the insulating material in the region of the first space 111 and the isolation opening 115 and to form a one-piece insulating isolation layer 14' in conjunction with the pre-existing insulating isolation layer at the second recessed groove 119. The insulating isolation layer 14' covers the first space 111 and the isolation opening 115 to form the memory block 10 having the low-resistance conductive structure 101.

It should be noted that only the first low-resistance layer 110*f* may be deposited on the inner surface of the drain/source filled space 108*a*/108*b*, i.e., step S5331*b* may be directly followed by step S5333*b* and the low-resistance conductive structural body 101 may be formed by a subsequent step. In an embodiment corresponding to this case, etching is performed in a direction from the isolation opening toward a corresponding one of the first semiconductor substructure and the second semiconductor substructure, for removing residual titanium nitride (TiN) or tantalum nitride (TaN) material on the sidewall of the isolation opening instead of the second low-resistance layer 110*g*.

Figure 90:
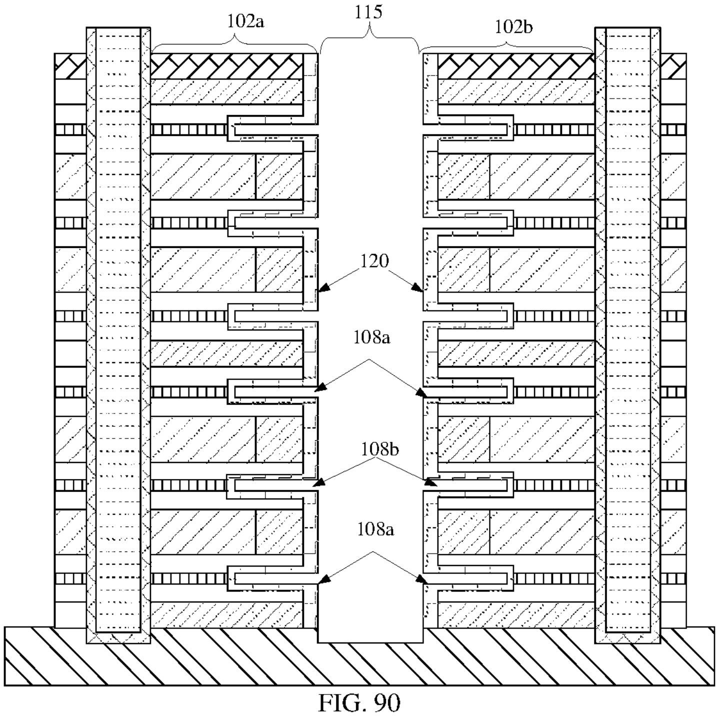
FIG. 90 is a schematic view of a structure at further another specific operation of a manufacturing method of a memory block according to still embodiment of the present disclosure.
Figure 91:
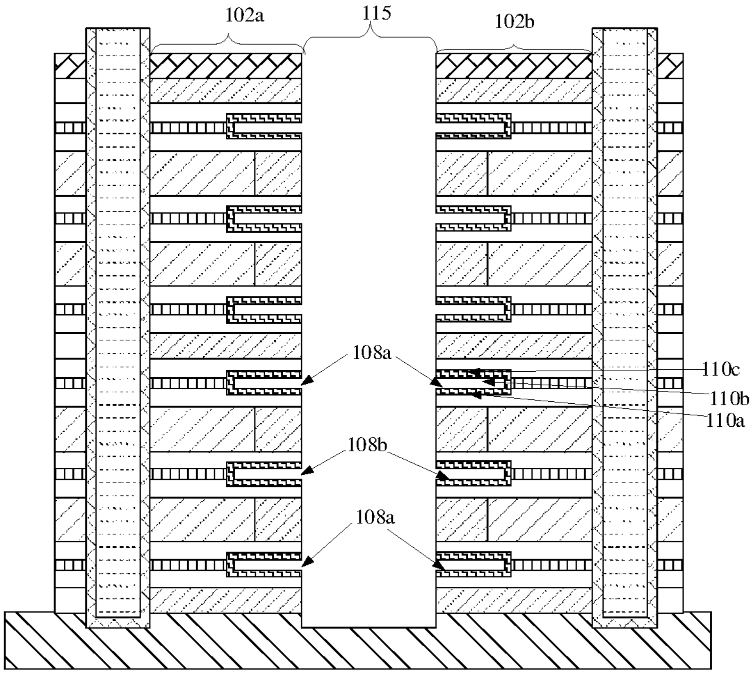
FIG. 91 is a schematic view of a structure at further another specific operation of a manufacturing method of a memory block according to still embodiment of the present disclosure.
Figure 92:
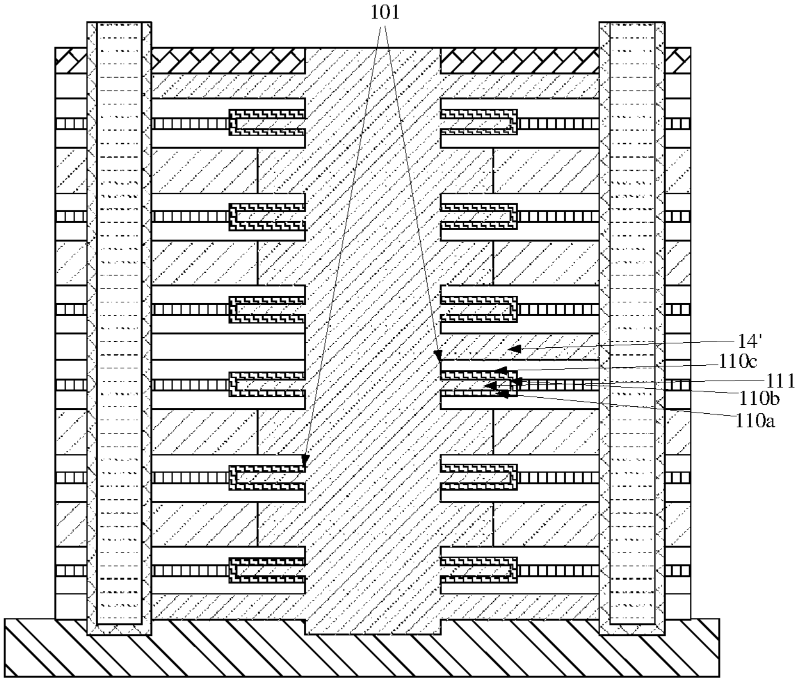
FIG. 92 is a schematic view of a structure at further another specific operation of a manufacturing method of a memory block according to still embodiment of the present disclosure.

Referring to FIGS. 90-92, which are schematic structural views corresponding to a further specific process of step S533, S533*c* includes the following.

S5331*c*: depositing a metal within the drain/source region filling space 108*a*/108*b* and on the sidewall of the isolation opening 115, referring to FIG. 90;

Specifically, the metal, such as tungsten (W), is deposited within the drain/source region filling space 108*a*/108*b* and on the sidewall of the isolation opening 115. The method of deposition may be chemical vapor deposition (CVD) or physical vapor deposition (PVD), and the specific deposition method is not limited herein.

S5332*c*: referring to FIGS. 91-92, removing the metal on the sidewall of the isolation opening 115 by etching in a direction from the isolation opening 115 toward a corresponding one of the first semiconductor substructure 102*a* and the second semiconductor substructure 102*b* to form the low-resistance conductive structure 101, where the low-resistance conductive structure 101 includes a first conductive layer structure 110*a*, a second conductive layer structure 110*b*, and a third conductive layer structure 110*c*; the first conductive layer structure 110*a* is formed on a portion of an upper surface of the first drain region semiconductor layer structure 106*a* or the first source region semiconductor layer structure 107*a*, the second conductive layer structure 110*b* is formed on a side of the second drain region semiconductor layer structure 106*b* or the second source region semiconductor layer structure 107*b*, and the third conductive layer structure 110*c* is formed on a portion of a lower surface of the third drain region semiconductor layer structure 106*c* or the third source region semiconductor layer structure 107*c*; the first conductive layer structure 110*a*, the second conductive layer structure 110*b*, and the third conductive layer structure 110*c* are each of a metal layer structure.

Specifically, with continued reference to FIGS. 91-92, by etching in a direction from the isolation opening 115 toward a corresponding one of the first semiconductor substructure 102*a* and the second semiconductor substructure 102*b*, the width of the isolation opening 115 is increased. That is, by etching the sidewall of the isolation opening 115, the metal on the sidewall of the isolation opening 115 is removed. The residual metal is disposed within the drain/source region filling space 108*a*/108*b*, thereby forming the low-resistance conductive structure 101. In this case, within the drain/source region filling space 108*a*/108*b*, the first conductive layer structure 110*a* and the third conductive layer structure 110*c* may define the first space 111 as in S533*a* and S533*b*. However, it may be appreciated by those skilled in the art that that when the metal is being deposited in the drain/source region filling space 108*a*/108*b*, the drain/source region filling space 108*a*/108*b* may also be filled up, thereby forming a conductive layer structure that fills the drain/source region filling spaces 108*a*/108*b* in one piece, which is not limited herein. In addition, the width of the isolation opening 115 is increased.

S5333*c*: referring to FIGS. 91-92, filling an insulating material in the isolation opening 115, or the isolation opening 115 and a surface of the first space 111, to form the insulating isolation layer 14'.

Specifically, with continued reference to FIGS. 91-92, the insulating material deposited may be an oxide, such as silicon dioxide ($SiO_2$), or the like. The insulating isolation layer 14' covers the isolation opening 115, or the isolation opening 115 and the first space 111, to form the memory block 10 having the low-resistance conductive structure 101.

The memory block 10 provided in the present disclosure each the low-resistance conductive structure 101. The source/drain region semiconductor layer 11*c*/13*c* having the low-resistance conductive structure 101 has a higher electron mobility, and thus is more conductive and has a lower resistance, which may lead to an elevated power utilization rate, a lower heat generation, and an elevated response speed of the memory block. In addition, due to the elevated power utilization rate, the drain/source connection terminal subarray for renewing the voltage in the memory block may be reduced in number or removed, and the drain/source connection terminal subarray 9*a* of the semiconductor stacked strip structure 1*c* in the memory block 10 may be made to lead out from the edge of the stepped structure only, thereby increasing the space utilization rate of the memory block and saving the cost of materials.

The above is only some embodiments of the present disclosure, and is not intended to limit the scope of the present disclosure. Any equivalent structure or equivalent process transformation using the contents and the accompanying drawings of the present disclosure, or any direct or indirect application in other related technical fields, is included in the scope of the present disclosure.

What is claimed is:

1. A memory block, comprising:

a memory array, comprising: a plurality of columns of semiconductor stacked strip structures that are spaced apart along a row direction; wherein each column of stacked strip structure extends along a column direction and comprises at least one drain region semiconductor strip, at least one channel semiconductor strip, and at least one source region semiconductor strip that are stacked along a height direction;

each drain region semiconductor strip and/or each source region semiconductor strip in each column of semiconductor stacked strip structure comprises a low-resistance conductive structure;

each column of semiconductor stacked strip structure at a non-edge position comprises a first semiconductor substructure, a second semiconductor substructure, and an insulating isolation structure arranged between the first semiconductor substructure and the second semiconductor substructure;

each drain region semiconductor strip in the column of semiconductor stacked strip structure at the non-edge position is divided into a first drain region semiconductor sub-strip and a second drain region semiconductor sub-strip;

each channel semiconductor strip in the column of semiconductor stacked strip structure at the non-edge position is divided into a first channel semiconductor sub-strip and a second channel semiconductor sub-strip;

each source region semiconductor strip in the column of semiconductor stacked strip structure at the non-edge position is divided into a first source region semiconductor sub-strip and a second source region semiconductor sub-strip; and each of the first drain region semiconductor sub-strip and the second drain region semiconductor sub-strip comprises a first drain region semiconductor layer structure, a second drain region semiconductor layer structure, and a third drain region semiconductor layer structure; the second drain region semiconductor layer structure is arranged between the first drain region semiconductor layer structure and the third drain region semiconductor layer structure; the first drain region semiconductor layer structure and the third drain region semiconductor layer structure are each of a silicon semiconductor layer structure, and the second drain region semiconductor layer structure is of a silicon germanium semiconductor layer structure; and/or each of the first source region semiconductor sub-strip and the second source region semiconductor sub-strip comprises a first source region semiconductor layer structure, a second source region semiconductor layer structure, and a third source region semiconductor layer structure; the second source region semiconductor layer structure is arranged between the first source region semiconductor layer structure and the third source region semiconductor layer structure; the first source region semiconductor layer structure and the third source region semiconductor layer structure are each of a silicon semiconductor layer structure, and the second source region semiconductor layer structure is of a silicon germanium semiconductor layer structure.

2. The memory block according to claim 1, wherein, the memory array comprises a plurality of memory cells distributed in a three-dimensional array; wherein the memory array comprises a plurality of memory subarray layers sequentially stacked along the height direction, and each memory subarray layer comprises a drain region semiconductor layer, a channel semiconductor layer, and a source region semiconductor layer stacked along the height direction;

in each memory subarray layer, the drain region semiconductor layer comprises a plurality of drain region semiconductor strips spaced apart along the row direction, each drain region semiconductor strip extending along the column direction; the channel semiconductor layer comprises a plurality of channel semiconductor strips spaced apart along the row direction, each channel semiconductor strip extending along the column direction; the source region semiconductor layer comprises a plurality of source region semiconductor strips spaced apart along the row direction, each source region semiconductor strip extending along the column direction;

the drain region semiconductor strips, the channel semiconductor strips, and the source region semiconductor strips that are in a same column are stacked to form a corresponding column of semiconductor stacked strip structure.

3. The memory block according to claim 2, wherein, the column of semiconductor stacked strip structure is etched into a stepped structure at an edge position, for leading out each drain region semiconductor strip and each source region semiconductor strip in the column of semiconductor stacked strip structure.

4. The memory block according to claim 2, wherein, adjacent two of the plurality of memory subarray layers comprise the drain region semiconductor layer, the channel semiconductor layer, the source region semiconductor layer, the channel semiconductor layer, and the drain region semiconductor layer, in a sequential cascade along the height direction, so as to share the same source region semiconductor layer;

an interlayer isolation layer is arranged on every adjacent two of the plurality of memory subarray layers to be isolated from another two of the plurality of memory subarray layers.

5. The memory block according to claim 1, wherein, each drain region semiconductor strip and/or each source region semiconductor strip in each column of semiconductor stacked strip structure at a non-edge position comprises the low-resistance conductive structure.

6. The memory block according to claim 1, wherein, a length of the second drain region semiconductor layer structure in the row direction is less than a length of the first drain region semiconductor layer structure and a length of the third drain region semiconductor layer structure in the row direction, to define a drain region filling space between the first drain region semiconductor layer structure, the second drain region semiconductor layer structure, and the third drain region semiconductor layer structure; a drain region low-resistance conductive layer structure is formed in the drain region filling space, and the low-resistance conductive structure in each of the first drain region semiconductor sub-strip and the second drain region semiconductor sub-strip comprises the drain region low-resistance conductive layer structure; and/or a length of the second source region semiconductor layer structure in the row direction is less than a length of the first source region semiconductor layer structure and a length of the third source region semiconductor layer structure in the row direction, to define a source region filling space between the first source region semiconductor layer structure, the second source region semiconductor layer structure, and the third source region semiconductor layer structure; a source region low-resistance conductive layer structure is formed in the source region filling space, and the low-resistance conductive structure in each of the first source region semiconductor sub-stripe and the second source region semiconductor sub-strip comprises the source region low-resistance conductive layer structure.

7. The memory block according to claim 6, wherein, the drain region low-resistance conductive layer structure and/or the source region low-resistance conductive layer structure is made of a high-conductivity material;

the drain region low-resistance conductive layer structure or the source region low-resistance conductive layer structure comprises a first conductive layer structure, a second conductive layer structure, a third conductive layer structure, a fourth conductive layer structure, and a fifth conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, the third conductive layer structure is formed on a portion of a lower surface of the third drain region semiconductor layer structure or the third source region semiconductor layer structure, the fourth conductive layer structure is formed on a side of the first drain region semiconductor layer structure or the first source region semiconductor layer structure, and the fifth conductive layer structure is formed on a side of the third drain region semiconductor layer structure or the third source region semiconductor layer; the first conductive layer structure, the second conductive layer structure, the third conductive layer structure, the fourth conductive layer structure, and the fifth conductive layer structure are made of a material comprising a metal silicide; or the drain region low-resistance conductive layer structure or the source region low-resistance conductive layer structure comprises a first conductive layer structure, a second conductive layer structure, and a third conductive layer structure; the first conductive layer structure is formed on a portion of an upper surface of the first drain region semiconductor layer structure or the first source region semiconductor layer structure, the second conductive layer structure is formed on a side of the second drain region semiconductor layer structure or the second source region semiconductor layer structure, and the third conductive layer structure is formed on a portion of a lower surface of the third drain region semiconductor layer structure or the third source region semiconductor layer structure; each of the first conductive layer structure, the second conductive layer structure, and the third conductive layer structure comprises at least a first low-resistance layer; the first low-resistance layer is made of a material comprising titanium nitride or tantalum nitride; or the drain region low-resistance conductive layer structure or the source region low-resistance conductive layer structure comprises a conductive layer structure filled in the drain region filling space or the source region filling space, and the conductive layer structure is made of a material comprising a metal.

8. The memory block according to claim 7, wherein, each of the first conductive layer structure, the second conductive layer structure, and the third conductive layer structure further comprises a second low-resistance layer, wherein the second low-resistance layer is attached to a surface of the first low-resistance layer; a material of the second low-resistance layer comprises titanium or tantalum, or the material of the second low-resistance layer comprises a combination layer of titanium and another metal, or a combination layer of tantalum and another metal.

9. The memory block according to claim 7, wherein, the first conductive layer structure and the third conductive layer structure are spaced apart from each other to define a first space configured to be filled with an insulating substance.

* * * * *